(12) United States Patent
Yoshida

(10) Patent No.: US 10,884,564 B2
(45) Date of Patent: Jan. 5, 2021

(54) SHEET-SHAPED DEVICE

(71) Applicant: I.P SOLUTIONS, LTD, Tokyo (JP)

(72) Inventor: Kenji Yoshida, Tokyo (JP)

(73) Assignee: I.P SOLUTIONS, LTD, Tokyo (JP)

( * ) Notice: Subject to any disclaimer, the term of this patent is extended or adjusted under 35 U.S.C. 154(b) by 0 days.

(21) Appl. No.: 16/495,392

(22) PCT Filed: Mar. 20, 2018

(86) PCT No.: PCT/JP2018/011228
§ 371 (c)(1),
(2) Date: Sep. 19, 2019

(87) PCT Pub. No.: WO2018/174109
PCT Pub. Date: Sep. 27, 2018

(65) Prior Publication Data
US 2020/0257408 A1      Aug. 13, 2020

(30) Foreign Application Priority Data

Mar. 20, 2017   (JP) ................................ 2017-053833
Mar. 23, 2017   (WO) .................. PCT/JP2017/011557
Aug. 31, 2017   (JP) ................................ 2017-168100

(51) Int. Cl.
*H05K 1/18* (2006.01)
*G06F 3/044* (2006.01)
*G06K 19/077* (2006.01)

(52) U.S. Cl.
CPC ..... *G06F 3/0445* (2019.05); *G06K 19/07756* (2013.01); *H05K 1/18* (2013.01)

(58) Field of Classification Search
CPC .......... H05K 1/18; H05K 1/181; H05K 1/182; H05K 1/183; H05K 1/184; H05K 1/185;
(Continued)

(56) References Cited

FOREIGN PATENT DOCUMENTS

JP   2011-134298 A   7/2011
JP   2013-529800 A   7/2013
(Continued)

OTHER PUBLICATIONS

ISR; Japan Patent Office; Jul. 10, 2018.
(Continued)

*Primary Examiner* — Jeremy C Norris
(74) *Attorney, Agent, or Firm* — Patshegen IP LLC; Moshe Pinchas

(57) ABSTRACT

The present invention relates to a thin plate shaped apparatus comprising a plurality of first electrodes and a plurality of second electrodes which are arranged on the first surface of a nonconductive base material, a linear conductive member, a plurality of indicator electrodes formed in the operation area. The plurality of first electrodes are connected with the linear conductive member as a bundle or each separately, indicator electrodes are formed in the operation area, the second electrodes connected to the indicator electrodes possess physical quantities within a range of which their positions are not detected by a panel, and conductor patterns of which each respective position is detectable by the panel when any one of the plurality of indicator electrodes or the nonconductive member laminated on the plurality of indicator electrodes receives finger contact operations when the area formed with at least the second electrodes and the plurality of first electrodes is in a state of making contact with or coming into proximity to the panel through each respective physical quantity including those of second electrodes connected to indicator electrodes of the positions receiving the contact operations and the plurality of first electrodes.

22 Claims, 106 Drawing Sheets

(58) Field of Classification Search
CPC ........ H05K 1/186; H05K 1/187; H05K 1/188; H05K 1/189
See application file for complete search history.

(56) References Cited

FOREIGN PATENT DOCUMENTS

| | | |
|---|---|---|
| JP | 2013-168187 A | 8/2013 |
| JP | 2013-541761 A | 11/2013 |
| JP | 2015-75796 A | 4/2015 |
| JP | 2015-099514 A | 5/2015 |
| JP | 5911995 B1 | 4/2016 |
| JP | 2016-106285 A | 6/2016 |
| JP | 6031689 B1 | 11/2016 |
| JP | 6089194 B1 | 3/2017 |
| JP | 2017-076246 A | 4/2017 |
| WO | 2015/008828 A1 | 1/2015 |

OTHER PUBLICATIONS

Novel Interaction Method Using Visual Marker Integrated With Conductive Pattern; Ikeda, Oki & Tsukada; Feb. 9, 2017.
Paper Windows: An Interface Whose Inside Area Can Be Used As an Independent Touch Panal Display; Kato & Miyashita; 2015.
Generating Technique of Multi Touch Pattern Using the All in One Inkjet Printer With Conductive Ink; IPSJ Sig Technical Report; Mar. 15, 2014.
DNP Launches Sales Propmotion Support Service Using Touch Panel Display and Card; Jul. 2, 2014; www.dnp.co.jp/eng/news/detail/1191810_2453.html.
A Cuttable Multi-Touch Sensor; Olberding et al; http://hdl.handle.net/1721.1/92396; Dec. 18, 2018.

FIG. 5
(a) TOP PLATE UPPER SURFACE
(b) TOP PLATE LOWER SURFACE
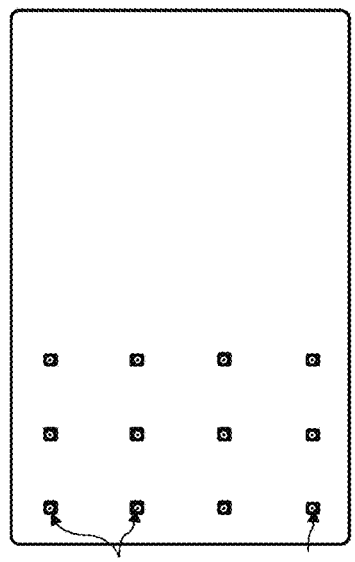
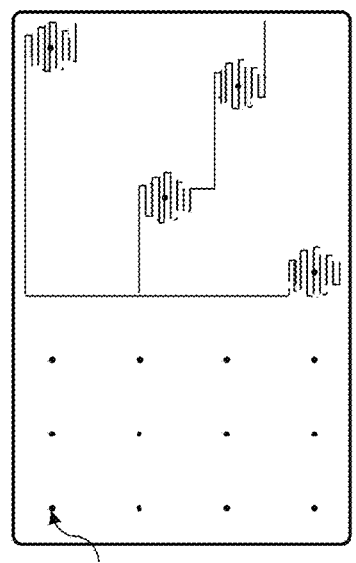
114A FINGER CONTACT (1.5X1.5 MM)　　THROUGH HOLE　　THROUGH HOLE
FIG. 6
(a) TOP PLATE UPPER SURFACE
(b) TOP PLATE LOWER SURFACE
114B
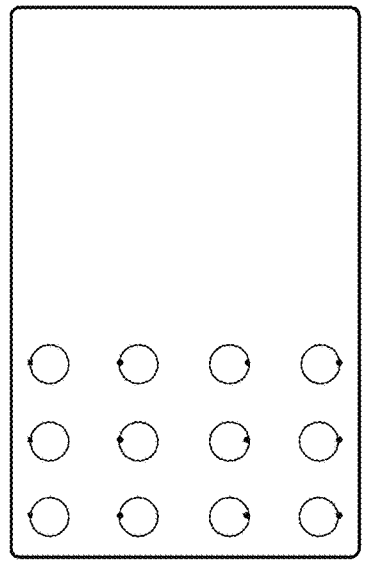
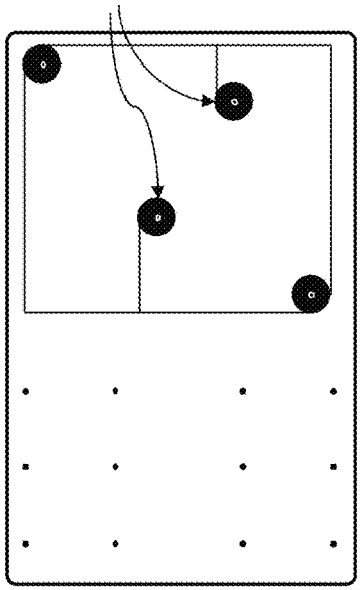
FINGER CONTACT (DIAMETER 7.0 MM)

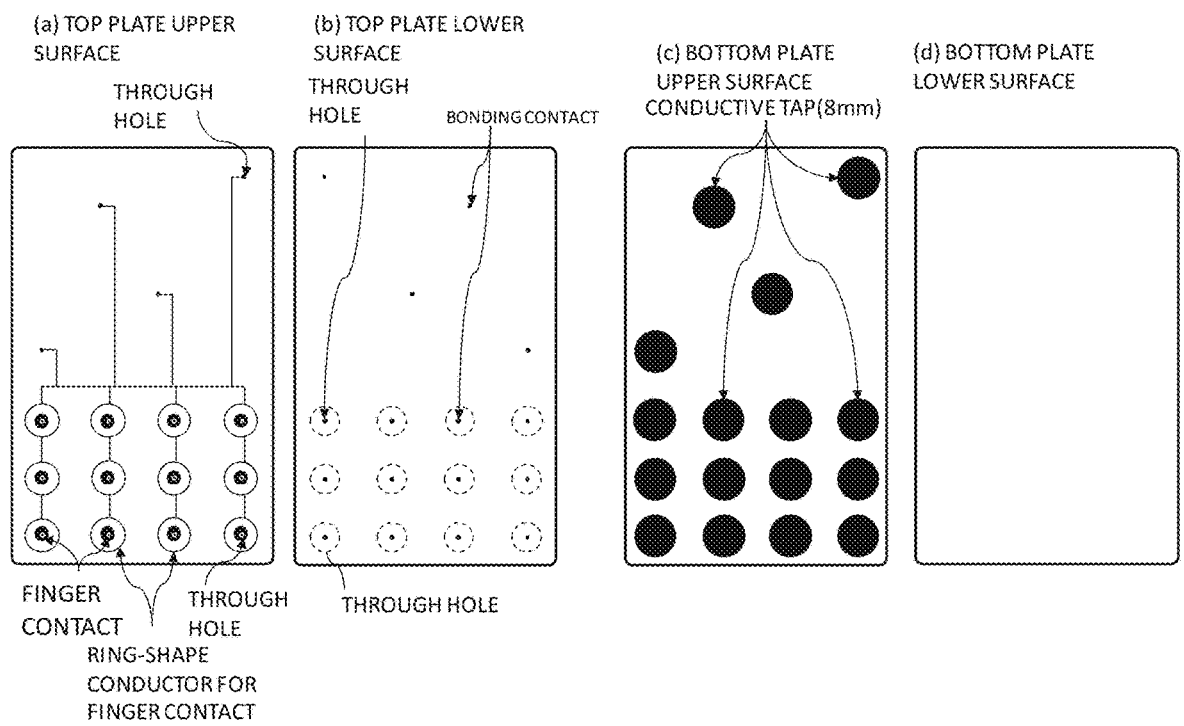
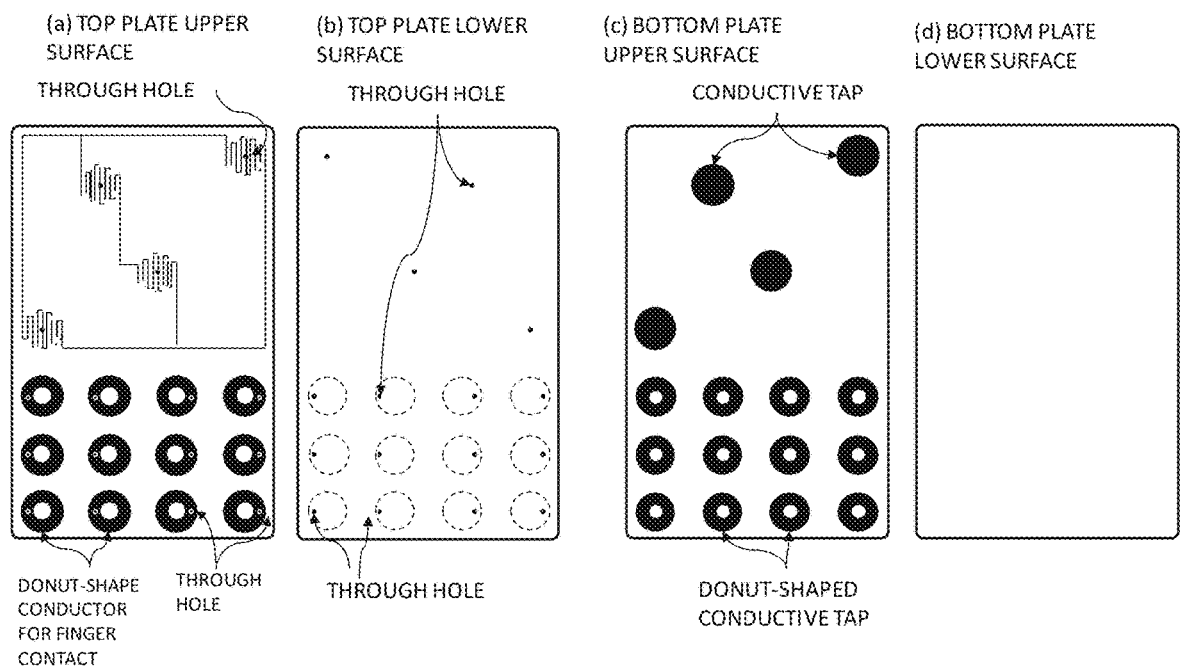

TAPERED DIELECTRIC COLUMN (a) TOP PLATE UPPER/LOWER SURFACE

FIG. 20
(a) TOP PLATE UPPER SURFACE
(b) TOP PLATE LOWER SURFACE
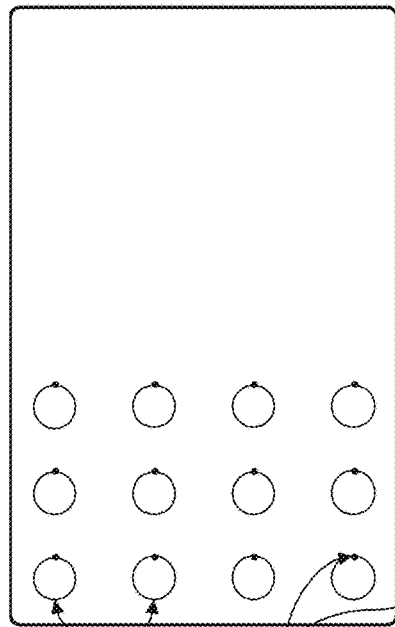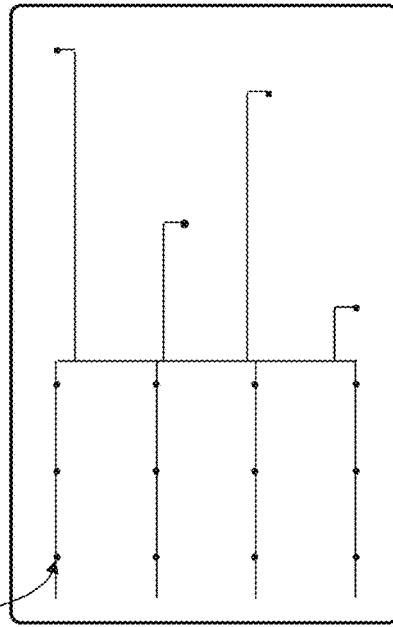
RING-SHAPE CONDUCTOR FOR FINGER CONTACT (7mm)
THROUGH HOLE
FIG. 21
(a) TOP PLATE UPPER SURFACE
(b) TOP PLATE LOWER SURFACE
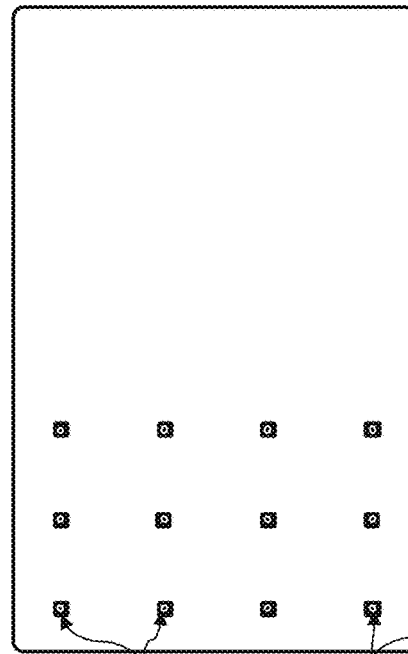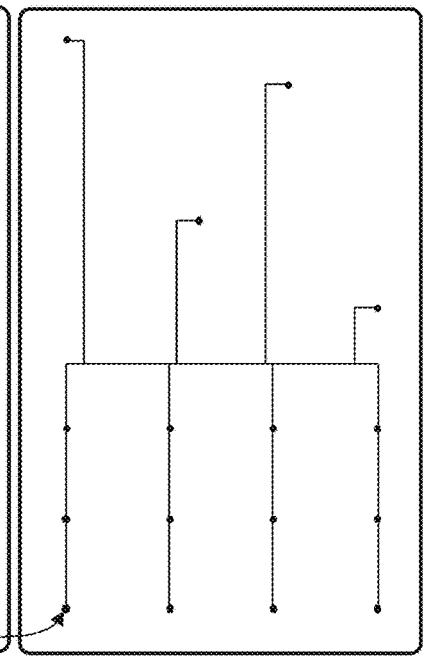
FINGER CONTACT (2.0×2.0mm)
THROUGH HOLE FIG. 32
(a) UPPER SURFACE
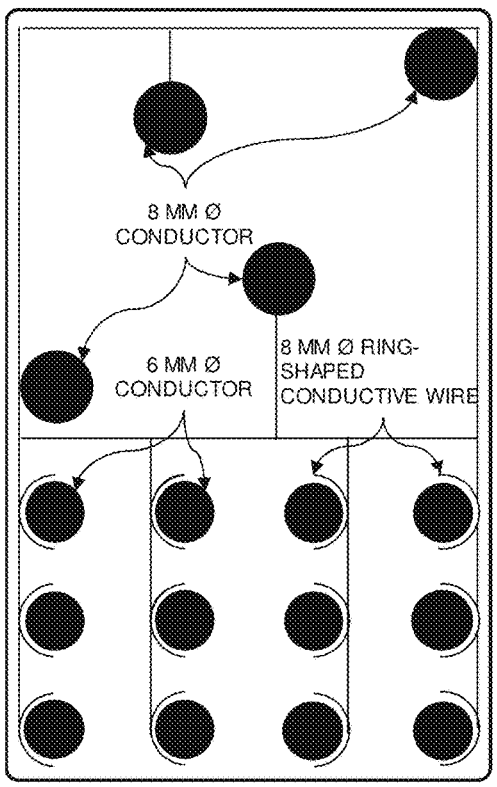
(b) LOWER SURFACE
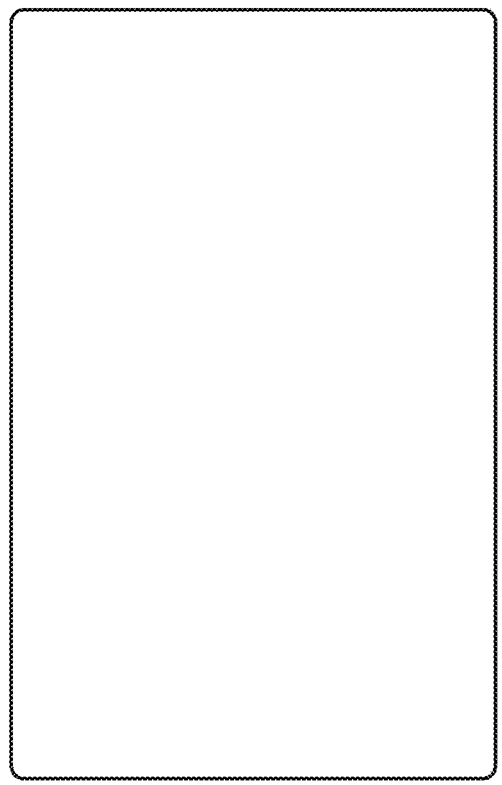
FIG. 33
(a) UPPER SURFACE
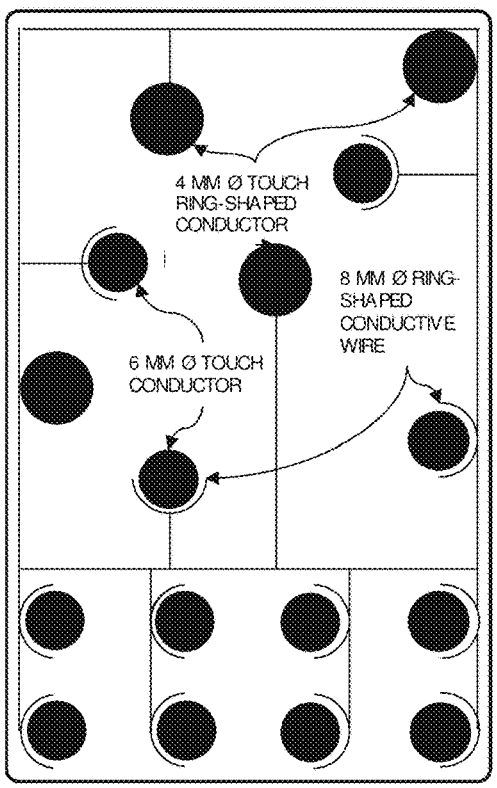
(b) LOWER SURFACE
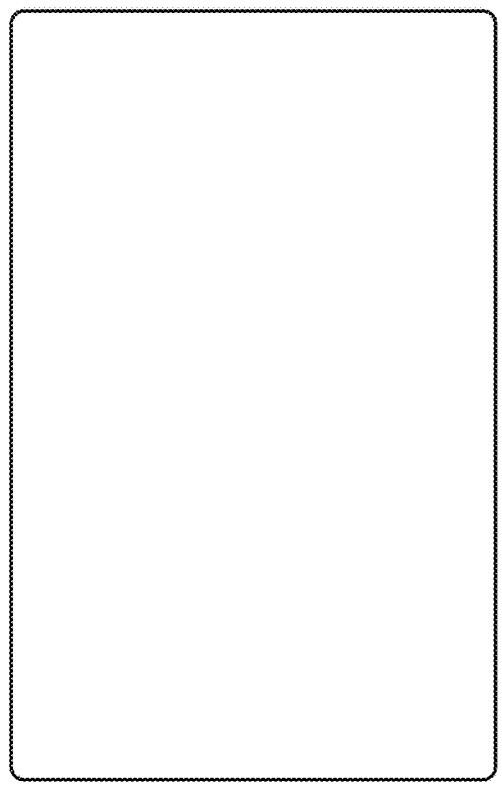

FIG. 34
(a) UPPER SURFACE
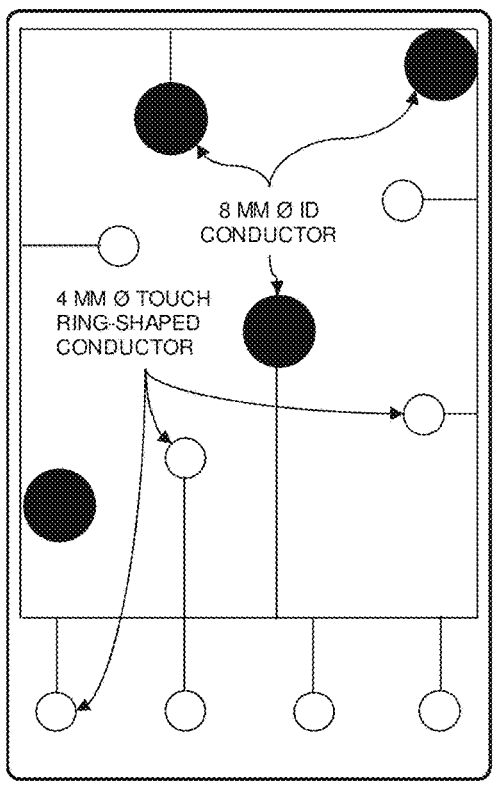
(b) LOWER SURFACE
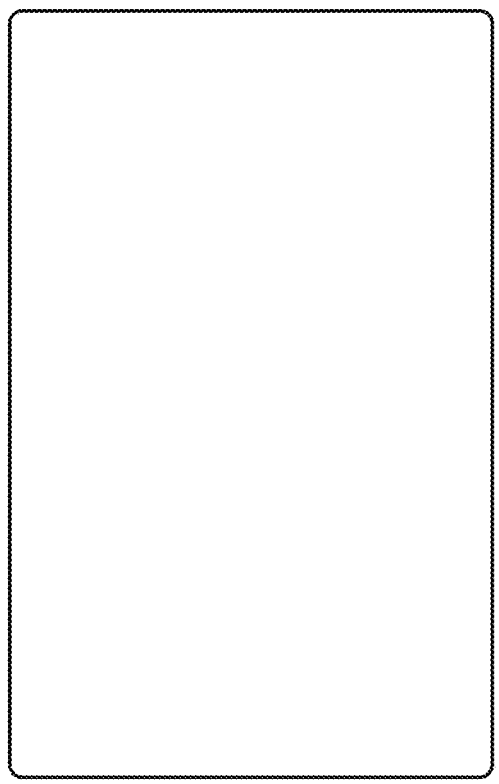
FIG. 35
(a) UPPER SURFACE
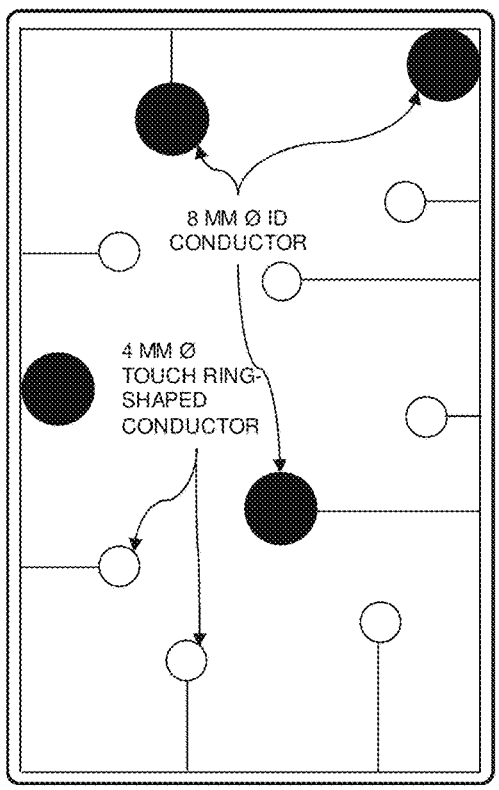
(b) LOWER SURFACE
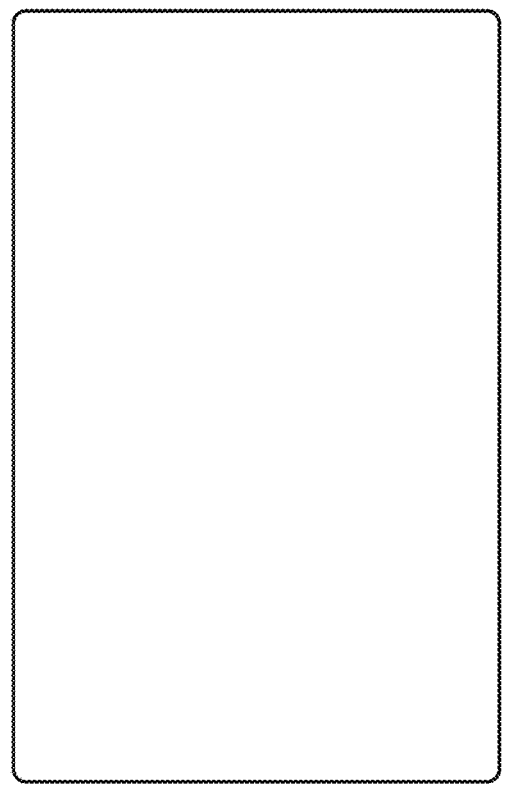

FIG. 36
(a) UPPER SURFACE
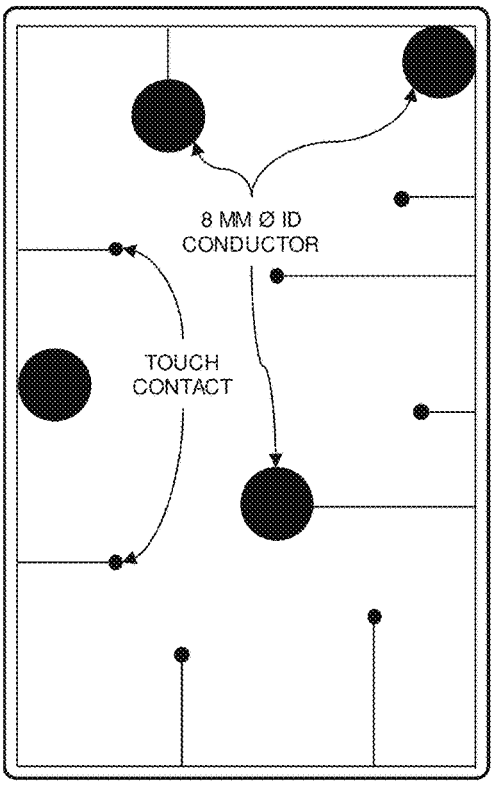
(b) LOWER SURFACE
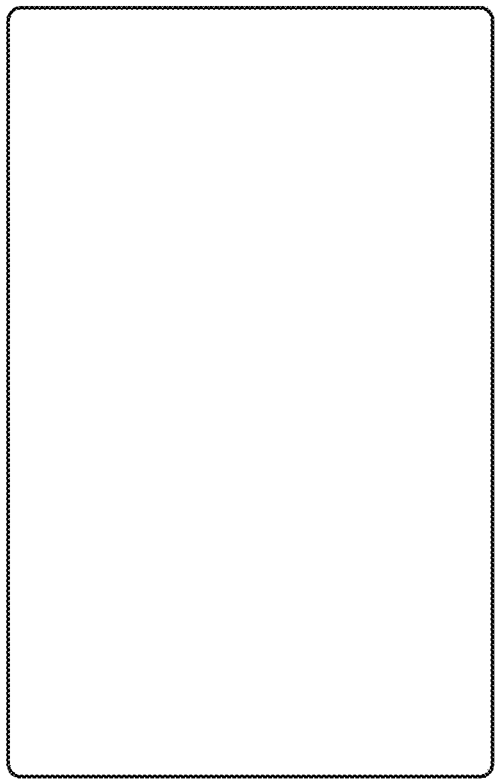
FIG. 37
(a) UPPER SURFACE
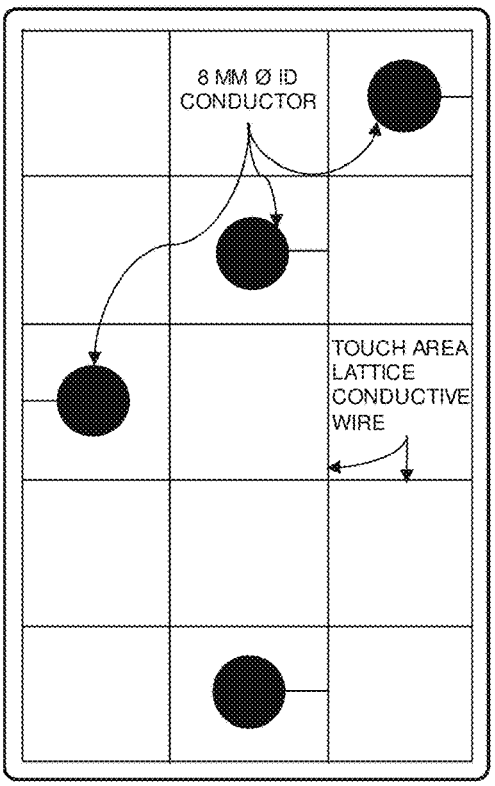
(b) LOWER SURFACE
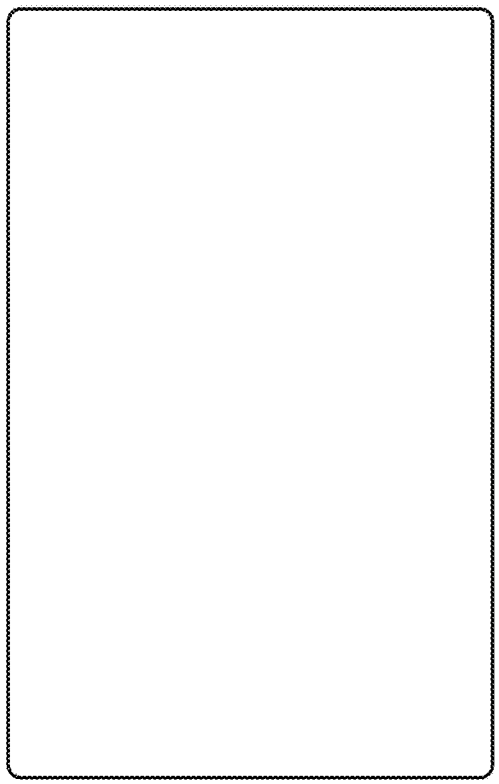

FIG. 44
FIG. 45
FIG. 46
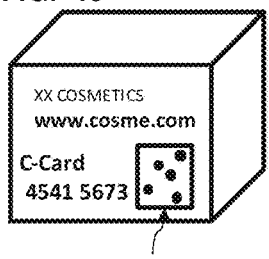
C-CARD ATTACHED TO
THE PRODUCT
PACKAGE
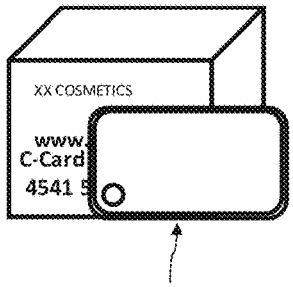
AUTHENTICATION BY TAPPING YOUR
SMARTPHONE ON THE C-CARD

BUSINESS
C-CARD
TICKET/COUPON AUTHENTICATION
TABLET

FIG. 55
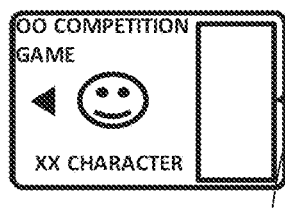
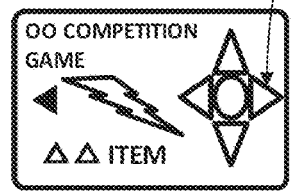
FINGER OPERATION AREA (NON-CONDUCTOR)
FIG. 56
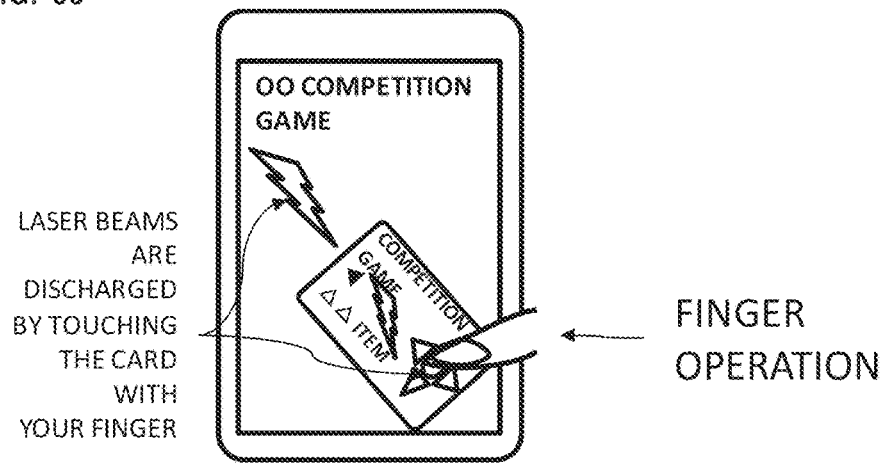
LASER BEAMS ARE DISCHARGED BY TOUCHING THE CARD WITH YOUR FINGER
FINGER OPERATION
FIG. 57
FRONT SIDE
C−Card
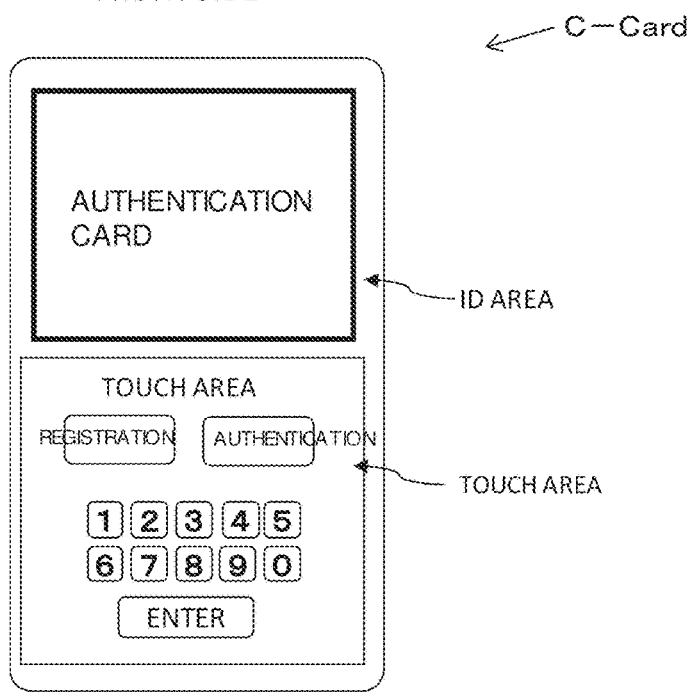
ID AREA
TOUCH AREA C-Card C-Card

BY TOUCHING, THE CRY OF THE ANIMAL IS EMITTED

C-Card

FIG. 68
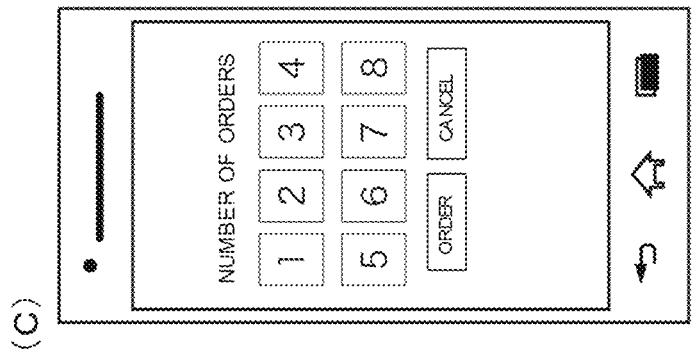
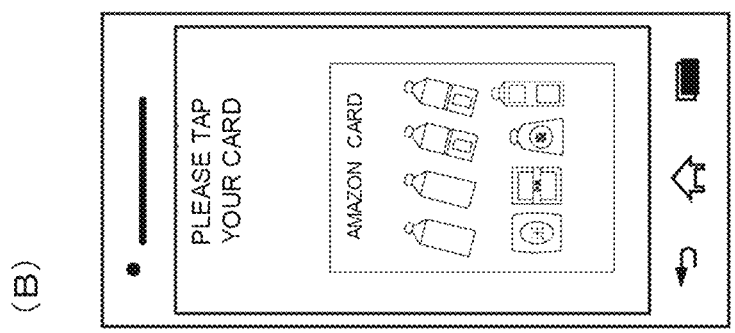
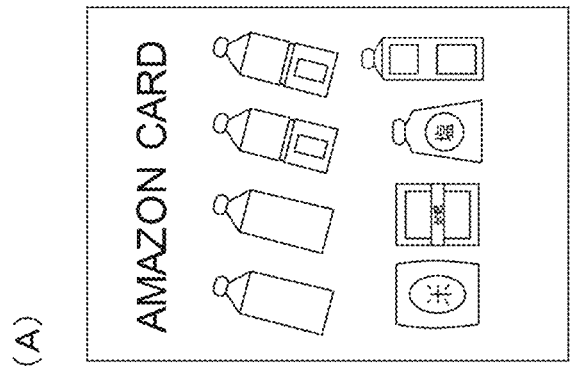

FIG. 69
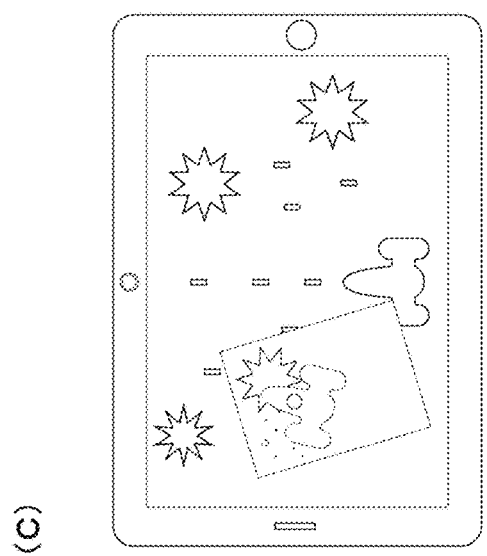
(C)
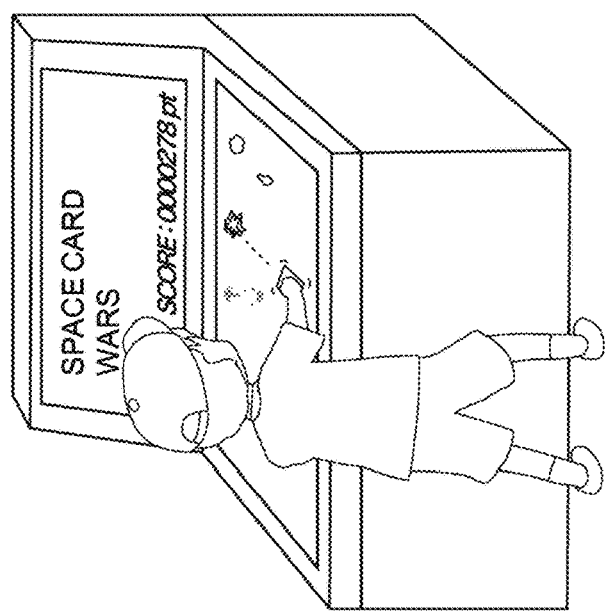
(B)
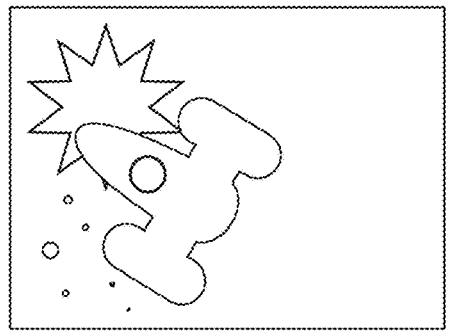
(A)

110B6

THE VERTICAL DIMENSION TO THE CONDUCTIVE TAPS DESCRIBED ABOVE
INCLUDES 3MM OF LATERAL CONDUCTIVITY LEADING TO THE THROUGH HOLES.

FIG. 107
(A)
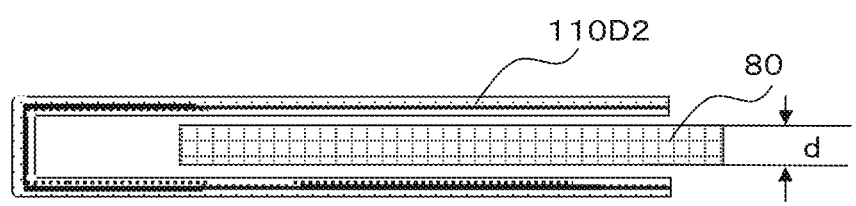
(B)
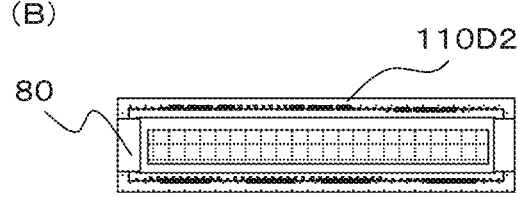
FIG. 108
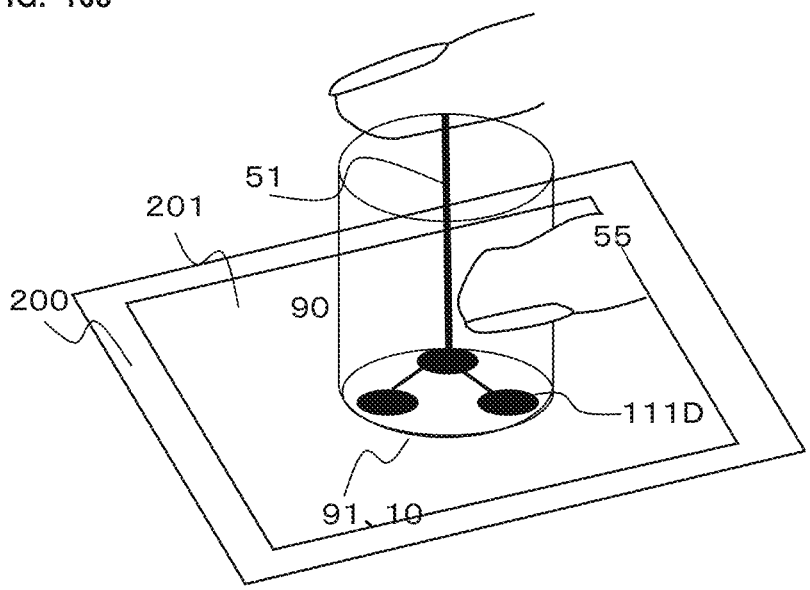

FIG. 112
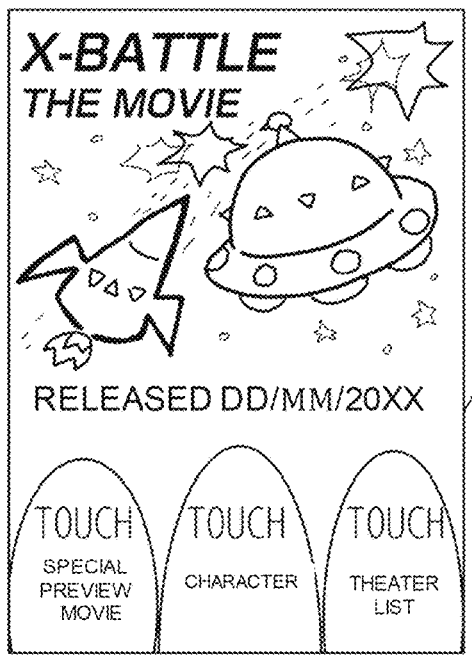
(a)
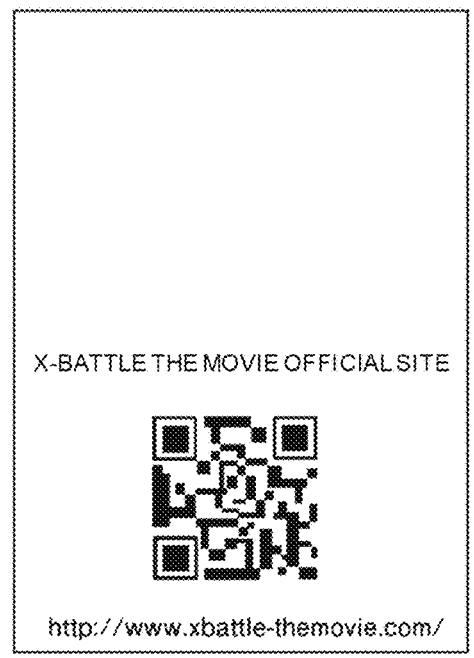
(b)
FIG. 113
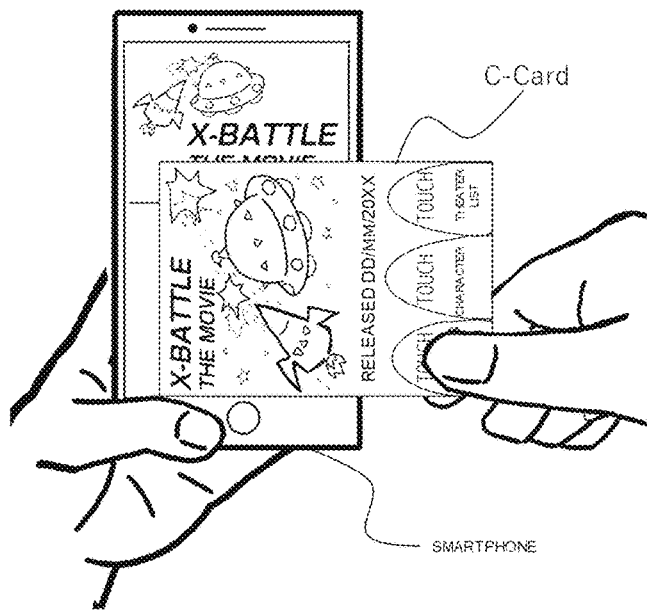
(a)
(b)

FIG. 114
(a) (b)
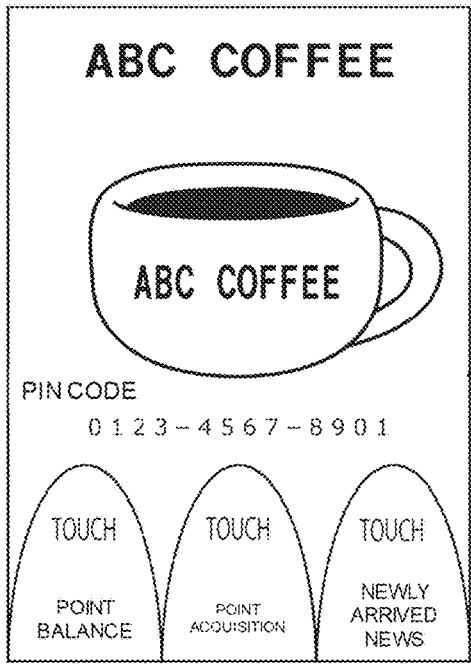
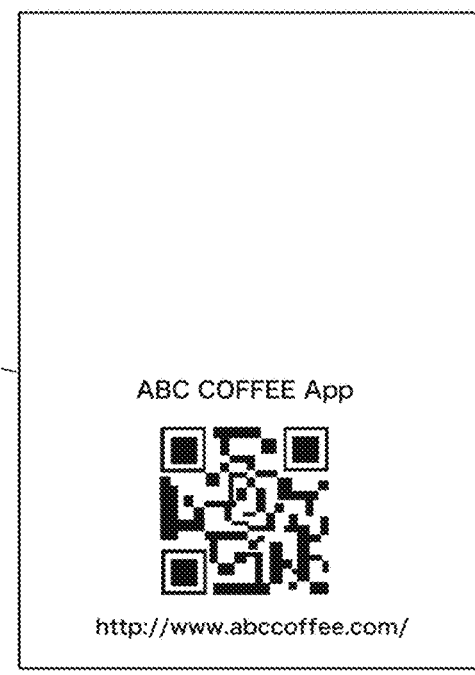
C-Card

FIG. 116
(a)
(b)
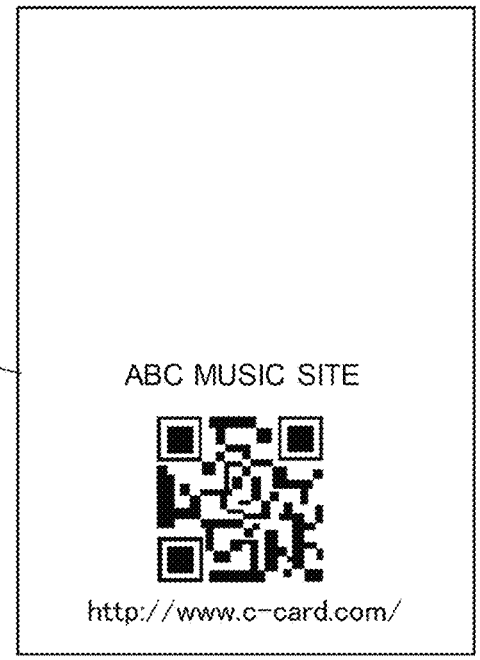
C-Card

FIG. 118
(a)
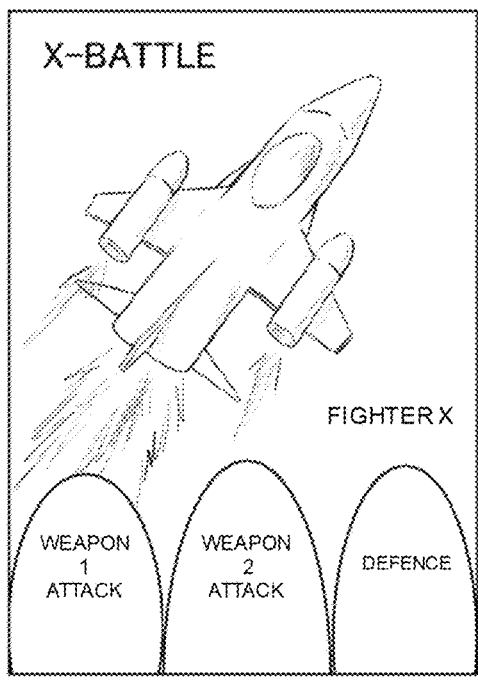
(b)
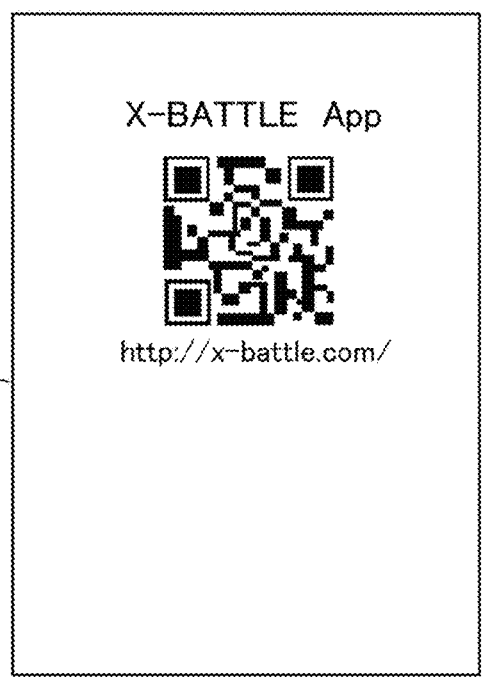
FIG. 119
(a)
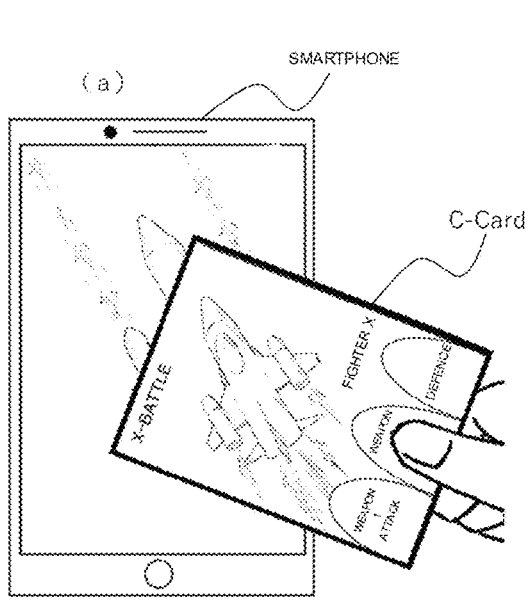
(b)
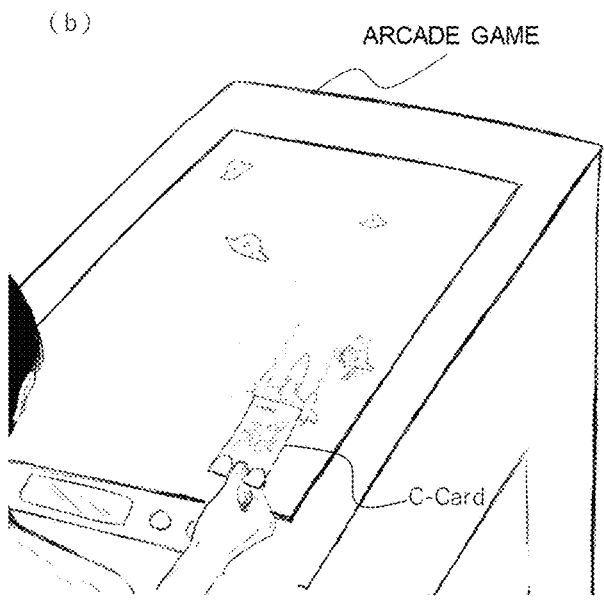

FIG. 123
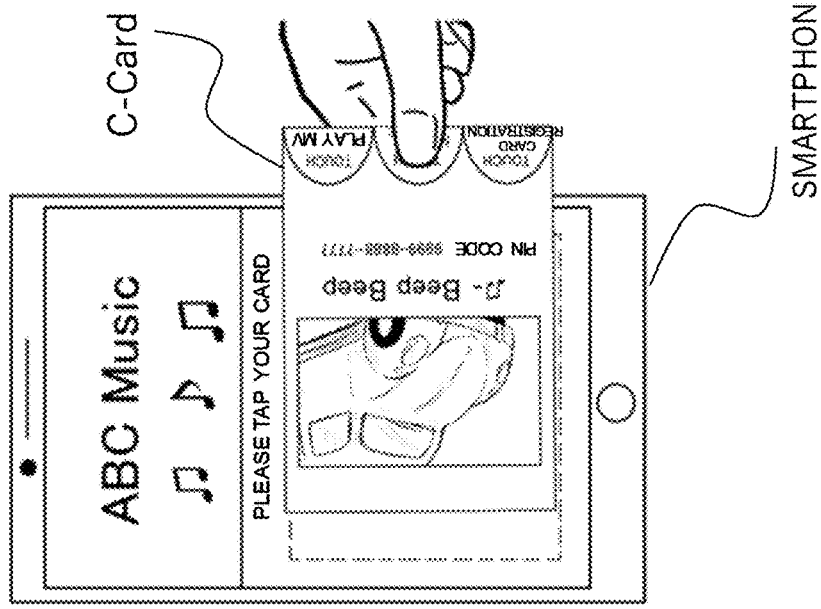
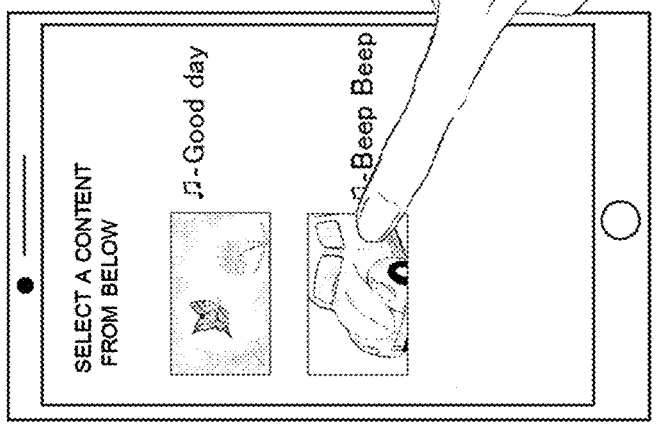
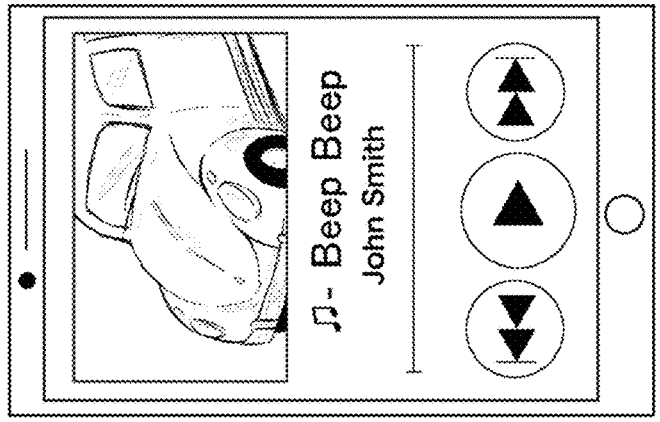

FIG. 124
(a)
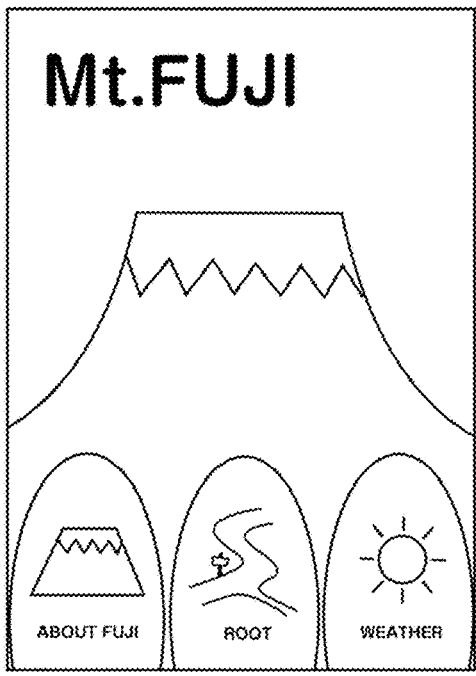
(b)
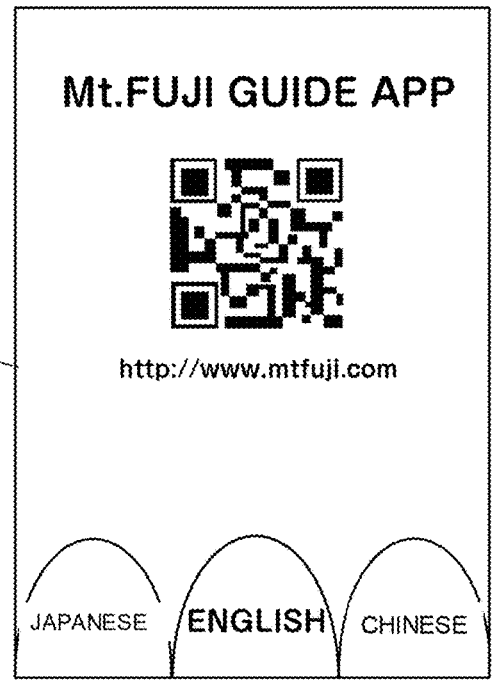

FIG. 128
(a)                                   (b)
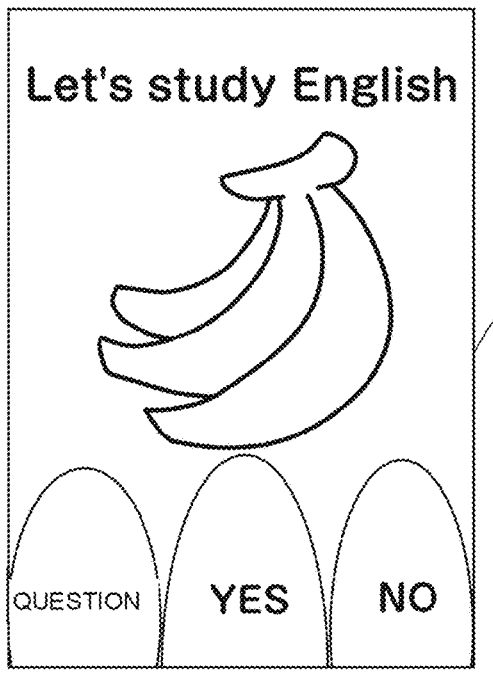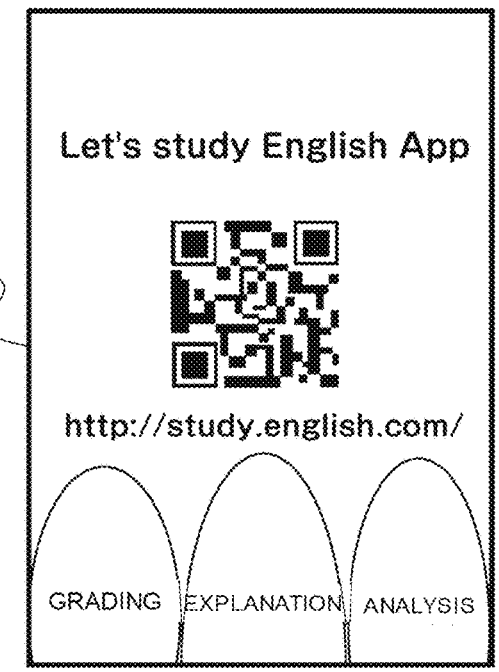
C-Card FIG. 136
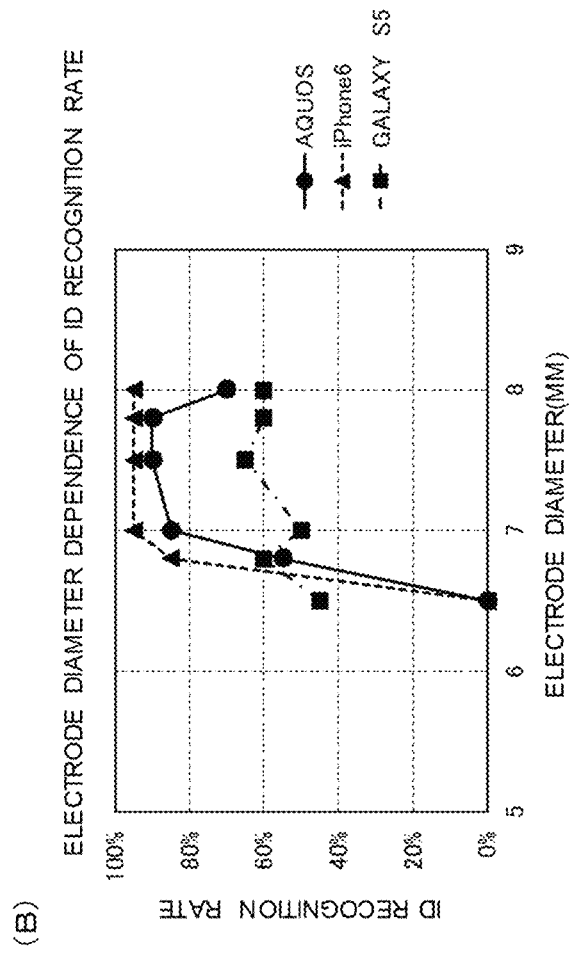
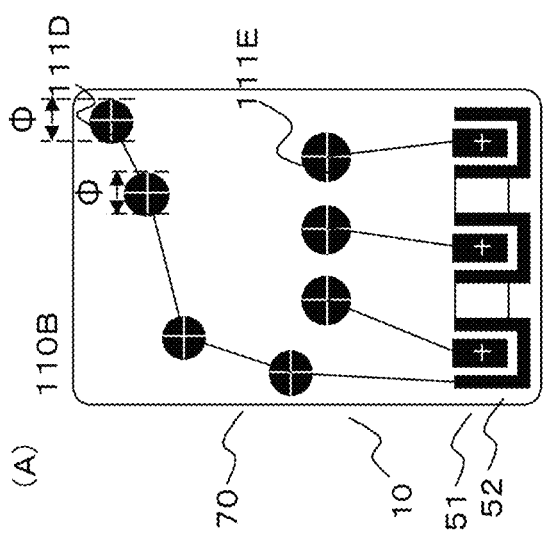

FIG. 140

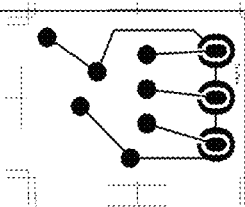

| | | No. | 1 | 2 | | | 3 | 4 | 5 |
|---|---|---|---|---|---|---|---|---|---|
| SPECIFICATION | WIRING SPECIFICATION | | ELECTRODE DISCRETE WIRING | SINGLE BRUSH STROKE | | | PROTRUDING WIRING | LOOP WIRING | 2 SYSTEM WIRING |
| | INK | | CARBON | Ag PASTE | | | CARBON | | |
| | WIRING WIDTH | | 0.8mm | 0.2mm | 0.8mm | 0.6mm | | 0.8mm | |
| | CONDUCTOR PATTERN | | | | | | | | |
| EVALUATION RESULT | ID RECOGNITION RATE | | 17% | 73% | 55% | 75% | 65% | 34% | 68% |
| | MISMATCH RATE | | 31% | 0% | 45% | 25% | 35% | 31% | 23% |
| | ERROR RATE | | 51% | 27% | 0% | 0% | 0% | 34% | 9% |
| | DETECTION ERROR ΔL(ave) | | 0.39 | 0.19 | 0.29 | 0.28 | 0.20 | 0.26 | 0.36 |
| | radius (ave) | | 65.95 | 33.65 | 42.20 | 37.23 | 40.93 | 41.53 | 43.68 |
| | DETECTION COORDINATE GRAPH | | ELECTRODE DISCRETE WIRING | Ag INK SINGLE BRUSHSTROKE | CARBON SINGLE BRUSHSTROKE | WIRING W=0.6MM | PROTRUDING WIRING | LOOP WIRING | 2 SYSTEM WIRING |

FIG. 154

| COMPANY ID | CARD ID | SUB-CODE (1) | | | | SUB-CODE (2) | | | | SUB-CODE (3) | | | | SUB-CODE (4) | | | |
|---|---|---|---|---|---|---|---|---|---|---|---|---|---|---|---|---|---|
| | | TOUCH SCREEN | CONTENT A | CONTENT B | CONTENT C | TOUCH SCREEN | CONTENT A | CONTENT B | CONTENT C | TOUCH SCREEN | CONTENT A | CONTENT B | CONTENT C | TOUCH SCREEN | CONTENT A | CONTENT B | CONTENT C |
| 11 | 150 | IMAGE 1 | A-1 | B-1 | C-1 | IMAGE 2 | A-2 | B-2 | C-2 | IMAGE 3 | A-3 | B-3 | C-3 | IMAGE 4 | A-4 | B-4 | C-4 |

FIG. 155
https://content.iml-lab.net/card/?d=978050599389001
(A) URL AND QR CODE OF SUB-CODE (1)
https://content.iml-lab.net/card/?d=978050563789002
(B) URL AND QR CODE OF SUB-CODE (2)
https://content.iml-lab.net/card/?d=978050543752003
(C) URL AND QR CODE OF SUB-CODE (3)
https://content.iml-lab.net/card/?d=978050529118004
(D) URL AND QR CODE OF SUB-CODE (4)

FIG. 156

| COMPANY ID | GROUP NUMBER | CARD ID | SUB-CODE (1) ||||  SUB-CODE (2) |||| SUB-CODE (3) |||| SUB-CODE (4) ||||
|---|---|---|---|---|---|---|---|---|---|---|---|---|---|---|---|---|---|---|
| | | | TOUCH SCREEN | CONTENT A | CONTENT B | CONTENT C | TOUCH SCREEN | CONTENT A | CONTENT B | CONTENT C | TOUCH SCREEN | CONTENT A | CONTENT B | CONTENT C | TOUCH SCREEN | CONTENT A | CONTENT B | CONTENT C |
| 12 | 1 | 151 | IMAGE 11 | A-111 | B-111 | C-111 | IMAGE 12 | A-112 | B-112 | C-112 | IMAGE 13 | A-113 | B-113 | C-113 | IMAGE 14 | A-114 | B-114 | C-114 |
| | | 152 | | A-121 | B-121 | C-121 | | A-122 | B-122 | C-122 | | A-123 | B-123 | C-123 | | | | |
| | | 153 | | A-131 | B-131 | C-131 | | A-132 | B-132 | C-132 | | A-133 | B-133 | C-133 | | | | |
| | 2 | 152 | IMAGE 21 | A-211 | B-211 | C-211 | IMAGE 22 | A-222 | B-222 | C-222 | IMAGE 23 | A-213 | B-213 | C-213 | | | | |
| | 3 | 151 | IMAGE 31 | A-311 | B-311 | C-311 | | | | | | | | | | | | |
| | | 153 | | A-321 | B-321 | C321 | | | | | | | | | | | | |

SHEET-SHAPED DEVICE

FIELD OF THE INVENTION

The present invention relates to a thin plate-like device used with an electronic apparatus equipped with a touch panel.

BACKGROUND OF THE INVENTION

In recent years, services using a browser or an application that allow the browsing of predetermined contents (Web contents, videos, SNS contents, and the like) and the use of reward points/coupons, by holding a card bearing a conductor pattern that can be detected by a capacitive touch panel between the fingers and holding it over an electronic device (for example, a smartphone, a tablet or the like) equipped with a capacitive touch panel, are rapidly spreading (see Patent Literature 1 and 2).

PRIOR ART DOCUMENTS

Patent Literature

Patent Literature 1: WO2012/070593
Patent Literature 2: Japanese Unexamined Patent Application Publication No. 2015-197767
Patent Literature 3: WO2015/102029

SUMMARY OF THE INVENTION

Problems that the Invention is to Solve

However, with conventional cards, while applications are diverse including promotions and events, generally, what can be viewed with one card is limited to only one content. Therefore, currently it is only possible to browse a specific site or execute a specific application.

The present invention has been made in view of such a situation, and to dramatically improve the functions of the card is regarded as the technical issue.

Solution to Problem (1) Features are that in order to solve the above problems, the thin plate type apparatus according to the present invention is a thin plate type apparatus laminated with one or more non-conductive base materials, and comprises a wiring layer which acts on a panel having a sensor for detecting a physical quantity, wherein the said panel detects the positions from a physical quantity in a predetermined range detected by the said sensor, and the said wiring layer comprises a plurality of first electrodes and a plurality of second electrodes formed on a first surface which is one of the nonconductive base material surfaces, a linear conductive member formed on the said first surface, and a plurality of indicator electrodes formed in one or more operation areas touched by the finger on the said first surface, and the said plurality of first electrodes are connected by the said linear conductive member as a bundle or each separately, and in the said operation area, indicator electrodes connected with the said linear conductive member to at least one second electrode each of which differs among the said plurality of second electrodes are formed, and the second electrode connected to the indicator electrode may have a physical quantity in a range in which the position is not detected by the said panel, and conductor patterns of which each respective position is detectable by the said panel when any one of the plurality of indicator electrodes or the nonconductive base material laminated on the plurality of indicator electrodes receives finger contact operations when the area formed with at least the second electrodes and the said plurality of first electrodes is in a state of making contact with or coming into proximity to the said panel through each respective physical quantity including those of second electrodes connected to indicator electrodes of the positions receiving the said contact operations and the said plurality of first electrodes.

(2) Furthermore, the said finger touching operation may include holding the position between the fingers and bringing the said apparatus into contact with or into proximity to the panel.

(3) Furthermore, conductor patterns of which their positions are capable of being detected, respectively, by the said panel, in a state of making contact with or coming into proximity to the said panel, is formed on either of the two faces of the thin plate.

(4) Furthermore, only one layer of the said wiring layer is provided in the said apparatus, and conductor patterns of which each respective position is detectable by the said panel in a state of making contact with or coming into proximity to the said panel, is formed on either of the two faces of the thin plate.

(5) Furthermore, at least one of the said one or more non-conductive base materials is a characteristic base material having the physical property of suppressing the occurrence of a change in a physical quantity of which the position where the said contact operation is received is detectable by the said panel, when the said apparatus receives a finger contact operation in a state of making contact with or coming into proximity to a panel at least at one part other than the said at least one operation area, and the said wiring layer is provided on the first surface side of the said apparatus and the second surface side which is the opposite side of the first surface side of the said apparatus with the said characteristic base material in between.

(6) Furthermore, at least one of the said one or more non-conductive base materials is a characteristic base material having the physical property of suppressing the occurrence of a change in a physical quantity of which the position where the said contact operation is received is detectable by the said panel, when the said apparatus receives a finger contact operation in a state of making contact with or coming into proximity to a panel, at least at one portion other than the said at least one operation region, and the said wiring layer may be provided on one side of the said characteristic base material.

(7) Features are that the thin plate shaped apparatus according to the present invention is a thin plate like apparatus laminated with one or more nonconductive base materials, comprises a wiring layer acting on a panel having a sensor for detecting a physical quantity, the said panel detects the positions from physical quantities in a predetermined range detected by the said sensor, the said wiring layer comprises a plurality of first electrodes arranged on the first surface which is one of the surfaces of the said nonconductive base materials, a linear conductive member formed on the said first surface, and one or more operation area touched by fingers, the said plurality of first electrodes are connected by the said linear conductive member as a bundle or each separately, and a conductor pattern may be formed of which each respective position is detectable by the said panel when one or more of the positions of the said one or more operation areas receives a finger contact operation in a state of making contact with or coming into proximity to the said panel through each respective physical quantity including those of the said positions receiving the said contact and the said plurality of first electrodes.

(8) Furthermore, in the operation area, a recess for reducing the thickness of the one or more nonconductive base materials is provided, and a conductor pattern may be formed of which each respective position is detectable by the said panel when the said recess receives the said finger contact operation through each respective physical quantity including those of the positions receiving the said contact operation and first electrodes connected to the said first indicator electrodes.

(9) Furthermore, in the said operation area, a hole which reaches from the said first surface to the opening on one of the surfaces of the thin plate shaped apparatus and enables the said finger contact operation on the said first surface, and the bottom portion of the said first surface side with the said hole or the opening of the said first surface side with the said hole further comprises a plurality of indicator electrodes connected to the said first electrodes by the said linear conductive member, and a conductor pattern may be formed of which each respective position is detectable by the said panel when the said finger contact operation is received through each respective physical quantity including those of the positions receiving the said contact operation and first electrodes connected to the said first indicator electrodes.

(10) Furthermore, the said plurality of indicator electrodes may comprise first indicator electrodes and second indicator electrodes to which predetermined distances are secured, and the said first indicator electrodes are connected to first electrodes and the said second indicator electrodes are connected to second indicator electrodes by a conductive member, the bottom portion of the said first surface side with the said hole or the opening on the said first surface side with the said hole further comprises the said second indicator electrodes and the said linear conductive member connected to the second indicator electrodes, and in an area differing from the said opening, second electrodes connected with the said linear conductive member, and a conductor pattern may be formed of which each respective position is detectable by the said panel when the said finger contact operation is received, through each respective physical quantity including those of the positions receiving the said contact operation, second electrodes connected to the said second indicator electrodes, and first electrodes connected to the said first indicator electrodes.

(11) Features are that the thin plate shaped apparatus according to the present invention is a thin plate like apparatus laminated with one or more nonconductive base materials and comprises a wiring structure acting on a panel having a sensor for detecting a physical quantity, the said panel detects the positions from physical quantities in a predetermined range detected by the said sensor, the said wiring structure comprises a plurality of first electrodes arranged on the first surface which is one of the surfaces of the said nonconductive base materials, a linear conductive member formed on a second surface differing from the said first surface, and conductive material which passes through the penetrated portion of the nonconductive base material between the said first surface and the said second surface and conducts to the said plurality of first electrodes and the said linear conductive member, the said plurality of first electrodes are connected by the said conductive material as a bundle or each separately, and a conductor pattern may be formed of which each respective position is detectable by the said panel through each respective physical quantity including those of the said plurality of first electrodes, in a state of making contact with or coming into proximity to the said panel in a state where making contact with or coming into proximity to the said panel.

(12) Furthermore, one or more operation areas to be touched with fingers on the second surface or on the nonconductive base material laminated on the second surface may be further comprised, and a conductor pattern may be formed of which each respective position is detectable by the said panel, when a contact operation by one or more fingers is received by one or more of positions of the said one or more operation areas, through each respective physical quantity including those of positions receiving the said contact and the said plurality of first electrodes, in a state where making contact with or coming into proximity to the said panel.

(13) Furthermore, further comprised is one or more operation areas touched by fingers on the said second surface, a plurality of indicator electrodes formed in the said one or more operation areas, and second electrodes that conduct with each said indicator electrode by the said conductive material on the said first surface, and conductor patterns of which each respective position is detectable by the said panel when any one of the plurality of indicator electrodes or the nonconductive base material laminated on the plurality of indicator electrodes receives finger contact operations when the area formed with at least the second electrodes and the said plurality of first electrodes is in a state of making contact with or coming into proximity to the said panel through each respective physical quantity including those of second electrodes connected to indicator electrodes of the positions receiving the said contact operations and the said plurality of first electrodes.

(14) Furthermore, the wiring on the first and second surfaces of the said wiring structure may be formed by electrolytic plating, and the penetration portion may be formed by non-electrolytic plating.

(15) Features are that a thin plate shaped apparatus according to the present invention is a thin plate like apparatus laminated with one or more nonconductive base materials, and comprises a wiring layer acting on a panel having a sensor for detecting a physical quantity, the said panel detects the positions from physical quantities in a predetermined range detected by the said sensor, the said wiring layer comprises a plurality of first electrodes arranged on the first surface which is any one of the surfaces of the said nonconductive base material and a linear conductive member formed on the said first surface or another first surface, the said plurality of first electrodes are bundled or are separated into a plurality and as the said bundle or each of the first electrodes separated into a plurality are connected by a single line segment to any one of the other first electrodes with the said linear conductive member, and a conductor pattern may be formed of which each respective position is detectable by the said panel when the area formed with at least the said first electrodes is in a state of making contact with or coming into proximity to the said panel through each respective physical quantity including those of the said plurality of first electrodes.

(16) Features are that a thin plate shaped apparatus according to the present invention is a thin plate like apparatus laminated with one or more nonconductive base materials, and comprises a wiring layer acting on a panel having a sensor for detecting a physical quantity, the said panel detects the positions from physical quantities in a predetermined range detected by the said sensor, the said wiring layer comprises a plurality of first electrodes arranged on the first surface which is any one of the surfaces of the said nonconductive base material and a linear conductive member formed on the said first surface or another first surface, the said plurality of first electrodes are connected by the said linear conductive member as a bundle or each separately, at least a part of the said plurality of first electrodes are formed with conductive lines wired to form a linear pattern, and a conductor pattern may be formed of which each respective position is detectable by the said panel when the area formed with at least the said first electrodes is in a state of making contact with or coming into proximity to the said panel through each respective physical quantity including those of the said plurality of first electrodes.

(17) Features are that a thin plate shaped apparatus according to the present invention is a thin plate like apparatus laminated with one or more nonconductive base materials, and comprises a wiring layer acting on a panel having a sensor for detecting a physical quantity, the said panel detects the positions from physical quantities in a predetermined range detected by the said sensor, the said wiring layer comprises a plurality of first electrodes arranged on the first surface which is any one of the surfaces of the said nonconductive base material and a linear conductive member formed on the said first surface or another first surface, the said plurality of first electrodes are connected by the said linear conductive member as a bundle or each separately, the said linear conductive member formed on the said first surface or another first surface is a solid matter of ink having a volume resistivity of $1 \times 10^{-5}$ Ω·cm or less, and a conductor pattern may be formed of which each respective position is detectable by the said panel when the area formed with at least the said first electrodes is in a state of making contact with or coming into proximity to the said panel through each respective physical quantity including those of the said plurality of first electrodes.

(18) Features are that a thin plate shaped apparatus according to the present invention is a thin plate like apparatus laminated with one or more nonconductive base materials, and comprises a wiring layer acting on a panel having a sensor for detecting a physical quantity, the said panel detects the positions from physical quantities in a predetermined range detected by the said sensor, the said wiring layer comprises a plurality of first electrodes arranged on the first surface which is any one of the surfaces of the said nonconductive base material and a linear conductive member formed on the said first surface or another first surface, the said plurality of first electrodes are connected by the said linear conductive member as a bundle or each separately, or each independently, the said plurality of first electrodes are connected by the said linear conductive member having a predetermined length, each has a physical quantity in a range in which the position is detected by the said panel, and a conductor pattern may be formed of which each respective position is detectable by the said panel when the area formed with at least the said first electrodes is in a state of making contact with or coming into proximity to the said panel through each respective physical quantity including those of the said plurality of first electrodes.

(19) Furthermore, in the said case where each is independently connected, the said predetermined length may be 30 cm or more.

(20) Furthermore, in the said case where each is independently connected, the predetermined length may be 70 cm or more.

(21) Features are that the thin plate shaped apparatus according to the present invention is a thin plate like apparatus laminated with one or more nonconductive base materials, a wiring layer acting on a panel having a sensor for detecting a physical quantity is comprised, the said panel detects the positions from the physical quantities in a predetermined range detected by the said sensor, the said wiring layer is formed on the said first surface or another first surface with a plurality of first electrodes arranged on the first surface which is any one of the surfaces of the said nonconductive base material, a linear conductive member which possesses a physical quantity in a range of which the positions are not detected by the said panel is comprised, the said plurality of first electrodes are connected by the said linear conductive member as a bundle or each separately, and a conductor pattern may be formed of which each respective position is detectable by the said panel when the area formed with at least the said first electrodes is in a state of making contact with or coming into proximity to the said panel through each respective physical quantity including those of the said plurality of first electrodes.

(22) Furthermore, also comprised may be a linear conductive member connecting each of the said plurality of first electrodes with one of the other first electrodes with a line segment.

(23) Furthermore, the line segment may be a straight line.

(24) Furthermore, the said linear conductive member may be formed with a path having the shortest total extension of the said line segments.

(25) Furthermore, one or more indicator electrodes connected to the said plurality of first electrodes with a linear conductive member on the said first surface may be comprised, and a conductor pattern may be formed of which each respective position is detectable by the said panel when the said one or more indicator electrodes or the nonconductive base material laminated on the one or more indicator electrodes receives a finger contact operation, through the first electrode connected to the indicator electrode at the position where the said contact operation is received when in a state in which the said apparatus is making contact with or coming into proximity to the said panel.

(26) Furthermore, the said one or more indicator electrodes may be a plurality of indicator electrodes connected to each other by one indicator electrode or the said linear conductive member, and the said plurality of first electrodes closest to the said one or more indicator electrodes may be connected.

(27) Furthermore, the said one or more indicator electrodes and the said plurality of first electrodes may be connected by a plurality of paths by the said linear conductive member.

(28) Furthermore, the said plurality of first electrodes may be connected by a one-stroke path with the said linear conductive member, and the said one or more indicator electrodes may be connected to the first electrodes at both edges connected by the said one-stroke path with the said linear conductive member.

(29) Furthermore, the said plurality of first electrodes may be connected by a loop-like path with the said linear conductive member, and the said one or more indicator electrodes may be connected with at least one of the said first electrodes with the said linear conductive member.

(30) Furthermore, all of the said plurality of first electrodes may be arranged inside a rectangle whose diagonal line is a line connecting the two most separated first electrodes among the said plurality of first electrodes.

(31) Furthermore, at least a part of the said plurality of first electrodes may be formed by having conductive wiring wired to form a linear pattern, and a conductor pattern may be formed of which each respective position is detectable by the said panel when in a state in which the area formed with at least the said plurality of first electrodes is making contact with or coming into proximity to the said panel.

(32) Furthermore, the said linear conductive member may have a physical quantity in a range in which the position is not detected by the said panel.

(33) Furthermore, the said linear conductive member formed on the said first surface or another first surface is a fixed substance of ink having a volume resistivity of $1\times10^{-5}$ Ω·cm or less, and a conductor pattern may be formed of which each respective position is detectable by the said panel in a state where the area formed with at least the said plurality of first electrodes is making contact with or is in close proximity to the said panel.

(34) Furthermore, the said ink may be any one of silver salt ink, silver nano ink, silver paste ink, or carbon ink.

(35) Furthermore, the said wiring layer may be formed by gravure printing or ink jet printing when using silver salt ink, flexographic printing or ink jet printing when using silver nano ink, screen printing or ink jet printing when using silver paste ink.

(36) Furthermore, the level difference of the said linear conductive member from the base material may be 20 μm or less.

(37) Furthermore, the line width of the said linear conductive member may be 0.3 mm or less when using silver salt ink, silver nano ink or silver paste ink.

(38) Furthermore, the line width of the linear conductive member may be 0.15 mm or less when using silver salt ink, silver nano ink or silver paste ink.

(39) Furthermore, the said plurality of first electrodes are connected by the said linear conductive members having a predetermined length, and each has a physical quantity in a range in which the position is detected by the said panel, and a conductor pattern may be formed of which each respective position is detectable by the said panel in a state where the area formed of at least the said plurality of first electrodes is making contact with or is in close proximity to the said panel

(40) Furthermore, in a state where the said apparatus is making contact with or is in close proximity to the said panel, the said panel may not necessarily detect the positions from the physical quantities generated when a finger touches the surface opposite to the surface on the side of the panel receiving the said contact or being approached.

(41) Furthermore, on the said first surface, a raising layer made of a non-conductive material that reduces the level difference caused by the wiring layer may be formed.

(42) Furthermore, the said plurality of indicator electrodes may comprise first indicator electrodes and second indicator electrodes to which predetermined distances are secured, and the said first indicator electrodes are connected to first electrodes and the said second indicator electrodes are connected to second indicator electrodes by a conductive member, and a conductor pattern may be formed of which each respective position is detectable by the said panel, when a finger contact operation is received respectively by the first indicator electrodes and second indicator electrodes, where the predetermined distance is ensured, directly or by the nonconductive base material laminated on the indicator electrode, through each respective physical quantity including those of first electrodes connected to the said first indicator electrodes and second electrodes connected to the said second indicator electrodes, in a state where the area with at least the said first electrode and the said second electrode formed makes contact with or comes into proximity to the said panel.

(43) Furthermore, a predetermined distance is secured between edges of other second indicator electrodes which are adjacent to the said second indicator electrode, and a conductor pattern may be formed of which each respective position is detectable by the said panel, when a finger contact operation is received by the said second indicator electrode directly or by the nonconductive base material laminated on the plurality of indicator electrodes, through each respective physical quantity including those of second electrodes connected to one of the second indicator electrodes and first electrodes connected to first indicator electrodes, in a state where the area with at least the said second electrode and the said first electrode formed makes contact with or comes into proximity to the said panel.

(44) Furthermore, the said first indicator electrode may be formed so as to surround a predetermined range around the said second indicator electrode.

(45) Furthermore, a gap between the said first indicator electrode formed so as to surround the said predetermined range and the said second indicator electrode may be 1.2 mm or more.

(46) Furthermore, a gap between the said first indicator electrode formed so as to surround the said predetermined range and the said second indicator electrode may be 1.5 mm or more.

(47) Furthermore, the said first indicator electrode and/or the said second indicator electrode may be formed as a part of the said linear conductive member.

(48) Furthermore, the said indicator electrode and part of the linear conductive member connected to the indicator electrode are formed on the second surface which is a layer closer to the contact face of the said apparatus or the layer opposite to face of the panel side which comes into closer proximity than the said first surface, and a conductor pattern may be formed of which each respective position is detectable by the said panel when the nonconductive base material of the said opposite face receives a finger contact operation, through the second electrode and a plurality of first electrodes connected to the indicator electrode located in a layer under the position receiving the said contacting operation mediated by a nonconductive base material interposed between the opposite surface and the second surface.

(49) Furthermore, the said indicator electrode and part of the linear conductive member connected to the indicator electrode are formed on the second surface which is a layer closer to the contact face of the said apparatus or the layer opposite to face of the panel side which comes into closer proximity than the said first surface, and the second electrode on the said first surface and the indicator electrode on the second surface may be connected by a linear conductive member forming a bent path on the side of the said apparatus.

(50) Furthermore, at least a part of the said indicator electrode may be coated with white ink using conductive titanium oxide as a pigment, and a graphic may be printed on the coated surface.

(51) Furthermore, at least a part of the said apparatus may comprise a transparent region laminated with the one or more transparent non-conductive base materials.

(52) Furthermore, the said transparent area may be comprised with one or more operation areas touched with the finger, and a conductor pattern may be formed of which each respective position is detectable by the said panel, when a finger contact operation is received at least at one or more positions of the said one or more operation areas, in a state of making contact with or coming into proximity to the said panel, through each respective physical quantity of the positions receiving the said contact operation and the said plurality of first electrodes.

(53) Furthermore, at least one linear conductive member may be formed by extending from a first electrode and/or a second electrode connected by the said linear conductive member in a predetermined direction.

(54) Furthermore, the said physical quantity may be at least electrostatic capacitance.

(55) Furthermore, the range of the physical quantity of the second electrodes for keeping their positions from being detected by the said panel may be 5 pF or less.

Advantageous Effect of the Invention

According to the present invention, the function of a card can be greatly improved.

BRIEF DESCRIPTION OF THE DRAWINGS

FIG. 5 is a structural example of an apparatus.
FIG. 6 is a structural example of an apparatus.
FIG. 11 is a structural example of an apparatus.
FIG. 12 is a structural example of an apparatus.
FIG. 20 is a structural example of an apparatus.
FIG. 21 is a structural example of an apparatus.
FIG. 32 is a structural example of an apparatus.
FIG. 33 is a structural example of an apparatus.
FIG. 34 is a structural example of an apparatus.
FIG. 35 is a structural example of an apparatus.
FIG. 36 is a structural example of an apparatus.
FIG. 37 is a structural example of an apparatus.
FIG. 44 is an embodiment (1) using a C-Card as a quality assurance card.
FIG. 45 is an embodiment (2) using a C-Card as a quality assurance card.
FIG. 46 is an embodiment in which a C-Card is attached to a product package.
FIG. 55 is an embodiment using a C-Card as a game card.
FIG. 56 is a diagram describing a state in which a game is played using a game card.
FIG. 57 is an embodiment using a C-Card as an authentication card.
FIG. 68 is a diagram describing online shopping using a C-Card.
FIG. 69 is a diagram describing an arcade game/online game using a C-Card.

FIG. 107 is a structural example of a thin plate-like apparatus.
FIG. 108 is an embodiment of a compact conductor pattern.
FIG. 112 is a diagram showing a case where a C-Card is used for the promotion of a movie, and is a diagram showing the card for the promotion of the movie.
FIG. 113 is a diagram showing a case where a C-Card is used for the promotion of a movie and a diagram describing the usage state of the card.
FIG. 114 is a diagram showing a case where a C-Card is used for promotion by a coffee shop, and is a diagram showing the card for promotion by a coffee shop.
FIG. 116 is a diagram showing a case where a C-Card is used for viewing song/video contents, and is a diagram showing the C-Card for songs/video contents.
FIG. 118 is a diagram specifically showing a game card using a C-Card, and is a diagram showing the game card.
FIG. 119 is a diagram specifically showing a game card using a C-Card, and is a diagram describing the usage state of the card.
FIG. 123 is a diagram describing a case where different contents are provided with the same card ID, and is a diagram describing a case where the cards of FIGS. 120(a) and 120(b) are two cards having the same card ID and after registration are reused.
FIG. 124 is a diagram showing a specific example of a sightseeing information card using a C-Card, and is a diagram showing the sightseeing information card.
FIG. 128 is a diagram showing a specific example of a problem card using a C-Card, and is a diagram showing a problem card.

FIG. 136 is a diagram showing the result of the evaluation of the electrode diameter Φ and the electrode edge to edge distance against the ID code recognition rate of the code generation apparatus.

FIG. 140 is a diagram showing a result of an evaluation of the ID recognition rate and the detection error according to individual wiring specifications of conductor patterns of a code generation apparatus.

FIG. 154 is a diagram describing the setting of a subcode by a content generator.

FIG. 155 is a diagram describing QR codes in which a URL; at least a company ID, and a subcode are registered.

FIG. 156 is a diagram describing the setting of a group number by a content generator.

DETAILED DESCRIPTION OF PREFERRED EMBODIMENTS

Hereinafter, embodiments of the present invention will be described with reference to the figures.

First Embodiment

Hereinafter, the card-type apparatus 110 according to the first embodiment will be described.

Figure 1:
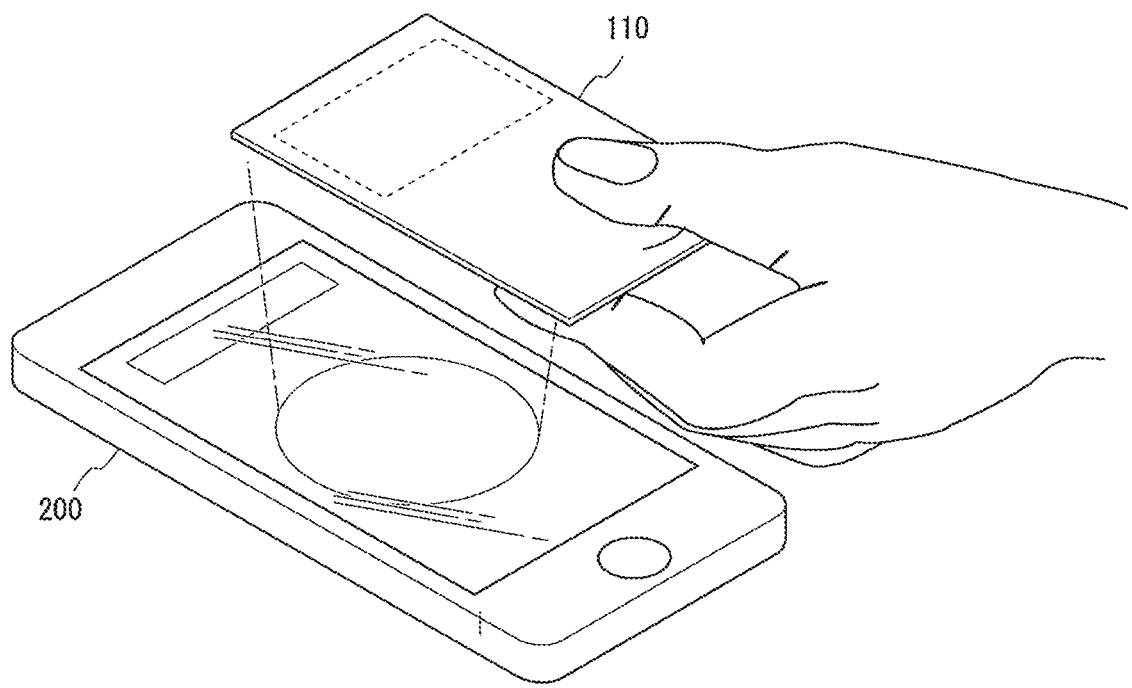
FIG. 1 is a diagram showing an example of use of a card type apparatus.

FIG. 1 shows an example of the use of card type apparatus 110. The card-type apparatus 110 has a configuration in which conductive electrodes are embedded in a plate-shaped member made of plastic or paper.

As shown in FIG. 1, the card-type apparatus 110 is used by having it make contact with a touch panel of an information device 200 such as a mobile phone, a smartphone, a portable information terminal, a tablet terminal, a personal computer, and an in-vehicle device.

Figure 2:
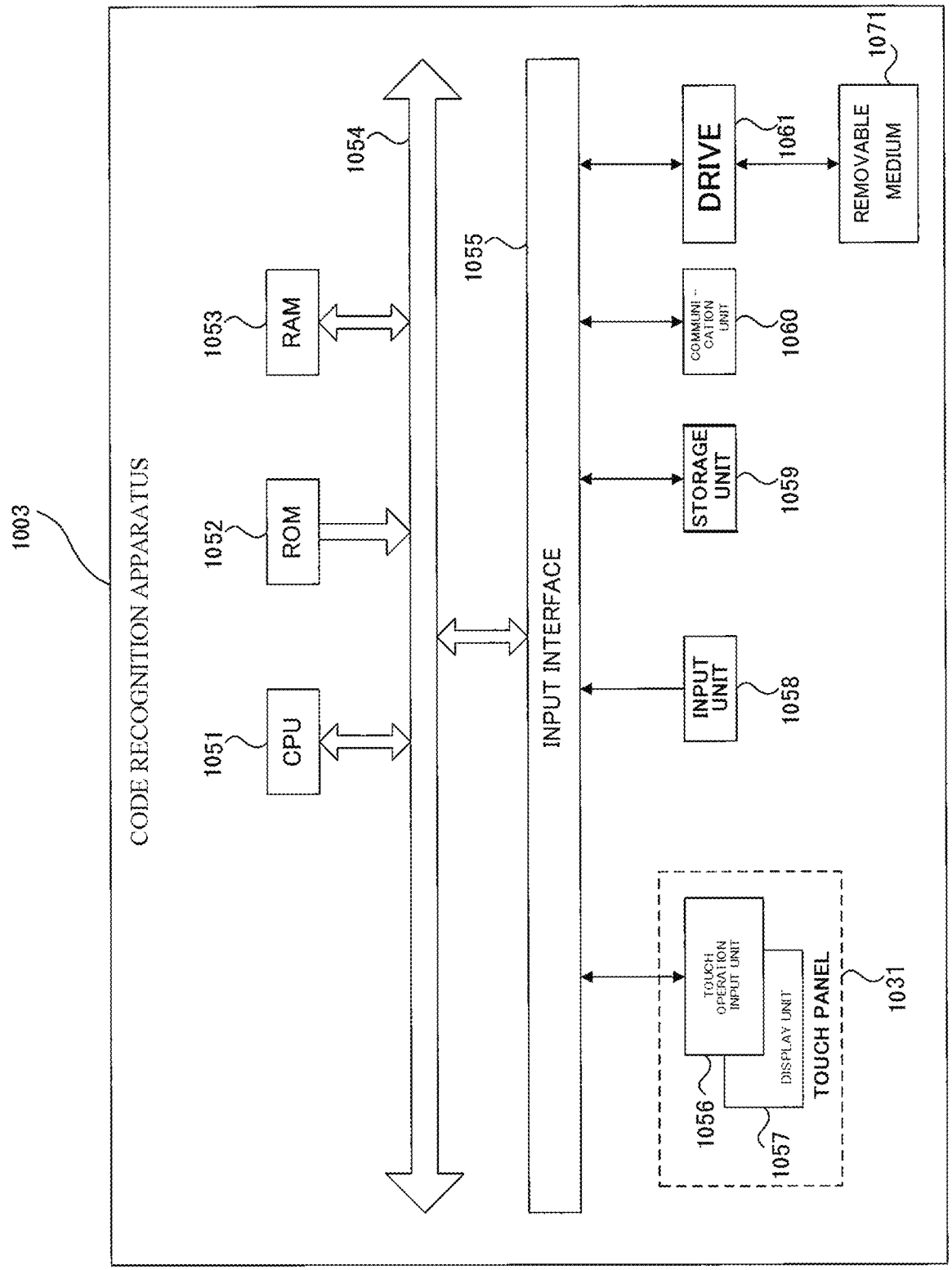
FIG. 2 is a block diagram showing an example of a hardware configuration of an information apparatus.

FIG. 2 is a block diagram showing a hardware configuration example of the information device 200.

The information device 200 comprises a CPU 1051, a ROM (Read Only Memory) 1052, a RAM (Random Access Memory) 1053, a bus 1054, an input/output interface 1055, a touch operation input unit 1056, a display unit 1057, an input unit 1058, a storage unit 1059, a communication unit 1060, and a drive 1061.

The CPU 1051 executes various processes according to a program recorded in the ROM 1052 or a program loaded from the storage unit 1059 into the RAM 1053.

In the RAM 1053, data and the like necessary for the CPU 1051 to execute various processes are also stored as appropriate.

The CPU 1051, the ROM 1052, and the RAM 1053 are mutually connected via a bus 1054. An input/output interface 1055 is also connected to the bus 1054. To the input/output interface 1055, a touch operation input unit 1056, a display unit 1057, an input unit 1058, a storage unit 1059, a communication unit 1060, and a drive 1061 are connected.

The touch operation input unit 1056 is constituted by, for example, an electrostatic capacitance type position input sensor laminated on the display surface of the display unit 1057, and detects the coordinates of the position where the touch operation is performed.

Here, the touch operation refers to an operation of bringing an object into contact with or bringing it into proximity to the touch operation input unit 1056. An object making contact with or in proximity to the touch operation input unit 1056 is generally a user's finger, a touch pen, or the like. Note that hereinafter, the position at which the touch operation is performed is referred to as a "touch position," and the coordinate of the touch position is referred to as a "touch coordinate."

The display unit 1057 is constituted by a liquid crystal display and the like and displays various images.

Thus, in the present embodiment, the above described touch panel 1031 is constituted by the touch operation input unit 1056 and the display unit 1057.

Thus, the input unit 1058 is constituted by various hardware buttons and the like, and various kinds of information are input according to instruction operations by a player.

The storage unit 1059 is constituted by a DRAM (Dynamic Random Access Memory) and the like, and stores various data.

The communication unit 1060 controls communication with other devices via network N including the Internet.

The drive 1061 is provided as necessary. Drive 1061 is mounted as necessary with removable media 1071 which comprises a magnetic disk, an optical disk, a magneto-optical disk, a semiconductor memory, and the like. The program read from the removable medium 71 by the drive 1061 is installed in the storage unit 59 as necessary. In addition, the removable medium 1071 can also store various data stored in the storage unit 1059 in the same manner as the storage unit 1059.

Second Embodiment

[Regarding the Threshold of the Electrodes of the Touch Panel]
(1) Threshold Change of a Smartphone and the Like after 10 Seconds With many models of the iPhone (registered trademark), there are first and second threshold values for the detected capacity (in addition, there may be a setting for error processing for each electrode) as conditions for issuing events according to the touch situation. At the moment when an electrode such as an electrode 111 of the apparatus 110 touches the touch panel, the first lower threshold is used, and the ON threshold value is set so that the touch panel detects the electrode (ON) even if it has a relatively low capacity. After the touch panel detects the electrode, to prevent immediate change to non-detection (OFF) by a small change in detection capacity, caused by hysteresis, the OFF threshold value is set so that OFF is attained at a capacitance lower than when ON is detected. However, when at least one electrode of the electrodes detected by the touch panel maintains a state (stationary state) in which it does not move on the touch panel for 10 seconds, a second threshold value is set for all of the electrodes. At that moment, if the capacity detected by the electrode is lower than the OFF capacity of the second threshold value, the touch panel immediately determines the electrode to be non-detected. However, note that when all of the electrodes are moving, the touch panel assumes that a finger is moving, and the first threshold value continues to be applied. In other words, in a case where at least one is in a stationary state and it does not even have the capacity of a finger, it is considered that an electrode other than a finger is touching and an event of electrode OFF is issued from the device driver to the OS and the application. Note that if an electrode exceeding the OFF capacity of the second threshold value is included but the electrode is in a stationary state, it will also be regarded as non-detected. Thereafter, if a slight movement of the electrode is detected, it is detected again, but it is an unstable behavior (error setting is presumed). Furthermore, in a case where an electrode in the stationary state is non-detected, if an electrode exceeding the OFF capacity of the second threshold is moving, the electrode is not non-detected, but the behavior of the touch panel becomes unstable (error is presumed). Note that when the capacity of all of the electrodes exceeds the OFF capacity threshold of the second threshold value, irrespective of whether they are in the stationary state and/or the moving state they do not become non-detected. In the various cases mentioned above, even if there is an electrode which is non-detected or under unstable operation, if the touch panel thereafter detects a new electrode, only this electrode is detected normally and for 10 seconds the above processings are executed in accordance with the capacity, stationary states and movements of the electrode. That is, the first and second threshold values and error settings are implemented for each electrode.

On the other hand, irrespective of the first and second threshold values, the existence of an electrode is always detected even when it is non-detected as long as it has a certain capacity, and when the electrode moves, the touch panel detects the electrode by following its movement. However, events (including error settings) indicating ON/OFF of the electrode is issued with accordance to the set threshold conditions, and various developed applications recognize the electrode detection state (including error settings). On the other hand, when an electrode with a relatively small capacity is being detected, in a state where the electrodes are horizontally or vertically aligned, the detected capacity decreases further due to characteristics of the touch panel, and in some cases, one or all of the arranged electrodes become OFF. Here, as long as other electrodes are not non-detected, electrodes that are non-detected in the horizontal or vertical state are detected by the touch panel when they are moved so as not to be aligned horizontally or vertically. In order to avoid this, it is desirable to increase the capacity of the electrode so that sufficient capacity is detected. Note that even with a person's finger, when it is a finger of a child or the contact surface is small, since capacity is insufficient, it is no longer detected if the second threshold is applied. Thereafter, when the contact area is widened, the capacity is increased, and the electrode is moved, it is detected again, but the behavior of the touch panel becomes unstable (error setting is presumed). Note that it is needless to say that the capacity to detect is more easily detected if the area of the electrodes is large, the degree of adhesion with the screen is high, and the capacity of the electrodes including the linear conductive member is large. Also, many current smartphones detect up to five electrodes, and if the number exceeds five, an error event is issued, and error settings are applied to all electrodes. Furthermore, although an error event is not issued for long and slender finger-like conductors, an error event is issued for bulky fist-like conductors. That is, error processing occurs when the smartphone determines that the touch is not by a human finger. Note that even if the threshold value is not exceeded, if capacitance is detected over a wide range, there are cases where electrodes that had been detected are no longer detected, even if the situation does not lead to the issuing of an error event.

(2) Threshold Change of a Tablet after 10 Seconds

As for the iPhone (registered trademark), as conditions for issuing events of the touch situation, there are first and second threshold values (a case where a third threshold including error processing is also assumed) for the iPad (registered trademark) and it is considered that basic processing in accordance with the first and second threshold values is the same as that of the smartphone. However, with large iPads (registered trademark), compared with a smartphone, the capacity of an electrode is detected larger and response is better. With electrodes of the ID area of the present embodiment, in principle, the detection result of a touch panel does not become OFF even with the second threshold. Therefore, as with a card game, you can continuously play while moving the card on the surface of a touch panel. With a tablet dedicated card, in the touch area of the present embodiment, as in the mechanisms of FIGS. 14 to 19, it is possible to detect a touch by merely providing a dielectric column directly underneath the touch without providing a through hole (conduction hole) or an electrode in the touch area the omission of which would make manufacturing of the touch panel inexpensive. Note that when the detection capacity (including the connected wiring) of the electrode in the ID area is small and it is used on a wooden desk (the detection capacity is smaller than that of a steel desk), in some cases, it becomes non-detected in 10 seconds. It is needless to say that the capacity to detect is more easily detected if the area of the electrode is large, the capacity of the electrode including the linear conductive member is large, and the degree of adhesion is high. In other words, it is possible to detect an electrode normally in any situation as long as all of the electrodes have sufficient capacity to be detected with the second threshold, not only in the stationary state and/or in the moving state of 10 seconds or more. In addition, most current smartphones detect up to 11 electrodes, but if the number exceeds 11, an error event is issued, and all of the electrodes are set to error.

[Operating Environment for the Touch Panel]

Detection capacities of smartphones, tablets, and business touch panels differ depending on the models and operating environments, therefore it is desirable to have a mechanism that functions with any type of model and under any kind of operating environment, however, as the number of through holes, contacts, and electrodes increases, the cost rises. Therefore, dedicated card specifications specific to the characteristics of each touch panel can also be considered.

(Regarding the Touch Area when Using a Smartphone)

Figure 4:
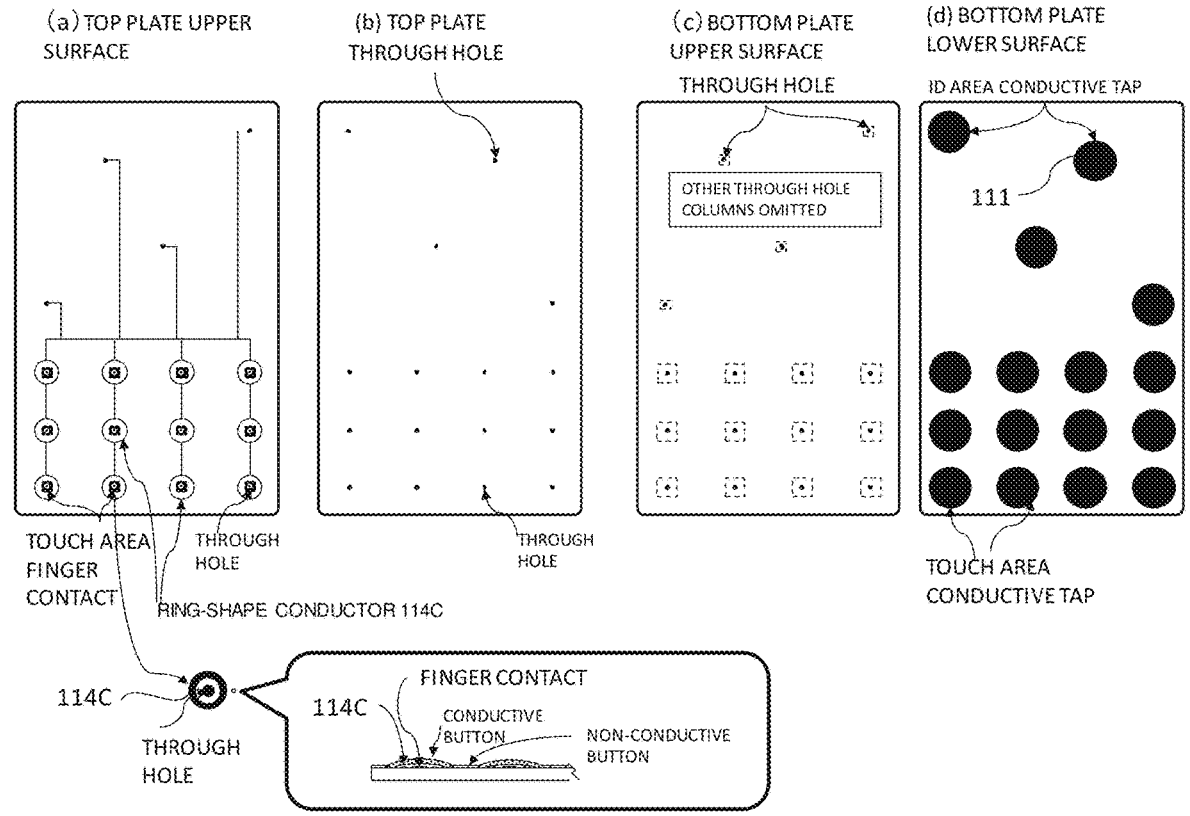
FIG. 4 is a structural example of an apparatus.

For the operating environment, a case where a smartphone is held in the hand and a case where it is used by placing it on a desk are assumed. For the desk, there are wooden desks and steel desks, and having it work properly on the wooden desk on which electrode capacity is hard to detect is to be a requirement.
1) The smartphone is held in the hand and used.
2) The smartphone is placed on a wooden desk and used.
As shown in FIG. 4, for both cases 1) and 2), detection is favorable when finger contacts, through holes (conduction holes), and electrodes are provided, and response is good particularly in the case of 1).

Figure 15:
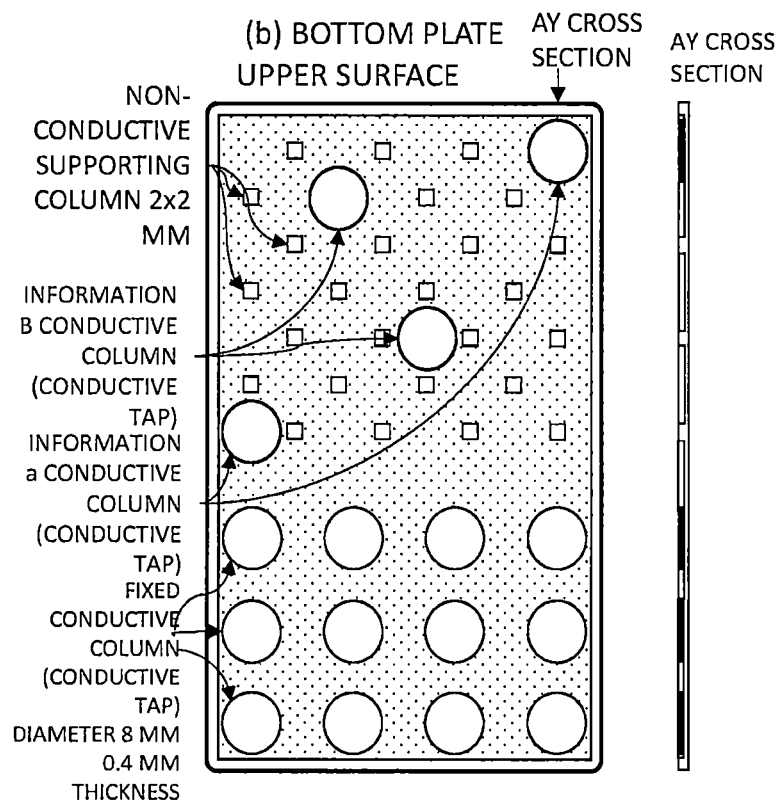
FIG. 15 is a structural example of an apparatus.
Figure 22:
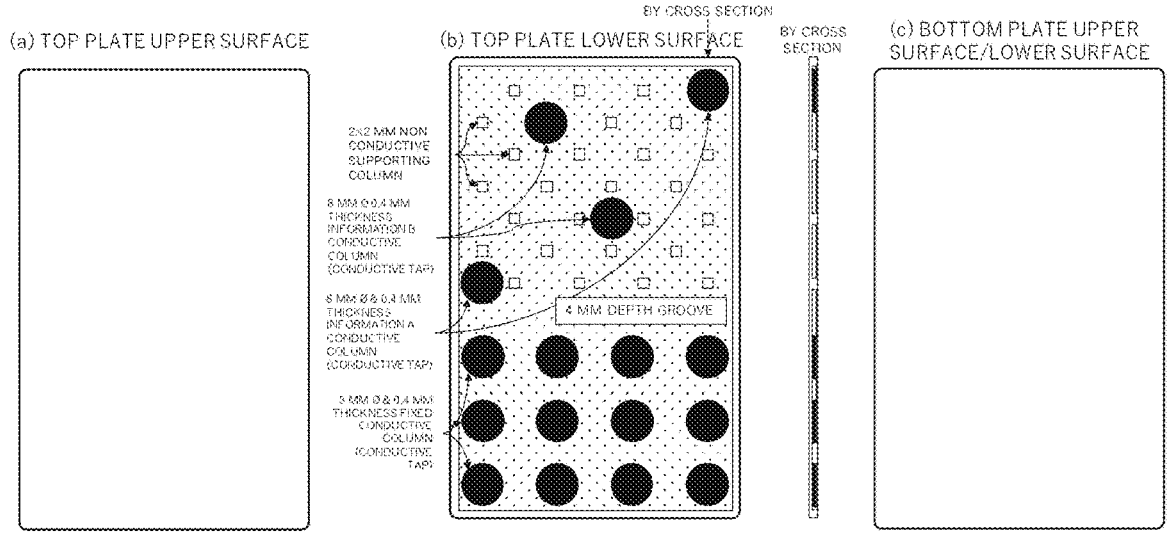
FIG. 22 is a structural example of an apparatus.
Figure 23:
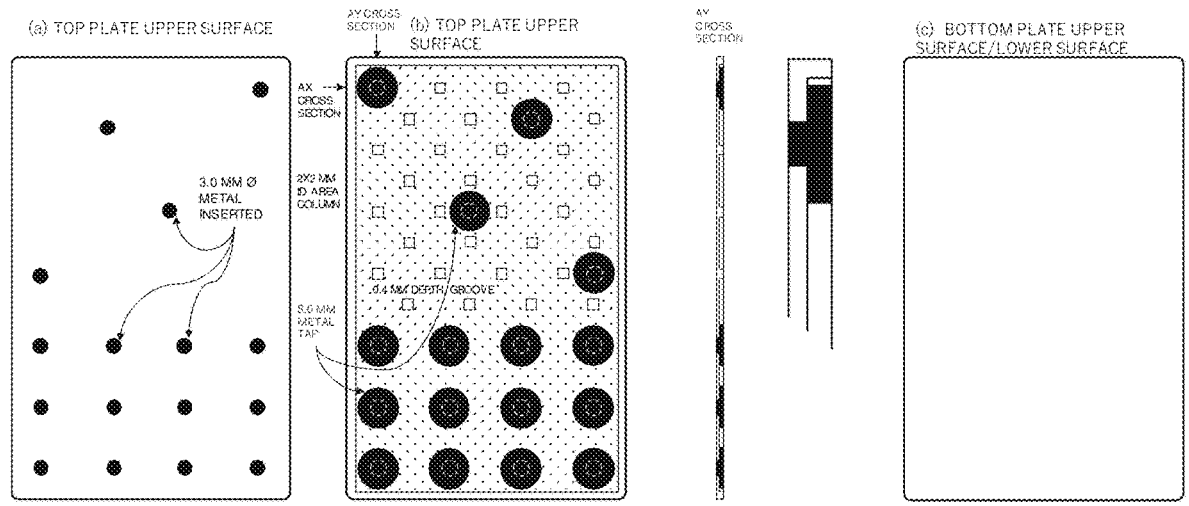
FIG. 23 is a structural example of an apparatus.
Figure 24:
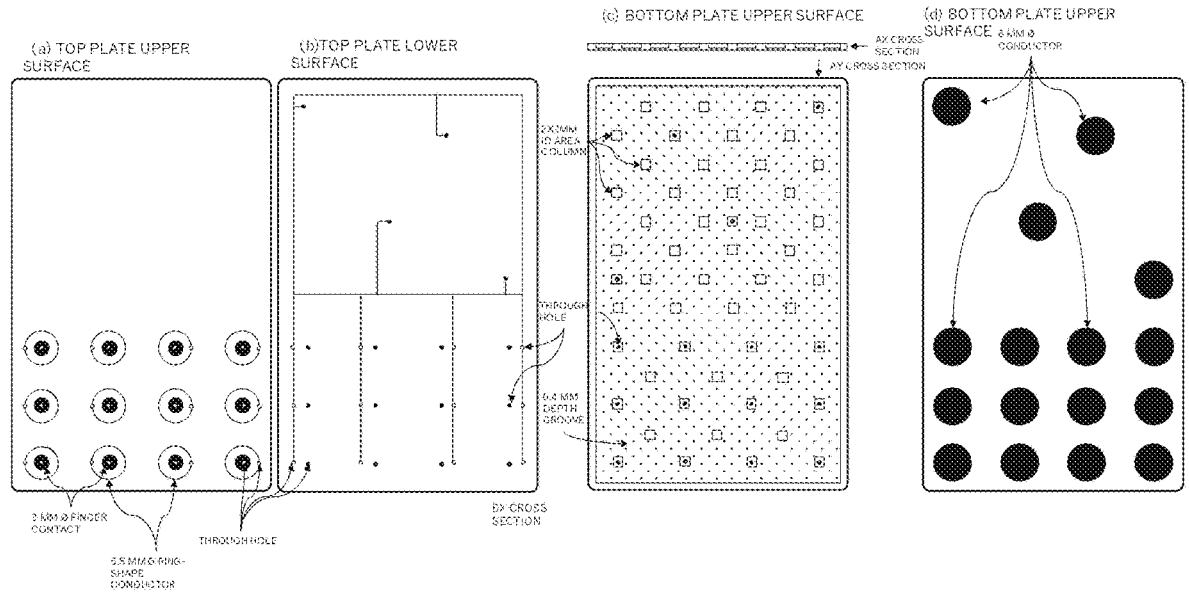
FIG. 24 is a structural example of an apparatus.
Figure 25:
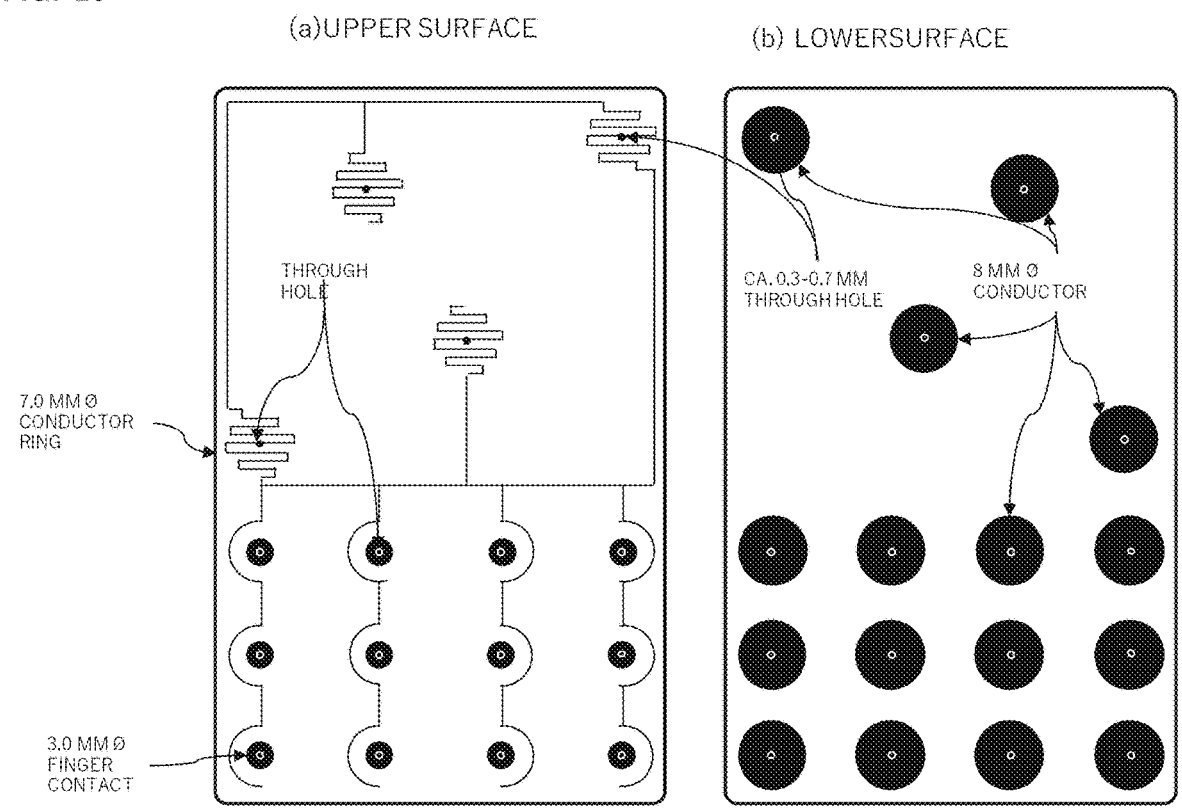
FIG. 25 is a structural example of an apparatus.
Figure 26:
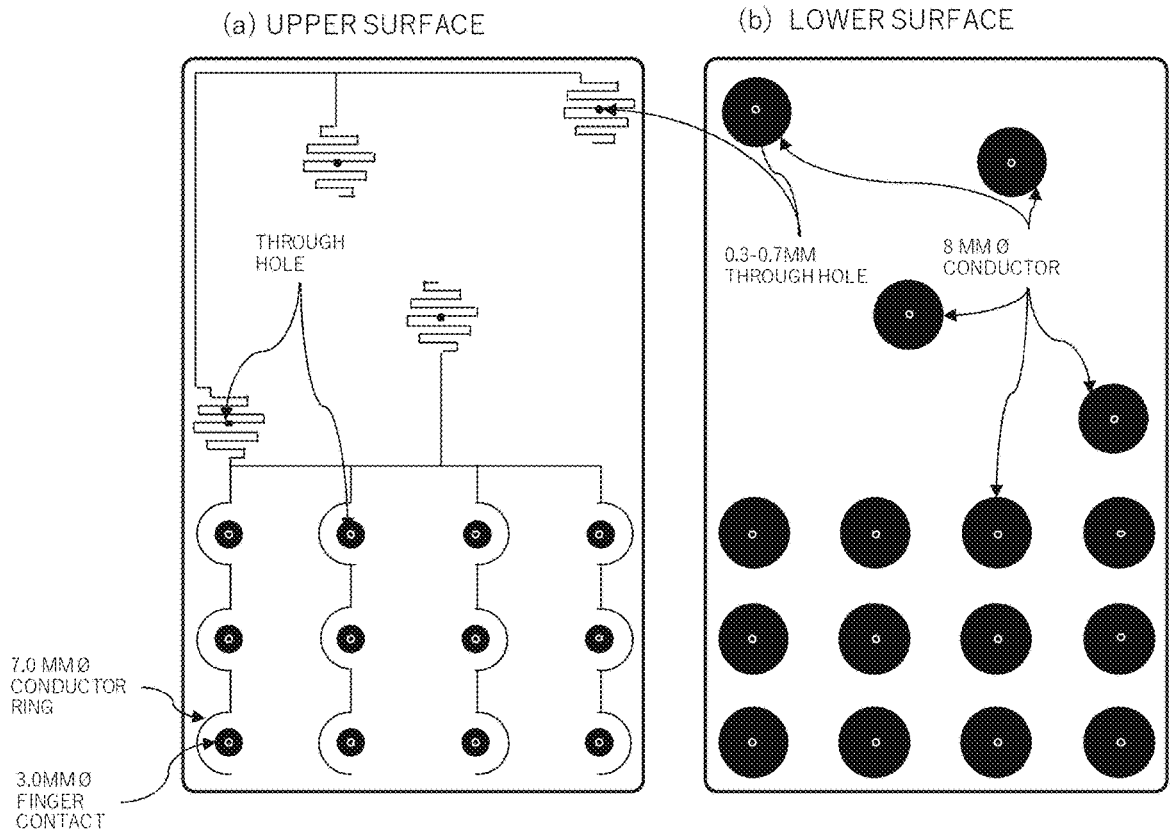
FIG. 26 is a structural example of an apparatus.
Figure 27:
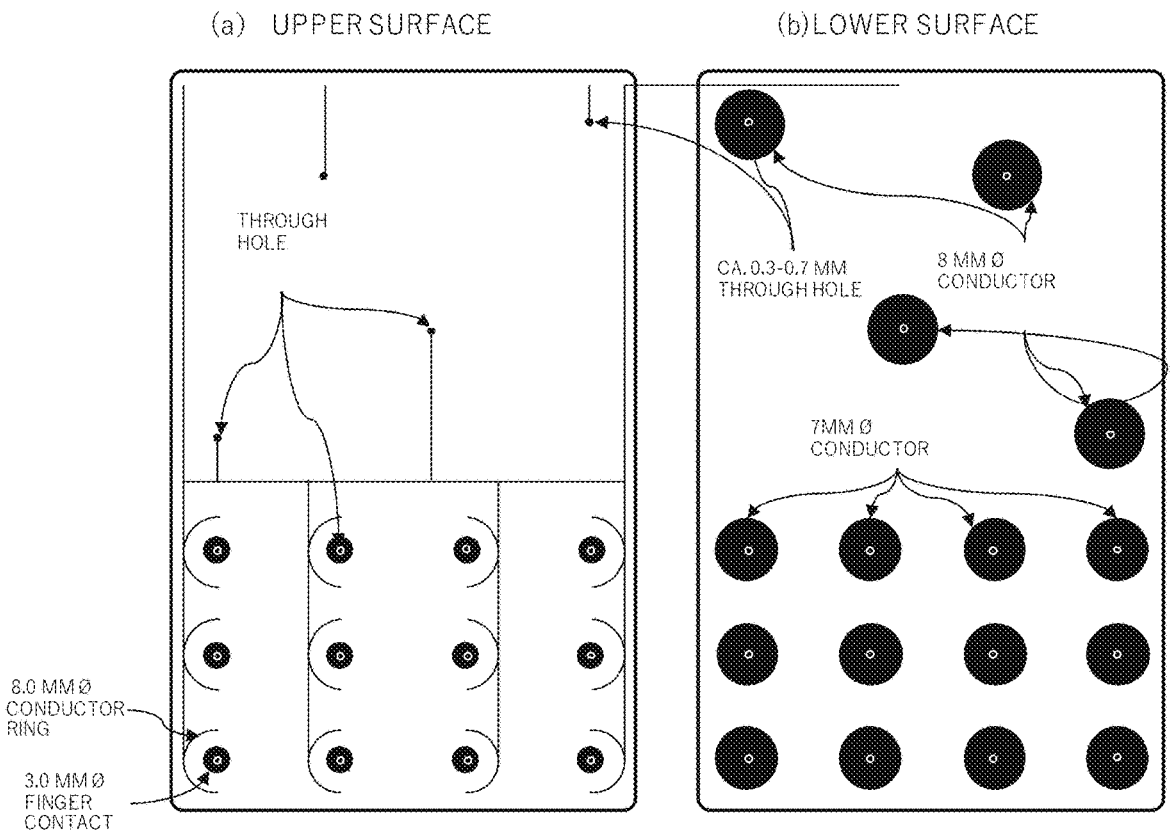
FIG. 27 is a structural example of an apparatus.
Figure 28:
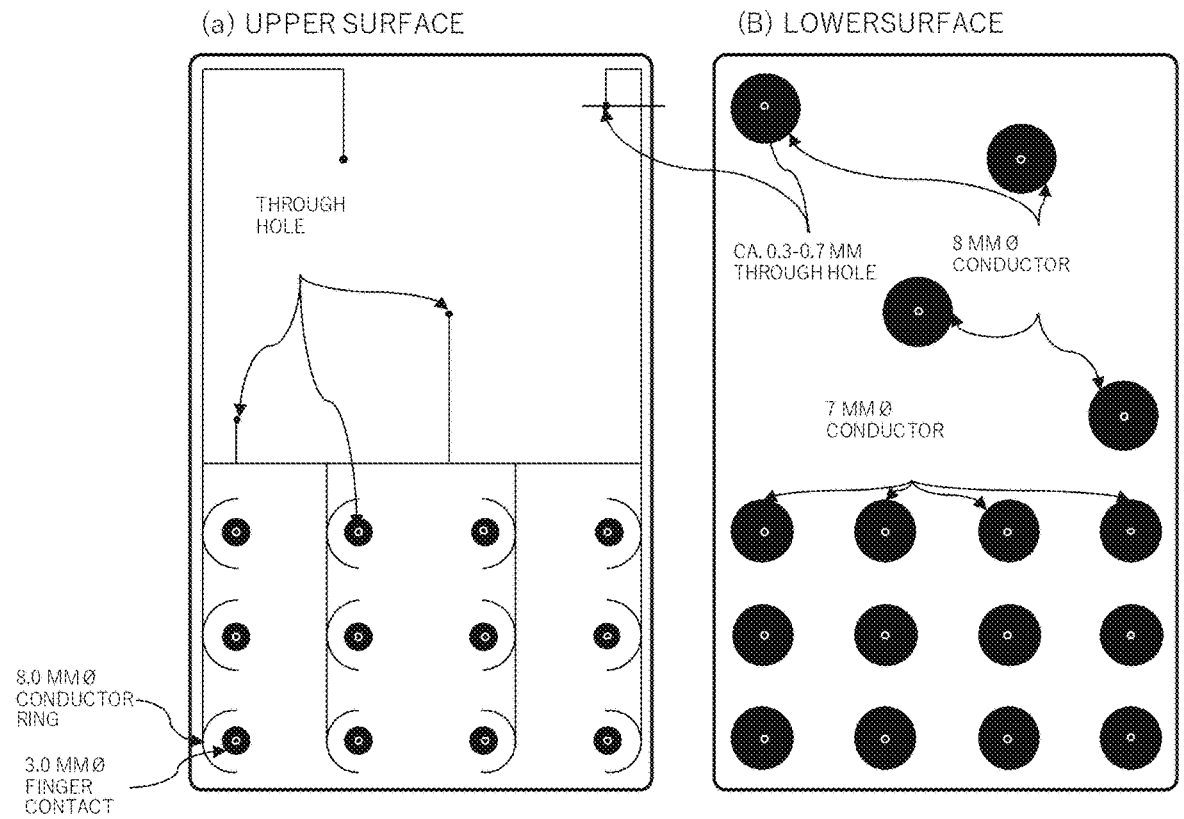
FIG. 28 is a structural example of an apparatus.
Figure 29:
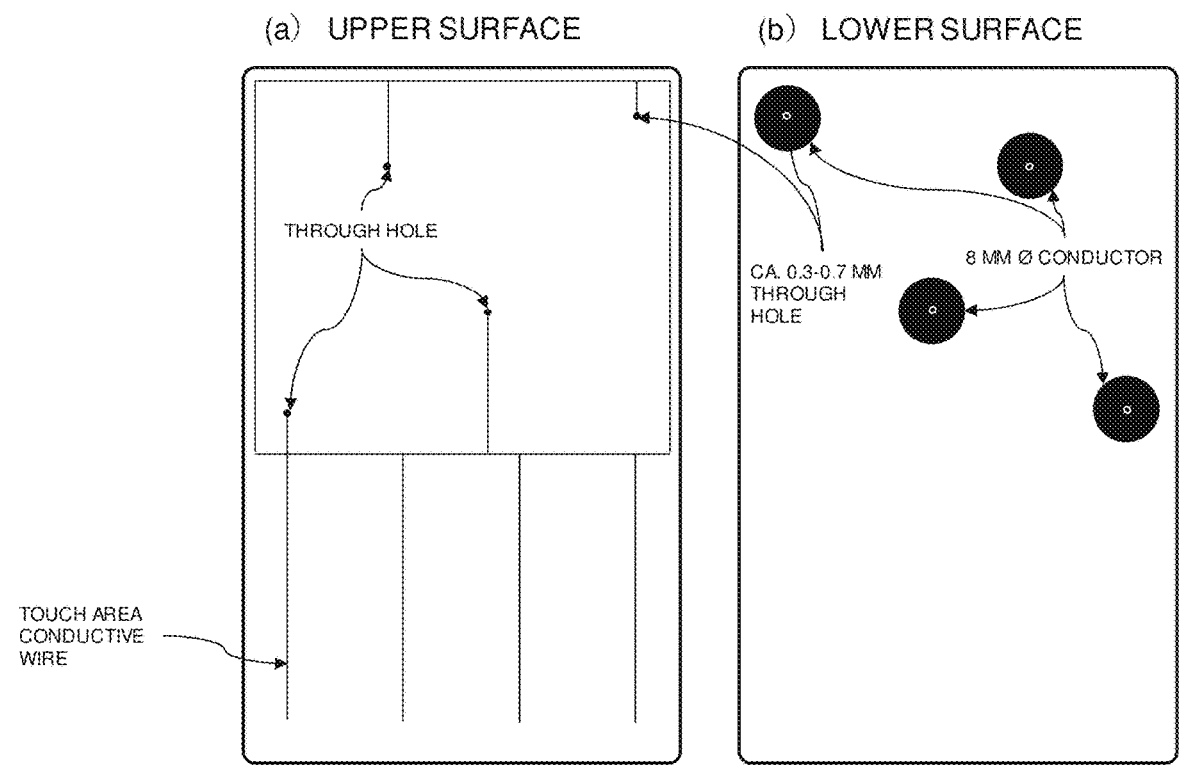
FIG. 29 is a structural example of an apparatus.
Figure 30:
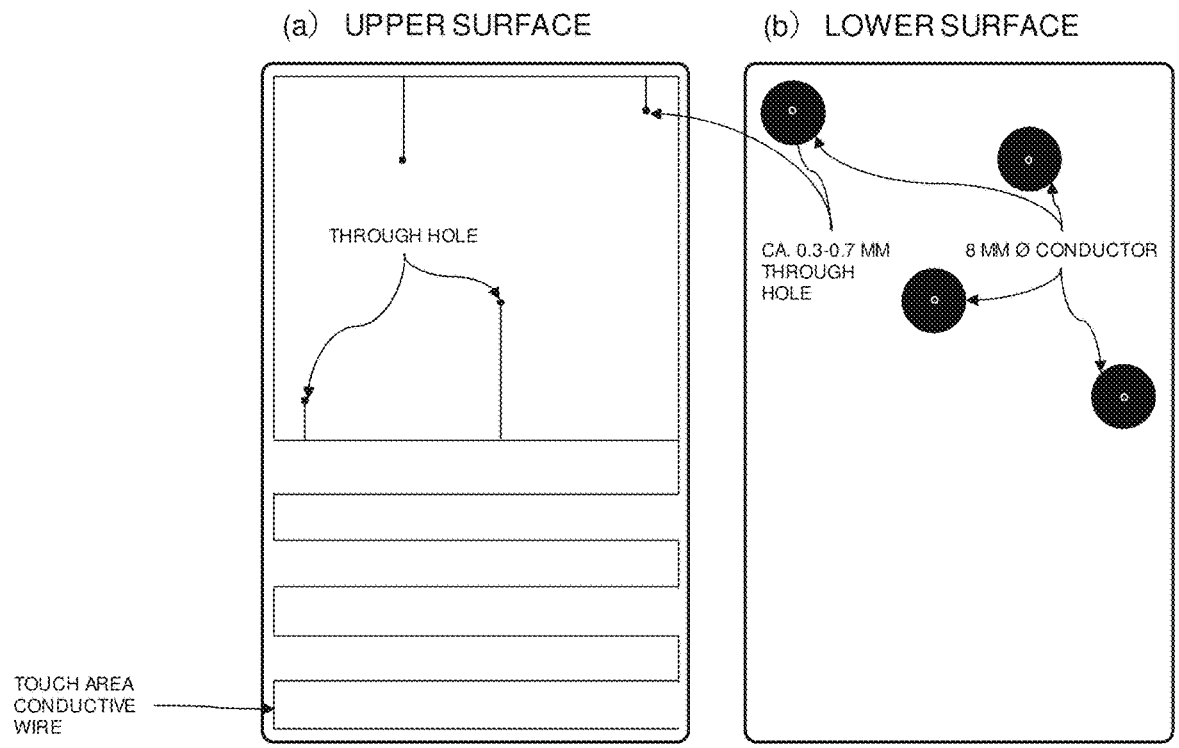
FIG. 30 is a structural example of an apparatus.

However, as shown in FIG. 15, in a case where there are only dielectric pillars, although there is some response under conditions 1), since it is difficult to detect the capacitance of a touch, it is desirable to provide finger contacts, through holes (conduction holes), and electrodes. Note that if the thickness of the card is made sufficiently thin to be about 0.8 mm or less and a material with high dielectric property is used, it is easier to detect the capacitance of a touch with only the dielectric pillar. Meanwhile, as shown in FIG. 22 to FIG. 24, a mechanism using a dielectric column as a conductive column (the top plate excluding the touch area and the lower surface of the bottom plate are to be nonconductors) is also desirable. In that case, the through hole inside the column is unnecessary, and the conductive column may be fitted to the bottom plate or may be provided on the bottom plate by multiple molding. Also, the conductive column may be a metal rod or a metal wire. Note that 1) detects more capacity and response is better than 2) since a circuit is formed between the human body that touches and the touch panel via the smartphone body.

(Regarding the ID Area when a Smartphone is Used)

Basically, in order to detect four electrode in the ID area by holding capacity without touching with a finger, a linear conductive member having an extension of more than 25 cm is provided to hold the capacity and a through hole (conduction hole) is provided on the wiring to conduct to the electrode, and in doing so, the touch panel can detect the electrode.
1) Use by holding a smartphone in the hand.
2) Use by placing on a desk.
With both 1), 2) detection is good, but especially with 1), the detection response of the electrode is good even if the finger does not touch the wiring, but in the case of 2), it is desirable to increase the length of the linear conductive member, the size of the contacts, and the size of the taps so that the touch panel can reliably detect the capacity of all of the electrodes in the ID area simply by placing the apparatus 110 on the touch panel without having the finger touch the linear conductive member. With many models of iPhone (registered trademark), when 10 seconds elapse with an electrode in the stationary state, all of the electrodes become non-detected. On the other hand, as with a smartphone, in a state where the electrode is being detected and the electrodes are aligned horizontally or vertically, due to the characteristics of the touch panel, there are cases where the detected capacity decreases and one or all of the aligned electrodes become OFF. To avoid this, if a through hole (conduction hole) and an electrode are also provided in the touch area as shown in FIG. 4 of the present embodiment, so as to have sufficient capacity be detected, the frequency of non-detection is greatly reduced.

Since in many operation tests of 1), the touch panel can detect an electrode in the ID area even if 10 seconds are exceeded, as long as the wiring is touched, it is desirable to have a mechanism where the touch area is wired to conduct to the electrode in the ID area (the AC signal is conductive) so that the electrode can be detected again every time the touch area is touched even if 10 seconds are exceeded. Note that since the screen of the smartphone is small, after placing the card and touching one touch area, the card is removed from the screen to execute applications and browse contents, and thus conditions of use may be considered to be to touch the touch area within 10 seconds after placing the card. If a card-like apparatus 110 is placed and the touch panel reliably detects four electrodes of the ID area even once, conduction from the finger to the electrode of the ID area through wiring is unnecessary, and the touch area and ID area can be separated.

Furthermore, when the area on which the card-like apparatus 110 is placed is roughly of the same size as the card-shaped apparatus 110 and when the placement direction of the card-like apparatus is also restricted, if the touch panel detects four electrodes in the ID area, then the smartphone can detect touches to the touch area thereafter without misrecognitions even if 10 seconds are exceeded.

(Regarding the Touch Area when a Tablet is Used)

As an operating environment, it is assumed that in principle the user does not hold both an apparatus 110 and a tablet in the hand, and it is assumed that in principle the user uses it by placing it on a desk, with conditions being that the touch panel functions normally on wooden desks on which the capacity of the electrode is difficult to detect.

Compared with smartphones, the tablet has better detection response of electrodes by the touch panel and detection can be performed continuously. In the touch area, it is not necessary to provide a through hole (conduction hole) or an electrode. However, it becomes difficult for the touch panel to detect the capacity of an electrode under conditions such as low dielectricity of the material forming the dielectric column, the diameter of the dielectric column being less than 8 mm, the thickness of the card being 0.8 mm or more. Note that the manufacturing cost can be reduced to a low cost by not providing through holes (conduction holes) or electrodes.

(Regarding the ID Area when a Tablet is Used)

Basically, in order to detect four electrodes in the ID area by holding a capacity without touching the apparatus 110 with a finger, a linear conductive member having an extension of more than 25 cm is provided to hold the capacitance, and connection to the electrodes via through holes (conduction holes) provided on the wiring is achieved. Since the tablet body is large and floating capacity between the ground and the operating human body is large, a large capacity is detected, and even if the second threshold value is applied for more than 10 seconds, the detection of electrodes in the ID area can be continued, and it is extremely satisfactory. On the other hand, as with a smartphone, in a state where the electrodes are being detected and the electrodes are aligned horizontally or vertically, due to the characteristics of the touch panel, there are cases where the detected capacity decreases and one or all of the aligned electrodes become OFF. To avoid this, if a through hole (conduction hole) and an electrode are also provided in the touch area as shown in FIG. 4 of the present embodiment, so as to have sufficient capacity be detected, the frequency of non-detection is greatly reduced. It is desirable to increase the length of the wiring, the size of the contact and the size of the tap so as to reliably detect the capacity of all of the electrodes of the ID area by wiring the touch area and conducting to the electrode of the ID area, and sufficiently securing the capacity of the taps of the ID area when touching with the finger, or just by placing the card-like apparatus 110. Furthermore, when the area on which the card-like apparatus 110 is placed is roughly of the same size as the card-shaped apparatus 110 and when the placement direction of the card-like apparatus is also restricted, if the touch panel detects four electrodes in the ID area, then the tablet can detect touches to the touch area as touches to the electrode taps thereafter without misrecognitions even if 10 seconds are exceeded. As a result, if the card-shaped apparatus 110 is placed on the touch panel and the four electrodes of the ID area are reliably detected even once, electric connection (of AC signals) of the finger with the electrodes of the ID area becomes unnecessary, and the touch area and the ID area can be separated.

Third Embodiment

[Mechanism of a C-CARD (Thin Top Plate and Uneven Bottom Plate)]

With reference to FIG. 3 to FIG. 9, the apparatus 110AB according to the sixth embodiment is described. As in the first and the second embodiments, and the like, the apparatus 110AB of the present embodiment is a thin plate type apparatus. Hereafter, such card type apparatuses are collectively referred to as "C-Cards." As in the above first embodiment and the like, among the surfaces of the thin plate that is in a plan view, the surface in close proximity to or in contact with the touch panel is referred to as the working surface. Also, the side opposite of the working surface is called the upper surface. Both the working surface and the upper surface of the apparatus 110AB have an ID area and a touch area as in the first embodiment, the second embodiment, and the like. Also, in the following description, the electrodes 111 in the ID area and the touch points in the touch area are called electrodes, and the planar shape formed by the shape and the arrangement of the electrodes 111 in the ID area and the touch points in the touch area is called a conductor pattern.

Figure 3:
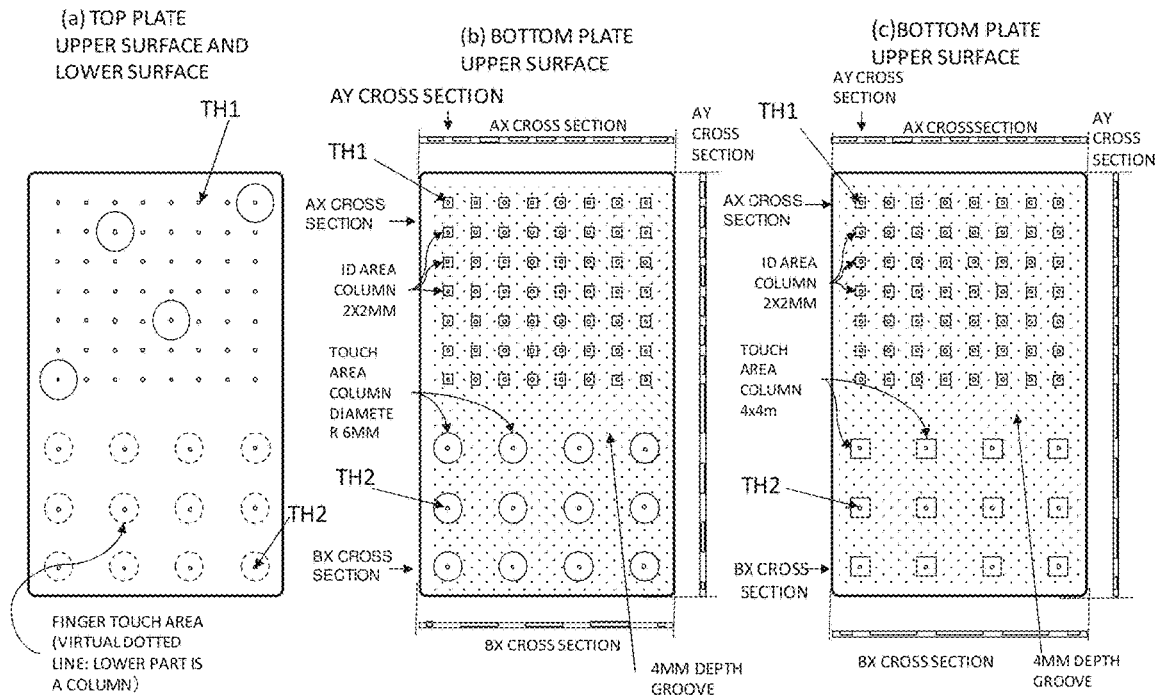
FIG. 3 is a structural example of an apparatus.

In the present embodiment, it is formed with two pieces consisting of a top plate and a bottom plate, and in order to arrange a large number of patterns in the ID area, design, methods of construction, materials are devised so that the production of a mold is not necessary for every electrode pattern which includes electrodes 111 in the ID area and touch points in the touch area. As shown in FIG. 3(*a*), the top plate is made of a highly nonconductive sheet or molded plate so that it will not bend while bonding. To this end, a material that is hard or does not stretch is used. In order to make it easy for the touch panel to detect physical quantities such as capacity and electric field, it is desirable to mold the bottom plates of FIGS. 3(*c*) and 3(*d*) with a material that can maintain a flat surface for the contact surface between the touch panel and the card. Especially, when using the card in a stationary state in which the card is not rotated and/or moved on the touch panel, it is desirable to use a nonconductive material that sticks to the touch panel with high adhesion.

Figure 14:
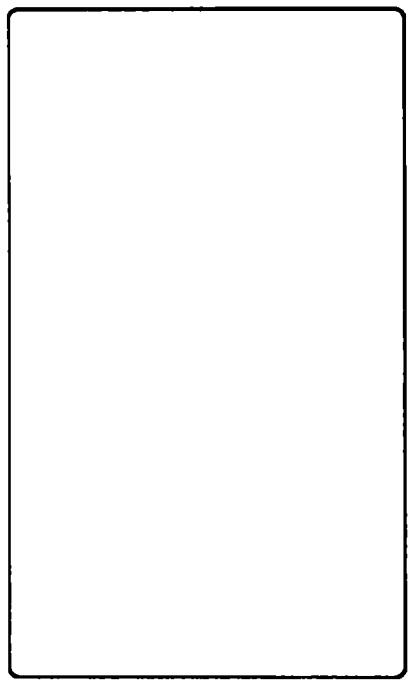
FIG. 14 is a structural example of an apparatus.
Figure 19:
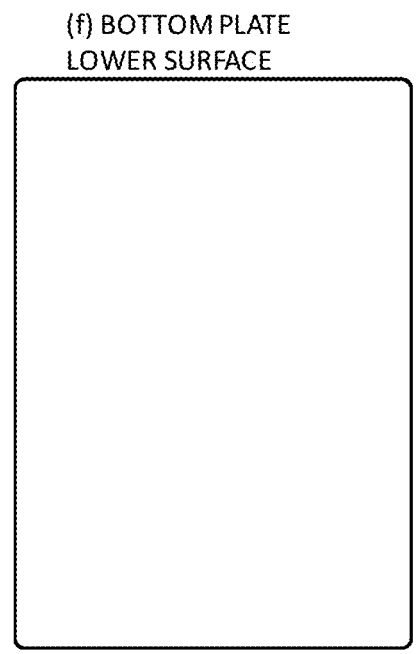
FIG. 19 is a structural example of an apparatus.

In order to deal with electrode patterns showing various IDs, as in FIGS. 3(*a*), 3(*b*), and 3(*c*), it is desirable to provide a hole for the through hole TH1 which connects an electrode and wiring in the top plate and in the bottom plate above the center of a candidate position of the bottom plate for arranging electrodes. These holes may be opened at the time of molding, or holes may be opened at required positions after molding. Note that the hole for a through hole requires a diameter of about 0.3 to 1.0 mm. On the other hand, depending on the mechanism, as shown in FIG. 14, FIG. 19, and the like, there are cases where it is not necessary to open holes in the top plate. This is because there are cases where the dielectric constants of the materials of the top plate and the bottom plate are sufficiently high, and an electrostatic capacity sufficient enough to be detected by the touch panel may be formed in the electrode pattern (the arrangement of the electrodes 111) indicating ID. Note that in the present embodiment, holes for the through hole TH2 are provided at 12 places of the touch area of the bottom plate. In the manufacturing process, it is desirable to mold with a plate of about 40 cm×50 cm or more, conduct wire settings by printing with conductive ink, plating or the like, and fill the through hole with conductive ink after bonding together. When through holes for conducting to the top plate and the bottom plate are provided before bonding together, contacts are provided so that the through holes of both are connected to each other. As for printing on the front side and the back side of the card, the top plate has a thickness of 0.2 to 0.3 mm, and since this can be dealt with by various printing machines, it can be printed directly. Since the bottom plate is thick, it is desirable to print separately on a white sheet and adhere it on the back side of the bottom plate. Note that if it is necessary to blindfold the electrodes 111, wiring or contacts, it is desirable to produce a printed sheet by blindfolding with a white sheet (other colors may be used depending on the graphics) and to print graphics on it. The printed sheet, including the ink layer and the adhesive layer, should be within about 0.1 to 0.15 mm so as not to affect the detection of the electrodes 111. Furthermore, in a case where conduction by a finger is performed, it is desirable to have the thickness of within about 0.005 to 0.015 mm for the printed sheet to enable conduction from the finger. Note that conductivity is highest when printing is directly done on the top plate. In the manufacturing process, with cost under sufficient consideration, it is desirable to have the formation of wiring, contacts, through holes, electrodes and the like on the top plate and the bottom plate, printing or bonding of printed sheets in the proper order, and after bonding of the top plate and the bottom plate cutting into card size. Note that the element 111 is also referred to as an electrode or simply as a tap.

The thickness of the bottom plate of FIGS. 3(b) and 3(c) is, for example, 0.6 mm to 0.8 mm, and in the ID area, since there are 56 electrodes arrangements in 7 rows in the horizontal direction and 8 rows in the vertical direction, 2 mm×2 mm columns for the through holes are provided at 6 mm intervals (ID area column). The dimensions and the number of these columns are designed conditions, and the number of electrodes (electrodes 111) connected to the wiring via the columns and the through holes is arbitrary. With 6 mm intervals, it is likely for the detection of a finger touch of a position other than those of the arranged electrodes, but the setting of 6 mm intervals is to increase the number of candidates for electrode placement. As described above, capacity detection other than the ID pattern is processed as error, as misrecognition by an application on the touch panel side. Primarily, it is desirable to provide columns for through holes at intervals of about 8 mm. However, in the mass production process, there is no need to arrange the columns at predetermined intervals as long as there is a manufacturing process that allows formation at arbitrary positions each time without forming the through hole attached columns at candidate positions for the electrode arrangement. In that case, supportive columns for preventing the card from bending or denting by finger pressure may be provided. In the area around the column, for example, a groove having a depth of 0.4 to 0.5 mm (a cavity between the top plate and the bottom plate) is provided. The air layer which has the lowest dielectric constant (1) provided by this groove, is for preventing the touch panel from mistakenly recognizing the touch of a finger or coupling due to wiring/contact of the top plate as a physical quantity change from the apparatus 110AB, and for correctly detecting only the electrodes of the ID area. The column may be circular or polygonal, but it is desirable to have the cross-sectional dimensions as small as possible. This is because when the top plate is touched with a finger and the size of the column is large, the touch panel may detect the capacity of the finger through the column. Fundamentally, a conductive pattern (array of electrodes 111) for specifying a card is arranged in the ID area, so if a position other than the arrangement is touched with a finger and it is detected, misrecognition of the ID defined by the electrode pattern occurs. Of course, regarding pattern recognition on the touch panel side, detection of an electrode at a position which is unlikely is regarded as an error, but every time the card is touched with a finger, an error may occur, and it becomes impossible to operate normally. Therefore, it is desirable to set the column for the through hole as small as possible, within about 2×2 mm when the cross-sectional shape is rectangular, and within about 3 mm in diameter when the cross-sectional shape is circular. However, even if the column is small, if the spacing between the columns is narrow, there are cases where the touch panel detects the capacity of a finger as that of one electrode via a plurality of columns when touching with a finger, and thus it is desirable to set a distance of at least 4 to 6 mm or more for the spacing between the column ends. The magnitude of this distance is largely influenced by the thickness of the top plate, the gap of the bottom plate (the depth of the groove) and the dielectric constant of the bottom plate. When the above-described gaps are provided, the thickness of the bottom plate is 0.2 to 0.3 mm, and this thickness is for maintaining the flatness of the lower surface of the card, and it can be molded with a nonconductive hard thermosetting resin. Furthermore, when placing an electrode on the lower surface, it is desirable to perform pressure crimping to maintain a sufficiently flat surface when sticking a white sheet or such (other colors may be used depending on the graphics) for blindfolding of the electrode.

In the touch area are columns (touch area columns) for the through holes for arranging the 12 electrodes arranged on the lower surface in 4 rows in the horizontal direction and 3 rows in the vertical direction, and for preventing the card from bending, provided at intervals of 14 mm in the horizontal direction and 12 mm in the vertical direction. These columns are also referred to as columns for touch points.

As for the shape of the column, in FIG. 3(b), the cross section is circular and about 3 mm to 8 mm in diameter is desirable. When through holes are provided, as in the ID area, the diameter of the cross section of the columns may be about 3 mm, but when through holes are not provided, it is desirable for the diameter of the cross section of the column to be about 8 mm so that the capacity of the finger can be detected. In FIG. 3(c), the shape of the column is rectangular, and it is desirable for the cross-sectional dimensions to be about 2×2 mm to 7×7 mm. When providing through holes, the cross-sectional dimensions of the columns may be about 2×2 mm as in the ID area, but when through holes are not provided, it is desirable to have the cross-sectional dimensions of the columns to be about 7×7 mm so that the capacity of the finger can be detected. In the touch areas of FIGS. 3(b) and 3(c), in addition to the touch point columns of 4 rows and 3 columns making 12, exemplified in the figures, columns of any shape may be provided properly to prevent bending. However, it is necessary to give due consideration of the size and placement intervals of the columns so that the touch panel does not detect touches by a finger of places other than the 12 touch points. Note that in areas other than the above mentioned touch point area, a groove having a depth of 0.4 to 0.5 mm is provided as in the ID area, and its function is the same as that in the ID area. Here, the utilization of columns that do not have through holes also includes a method that does not use the electrodes in the lower section, and thus for the lacking capacity, effective use of finger contacts placed on the top plate and wiring by coupling are made.

In order to blindfold the wires, finger contacts, or the like on the card surface, as described above, a white colored (other colors may be used depending on the graphics) sheet or the like on which graphics can be printed is adhered on it. In order to enable conduction from the finger, it is desirable to have the white sheet within about 0.005 to 0.015 mm including an adhesion layer. The problem would be the finger of the user simultaneously touching the finger contact points of adjacent touch points and the touch panel detecting the electrode of the two touch areas, but, as shown in FIG. 3, in the touch area, the electrodes are placed at sufficient intervals (for example, 12 mm horizontal by 14 mm vertical), and are designed so that they cannot be touched simultaneously. By the conductor arrangement for conduction, there is conduction to the electrodes of the touch area via the through holes, and the touched positions can be detected with certainty. Note that in order to detect only the electrodes of the ID area and the electrodes of the touch area directly under the place touched by conduction, it is desirable to separate the ring-shaped conductor and the finger contact from each other by about 1 mm or more so that there is no conduction between them. Here, although a ring-shaped conductor and the circular finger contact are shown, as long as there is no conduction between a conductor for conducting to the ID area and a finger contact for an electrode, any shape such as an oval or a polygon in any combination may be used.

On the upper surface of the top plate in FIG. 4(a), ring-like conductor 114C (for example, 6 mm in diameter) for conducting to the electrodes in the ID area are provided. Indicator electrodes (finger contacts, rectangular with dimensions of about 1.0×1.0 to 2.0×2.0 or of 1.5 to 3 mm in diameter) for conducting to the electrodes of the touch area are provided in the center. By touching the touch area of about 6 mm in diameter, via the finger contacts and the through holes of FIG. 4(b) and FIG. 4(c), there is conduction to an electrode 111 disposed in the lower area shown in FIG. 4(d), and at the same time there is conduction to four electrodes (elements 111) arranged in the ID area, and five electrodes 111 in total are detected by the touch panel. Extension of the linear conductive member is 25 cm or more even with only the fixed linear conductive member of the touch area, and has a capacity equal to or larger than the threshold value set for detection by the touch panel, and even with the iPhone (registered trademark) and the iPad (registered trademark), it is confirmed that four electrodes in the ID area can be detected just by placing the apparatus 110AB on the touch panel. In the figure, a linear conductive member of 20 cm or more is in an interdigital shape, but it may be in any shape such as a lattice shape, a spiral shape, or the like. Note that with the information device 200 or the like according to the present embodiment, for example with a smartphone, when 10 seconds elapse from an operation such as the placement of the apparatus 110AB onto the touch panel, the threshold of a physical quantity (for example, electrostatic capacity) detected by the touch panel fluctuates and the apparatus becomes non-detected, but it has been confirmed that with a tablet an electrode can be detected continuously with no limit in time. Therefore, in the following description, the threshold value when the touch panel determines the presence or absence of a physical quantity immediately after performing an operation such as the placement of the apparatus 110AB onto the touch panel of the smartphone is referred to as the first threshold value. Also, the threshold set after about 10 seconds elapse from this operation is referred to as the second threshold. It has been confirmed that the second threshold value is higher than the first threshold value.

Through holes of 0.3 to 1.0 mm are formed inside the top plate of FIG. 4(b), and by the finger touch of a finger contact or a ring-shaped electrode 114C, the finger of the user is conducting with an electrode 111. As shown in FIG. 4(c), through holes are provided inside the columns having the height of 0.4 to 0.5 mm on the upper surface of the bottom plate, and as shown in FIG. 4(d), four electrodes of the ID area arranged on the upper surface of the bottom plate are conducting. In the touch area, electrodes are arranged at intervals of 12 mm in the vertical direction and 14 mm in the horizontal direction, and each of the electrodes has a diameter of about 8 mm. The diameter of 8 mm of an electrode corresponds roughly to the touch area of the finger (maximum contact length).

Furthermore, the finger contact is slightly longer in the horizontal direction with respect to the aspect ratio, which is because when a person's finger makes contact, the contact area is slightly longer in the horizontal direction. In this way, adjacent finger contacts are made not to be touched simultaneously. Different icons are printed on these twelve touch areas, and when one of the touch areas is touched, in addition to the four electrodes in the ID area, one electrode is detected, and an application specified by an icon related to an image printed on the apparatus 110AB can be executed or contents specified by an icon can be browsed. In a case where through holes are provided to both the top plate and the bottom plate before adhesion, in order to secure proper conduction, it is desirable to provide bonding contacts of rectangular shape of about 1.0×1.0-2.0×2.0 or of about 1.5 to 3 mm in diameter to contacts point between through holes of the top plate and through holes of the bottom plate.

On the other hand, if holes for through holes are opened after adhesion of the top plate and the bottom plate, and the conductive ink is filled, it is possible to reliably provide through holes with high conductivity. On the upper surface of the top plate, in order to blindfold the wiring and the finger contact of FIG. 4(a), it is desirable to adhere a white sheet (may be another color) within about 0.005 to 0.015 mm including an adhesion layer in order to enable conduction from the finger. In a case where the line width of the circumferential shape of the ring-shaped conductor 114C is narrow, there is a possibility that the finger does not become conducted to the ring-shaped conductor 114C. Therefore, in order to increase conduction from the finger, as shown in the lower part of FIG. 4(a), the line width of the circumferential shape of the ring-shaped conductor 114C is widened, the shape is made into a donut shape, and the area is increased.

On the other hand, buttons having a diameter of 6 to 10 mm or a rectangular shape of 5×5 mm to 8×8 mm, molded with a conductive material printed with an icon may be placed at the central portion (each touch point) of the twelve touch areas. Adjacent buttons should be separated with an interval of 1 mm or more to prevent conduction between each other. However, if the area of the conductive button is too large, coupling may occur and the range of the capacity to be detected may become excessive, thereby causing error, or there are cases where the touched position and the detected position do not coincide with each other, and thus, it is necessary to pay sufficient attention to the size of the button. Control may be applied by the conductivity of the conductive material used for the button.

Note that a slight gap is provided between the button and the finger contact, so that only the area pressed by the finger comes into contact with the card wiring portion and becomes conductive. It is desirable to have the twelve conductive buttons arranged on a sheet formed of a nonconductive material. However, a hole must be opened under the conductive button of the sheet to allow conduction. Note that the conductive button and the nonconductive sheet may be integrally molded by multiple molding. Furthermore, unless misrecognition due to the influence of coupling described above is induced by the control of the strength of conductivity (selection of the conductive material), the button and the sheet may be integrally molded with a material having a relatively weak appropriate conductivity.

Meanwhile, in order to induce touching of each touch area for games and security, guidance light may be emitted from the touch panel to a predetermined touch area. To make it easy for the user to make visual recognition, the guiding column under the touch area may be translucent, or a hollow portion may be provided in the guiding column. Furthermore, when the guiding light is shielded by the electrodes 111 arranged in FIG. 4(*d*), the electrodes may be formed into donut shapes.

Usually, cards are generally printed with high-quality graphics. As in the present embodiment, the touch area has priority in function, and in many cases, it is not necessary to be concerned much with graphics. Hereinafter, FIGS. 6 to 9 show an embodiment where nothing is provided on the upper surface of the top plate, and wirings and through holes are provided on the lower surface in order to prevent conductive wires, through holes, and the like from being seen through or unevenness from occurring when high-quality graphics are printed directly on areas other than the touch area or when adhering high-quality printed sheets onto a card. However, since wiring and/or conductors are arranged on both the upper surface and the lower surface of the top plate, the cost is high.

FIG. 6 show an embodiment in which the wiring of the ID area is wired on the lower surface of the top plate. Therefore, the ID area on the upper surface of the top plate does not have a mechanism for conducting from the touch of a finger. On the other hand, since the electrodes 111 on the lower surface of the bottom plate of the touch area needs only to be conducted to the upper surface of the top plate by the touch of a finger, it is desirable to provide finger contacts which are as inconspicuous as possible on the upper surface of the top plate. On the other hand, since there is no conduction from the finger in the ID area, capacity is held by the wiring in the ID area (including conductors for coupling) and the electrodes. However, if the card deforms, if small dust particles or the like adhere to the surface of the touch panel, or if the protective sheet is not adhered properly, the electrode may not be recognized and thus attention is required.

Figure 7:
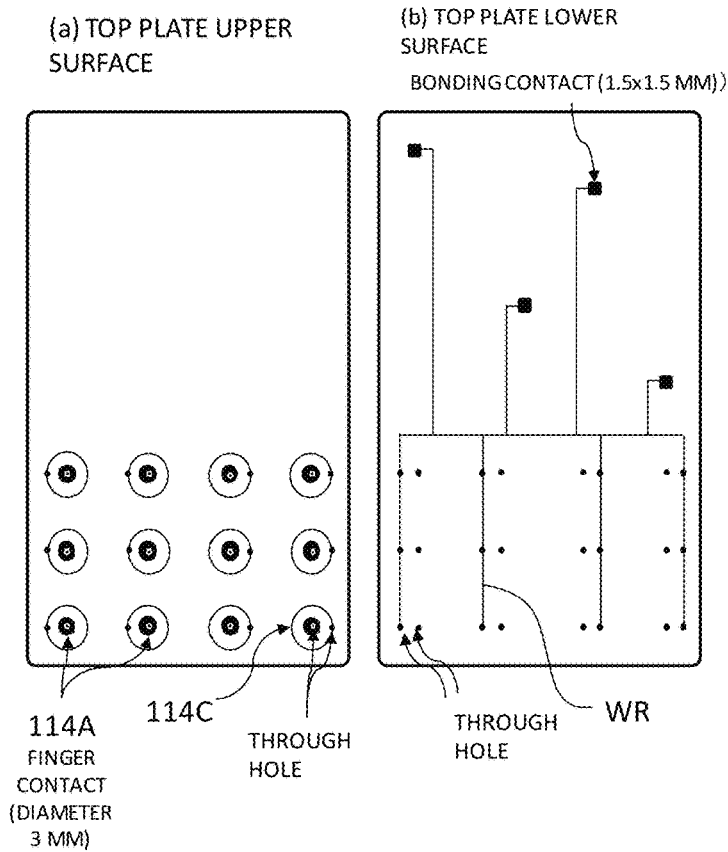
FIG. 7 is a structural example of an apparatus.
Figure 8:
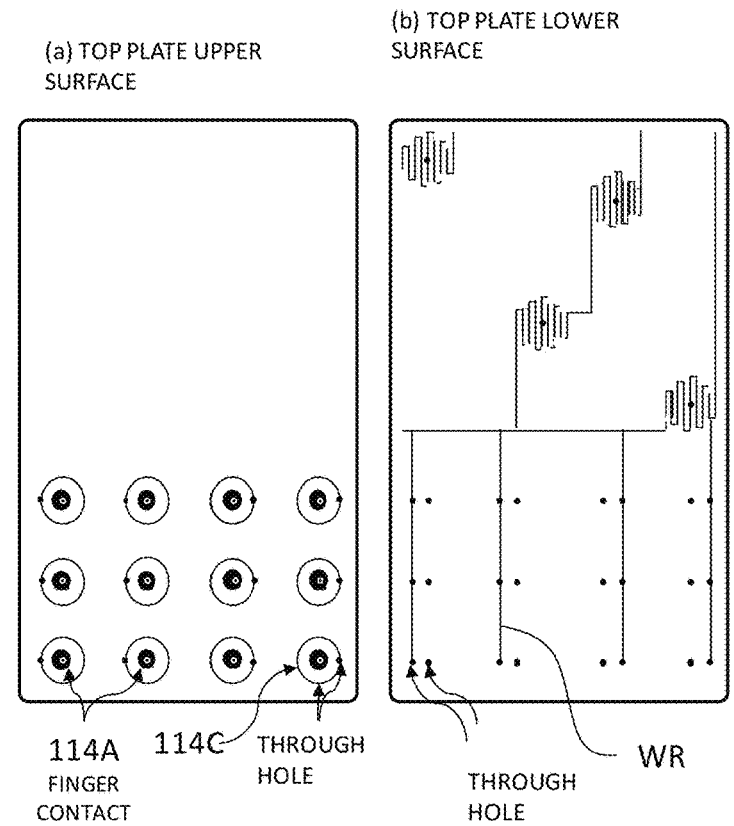
FIG. 8 is a structural example of an apparatus.

FIG. 7 and FIG. 8 show an embodiment in which wirings on the upper surface of the top plate of the ID area shown in FIG. 4 are wired on the lower surface of the top plate. This is also a mechanism for forming high-quality graphics in areas other than the touch areas. FIG. 6 differ from the point in which the ring-shaped conductor 114C on the upper surface of the top plate is connected to the wiring WR on the lower surface of the top plate and electrodes on the lower surface ID area of the bottom plate via the conductive member in the through hole. Therefore, since the user is conducted to the electrode in the ID area by the touch of a finger to the conductor 114C, even if the contact state between the card and the touch panel is not satisfactory or the detection capacity of the touch panel is somewhat low, this mechanism is capable of reliably detecting capacity. Here, in order to make the touch area not very conspicuous even with graphics printed on the upper surface or with printed sheets adhered, a finger contact 114A is provided at the center of each touch area on the top plate surface and a ring-shaped conductor 114C surrounding the peripheral is provided and a conductive path passing through the through hole is provided above the ring-shaped conductor 114C and connected to the wiring WR on the lower surface. A through hole is provided from the finger contact 114A to the electrode directly beneath so that they are conducted, and a conductive path is formed in the through hole. For this reason, the card surface may be printed with 12 designs in each touch area with such a design that the finger contact 114A and the ring-shaped conductor 114C are inconspicuous. In some cases, as part of a design of the touch area, the finger contact 114A and the ring-shaped conductor 114C may be exposed or may be printed with graphics of similar color.

Figure 9:
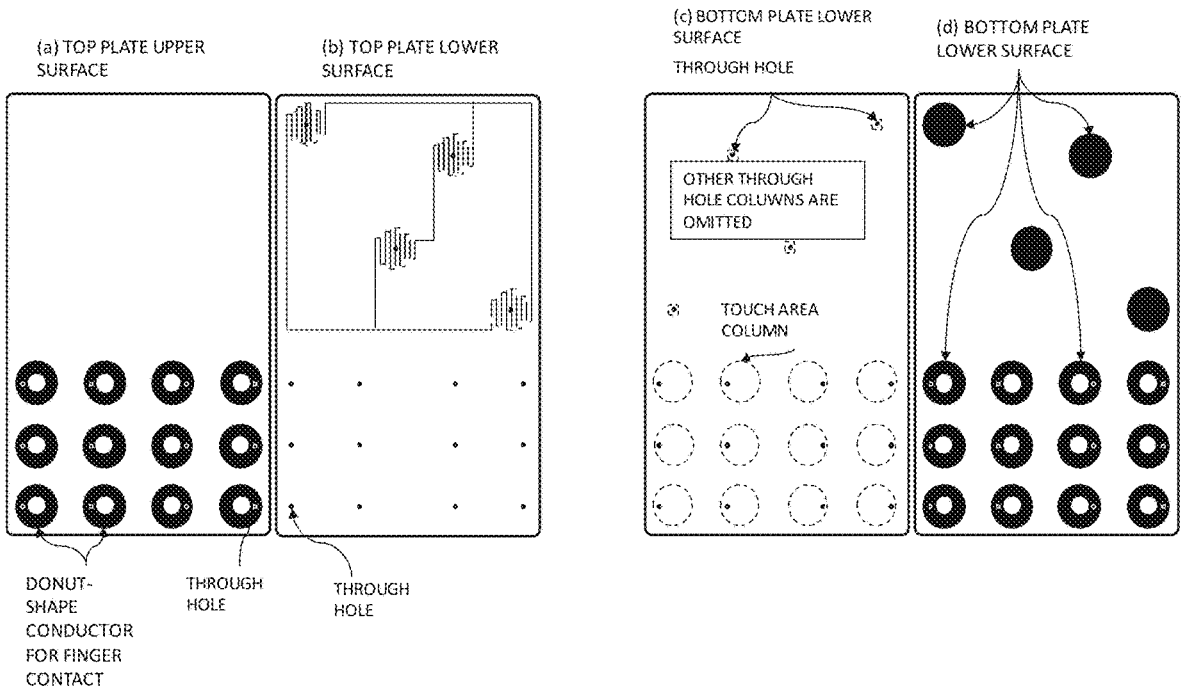
FIG. 9 is a structural example of an apparatus.

FIG. 9 shows a mechanism that enables the user to visually recognize the guidance light emitted from the touch panel to predetermined touch areas in order to induce touching of each touch area for games and security. In FIG. 9(*a*), the finger contacts are donut-shaped conductors and through holes are provided in the conductors, but ring-shaped conductive wires as shown in FIG. 6(*a*) may also be used. Furthermore, it is desirable to make the guiding column (touch area column) on the lower surface of the bottom plate of the touch area in FIG. 9(*c*) translucent or provide a hollow portion in the guiding column so that light can be transmitted and visually recognized. Note that if the electrode is shielded by the guiding light, the electrode may be formed into a donut shape as shown in FIG. 9(*d*). In the present embodiment, wiring of the electrode of the ID area is made to be nonconductive by the touch of a finger, but the wiring may be made to conduct to them. For example, it is also possible to design so that conductors or the like, or guiding light for conducting to the electrodes formed in a donut shape and the electrodes of the ID region can be visually recognized also in FIG. 3 to FIG. 8. As for fields of application of this embodiment, even when there is no icon printed on the card surface, the position to touch can be indicated by a guiding light. The guiding light may selectively guide finger touching with light emission of different colors. Furthermore, it is also possible to selectively guide finger touching by changing the blinking interval (light on/off time). Also, the light set and light other than the set light may be emitted simultaneously. Note that multiple touches may be made simultaneously. For entertainment systems, indicating the position to touch next, and setting item selection, character movements, the direction of attack, language, and the like may be done by emission color or by blinking lights. For security systems, the user sets the emission color and blinking, and as one-time passwords various lights are emitted with a change in time for part of or all of the touch areas, then by selecting the preset light and touching a specific touch area a one-time password can be entered. Furthermore, by setting the order of touching in addition to a plurality of colors of lights and blinking, even higher security can be realized. Also, by adopting a procedure of touching the left, right, above, below, and diagonal directions of a specified position without touching the set light position, skimming cannot be done easily. In addition, if the molding material of the card is made transparent, images can be displayed in areas other than the touch area. Thus, switching of images by the touch of a finger or ordering/settling of the specified images (products and services) can be done. Of course, with a card having a mechanism in which conductors for blocking light are not arranged in the touch area, images can also be displayed in the touch area and switching can be done freely.

As above, FIGS. 4 to 9 are described as specific examples to which the structure in FIG. 3 is applied, and, the various conductive wires, conductors, through holes, contacts, electrodes, may be combined in any way for forming for the mechanism of FIG. 3.

Forth Embodiment

[Mechanism of a C-Card (Use by Placement, Structure; Uneven Bottom Plate and Thin Lower Plate)]

The apparatus 110AC according to the fourth embodiment will be described with reference to FIGS. 10 to 12. Like the first through the sixth embodiments, the apparatus 110AC of the present embodiment is a thin plate type apparatus. Both the working surface and the upper surface of the apparatus 110AC have an ID area and a touch area similar to those of the first to the sixth embodiments and the like. In the present embodiment, the structure of the top plate and the bottom plate of the apparatus 110AC are in reverse with respect with that of the above-described sixth embodiment. Other configurations and operations of the present embodiment are similar to those of the sixth embodiment.

In the present embodiment, it is formed with two pieces consisting of a top plate and a bottom plate, and in order to arrange a large number of patterns in the ID area, design, methods of construction, materials are devised so that the production of a mold is not necessary for every electrode pattern which includes elements 111 in the ID area and touch points in the touch area. FIG. 10 is an embodiment where, the thin top plate of FIGS. 3(a) and 3(b) is used as the bottom plate of FIGS. 10(c) and 10(d), the uneven bottom plate of FIGS. 3(c) and 3(d) is used as the top plate of FIGS. 10(a) and 10(b).

In this embodiment, there are two kinds of features, and one of them is that it is possible to realize a mechanism that has electrodes 111 of the ID area and the touch area formed on the top surface of the bottom plate, and does not need to have electrodes formed on the bottom surface of the bottom plate which makes contact with a touch panel surface. When electrodes are formed on the lower surface of the bottom plate, a slight difference in height is developed on the lower surface. As a result, for example, when the apparatus 110AC is placed on the touch panel of the information device 200, an air layer is formed between the lower surface of the bottom plate which is the working surface and the touch panel, and the detection accuracy of a physical quantity such as capacity by the touch panel decreases. However, if the thin bottom plate can be molded with a hard material and flatness can be maintained, the card and the touch panel surface can be brought into close contact with each other with the generation of an air layer being suppressed, and the detection of the capacity of the electrode on the upper surface side of the bottom plate by the touch panel becomes easier. The distance from the electrode serving as a substitute for a finger to the touch panel surface is about 0.2 to 0.3 mm with thickness of the bottom plate, and since the thickness of a general protective sheet for covering the touch panel of a smartphone or the like is around 0.5 mm, there is no strong effects on the detection of the electrodes.

The second feature is that if the color of the bottom plate is molded in white (other colors may be used depending on the design), since the thickness of the bottom plate is 0.2 to 0.3 mm, it becomes possible to print with various printing machines, and printing of graphics on the back side of a card becomes easy. Similarly, electrodes on the upper surface of the bottom plate can also be printed with conductive ink.

As shown in FIG. 10(c), the bottom plate is a highly nonconductive sheet or a molded plate and it is made not to bend when bonded together. For this purpose, hard and/or nonstretchable material is used. In order to make it easy for the touch panel to detect capacity, it is desirable to mold the bottom plate with a material that can keep the contact surface of the touch panel and the card flat. In particular, it is desirable to use a hard thermosetting resin which is nonconductive. When using a card in the stationary state in which the card is not rotated and/or moved on the touch panel, it is desirable to use a nonconductive material with high adhesion that adheres to the touch panel.

In order to accommodate various ID electrode patterns, as shown in FIGS. 10(a) and 10(b), it is necessary to provide holes for the through holes connecting the electrodes and the wiring at the candidate positions where the electrodes are arranged on the upper surface of the bottom plate. These holes may be opened at the time of molding, or the holes may be opened at required positions after molding. Note that the through holes require a diameter of about 0.3 to 1.0 mm. In FIG. 11, holes for through holes are provided at twelve positions of the touch area of the top plate. In the manufacturing process, it is desirable to mold the top plate with a plate of about 40 cm×50 cm or more, conduct wiring by printing with conductive ink, plating or the like, and fill the through holes with conductive ink after bonding together. When providing through holes for conducting the top plate and the bottom plate before bonding together, contacts are provided so that the through holes of the top plate are connected to the electrodes of the bottom plate.

Because the top plate is thick, it is desirable to print the card surface separately on a white sheet and adhere it on the top plate surface. Note that if it is necessary to blindfold electrodes, wiring, and contacts, it is desirable to blindfold them with a white sheet (other colors may be used depending on the graphics), and print graphics on it to produce a printed sheet. The white sheet is set to within about 0.1 to 0.15 mm so as not to affect the detection of electrodes. Furthermore, when performing conduction by a finger, it is desirable to have the thickness of the printed sheet be within about 0.1 to 0.15 mm. In the manufacturing process, considering cost efficiently, it is desirable to form wiring, contacts, through holes, electrodes and the like on the top plate and the bottom plate, print or adhere printed sheets in a proper order, bond together the top plate and the bottom plate, and then cut into card size.

As in FIGS. 3(b) and 3(c), since the lower surface of the top plates of FIG. 11(a) and FIG. 11(b) has grooves with a depth of 0.4 to 0.5 in areas other than where the column is, basically, wiring for conducting to the electrodes of the ID area and the conductors for finger contact in the touch area are formed on the upper surface of the top plate. The conductive wiring on the upper and lower surfaces of the top plate are the same as those in FIGS. 4(a) and 4(b), and by touching with a finger of the touch area (above the electrodes), the electrodes directly below and the electrodes in the ID area are conducted so that the touch panel can detect five electrodes. Four electrodes in the ID area and twelve electrodes in the touch area are formed on the upper surface of the bottom plate of FIGS. 11(c) and 11(d).

Note that in order to arrange the wiring of the conductive wire and the conductors on the upper surface, it is desirable to adhere a sheet such as a white (other colors may be used depending on the graphics) sheet for blindfolding and to print graphics on the blindfold sheet. With energy saving in consideration, it is desirable to bond together the top plate and the bottom plate in the manufacturing process after printing or adhering the printed sheet. The case is the same for FIG. 12 shown below.

A donut-like finger contact conductor is provided on the upper surface of the touch area on the top plates of FIGS. 12(a) and 12(b), and they have a predetermined area to enable conduction from a finger touch even when a blindfold sheet is adhered. Furthermore, in the touch area on the upper surface of the bottom plate in FIG. 12(c), a donut-shaped electrode having the same size as a conductor of the top plate is provided so that guiding light from the touch panel can be transmitted and visually recognized with ease.

Figure 10:
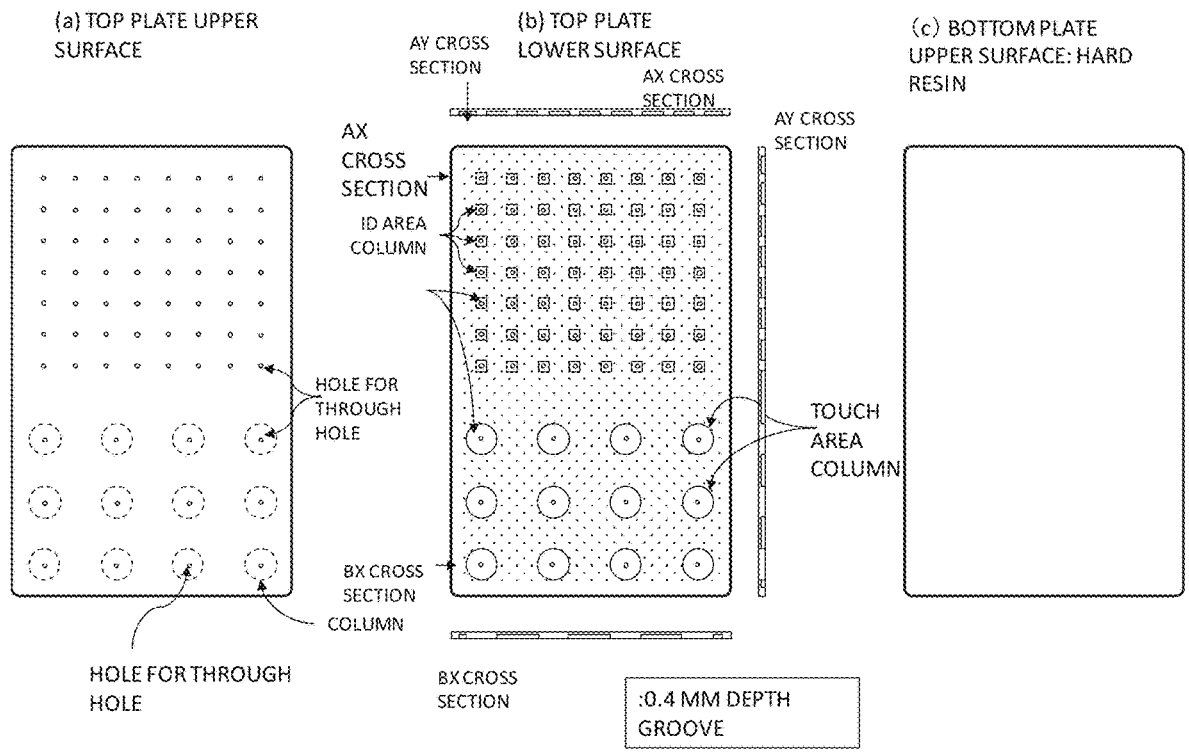
FIG. 10 is a structural example of an apparatus.

As above, FIGS. 11 to 12 are described as specific embodiments to which FIG. 10 is applied, but any combination of various conductive wires, conductors, through holes, and electrodes in FIGS. 4 to 9 and 10 to 19 may be formed in the mechanism of FIG. 12.

[Modification Example]

Figure 13:
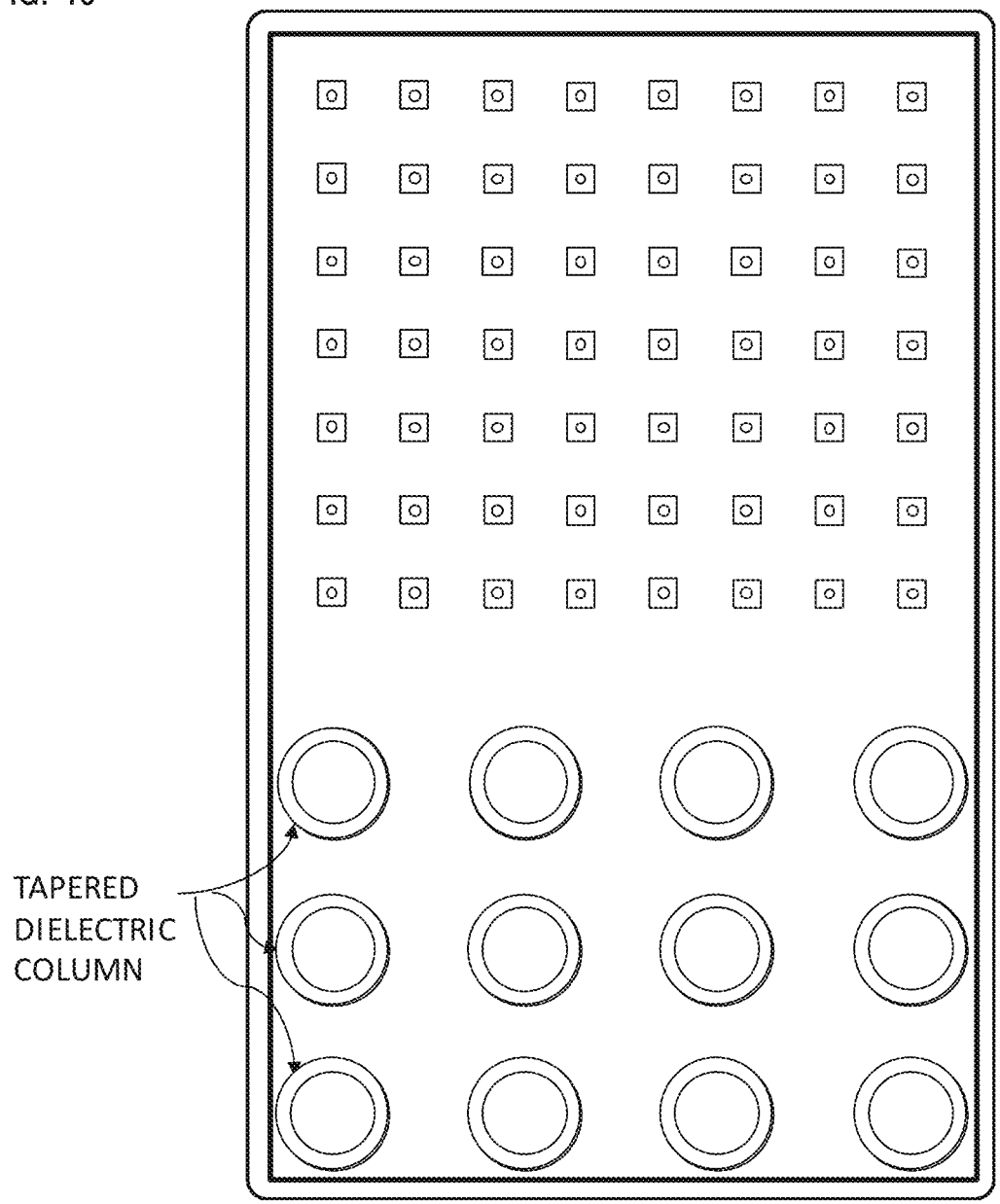
FIG. 13 is a structural example of an apparatus.

The dielectric column provided on the top plate of the present embodiment and the bottom plate of the above-described sixth embodiment may be in a tapered shape. Exemplified in FIG. 13 is a thin plate-shaped base material having a tapered-shape dielectric body. For the base material of FIG. 13, the bottom plate of the sixth embodiment or the top plate of the seventh embodiment is used. For example, when an apparatus 110AB, 110AC or the like is placed on the touch panel, if the side of the dielectric column close to the touch panel is of a thick shape and the side far from the touch panel surface is of a thin shape, a physical quantity detected by the touch panel on the working surface of the devices 110AB and 110AC is increased and the upper surface of the top plate (the side opposite of the working surface) of the devices 110AB and 110AC can be widened compared with a dielectric column end portion close to the touch panel having a small cross sectional area. By making the interval between the touch points wide, it is possible to avoid interference due to a finger touch between touch points.

On the other hand, conversely, when a physical quantity formed on the working surface via the dielectric is sufficiently large, the side of the dielectric column close to the touch panel may have a thin shape and the side far from the touch panel may have a thick shape.

Note that in FIG. 3 and FIG. 10, a large number of ID area columns formed with through holes are provided in the ID area. However, if four electrodes 111 are arranged on the lower surface of the bottom plate of the ID area as shown in FIG. 4(d) and the four electrodes 111 are to be connected to the wiring provided on the top plate, generally, four ID area columns having through holes are enough. However, as shown in FIGS. 3(b) and 3(c), by providing a large number of columns having through holes in the ID area, the apparatuses 110AB, 110AC, or the like (or the top plate or the bottom plate thereof) in a state prior to the formation of electrodes 111 can be mass-produced. That is, for example, a large number of bottom plates as shown in FIGS. 3(b) and 3(c) (or top plate as shown in FIG. 10(b)) may be produced with the same metal mold or the like, and it is possible to mass-produce apparatuses 110AB, 110AC, or the like with different IDs by forming, printing or fitting the electrodes 111 when bonding the top plate (or the bottom plate).

The electrodes 111 constitute an example of a plurality of first electrodes and second electrodes formed on the first surface. The wiring constitutes an example of a linear conductive member. The through hole constitutes an example of a hole.

Fifth Embodiment

[Mechanism of a C-CARD (Use by Placement, Structure; Thin Top Plate and Multiple-Molded Uneven Bottom Plate)]

With reference to FIGS. 14 to 19, a method of manufacturing the apparatus 110 is exemplified.

In FIGS. 14 to 19, the apparatus 110 is formed with the two plates consisting of a top plate and a bottom plate, and the bottom plate is molded by multi-molding using a conductive material and a nonconductive material. Twelve fixed conductive columns, two information A conductive columns and two information B conductive columns are formed with conductive material. For the twelve fixed conductive columns, with this mechanism, capacity is detected only beneath the fixed conductive columns in order to prevent misrecognized even if a position displaced from the fixed conductive column is touched when the touch region is touched with a finger. Although the two information A conductive columns are arranged at fixed positions, by arranging the two information B conductive columns at arbitrary positions, the conductive patterns of the ID area are formed. However, in order to increase the number of patterns, the two information A conductive columns may also be arranged at arbitrary positions.

The conductive columns and the nonconductive supporting columns are made to be arrangeable at necessary positions by the configuration of the mold. The supporting columns are arranged at predetermined intervals so that the supporting columns do not bend when the thin top plate is pressed with a finger. The size of the supporting columns is desirably within about 2×2 mm for a rectangle face, and within about 3 mm in diameter for a circular face, and it is desirable to set the spacing between the edge portions of the columns at 4 to 6 mm or more. The various conditions of the mechanism of the bottom plate including the above are described in the description of FIG. 3.

Since the conductive columns depicted in black in the sectional view (AY cross section) in FIG. 23 are formed with a thickness of 0.4 mm and a diameter of 8 mm above the lower surface of the bottom plate of 0.3 mm in thickness, it is possible to print directly on the surface of the lower surface of the bottom plate or adhere a very thin printed sheet of within about 0.1 to 0.15 mm or less. Note that since the conductive column has a diameter of 8 mm, capacity can be sufficiently detected even through a dielectric layer consisting of the lower surface of a bottom plate having a thickness of 0.3 mm and a printed sheet having a thickness of about 0.1 to 0.15 mm. With regards to the top plate of FIG. 14, a finger contact is provided on the upper surface and a contact point with the conductive column is provided on the lower surface. The wiring of the conductive wires is formed on the upper surface and/or the lower surface. Through holes are provided in the top plate, but depending on the arrangement of the conductive columns, through holes need not be provided on the lower surface. In addition to multiple molding, ordinary molding may be carried out with a nonconductive body, and conductive columns may be arranged from the upper surface of the bottom plate, and the lower surface may be bonded. As the top plate of this bottom plate, those in FIGS. 4(a), 4(b), and FIGS. 25 to 32 can be applied. FIG. 6(a) and FIG. 6(b) can be applied without forming the conductors on the lower face. Otherwise, FIG. 11(a) and FIG. 11(b) can be applied.

Figure 16:
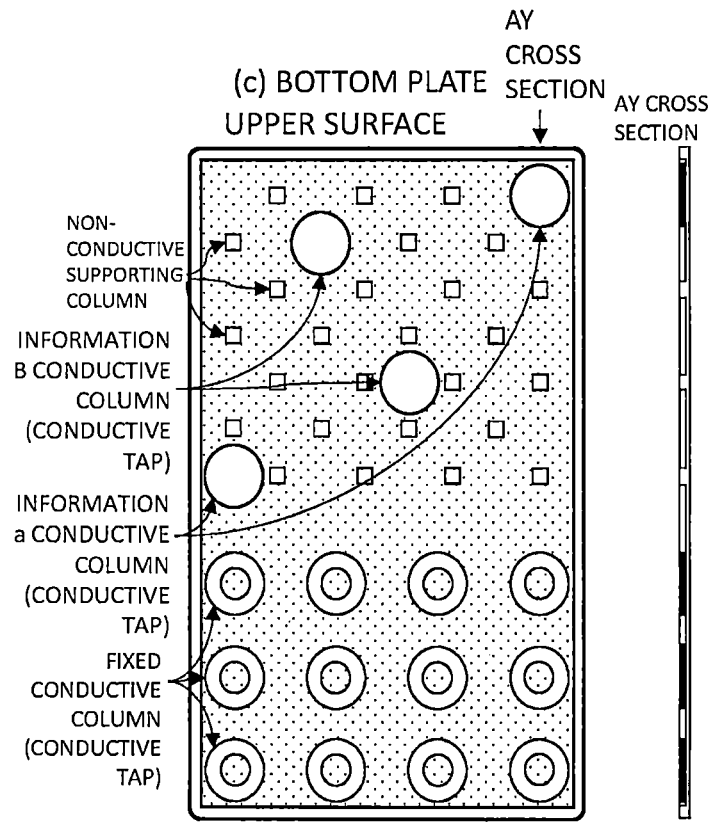
FIG. 16 is a structural example of an apparatus.
Figure 17:
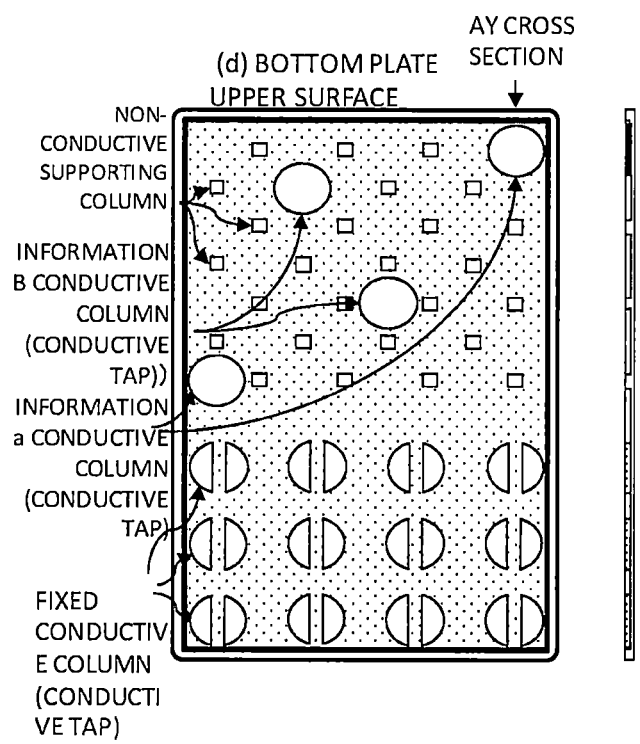
FIG. 17 is a structural example of an apparatus.

With reference to FIG. 16, conductive columns with a diameter of 8 mm are molded in a cylindrical shape (the hollow portion is an air gap or a transparent nonconductive body), and guiding light is emitted from a touch panel to predetermined touch areas to induce touching of each touch area thereby allowing visual recognition through the card surface. In addition to multiple molding, ordinary molding may be carried out with nonconductive bodies, and conductive columns may be arranged from the upper surface of the bottom plate, and the lower surface may be bonded. Those in FIG. 6, FIGS. 12(a), and 12(b), FIGS. 29 to 77 can be applied as the upper plate of the bottom plate. In FIG. 17, a notch is provided in the center vertical direction of the conductive columns having a diameter of 8 mm, and as in FIG. 16, guiding light is emitted from the touch panel to predetermined touch areas to induce touching of each touch area thereby allowing visual recognition through the card surface.

In addition to multiple molding, ordinary molding may be carried out with nonconductive bodies, and conductive columns may be arranged from the upper surface of the bottom plate, and the lower surface may be bonded. Those in FIG. 6, FIGS. 12(a), and 12(b), FIG. 29 can be applied as the upper plate of this bottom plate. FIGS. 20 and 21 are wiring diagrams of the upper plate that make use of the features of the notched conductive column in FIG. 17. Since only ring-shaped conductors for finger contact or finger contacts are formed on the top plate upper surface, it is possible to print directly or adhere a very thin printed sheet within about 0.005 to 0.015 mm. Even when adhering blindfold sheets of within 0.005 to 0.015 mm, in order to ensure conduction from the finger, ring-shaped conductors for finger contact of FIG. 20(a) may be formed as donut-shaped conductors in FIG. 12(c).

Furthermore, as the wiring in the ID areas of FIGS. 20 and 21, the wiring of FIG. 8(b) or FIG. 12(b) may be used. Note that all of the wiring of the conducting wires on the lower surface of the top plate may be formed on the upper surface of the top plate. In that case, the through holes must be arranged so as to conduct to the conductive columns of the ID area. In shown in FIG. 16, a pot cover shaped conductive column is arranged by multiple molding. The conductive column has a lower diameter of 8 mm and thickness of 0.3 mm. and an upper diameter of 3 mm and thickness of 0.4 mm, and the bottom of a conductor is in the same plane with the lower surface of the bottom plate, and thus capacity can be reliably detected. In addition to multiple molding, ordinary molding may be carried out with nonconductive bodies, and nonconductive bodies may be fitted in from the upper surface of the bottom plate and may be bound around the bottom of conductive columns. However, since the bottom of the conductive column can be visually recognized, blindfold sheets are used for covering. As the upper plate of the bottom plate, those in FIGS. 4(a), 4(b), 7, 8, 25 to 32 can be applied. Note that application can be done even if the wave shaped wiring of the top plate lower surface is not present.

Note that the conductive columns used in FIG. 15 to FIG. 23 may all be molded objects or be of any other material as long as conductivity is high and may be of metal.

Sixth Embodiment

[Mechanism of a C-CARD (Use by Placement, Structure; Multi-Molded Uneven Top Plate and Thin Bottom Plate)]

In shown in FIG. 22, the card is formed of a top plate and a bottom plate, and the top plate is molded by multiple molding using conductive material and a nonconductive material. The present embodiment constitutes a mechanism in which the bottom plate of FIGS. 14 to 19 is used as the top plate, and the front and back are reversed, while molding of the conductive columns and the supporting columns is the same. In the sectional view of FIG. 22(b), since the conductive columns depicted in black are formed with a thickness of 0.4 mm and a diameter of 8 mm under the upper surface of the bottom plate having a thickness of 0.3 mm, in principle, therefore, conductive wiring must be formed on the upper surface of the top plate, and through holes must be provided in the conductive columns of the ID area and be conducted. In that case, a blindfold sheet is required. This blindfold sheet is printed with graphics and when conduction from the finger to the electrodes in the ID area is carried out, it is desirable to have the thickness be within about 0.005 to 0.015 mm including the adhesive layer.

The bottom plate of this top plate is a flat plate or sheet with a thickness of 0.2 mm and is white (other colors may be used). Also, printing can be done directly on the lower surface of the bottom plate. Furthermore, even when a printed sheet of about 0.1 mm is provided for the bottom surface of the bottom plate, capacitance can be sufficiently detected even through these dielectric layers. Note that the bottom plate is formed with a nonconductive sheet (including paper, PET, and the like) with high dielectric properties, and since the bottom plate comes into contact with the touch panel, it needs to maintain a flat surface, and care is taken not to bend it when bonding together. For this purpose, a material that is hard or does not stretch is used. Also, in addition to multiple molding, ordinary molding may be carried out with nonconductive bodies, and conductive columns may be arranged from the upper surface of the top plate, and bottom surface may be adhered. For wiring on the upper surface of this top plate, wiring, finger contacts, and through holes of the upper surface shown respectively in FIG. 4, FIG. 11, and FIG. 25 to FIG. 31 can be applied.

Figure 18:
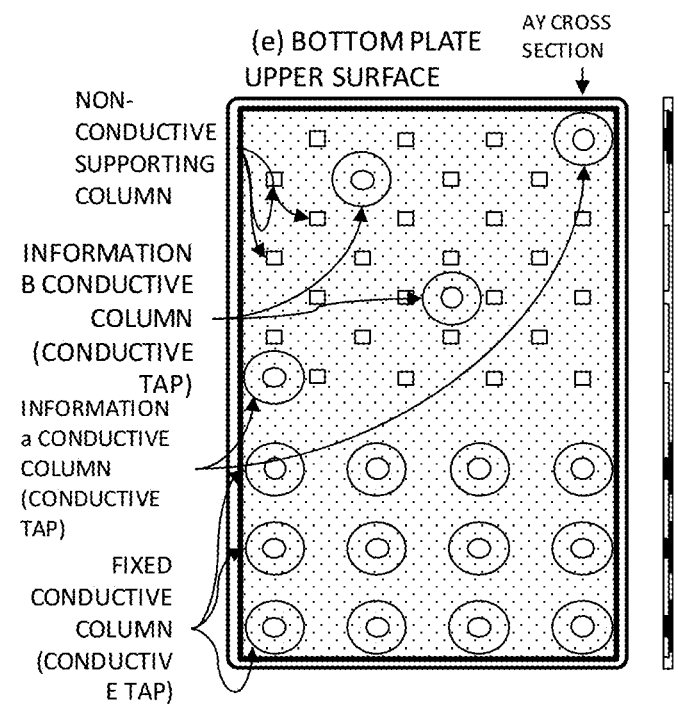
FIG. 18 is a structural example of an apparatus.

As shown in FIGS. 23(a) and 23(b), the conductors have the same shape as the conductors in FIG. 18, and the upper end face of the conductor is flush with the top plate upper surface, and thus plays the role of finger contact. This top plate shows a mechanism appropriate for carrying out ordinary molding with nonconductive bodies, in addition to multiple molding, and fitting and fixing conductive columns into the bottom plate. However, since the top of the conductive columns can be visually recognized, a blindfold sheet is necessary. It is desirable to have the thickness within about 0.005 to 0.015 mm including an adhesion layer in a case where graphics are printed onto this blindfold sheet, and fingers and electrodes of the ID area are conducted. Note that the degree of connectivity is highest when printing is done directly on the top plate. For the wiring of the upper surface of the top plate and bottom plate, wiring, finger contacts, and through holes of the upper surface of FIG. 4. FIG. 11, FIGS. 25 to 28, FIG. 32, respectively, can be applied. Note that the conductive columns of FIG. 22 and FIG. 23 may be conductive mold items and be of highly conductive material, and may be of metal.

As above, various embodiments related to electrodes formed with metals or plating, or by printing with conductive ink, and conductive columns molded with conductive material that serves both for electrodes and through holes are described, but wiring with a linear conductive member, finger contacts for conducting finger touches, contacts for conducting to two conductive units, through holes penetrating through plates for conducting in the thickness direction, and the like can be used in any combination as long as the original function is maintained.

Furthermore, if wiring or graphics cannot be directly formed on the flat surface side of an uneven plate, another sheet layer may be provided for forming wiring and graphics on the sheet. Also, although not shown, when an uneven plate is faced downward, wiring to the flat plane side which becomes the upper surface may be reduced as much as possible and the wirings may be embedded in the concave portions on the uneven side. Note that in the embodiment, both an ID area and a touch area are provided, however only either one is sufficient. In a case where only the ID area is provided, it is desirable to provide electrodes that the touch panel can detect just by placing a card. As one such method, wiring having a sufficient capacity of more than 25 cm is formed. To form wiring with a small area, it is possible to easily include a distance of 25 cm by forming the wiring in a wavy or spiral shape. The bottom plate upper surface has the same features as shown in FIG. 14, and so does an applicable top plate. However, since the lower part of the conductive column can be visually recognized, a blindfold sheet is required.

FIG. 24 shows a mechanism in which the cross section of columns of the bottom plate corresponding to the touch area of the upper plate in FIGS. 14 to 26 is reduced to suppress coupling of the conductive wires wired in the touch area.

Seventh Embodiment

[Mechanism of a C-CARD (Use by Placement, Structure: Single Layer without a Gap Layer, Conductive Wires and Electrodes Formed on Two Surfaces)]

The biggest reason for providing a gap layer is that the touch panel does not detect a finger touch even when a finger touches the surface of the card where no electrodes are disposed. Furthermore, the reasons for the gap layer is because due to the coupling effect of the conductive wires disposed around the electrodes, the touch panel overreacts (the detected area becomes oversized) to the electrodes and may not be able to detect the accurate position of an electrode, and because the coupling effect by the conductive wire is minimized. However, when an electrode such as a finger touches the ID area, if the touch panel responds by error processing when the touch panel detects an arrangement different from the arrangement of the electrodes of the ID area and/or when the touch panel detects a number of electrodes exceeding the number of electrodes, then there is no need to provide a gap layer inside the card. In that case, conductive wires and finger contacts may be printed (plating or the like or may be some other method) on the card surface, and electrodes may be printed on the back surface of the card (plating, conductor fitting, molding, or the like). However, it is necessary to at least provide a through hole between an electrode of the ID area and a conductive wire. By limiting the number of electrodes arranged on the card, if the touch panel detects a number of electrodes exceeding the limited number, it may respond by error processing. Furthermore, the deviation of the position of an electrode may be overcome by assuming beforehand the extent of deviation and having recognition of the arrangement of the electrodes and analysis of the conductive pattern based upon it. Naturally, since the accuracy of the position detection information of the electrodes is reduced, the number of different conductive patterns is reduced. However, there is an advantage that the manufacturing cost can be reduced. Therefore, in the above-described mechanism of the C-CARD in which an air gap layer is provided, the cost can be significantly reduced by manufacturing by a mechanism in which the air gap layer is filled with a material of low conductivity. In that case, since no gap layer is provided, it is possible to make the thickness about 0.2 to 0.4 mm although depending on the mechanism. Furthermore, it is also possible to use paper, the cheapest.

Note that since the card thickness is assumed to be within about 0.6 to 0.8 mm, it may not be necessary to provide electrodes of the touch area. If there is no gap layer, when touching an area other than predetermined positions of the predetermined touch area, the touched position will also be detected. However, if the conductive pattern including the detected positions of the electrodes of the ID area is different from an appropriate arrangement pattern, the touch panel responds by error processing. In this case, icons that clearly indicate the touch position of the touch area and touch positions must be registered. In that case, since the mechanism of the card does not have an air gap layer, it is possible to freely determine the touch position for each card. Furthermore, at least a portion of the ID area and the touch area may be mixed. That is, electrodes of the ID area and the touch positions of the touch area may be mixed. For the front and back surfaces of the card, either a method of directly printing or a method of pasting a sheet printed with graphics may be used, and if it is necessary to blindfold conductive wires, finger contacts, and electrodes, graphics may be printed.

Furthermore, if the line width of the conductive wire is within about 0.1 to 0.3 mm, even if the electrodes and the conductive wires are arranged on the same surface, since the detection capacity of the conductive wires is small and the electrodes can be properly detected, the conductive wires and the electrodes may be printed on the surface of the card, and through holes are not necessary. That is, the cards can be manufactured with at least one layer of materials such as paper and PET. In this case, the front surface of the card needs to be blindfolded by either method 1) or 2) and overlay printed with graphics, but the back surface does not need to be blindfolded, and the graphic may be printed directly if necessary.

Note that it is possible to have only, either the ID area or the touch area.

Figure 39:
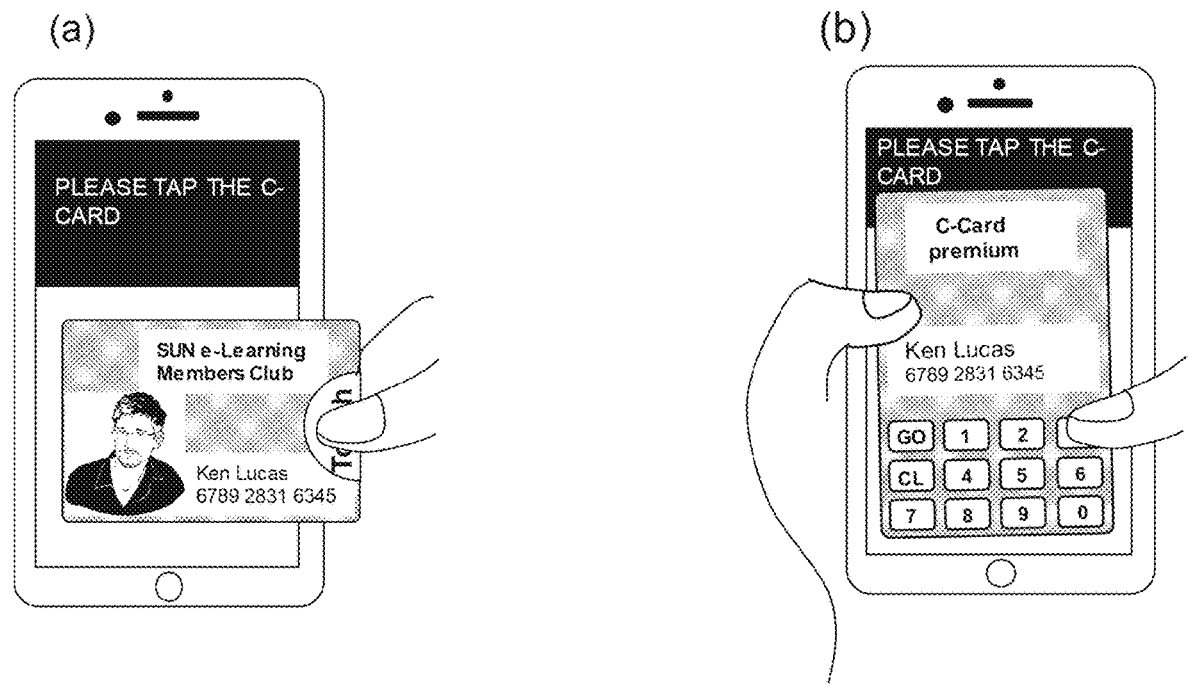
FIG. 39 is a structural example of an apparatus.
Figure 40:
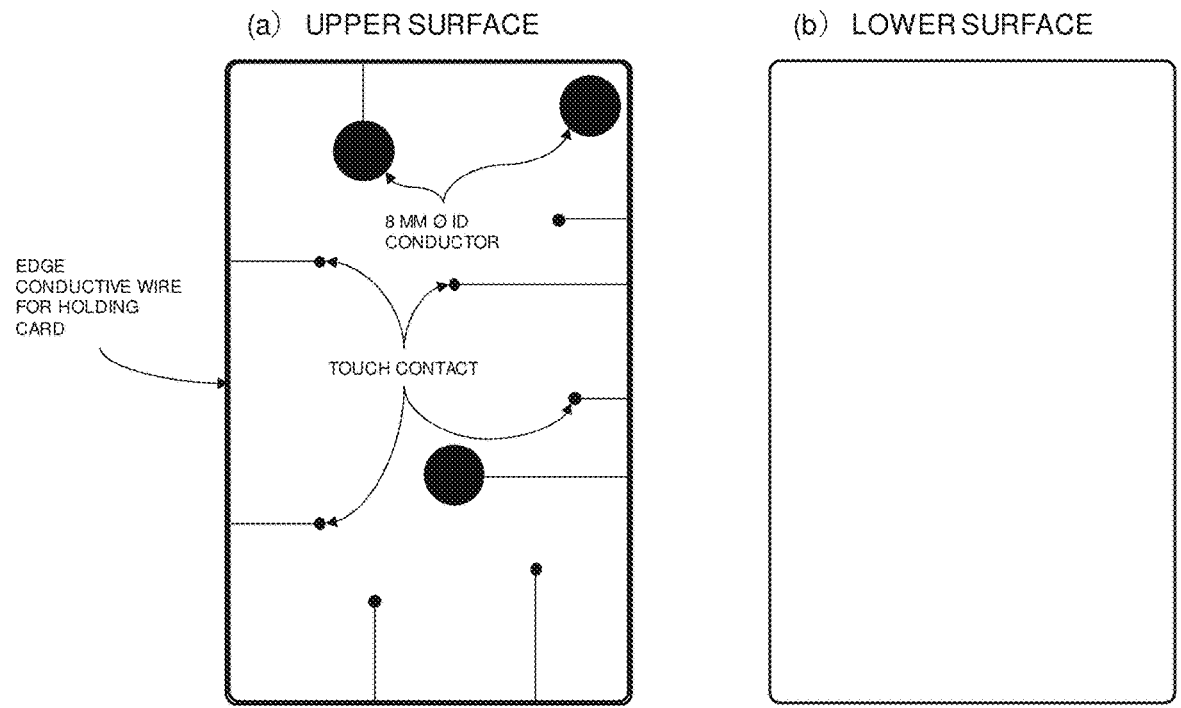
FIG. 40 is a structural example of an apparatus.
Figure 41:
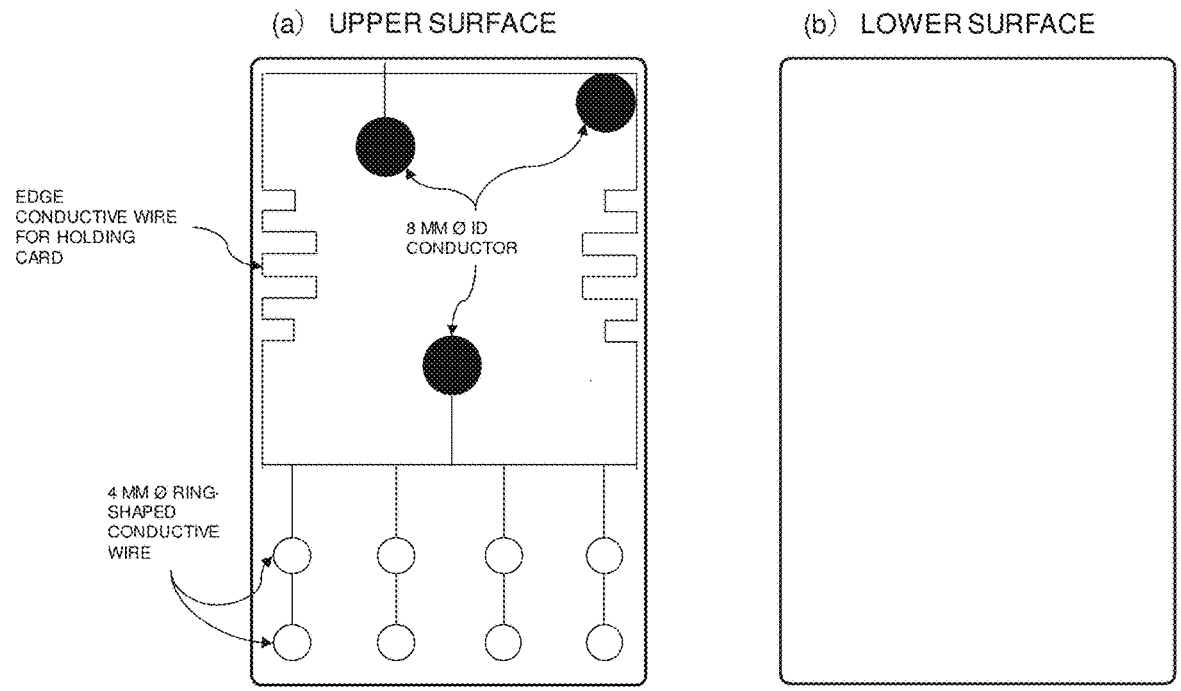
FIG. 41 is a structural example of an apparatus.

In a case where there is only an ID area, it is desirable to provide electrodes that can be detected by the touch panel just by the placement of the card. One such method is to form wiring that has enough capacitance exceeding 25 cm. For wiring in a small area, if wiring is in a wavy or spiral shape, it is possible to easily gain a distance of 25 cm. Furthermore, it is desirable to wire above the electrode taps to reduce the coupling effect of the conductive wires. Since it is difficult to maintain the planarity of paper, as shown in FIG. 39(a), an often-used way is by holding a predetermined area of the card with a finger and tapping the paper onto a smartphone. However, in the touch area (a plurality of touch areas need not be provided) formed in FIG. 25(b), according to the size and shape of the touch area, wiring with shapes such as an interdigital shape, a lattice shape, a wavy shape, a spiral shape, a circle shape, or a polygon shape may be aligned, and may be bonded to the wiring conducting to the electrodes of the ID area as shown in FIGS. 29 to 66. Note that although various forms of wiring for cards with a gap are shown, it is needless to say that wiring which suits conditions for cards without a gap and cards made of paper can be combined in any way.

As shown in FIG. 25(a) is wiring with wavy shape conductive wires above the electrodes, with through holes provided, and wiring for conduction to the electrodes of the ID area semicircles having a diameter of about 6 mm. Influence of the wiring is avoided since having the wiring in a ring shape would give rise to the flow of loop current. Note that the wiring surrounding the ID area in a rectangle shape is to shorten the conductive wire to the electrodes, and to prevent the occurrence of coupling by interference with other conductive wires. Furthermore, except for the conductive wire wired in a rectangular shape, the net shaped wirings above the ID area are made not to be connected with each other. This is to prevent loop current from flowing and to prevent the occurrence of coupling by reducing the wiring of the conductive wires above the electrodes. However, since the conductive wire is shortened, the retention capacity is lowered. For the finger contacts of the conductive wire touch area, circular conductors of about 3 mm in diameter are arranged in semicircles, and through holes are provided. As shown in FIG. 25(b), the electrodes of the ID area are disposed just below the wavy shaped wirings and electrodes are disposed just below the circular conductors of the touch area.

As shown in FIG. 26(a), a part of the rectangular wiring of the ID area of FIG. 25(a) is removed, and wiring is made so that loop current does not flow in the rectangular wiring. However, since the conductive wire is shortened, the retention capacity is lowered. In the electrode arrangement shown in FIG. 26(b), the electrodes of the ID area are disposed just below the wavy shaped wirings and electrodes are disposed just below the circular conductors of the touch area.

As shown in FIG. 27(a), the ID area is wired with a rectangular conductive wire, and the wiring is provided with the shortest distance from the rectangular wiring to the top of the through holes at the centers of the electrodes in ID area to minimize coupling by the conductive wires within the rectangular wiring. However, since the conductive wire is shortened, the retention capacity is lowered. Wiring for conduction to the electrodes of the ID area are wired linearly from the semicircles having a diameter of about 8 mm and their edges to the rectangular wiring. Influence is avoided by having the current flow linearly. For the finger contacts of the conductive wire touch area, circular conductors of about 3 mm in diameter are arranged in semicircles, and through holes are provided. In the electrode arrangement shown in FIG. 27(b), the electrodes are disposed just below the through holes in both the ID area and the touch area.

As shown in FIG. 28(a), a part of the rectangular wiring of the ID area of FIG. 27(a) is removed, and wiring is made so that loop current does not flow in the rectangular wiring. However, since the conductive wire is shortened, the retention capacity is lowered. In the electrode arrangement shown in FIG. 28(b), the electrodes are disposed just below the through holes in both the ID area and the touch area.

Wiring of the ID area of FIG. 29(a) is the same as that in FIG. 27(a), and the wiring for conduction to the electrodes of the ID area is wired linearly above the touch area and through holes are not provided. As shown in FIG. 29(b), electrodes are provided just below through holes only in the ID area. If the distance from the tap position to the lower surface of the card is less than about 0.6 mm, it is possible to detect capacitance no matter where on the conductive wiring wired in a straight line is tapped. Where to tap may be indicated by graphics or icons printed on the top of the card.

The wiring of the ID area of FIG. 30(a) is the same as that of FIG. 27(a), and the wiring for conduction to the electrodes of the ID area is wired with a single stroke with the wire folded back and forth to form parallel lines from left to right above the touch area, and through holes are not provided. For the same reason as in FIG. 29(b), electrodes are provided just below the through holes only in the ID area. The wiring in parallel lines in the touch area allows tapping anywhere in the touch area. Note that taps on the parallel conductive wires may serve only for conduction to the electrodes.

Figure 31:
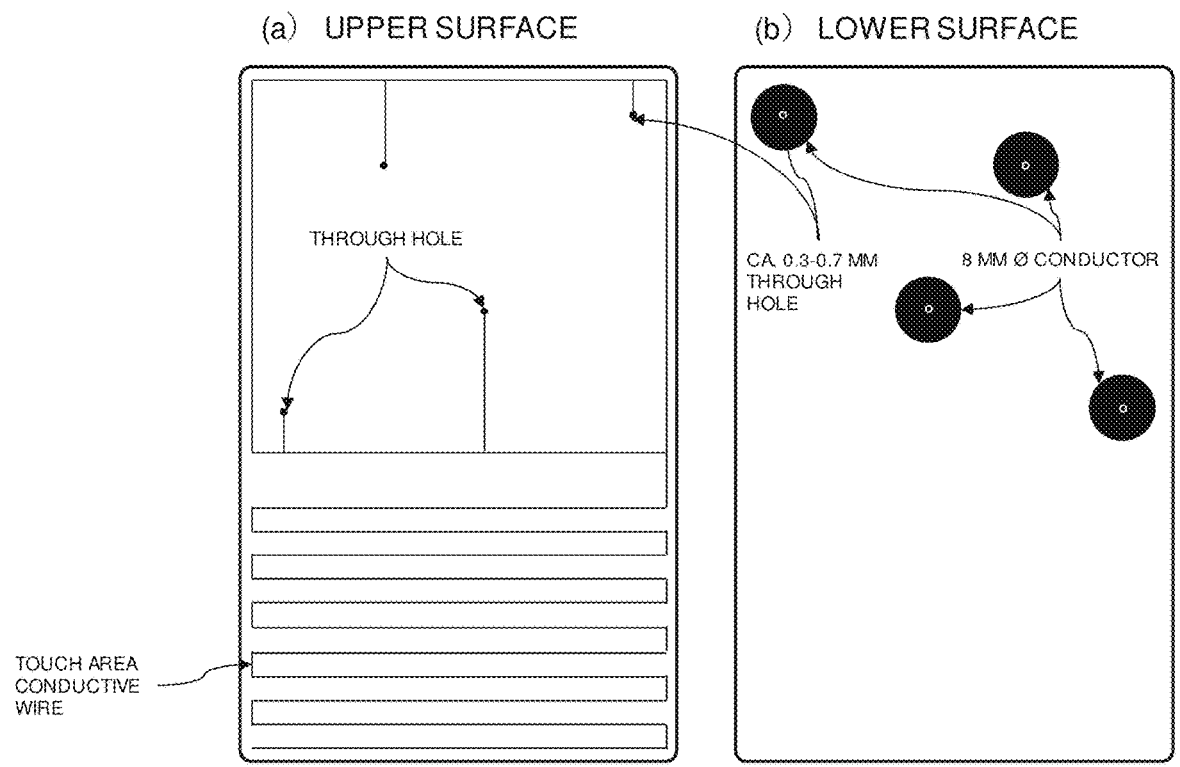
FIG. 31 is a structural example of an apparatus.
Figure 38:
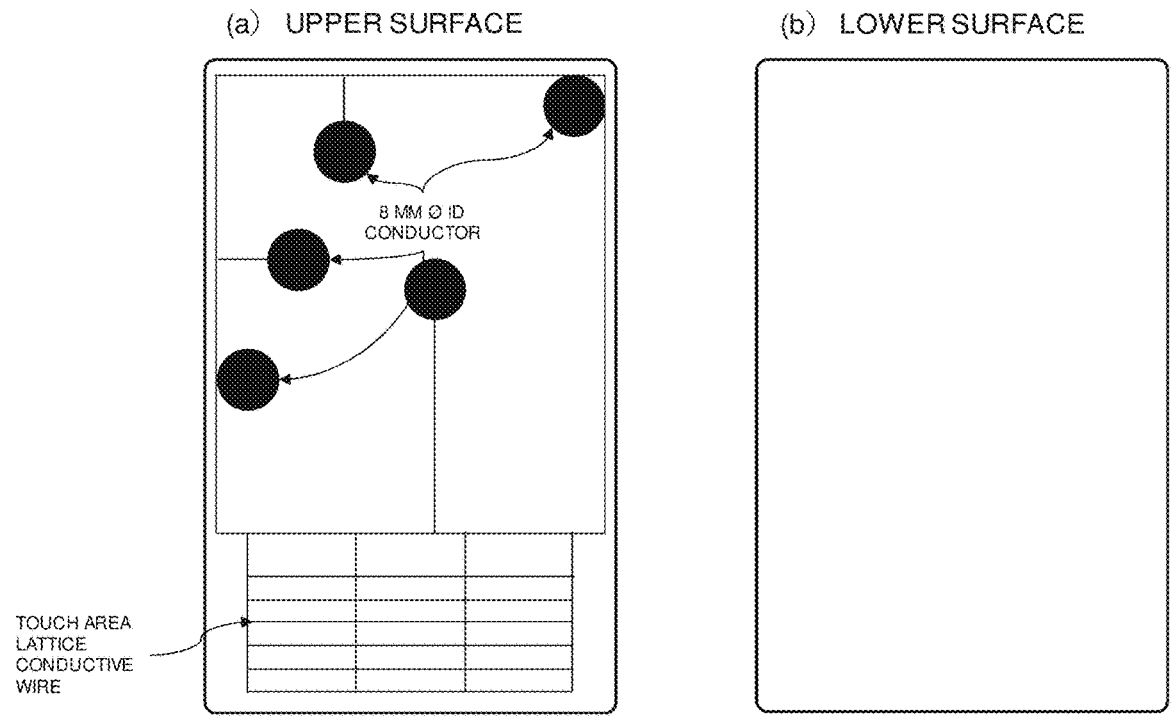
FIG. 38 is a structural example of an apparatus.

Shown in FIG. 31 is a diagram in which the intervals between the parallel wired lines in the touch area of FIG. 30(a) are set to ½, detection of taps is ensured, and the retention capacity of the wiring is increased.

Eighth Embodiment

[Mechanism of a C-CARD (Use by Placement, Structure: Single Layer without a Gap Layer, Formation of Conductive Wires and Electrodes on One Side)]

When an electrode such as a finger touches the ID area, if the touch panel detects an arrangement that is different from the arrangement of the electrodes in the ID area and/or detects a number of electrodes exceeding the actual number of electrodes, error processing proceeds. Since there is only a little influence by the detection capacitance of conductive wires and the electrodes can be detected appropriately, even if the electrodes and the conductive wires are arranged on the same face, if the line width of the conductive wires is within the range of about 0.1 to 0.2 mm, conductive wires and electrodes may be printed on the surface of the card and through holes are not necessary. Needless to say, as shown in FIGS. 25 to 31, it is not necessary to provide a gap layer inside the card.

That is, it is possible to manufacture the card with at least one layer of a material such as paper or PET. If electrodes are not provided at the touch positions, the electrodes in the ID area can be read and the touch positions can be freely determined for each card. Also, the arrangement of the electrodes in the ID area can be detected by an application on the touch panel side, and the functions of the touch positions can be made variable depending on the position where the card is placed or the orientation of the card. Also, at least a part of the ID area and the touch area may be mixed. That is, the electrodes in the ID area and the touch positions in the touch area may be mixed.

The conductive wires, the finger contacts, and the electrodes can be blindfolded by either the 1) direct printing method, or 2) the method of pasting a sheet printed with graphics for the front side and the back side of the card, and graphics may be printed if necessary. Furthermore, since the thickness of the card is within about 0.6 mm, the electrodes of the touch area are also unnecessary. Note that when there is error processing, it is necessary to perform registration of icons indicating the touch positions of the touch area and the touch positions.

Regarding the wiring of conductive wires and electrodes in embodiments for cards where "visual recognition of light and images from the touch panel is made by having at least a part of the card transparent or semitransparent," "formation of the wiring of conductive wires and electrodes is on one side," "formation of the ID area and the touch area is with overlap," "functions of the touch position are made variable according to the position on which the card is placed and the orientation of the card," and the like, and for cards having air gaps, and cards having conductive wires formed on the front side and electrodes on the back side, it goes without saying that the conductive wires and the electrodes can be formed on one side as long as functions are not impaired. That is, the technology described in this specification may be combined and used in any way.

In FIG. 32(a), the wiring of conductive wires and the electrodes of FIG. 28(a) and FIG. 28(b) are formed on the same surface. In FIG. 32(b), since electrodes and conductive wirings are not formed, and graphics can be printed directly, there is no need to provide a lower layer and the paper thickness can be reduced. Therefore, since the capacitance of a tap can be detected with certainty, properly speaking, it is not necessary to dispose electrodes in the touch area. However, electrodes are formed so that the capacitance can be properly detected even with an imperfect tap. Note that when reducing the paper thickness, it is desirable to have the thickness of the conductive wire be within 0.1 mm. Note that it is necessary to set the paper thickness to a degree that it does not affect the detection of the capacitance by the conductive wires.

In FIG. 33(a), the number of electrodes in the touch area of FIG. 32(a) is reduced, the ID area is expanded, and the touch area is formed in the ID area. This makes it possible to tap on touch areas that are unrestrictedly provided in graphics formed in the ID area on the surface. Note that in order to provide an element of a treasure hunt, it is not necessary to explicitly indicate the touch area. The same applies to FIG. 34(a) to FIG. 37(a) and FIG. 40(a). FIG. 33(b) is the same as FIG. 32(b).

In FIG. 34(a), the conductive wiring to the ID area in the touch area of FIG. 33(a) is further shortened, the ID area is expanded, and a part of the touch area is provided in the ID area. Furthermore, the wiring in the touch area is formed in a ring shape, and the electrodes in the touch area are eliminated. FIG. 34(b) is the same as FIG. 32(b).

In FIG. 35(a), the independent touch area in FIG. 34(a) is eliminated, a rectangular conductive wire is formed around the edge of the card, and all of the touch areas are provided in the ID area. This makes it possible to tap on touch areas that are clearly unrestrictedly provided in all graphics formed on the surface. FIG. 35(b) is the same as FIG. 32(b).

In FIG. 36(a), the wiring of the ring-shaped touch area of FIG. 35(a) is used as a small contact. As a result, if the contact position is not accurately tapped, conduction to the electrodes may not be possible. FIG. 36(b) is the same as FIG. 32(b).

In FIG. 37(a), the ring-shaped wiring in the touch area in FIG. 35(a) is eliminated, and the wiring in the touch area is made into a grid shaped conductive wire. Capacitance can be detected by tapping anywhere on the grid shaped conductive wires. Where to tap can be indicated by graphics or icons printed on the upper face of the card. Note that the role of a tap on the grid shaped conductive wires may be limited to conduction to the electrodes. FIG. 37(b) is the same as FIG. 32(b).

In FIG. 38(a), the rectangular ID area of FIG. 32(a) is expanded, and horizontally long grid shaped conductive wires are formed in the touch area. Because of the grid shaped conductive wires in the touch area, anywhere in the touch area can be tapped. Note that the role of a tap on the grid shaped conductive wires may be limited to conduction to the electrodes.

FIG. 38(b) is the same as FIG. 32(b).

FIG. 39(a) is a diagram in which the card is slightly bent to increase adhesion upon tapping the card onto a smartphone by holding the predetermined area for many cards, since it is difficult to maintain planarity with paper. FIG. 39(b) is a diagram in which the card is held with the thumb to prevent sliding when tapping the card onto a smartphone.

FIG. 40(a) shows a case where an independent touch area is eliminated, a rectangular conductive wire is formed around the edge of the card, and in regards with FIG. 36(a) where all of the touch area is provided within the ID area, as shown in FIG. 39(b), a rectangular conductive wire is provided around the edge of the card as a conductive wire for holding the card under the assumption that the card is held down with a thumb to prevent sliding when the card is held over a smartphone and the touch area is tapped. When the capacitance of the part being held with this thumb is detected and the capacitance of the tap of the touch area is detected, the number of electrodes in the ID area becomes three, due to the limit of five of the number of multi-touches to a smartphone. FIG. 40(b) is the same as FIG. 41(b).

As shown in FIG. 41(a), as in FIG. 39(b), when holding the card over the smartphone and tapping on the touch area, assuming that the card is held down with a thumb to prevent sliding, and wavy conducting wires for holding are provided on both the left and right. As in FIG. 40(a), the number of electrodes in the ID area is three. FIG. 41(b) is the same as FIG. 32(b).

Ninth Embodiment

[Example of the Use of a C-Card]

In FIG. 3 to FIG. 41, the card type thin plate C-Card apparatus has been described. Examples of use of such a C-Card will be described below.

Note that it is a matter of course that the design of a card type apparatus and its usage are not restricted to the following specific examples.

First, the user accesses a website whose service the person wishes use with a smartphone, tablet, or the like (hereinafter referred to as "smartphone"). Then, a C-Card is held over the displayed website. Then, the smartphone identifies the C-Card by recognizing the card ID provided for each C-Card.

Twelve icons are, for example, provided on the C-Card. By having the user touch an icon, it is possible to execute various operations and output of contents.

Also, using the display of a smartphone, the icon area or the area around the icon may be made to illuminate. By making it illuminate, it is possible to induce an operation by the user or draw the attention of the user.

To illuminate the C-Card, it is desirable to have all of or a part of the C-Card be transparent or translucent.

Specific uses of the C-Card are as follows.

(1) Music Card

Music cards are to be sold together with CDs. A PIN code is printed on the card face, and by entering the PIN code into a smartphone, live concerts may be viewed.

(2) Advertisement Card

Post photos that intrigue interest, motivate them to move over smartphones, and get them to smartphones. Contents with advertisement are displayed on the smartphone. Photographs are also shown on the icons. The card may be provided as a hand-out, by posting, as an insert, by DM, and at stores.

(3) Prepaid Card

A unique PIN code is printed on the surface of the card, and by touching the number icons corresponding to the PIN code, shopping and balance checking can be done. The address of delivery is required to be input only once since it gets linked with the smartphone ID, and thus input is unnecessary thereafter. Pin code entry is necessary every time. It may be made usable with any smartphone. Cards may be sold at convenience stores and the like.

(4) Ordering Card

Hold the card over a shopping site, touch a set icon, and enter the address for delivery and credit card information. Touch the icon corresponding to item setting/purchase, select the item you want to purchase, and register in items (1)-(10). Then, touch the item you want to purchase, enter the quantity on the screen of the smartphone, and purchase. Images of products (1) to (10) may be printed in advance as icons. Used for strengthening manufacturer's product net sales.

(5) Sports Card

Photographs of various athletes of baseball, football, sumo wrestling, or the like, are printed on the card surface, and by touching an icon a content may be browse or tickets may be purchased. The sports cards may be sold, or sponsor companies may offer them free of charge.

In addition, the card may be utilized for various uses such as for gift cards, idol contents, inbound information, sound content cards, security one-time passwords and the like.

Tenth Embodiment (Background of the Invention)

Regarding the use of a credit card or a card for personal authentication, for example with a credit card, when an individual uses a credit card for online shopping, the goods can be purchased by entering information written on the card such as the card number, the name, the expiration date, and the security code.

However, if the information displayed on the card is leaked, others may illegally use it by using the information such as the card number.

Therefore, in order to solve such problems hereafter, a smart card which performs authentication by acquiring information from the card by wireless or by transmitting and receiving data by wireless is proposed.

(Problems to be Solved by the Invention)

However, current information processing devices such as smartphones and tablets may not support all wireless systems installed into smartcards. Furthermore, such smart cards are very expensive due to the presence of wireless devices.

The object of the present invention is to provide a simple, inexpensive, and highly safe authentication means.

Note that in the present invention, not only such authentication cards but cards also for bank financial settlements, entering and leaving, access to information, browsing of contents, and operation authority of equipment are included. In other words, authentication cards are the keys to various personal authentications, settlements, and access to information.

To solve the above problems, the following configurations are adopted.

One aspect is exemplified by the following information processing apparatus or thin plate shaped apparatus.

(1) An information processing apparatus comprising a panel that detects the arrangement of a conductive pattern when the surface of a thin plate shaped non-conductive substrate or a medium having an ID area in which a plurality of conductive patterns are formed on the back side of the said surface makes contact, and a control unit, and the said control unit performs further input of information through the said panel when the arrangement of the conductive pattern detected by the said panel matches the pattern arrangement registered in a storage device accessible from the said control unit.

(2) An information processing apparatus according to (1), further comprising a display superimposed on at least a portion of the said panel, wherein the said control unit further performs output of information to the said display.

(3) An information processing apparatus according to (2), wherein the said control unit limits according to a predetermined rule either information input through the said panel or information output to the said display or both, when the arrangement of the said conductive pattern cannot be detected.

(4) An information processing apparatus according to one of (1) to (3), wherein the said control unit executes post-authentication processing when the said input information can be authenticated with predetermined authentication information.

(5) An information processing apparatus according to one of (1) to (4), wherein the said control unit sets input areas by touch operations at positions on the said panel determined from the said pattern arrangement and information is received from the said input area.

(6) An information processing apparatus according to (5), wherein graphics for guiding touch operations are formed at touch positions on the said medium corresponding to the said input area determined from the said pattern arrangement.

(7) An information processing apparatus according to (5) or (6), wherein the touch area on the said medium corresponding to the said input area determined from the said pattern arrangement is formed with one or more windows using transparent or semi-transparent material, and graphics for guiding touch operations are displayed in the display area on the display corresponding to the said input area.

(8) An information processing apparatus according to (7), wherein the control unit displays one or more graphics including at least one of numbers, characters, symbols, marks, and icons in the said window, receives touch operations to the said graphics, and performs further processing when the type and/or color of the graphics received by the said touch operation matches the predeterminedly set operational object information.

(9) An information processing apparatus according to (8), wherein the control unit performs further processing if the type of the received graphics matches those predeterminedly set and/or the order of the colors of the received graphics matches the predetermined order, when two or more of the said touch operations are received.

(10) An information processing apparatus according to (7), wherein the control unit displays graphics in the said window and acquires positions by the said touch operation to the said window and a trajectory by an operation of tracing the area.

(11) An information processing apparatus according to (5) or (6), wherein the touch area on the said medium corresponding to the said input area determined from the said pattern arrangement has a window formed with a transparent or semi-transparent material printed with graphics including at least one or more numbers, characters, symbols, marks, and icons. The said control unit changes the display of the positions on the said display corresponding to the said one or more graphics, receives touch operations to the said graphics via the said panel, and performs further processing when the type and/or color of the graphics received by the said touch operation matches the predeterminedly set operational object information.

(12) An information processing device according to (11), wherein when two or more said touch operations are received, the said control unit performs further processing if the order of the received graphics matches the order predeterminedly set.

(13) An information processing apparatus according to any one of (5) to (12), wherein the said input area and the said ID area, at least partially overlapped.

(14) An information processing apparatus according to any one of (1) to (13), wherein the control unit sets a second input area in an area where the said medium is not placed, and information from the said second input area is obtained.

(15) An information processing apparatus according to any one of (1) to (14), of which the said information processing apparatus further comprises a memory and the said authentication information is stored in the said memory.

(16) An information processing apparatus according to any one of (1) to (15), further comprising a communication unit that accesses networks, and wherein the said control unit acquires the said authentication information from a server on the said network via the said communication unit.

(17) An information processing apparatus according to any one of (4) to (16), wherein the processing after the said authentication includes further authentication processing using identification information uniquely identifying the said information processing apparatus.

(18) An information processing apparatus according to any one of (1) to (17), wherein the control unit allows input only when the arrangement of the said conductive pattern detected by the said panel matches the pattern arrangement registered in a storage device accessible from the said control unit or within a predetermined time from when a guidance (including a voice guide) for the input of information is output

(19) A thin plate shaped device acting on a panel comprising a sensor for detecting physical quantities, an ID area with a conductive pattern is arranged where positions with the said physical quantities are detected by the said panel, a touch area for detecting a physical quantity change by a touch operation on the upper surface by the said apparatus placed on the said panel, and non-conductive base material.

(20) A thin plate shaped apparatus according to (19), wherein the said conductive pattern has a conductive portion having a predetermined area that the panel detects.

(21) A thin plate shaped apparatus according to (19) or (20), wherein the said touch area is provided with conductive wires for conduction to the conductive pattern of the said ID area.

(22) A thin plate shaped apparatus according to any one of (19) to (21), wherein the said ID area has wiring formed by conductors having a predetermined area and ultra-thin conductive wires connecting them.

(23) A thin plate shaped apparatus according to any one of (19) to (22), wherein at least a portion of the outer edge of the said apparatus is provided with conductive wires for conduction to the conductive pattern of the said ID area.

(Embodiment for Carrying Out the Invention)

The invention according to the tenth embodiment can be realized by using the C-Card (hereinafter, simply referred to as "card") described above.

[Personal Authentication System]

FIGS. 42 to 46 describe examples of the use of the C-Card for personal authentication. Payments with various cards, such as current credit cards, require the use of expensive card readers for reading IC chips or magnetic stripes. Furthermore, the ID of a card that can input and output information in a non-contact manner may be skimmed during transmission, particularly magnetic cards, which may be easily copied and forged.

Figure 42:
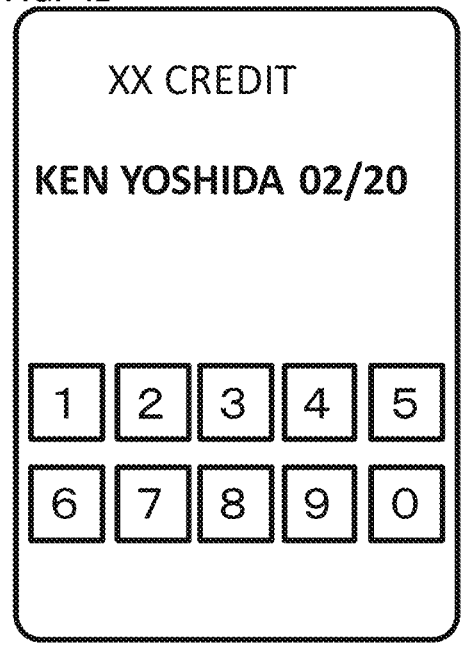
FIG. 42 is an embodiment using a C-Card as a credit card with a numeric keypad.

In FIG. 42, the C-Card is used as a credit card.

First, the user places the C-Card on the touch panel of an informational device such as a smartphone. Then, the information device recognizes the credit card ID from the arrangement pattern of the electrodes provided in the ID area. Next, the user enters a password from the numeric keypad printed in the touch area. The information device refers to the credit card ID and password registered in a memory provided inside or outside of the information device or in a server accessible via the network and compares them with the entered credit card ID and password to determine whether the association is correct. Then, if the association is determined to be correct, a credit card settlement processing is executed.

Figure 43:
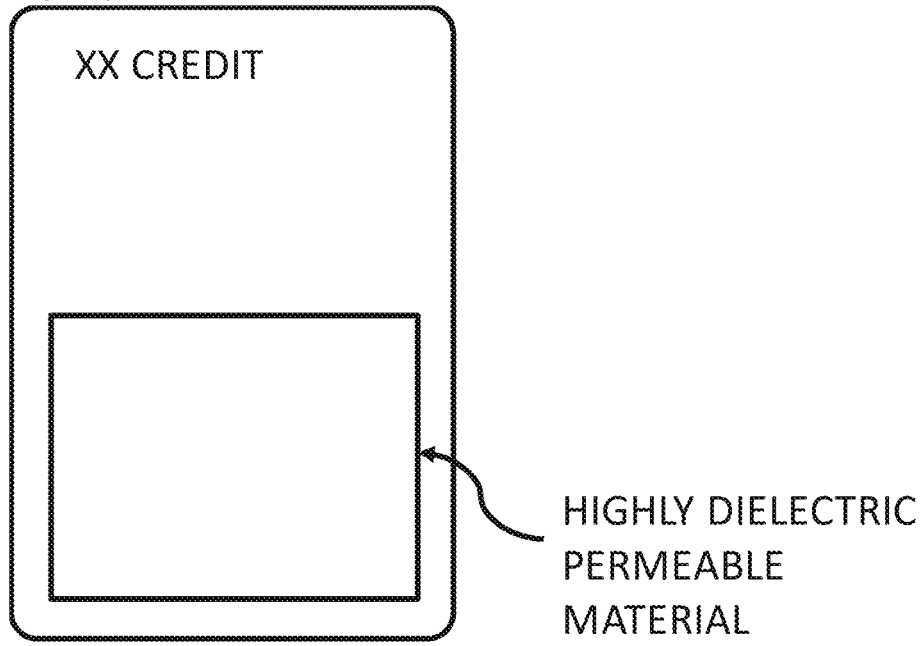
FIG. 43 is an embodiment using a C-Card as a credit card with a transparent area.

FIG. 43 is a diagram describing a case in which a C-Card is used.

For a C-Card, a portion of the touch area can be formed of transparent or semi-transparent materials. The user places the C-Card on an information device and signs in on the transparent or translucent area with fingers or stylus pens. The information device recognizes the credit card ID from the arrangement pattern of the electrodes provided in the ID area, acquires the feature points of the signature, and compares them with the feature points stored priorly in the memory. Then, only when the association of the credit card ID and the signature is determined to be correct, a credit card settlement processing is executed.

Currently, when payments are made on the Internet, the payments are possible by entering the name, the card number, the expiration date, and the security code on the credit card or the prepaid card. For this reason, cases are increasing where upon handing over a credit card for payments at a store or the like, the information on the card is copied, and the information is abused for paying on the net. When making a net settlement, since settlements using the C-Card can be done only by having the C-Card user tap the card onto a smartphone or some other information device 200 of the user, unless the C-Card is stolen, the number of the credit card or the like cannot not be entered and thus settlements through impersonation by others cannot be done.

Furthermore, by linking the ID of an information device 200 such as a smartphone and the C-Card, the C-Card can be prevented from being used even if it is stolen by having the smartphone of the user be required for its use. Even if both the smartphone and the C-Card are stolen, safe personal authentication can be performed by requiring fingerprint authentication when using the C-Card or by requiring password entry as shown in FIG. 42.

[Security System]

Forged products and illegally distributed products manufactured in developing countries are widespread. Especially, the elimination of infringement goods of high-grade goods such as brand name goods, and foods and pharmaceuticals which affect human life is a worldwide challenge. FIG. 44 to FIG. 45 describe examples of the use of the C-Card in security systems, such as product guaranteeing systems.

FIG. 44 is a diagram describing a case in which authenticity judgment is executed using a C-Card. In this case, a numeric keypad is printed on the C-Card. A C-Card may be obtained by a user at the time of purchase as a warranty card for product warranty by enclosing one in a package. The user may either activate a C-Card security application to provide product warranty on an information device or access the security page on the product website. Then, the C-Card is tapped against a smartphone or some other device, and the security code is entered from the numeric keypad. Then, the smartphone or the like compares the conductive code decoded from the arrangement of the electrodes of the C-Card with the security code input by the user and carries out an authenticity judgment based on whether the association is correct or not. The result of the authenticity judgment can be displayed on the display of the information device.

Furthermore, in addition to the result of the authenticity judgment, various kinds of information such as the manufacturing dates of products, validity periods, product contents can be obtained and displayed on the display. In this case, the card shown in FIG. 45 may be used. In FIG. 45, icons with "Manufacturing date," "Expiration date," and "Product contents" and the such are printed in the touch area. In addition, a security code is written on the card. The user enters the security code on the card into the information device prior to tapping the C-Card. The user then taps the C-Card on the information device. Then, the card ID obtained from the arrangement pattern of the electrodes provided in the ID area is linked with the security code. Next, the user touches the printed icon corresponding to the desired information and then removes the C-Card from the information device. The information device then displays information corresponding to the icon touched by the user.

FIG. 46 is a diagram describing the use of a C-Card upon receiving items or the like.

In this case, a C-Card is attached to the package of the products or the receipt received by the user. Card IDs are defined in the conductive patterns of the electrodes arranged on C-Cards, and the card IDs are linked with information only known to the user.

When a deliverer taps a C-Card on an information device, information linked to the conductive pattern is outputted on the touch panel of the information device. When the equipment, the deliverer can carry out personal authentication by having the information device display information of the user on the display.

[Ticket Purchase/Coupon Acquisition and Authentication]

Figure 47:
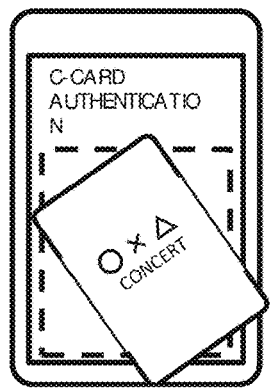
FIG. 47 is a diagram describing a case where a C-Card is used for the authentication of a ticket/coupon.
Figure 48:
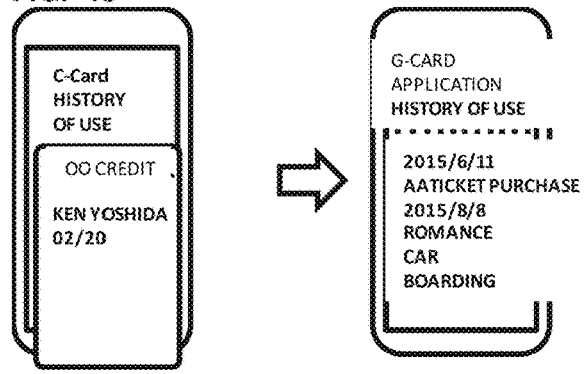
FIG. 48 is a diagram showing an example of the display of the use history of a C-Card.

FIG. 47 and FIG. 48 are diagrams describing the implementation of authentication for tickets and coupons using a C-Card.

In this embodiment, tickets/coupons are provided in the form of a C-Card. When this ticket is used for entry or as a coupon, the information device operates as a tablet for ticket/coupon authentication, a terminal for a dedicated reader, or the like. In this example, assume that the information device is running an application for checking tickets/coupons. When the user taps the C-Card, the information device recognizes the card ID from its conductive pattern. By removing the C-Card from the information device, the display shows a ticket/coupon code entry screen. When the user enters a ticket/coupon code, the information device refers to the credit card ID and password registered in a memory located inside or outside the information device or in a server or the cloud accessible via the net (hereinafter collectively referred to as "cloud or the like") and the entered card ID and the ticket/coupon code are checked to determine if the association is correct. If the association is judged to be correct, entry to venues or exchange for coupons/use of coupons is approved.

Note that since the positions of the numeric keypad can be uniquely recognized by the arrangement of the conductive pattern, with a C-Card with a numeric keypad printed on it, the ticket/coupon code may be entered by placing the C-Card on the touch panel and tapping the numeric keypad.

In order to prevent the reuse of tickets/coupons once used, an informational device may access the cloud, and in the cloud erase the linkage between the corresponding C-Card card ID and ticket/coupon code. Furthermore, as shown in FIG. 48, when a C-Card is tapped on an information device such as a user's smartphone, the information device may access the cloud or the like to acquire the use history of tickets/coupons corresponding to the C-Card card ID, and the use history may be displayed on the information device display.

Figure 49:
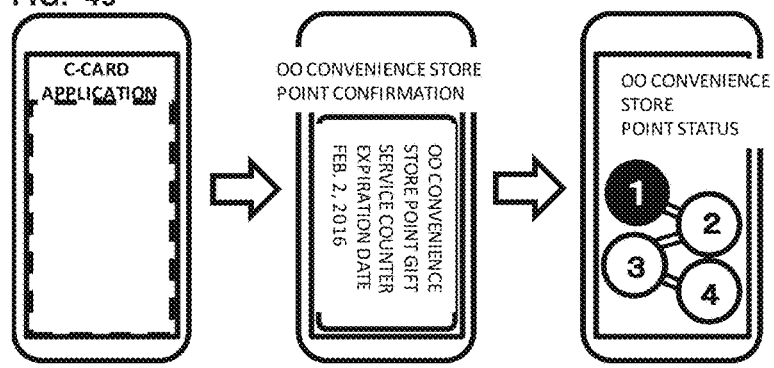
FIG. 49 is a diagram showing an example of the display of the status of a point service using a C-Card.
Figure 50:
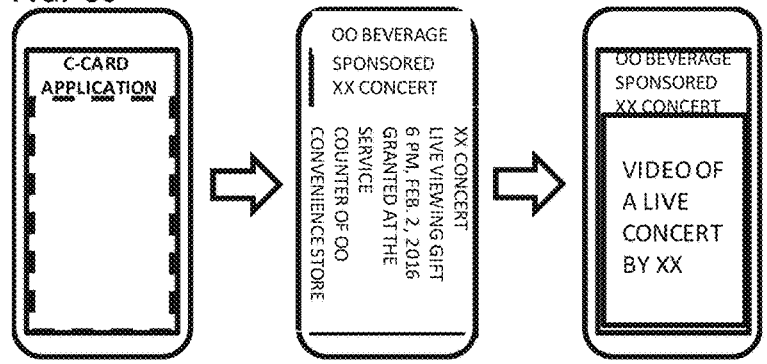
FIG. 50 is a diagram showing an example of the display of a service content such as a coupon using a C-Card.

FIG. 49 and FIG. 50 are diagrams describing the implementation of contents/coupons/point services for attracting customers using a C-Card.

FIG. 49 is a diagram describing an example where the status of a point service using a C-Card is displayed. When the user taps the C-Card on an information device such as a smartphone, the information device recognizes the card ID from the arrangement of the conductive pattern of the C-Card. Then, by accessing the cloud, the expiration dates of points and the amount of acquired points corresponding to the card ID are acquired and displayed on the display. This enables the user to check expiration dates and the amount of acquired points. Furthermore, FIG. 50 is a diagram showing an example where the contents of services such as coupons by the C-Card are displayed. By tapping the C-Card on an information device such as a smartphone, the user can check, for example, the contents of the coupons obtained from the purchase of a concert ticket.

Coupons/points recorded on a C-Card can be used by the user in a variety of stores. In addition, the user can use coupons/points for network services by activating a C-Card application on his/her smartphone or some other informational device and tapping the C-Card. Furthermore, as shown in FIG. 49 and FIG. 50, the user can also view service contents of current coupons/points recorded in the C-Card and the status of expiration dates. In addition, the user may move coupons/points to an application for using a G-Stamp (a stamp-type code generating apparatus) with an informational device 200, such as a smartphone or the like and use them. When a user desires to enjoy acquired contents, the user activates a C-Card application on an information device such as a smartphone or tablet. And when the user taps a C-Card on an information device such as a smartphone or tablet, various contents such as games, photos, and videos can be relayed from the C-Card to the information device. In addition, the user may operate contents for games and the such by placing the C-Card on a smartphone or tablet and moving and rotating it. Since the methods for recognizing the movement/rotation of the C-Card are as described in the international publication WO2017/142093, an application by the applicant of the present application, descriptions will be omitted here. When the user activates a C-Card application and uses the C-Card, the service provider may provide further services using various methods of communication that can be received by informational devices such as a user's smartphone. Also, the C-Card may be used not only for attracting customers to a service counter, but it may also be made to be usable without having to go to a service counter.

[Content/Coupon/Point Customer Attraction Services]

A C-Card can be used for content viewing services and customer attraction services through the saving of coupons/points. The user acquires a C-Card for content, coupon, and point provision by a predetermined manner from the service provider. Note that as the predetermined method, the user can acquire a C-Card by receiving those attached to direct mail (DM), catalogs, magazines, newspapers, products, or through distribution in stores, facilities or on the street.

[Stamp/Point Card Issuing System]

FIG. 51 to FIG. 54 describe the use of a C-Card as a stamp and a point card. Here, an example of adding and erasing stamps and points will be described.

Conventionally, when making a payment at a store, stamps have been stamped on paper stamp cards, and points have been stored in plastic point cards. However, as the number of cards increases it is difficult for the user to keep control. In addition, since the user cannot know how many points are stored and until when they are valid from a plastic card the user needs to go through the trouble of net registration and searching to acquire these pieces of information.

Figure 51:
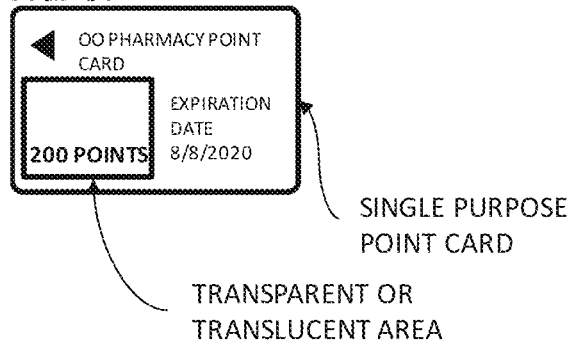
FIG. 51 is a diagram showing an example of the use of a C-Card as a dedicated reward point card of a specific store.
Figure 52:
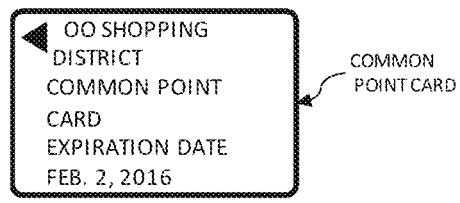
FIG. 52 is a diagram showing an example of the use of a C-Card as a reward point card common to a plurality of stores.

FIG. 51 describes an example of the use of a C-Card as a dedicated point card for a particular store. Furthermore, FIG. 52 is a diagram describing an example of the use of a C-Card as a common point card for a plurality of stores.

In the example of FIG. 51, a C-Card comprises a transparent or a semi-transparent area. The transparent or translucent area can display and visualize the status of currently stored stamps or points displayed on an information device display.

Figure 53:
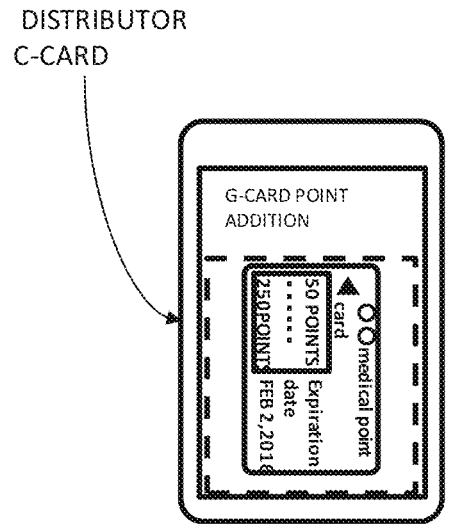
FIG. 53 is a diagram showing an example of the addition/removal of stamps/reward points recorded on a C-Card.

FIG. 53 is a diagram describing the addition/deletion of stamps or points recorded on a C-Card. The user presents a C-Card in a store. The user taps the C-Card on information device such as a smartphone, a tablet or the like that is provided in the store for business use. That is, with this service, the store vendor need not use a dedicated machine.

This operation allows the smartphone or tablet to access the cloud or the like. The cloud or the like performs point addition/deletion. Using such a procedure, the user can recognize the card ID, the status of currently stored stamps and points by the display of an information device such as a smartphone or tablet, and point removal can also be done.

Figure 54:
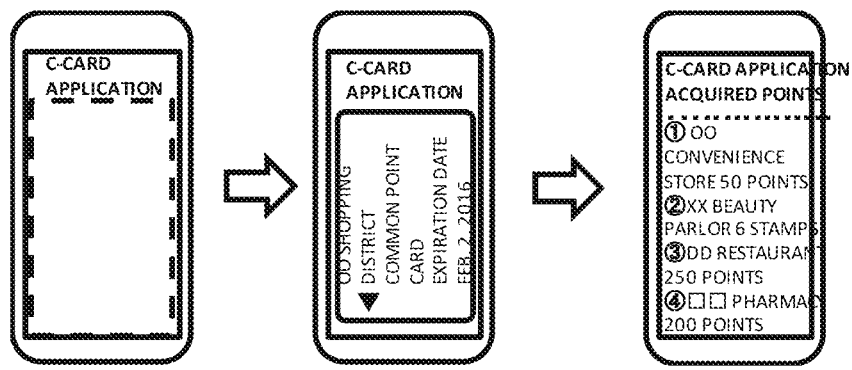
FIG. 54 is a diagram showing an example of the execution of different processings depending on the orientation of the placed C-Card.

The user can download a C-Card application via an information device such as a smartphone or access a C-Card website or a predetermined website and display C-Card recognition pages. When the user taps a C-Card on an information device 200 displaying a recognition page, the information device 200 recognizes the card ID from the arrangement of the conductive pattern of the C-Card. The information device accesses the cloud or the like, acquires information such as a store ID corresponding to the card ID, the amount of reward points acquired in the store, expiration dates, and the like, and displays the information on the information device. Thus, the user can check stored points for each store at any time by an information device 200 such as a smartphone. Furthermore, as shown in FIG. 54, when placing a C-Card in a predetermined direction, for example, in a direction different from the direction shown in FIG. 53, the information device 200 such as a smartphone may only display information recorded on the C-Card.

[Toys/Games]

FIG. 55 and FIG. 56 describe examples of a game using a card type apparatus. For game cards or trading cards using a C-Card, the user places the C-Card on an information device 200 having a touch panel such as a tablet. Since the C-Card is identified by the touch panel, the user can enjoy games by moving and rotating the C-Card. In addition, since obtained scores, power, items, and the like can be recorded in the cloud, users can play competitive games or enjoy games in the same way as in game arcades with the C-Card.

Furthermore, if a game arcade or a shopping mall is provided with a game machine capable of communicating with a C-Card, the C-Card becomes a tool for selling to users at the game arcade or the shopping mall. Users can play games by purchasing a C-Card in a game arcade or a shopping mall equipped with game machines that they can enjoy with a C-Card. In addition, the users can return to their homes and enjoy the continuation of games using the C-Card with tablets owned in their homes. Users may also tap a C-Card on third party tablets or the like and provide part or all of C-Card IDs or game information.

The user places the C-Card on an information device. Since the information device can identify the orientation of cards from the arrangement of conductive patterns, users can enjoy games by moving and rotating the C-Card.

A touch area is provided on the surface of a C-Card. The user can do game operations by touching the touch area of the C-Card. Information devices and game machines can accurately recognize the placement position of the C-Card. Therefore, as exemplified in FIG. 56, information devices and game machines can recognize the arrangement of the touch area provided in the C-Card. The touch area may be a transparent non-conductive area (insulator) with material such as acrylic. In this case, when the user manipulates the touch area of the C-Card, the touch panel of the information device or the game machine can recognize the touch of the finger directly through the C-Card. That is, the user can operate an information device or a game machine through a C-Card even when the user manipulates the C-Card with the C-Card intervening between the finger and the touch panel. Of course, since the touch area can be uniquely recognized by the arrangement of the conductive pattern, icons for operations in the touch area may be displayed through the transparent area of the C-Card from the display of the touch panel of the game machine.

[Authentication]

FIG. 57 is a diagram describing the implementation of an authentication card by using a C-Card.

In the drawing, the C-Card comprises an ID area and a touch area (an input area). In the lower layer of the ID area, a conductive pattern (electrodes) defining the card ID is provided. In the touch area, icons such as "REGISTRATION," "AUTHENTICATION," and numbers are printed, and electrodes are provided below the icons.

The information device 200 identifies the position and orientation of the C-Card from the arrangement of the conductive pattern (electrodes), and the coordinates (area) on the touch panel corresponding to the positions of the icons labelled in the touch area "REGISTRATION," "AUTHENTICATION," "ENTER," from "0" to "9" or the like. When the user, for example, touches the "REGISTRATION" icon, an action on a dielectric occurs. And the information device detects the touch operation of the user to the "REGISTRATION" icon and executes registration processing. In the registration processing, touch operations on "0" to "9" and "ENTER" are detected, and the registration password is received. The information device registers the received registration password in the memory inside of the information device.

Similarly, when the user touches the "AUTHENTICATION" label, the information device initiates authentication processing, detects touch operations on "0" to "9" and "ENTER," and receives the password for authentication. The information device compares the received authentication password with the corresponding password registered in the memory and outputs the result of comparison on the touch panel display.

Figure 58:
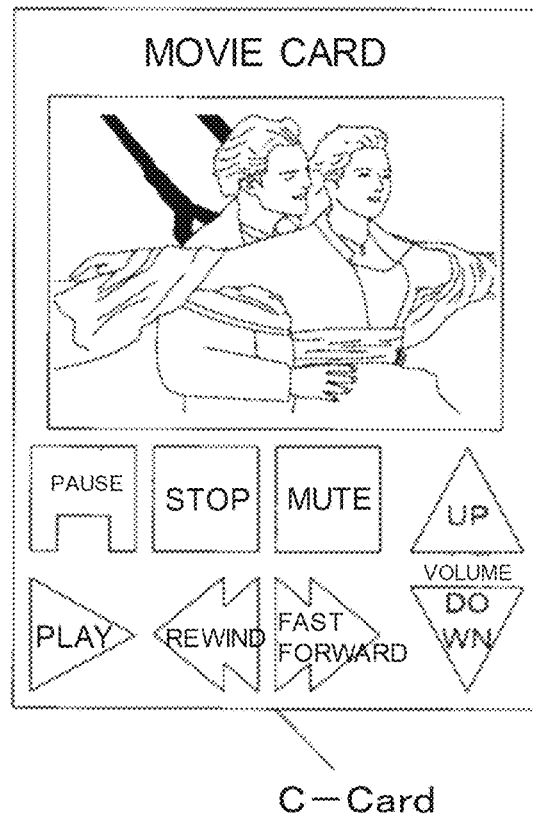
FIG. 58 is an embodiment using a C-Card as a movie card.

FIG. 58 is a diagram showing the use of a C-Card as a movie card.

The top half of the card contains pictures or photographs of one movie scene. When a C-Card is tapped on an information device, which movie it corresponds to is identified from the arrangement pattern of the electrodes. When "PLAY" is touched by the user, the movie is played on a display (which may be an information device display, or a display connected to the information device by wire or wirelessly). When "STOP" is touched, playback is stopped. When "MUTE" is touched, the sound is muted. Also, when the user wants to change the volume, he/she touches "UP" or "DOWN," touches "REWIND" to rewind, and touches "FAST FORWARD" to fast forward.

Figure 59:
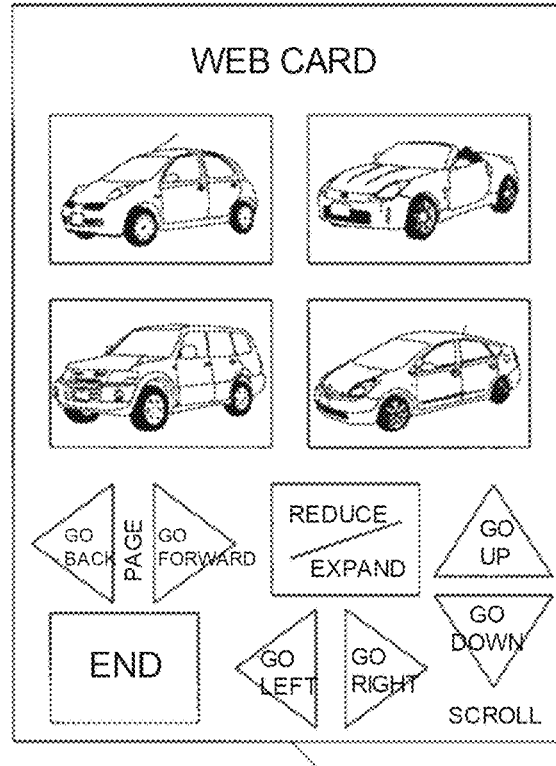
FIG. 59 is an embodiment using a C-Card as a Web card.

FIG. 59 is a diagram showing the use of a C-Card as a web card.

Pictures of cars are shown on the C-Card. When the user touches any one of the pictures, a web page associated with the picture shown is accessed. When the user wants to go to the next page from the shown page, he/she touches "ADVANCE," and touches "BACK" to go back to the previous page. To change the size of the photos or the like on the page, "ZOOM IN/ZOOM OUT" is touched. To scroll the screen, "UP," "DOWN," "LEFT," OR "RIGHT" is touched. To end web browsing, "EXIT" is touched.

Figure 60:
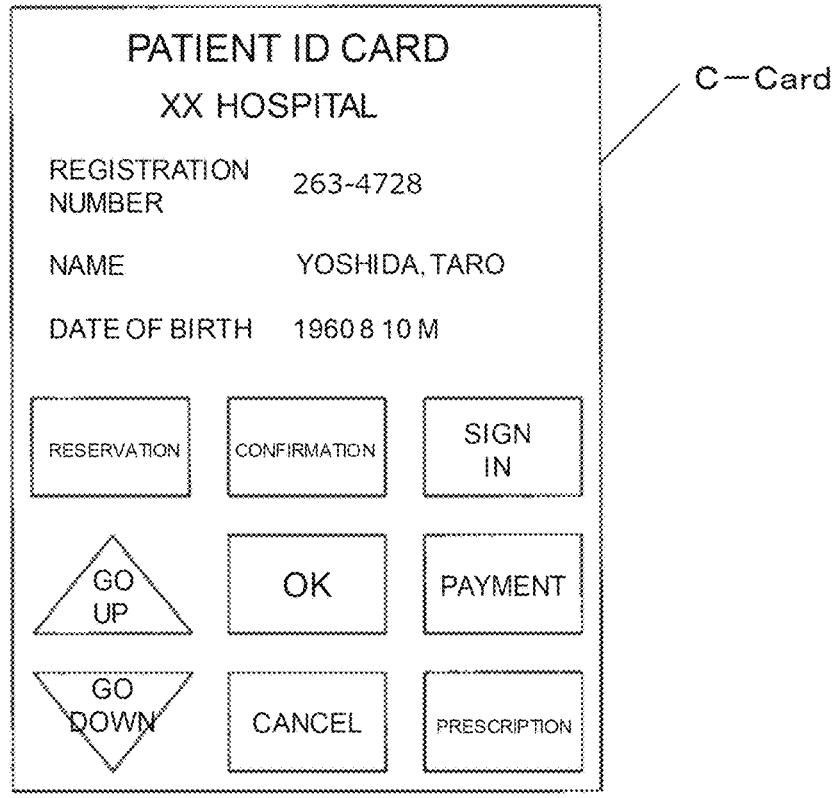
FIG. 60 is an embodiment using a C-Card as a patient ID card.

FIG. 60 is a diagram showing the use of the C-Card as a patient ID card.

In hospitals and clinics, information devices such as tablets and dedicated terminals are installed. When a user places a C-Card on an information device, first, the user's personal information is recognized by the arrangement pattern of the conductors. When the user touches "SIGN IN,"

reception processing is performed. After a medical examination, to make a settlement, "SETTLEMENT" is touched, and to receive a prescription, "PRESCRIPTION" is touched.

Figure 61:
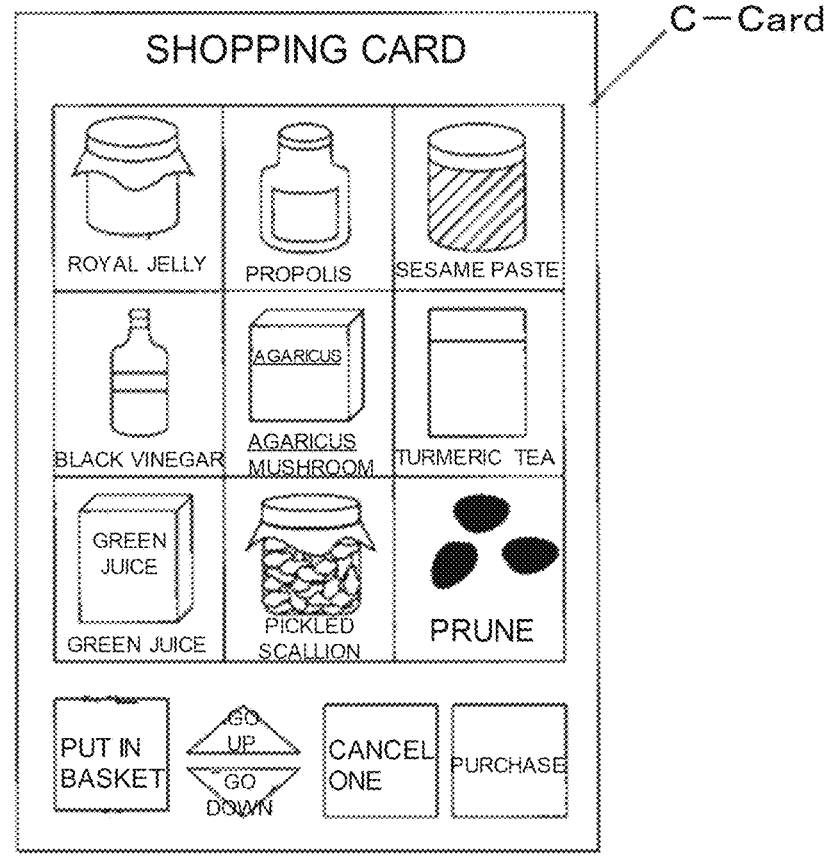
FIG. 61 is an embodiment using a C-Card as a shopping card.

FIG. 61 is a diagram showing the use of a C-Card as a shopping card.

In a store such as a convenience store, one or more information devices such as tablets and dedicated terminals are installed, and a card as shown in the figure is placed in the vicinity of the information devices. When the user clicks on the photo of an item displayed on the shopping card, the description of the item is displayed on the display. To purchase the product displayed, "ADD TO CART" at the bottom of the C-Card is touched. You can order one by touching once, and two by touching twice. The product ordered and its quantity are shown in the display. By touching "UP" the highlight moves up, and by touching "DOWN" the highlights moves down. When the operator touches "CANCEL ONE," the quantity of the highlighted product decreases by one.

After deciding on the product and its quantity, "PURCHASE" is touched. Then, an exchange ticket is output. On a later day, the user will bring this ticket to the store register and also pay the price. Then the product already packed is provided.

Note that in the present embodiment, payment may be made by methods other that paying with cash such as paying with a prepaid card.

Also, in the present embodiment, shops, the mail order dealers, or the like may distribute shopping cards to the user, and the user may perform the net shopping using the shopping card at home.

Figure 62:
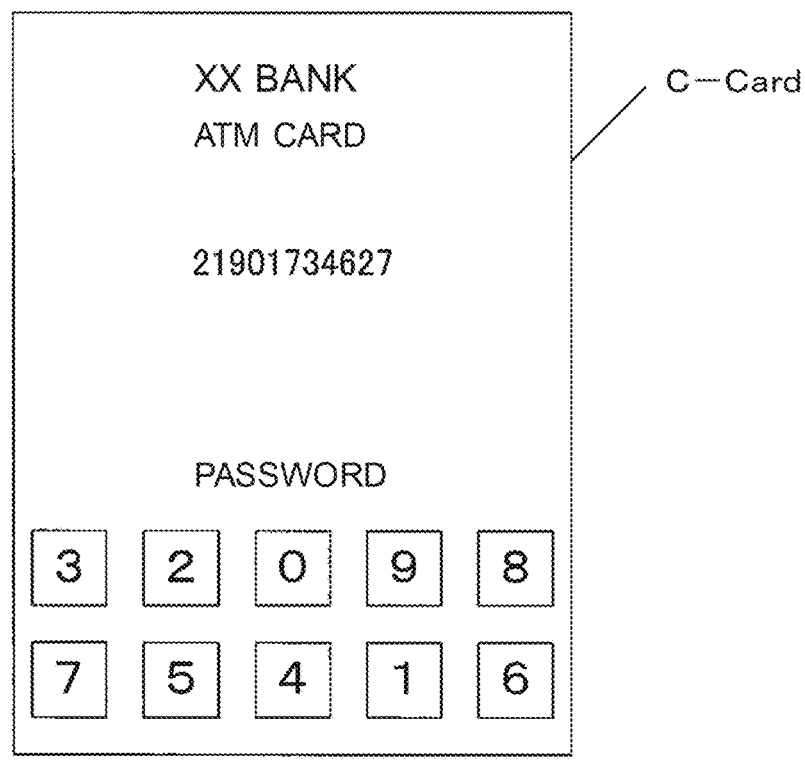
FIG. 62 is an embodiment using a C-Card as a bank ATM card.

FIG. 62 is a diagram showing the use of a C-Card as a bank ATM card.

In this case, the ATM of the bank is provided with a touch panel area for placing the C-Card. When the user places the C-Card on the touch panel area, information such as the account number is recognized by the conductive pattern. The user enters a predetermined password by touching numbers. Note that in order to prevent third parties from perceiving passwords from the movement of fingers, the C-Card numbers are arranged randomly. When the password is recognized to be correctly entered, the user can perform processings such as transfers, cash withdrawals and the like.

Figure 63:
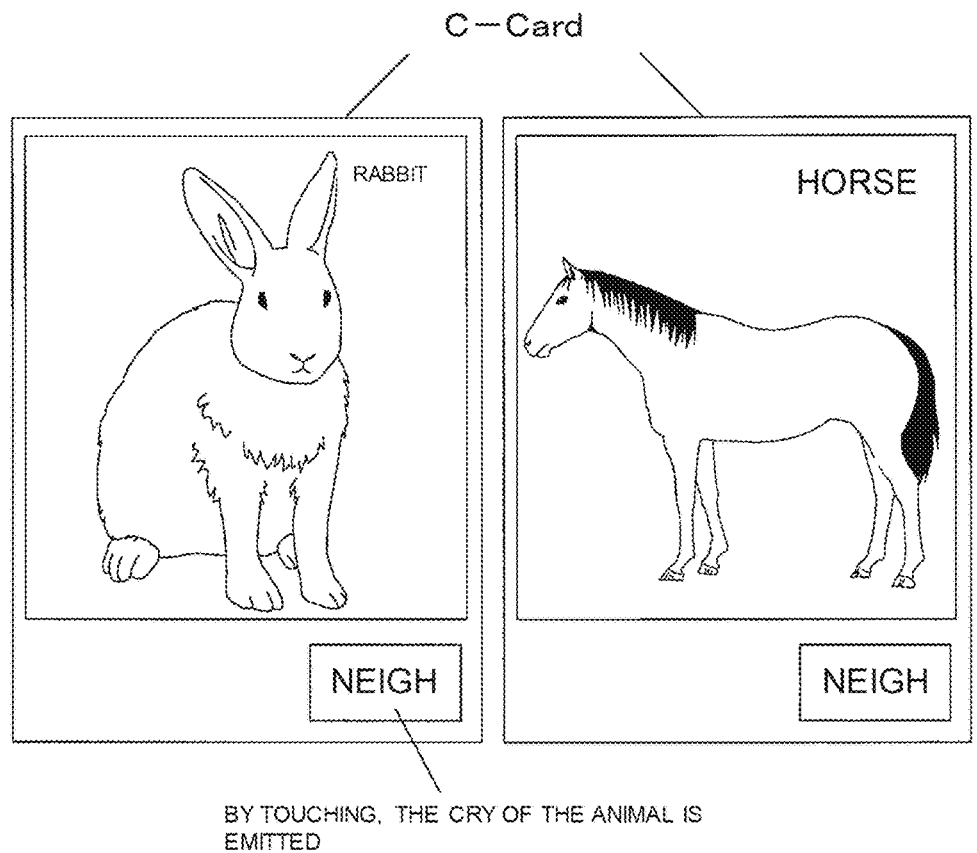
FIG. 63 is an embodiment using a C-Card as an animal card.

FIG. 63 is a diagram showing the use of a C-Card as an animal encyclopedia card.

When a user places a C-Card on an informational device, such as a smartphone or tablet, which animal the card corresponds to is recognized by the conductive pattern. When the user touches a picture or photograph of an animal on the card, a description of the animal is displayed on the display. Furthermore, by touching the "VOICE" symbol, the animal's sounding voice is output by a speaker.

Figure 64:
FIG. 64 is an embodiment using a C-Card as a questionnaire card.

FIG. 64 is a diagram showing the use of a C-Card as a questionnaire sheet.

The present embodiment describes a questionnaire for determining the optimal product for the user. In the upper part of the C-Card, the products (in this case a milky lotion) that are subject to the questionnaire are displayed. The user responds to the questions by touching "YES" or "NO." The responses by the user are displayed on the display. After the answering is complete, "JUDGEMENT" is touched. To change the answer, "CANCEL" is touched, and an answer is given again. As a result, the optimum cosmetic and directions for use are introduced to the user.

Figure 65:
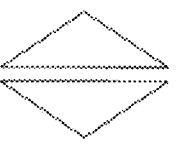
FIG. 65 is an embodiment using a C-Card as a system control card.

FIG. 65 is a diagram showing the use of a C-Card as a system control card.

This card is used to control machines and the like in factories and the like. For example, when controlling a manufacturing robot, the user touches the "MANUFACTURING ROBOT (A)" and touches instructions such as "REPLACE PARTS." Thus far, complicated control of machine tools, robots, and the like has been required. However, in this way, by preparing a C-Card for each use application, control can easily be carried out.

Figure 66:
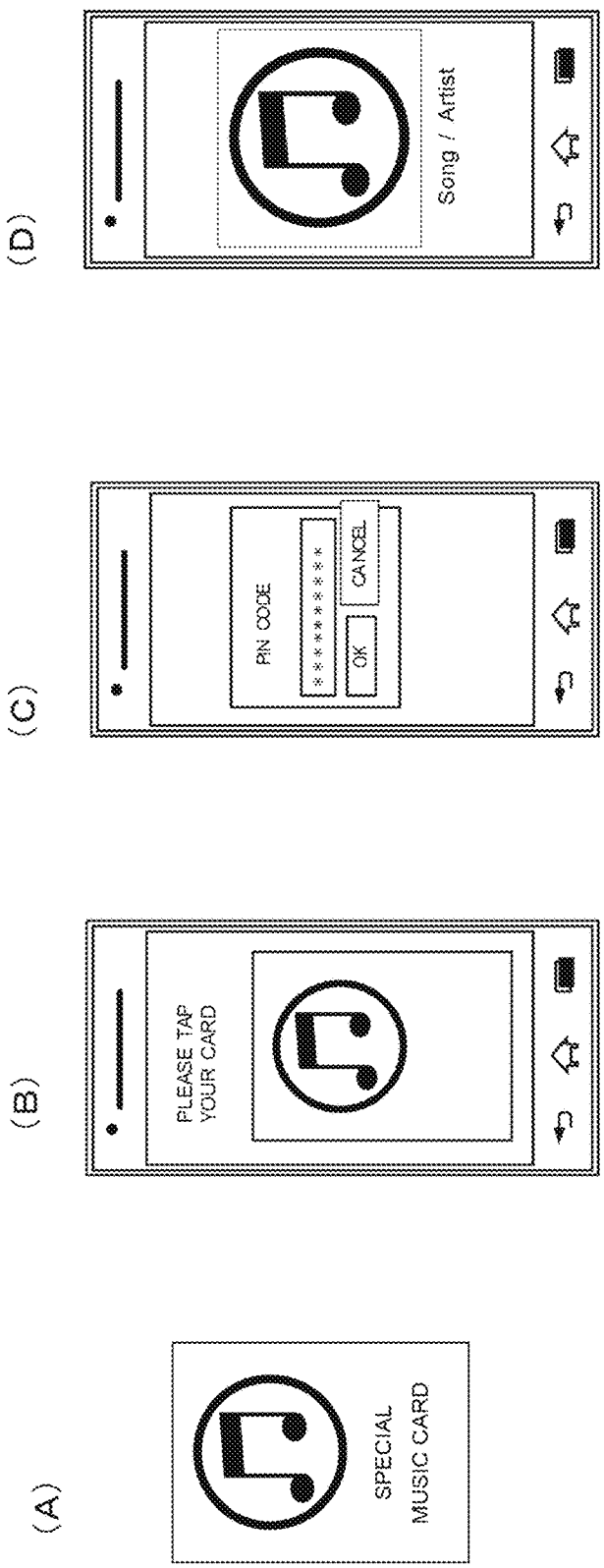
FIG. 66 is a diagram describing a content authentication service using a C-Card.

FIG. 66 is a diagram describing a content authentication service using a C-Card.

FIG. 66(A) shows a C-Card used as a music card. This card is distributed for viewing and the like of member exclusive content.

By accessing the web or activating an application, the words "PLEASE TAP YOUR CARD" are displayed as shown in FIG. 66(B). The user taps a C-Card on an informational device such as the smartphone. Then after removing the C-Card, a window for inputting a PIN code appears as shown in FIG. 66(C). When the user enters the PIN code, contents are displayed, and audio is outputted as shown in FIG. 66(D).

Note that PIN code input may be set only for high security contents.

Figure 67:
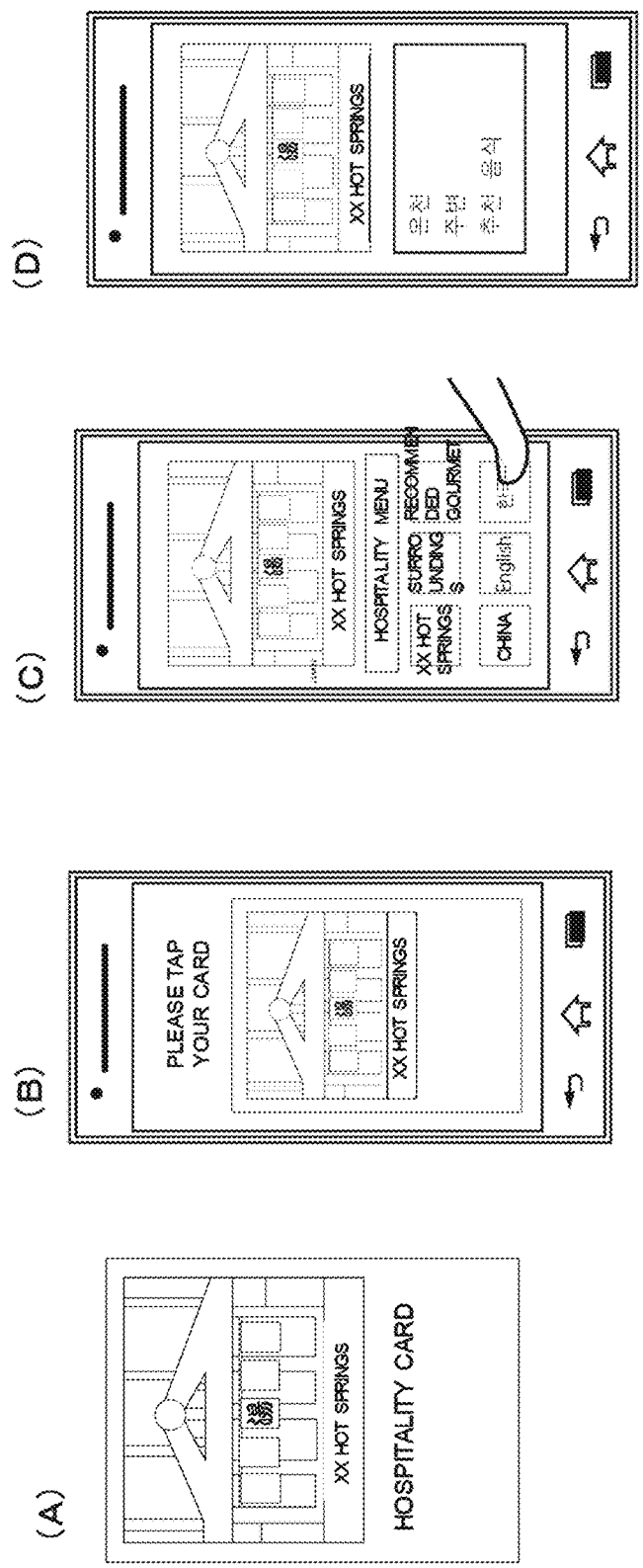
FIG. 67 is a diagram describing product advertisement/sightseeing guidance using a C-Card.

FIG. 67 is a diagram describing product advertising/visitor information using a C-Card.

FIG. 67(A) shows a C-Card used for tourism/facility guidance.

By accessing the web or activating an application, the words "PLEASE TAP YOUR CARD" are displayed as shown in FIG. 67(B). The user taps a C-Card on an informational device such as the smartphone. Then after removing the C-Card, as shown in FIG. 67(C), along with a photograph of the facility (OO hot springs), icons marked "OO HOT SPRINGS," "SURROUNDINGS," "RECOMMENDED GOURMET," "CHINA," and the like are displayed. The user touches the icon of the desired information. In this case, language selection is also possible. Then, the desired content is displayed in the language desired by the user (Korean in the Figure), as shown in FIG. 67(D).

According to the embodiment of FIG. 67, contents can easily be viewed simply by tapping a card onto a smartphone or the like. In addition, it becomes possible to deliver high security contents such as limited contents.

FIG. 68 is a diagram describing on-line shopping (Amazon Dash Button and the like) using a C-Card.

FIG. 68(A) shows a C-Card for use in on-line shopping. The card is printed with pictures of products that are regularly necessary.

By accessing the web or activating an application, the words "PLEASE TAP YOUR CARD" are displayed as shown in FIG. 68(B). The user taps a C-Card on an informational device such as the smartphone. Then after removing the C-Card, the numbers "0" to "9" and the icons "ORDER" and "CANCEL" are displayed as shown in FIG. 68(C). The user sets the required quantity and orders the desired product.

According to this embodiment, even for products regularly purchased such as daily necessities, by using the C-Card, it is possible to easily complete ordering simply by tapping it onto a smartphone or the like. It is very convenient because it eliminates the trouble of searching or the like for the ordering of products.

FIG. 69 is a diagram describing an arcade game/on-line game using a C-Card.

FIG. 69(A) is a C-Card that can be used for operating games. The card is printed with game-related pictures.

As shown in FIG. 69(B), the user plays a game on a game machine of a game arcade using a C-Card. Afterwards, as shown in FIG. 69(C), a tablet or the like can be used for playing at home or at an out-of-home destination using the same C-Card.

According to this embodiment, games can be played by tapping a C-Card on a game machine in a game arcade, and games can be played in the same way as at a game arcade by tapping a C-Card on a tablet or a smartphone at home or the like.

Figure 70:
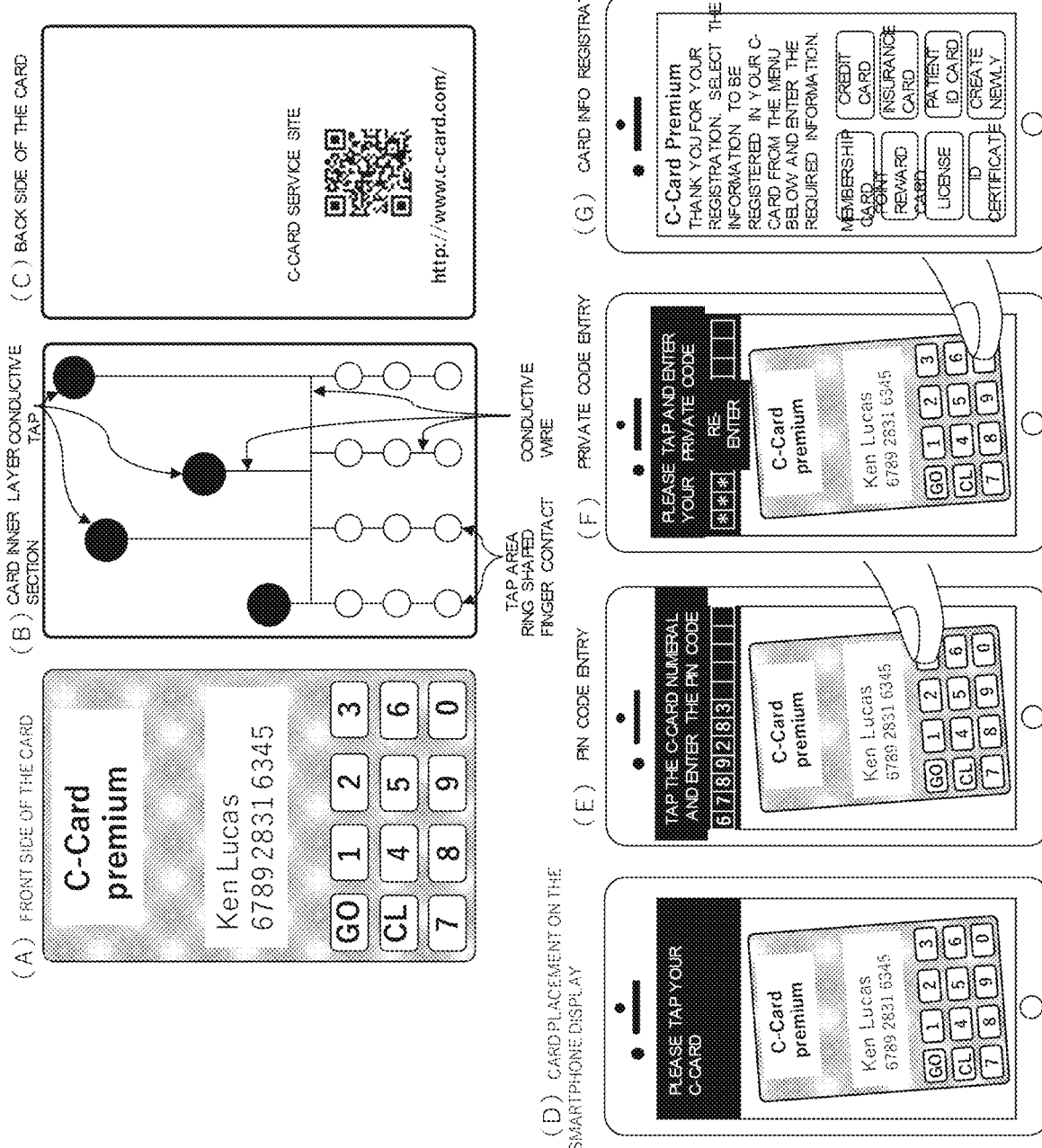
FIG. 70 is a diagram describing the registration of a common card.

(Registration of a common card) FIG. 70 is a diagram describing a case in which a C-Card is used as a common card.

A single card in which a plurality of credit cards, membership cards, reward point cards, patient ID cards, identification cards such as employee ID cards and student ID cards, various licenses such as driver's licenses and qualification licenses, various services such as patient ID cards of various hospitals and insurance cards, and personal and other information can all be viewed is called a common card. In a common card, a concealed card ID (a capacitance code based on a conductive pattern), a card ID (including PIN codes and the like) and a smartphone ID (other than the smartphone, any information communication terminal having a touch panel, such as a tablet) are registered according to the following procedures. Note that registration may be done in any way, not necessarily according to the following procedures.

When registering and using a common card only on the web without downloading a dedicated application, the common card (C-Card) cannot be linked with a relevant smartphone ID because the smartphone ID cannot be obtained, and thus it can be used with other smartphones. In addition, the information on the common card cannot be updated and push mail cannot be sent.

(1) The user acquires a C-Card (regardless of whether there is a charge or not) by mail, handing, posting, or the like. If the C-Card is intended for a particular person, the name may be printed on the face of the card. As shown in FIG. 70(A), the number under the name is a unique ID, and it is a card ID (may be a PIN code) that fully specifies the card. Note that a PIN code imprinted separately may be input.

(2) As shown in FIG. 70(C), a two-dimensional code such as a QR code indicating a URL which corresponds to services provided for the registration and the use of a C-Card or a URL itself may be printed on the back of the card. If a two-dimensional code is printed, you can take a photo with your smartphone to access the C-Card service website, or you can enter the URL into your smartphone. The C-Card service website can be accessed in any way, including the use of URLs transmitted by e-mail, SNSs, or the like. Note that the C-Card may be registered at first by downloading a C-Card service application if possible. When a C-Card service application is used, registration including the smartphone ID is performed, and it is possible to make settings so that operations can be done only with the specific smartphone. As a result, abuse cannot be done unless both the smartphone and the C-Card are acquired. The C-Card services application can be downloaded from the corresponding URL site and used at any time.

(3) When a C-Card service website is accessed (or a C-Card service application is activated), an area for tapping the C-Card is displayed on the screen of a smartphone, as shown in FIG. 70(D). When a card is tapped on the area, the touch panel detects and recognizes the capacitance code defined by the arrangement pattern of the electrodes formed in the card inner layer as shown in FIG. 70(B), and a PIN code input mode is activated. The input of the PIN code is completed by inputting the PIN code from the numeric keypad formed on the C-Card and tapping "GO." If you want to cancel, tap "CL." Here, if the screen of the smartphone is small and guidance cannot be made by text, voice guidance may be used. Since the capacitance code is formed in a limited ID area other than the touch area where the numeric keypad of the C-Card is arranged, the area of the ID area is small and only several thousand codes can be set. Therefore, it is desirable assign the capacitance codes according to the distribution area, store/facility, or the attribute of the individual to be distributed to or the type of C-Card. The biggest role of the capacitance codes with a limit of only a few thousand codes is that without tapping a C-Card, registration necessary for subsequent use of the card cannot be performed. Furthermore, since the arrangement of the numeric keypad is uniquely defined by the arrangement pattern of the electrodes, when the touch panel detects the position information of a tap, if the position information of the arrangement pattern of the electrodes of the ID area is not recognizing at the same time, it is not possible to recognize which numeric key has been tapped. This means that there is a need for a system that accurately implements the PIN code, even if the detected positions of a tap can change each time depending on the position and rotation angle of the card when it is tapped and placed. Thus, it is not easily to forge a card, and security is very high. Note that if security with only the PIN code is sufficient, the card may be removed, and the PIN code may be entered with a numeric keypad displayed on the smartphone screen. Furthermore, although not shown, when a C-Card is tapped onto a smartphone, the cloud may acquire the capacitance code and smartphone ID based on the C-Card conductive pattern, and a unique PIN code may be displayed on the smartphone display. The PIN code may be entered using the numeric keypad of a C-Card or one displayed on the smartphone screen. Note that smartphone IDs cannot be obtained from C-Card service sites (WEB).

Although there may be a reduction in security, since the PIN code input mode is not activated unless the card is tapped, it is possible to have only users possessing a card use the service. This is because, at the time of registration, since the user registers with his/her own smartphone, it can be said that strict security may not be necessary.

(4) If the back of the card in FIG. 70(C) is made of a slippery material such as plastic, the edge of the card must be held with fingers because the card may slide on the smartphone when the PIN code is tapped. In this case, an air gap layer with a depth of 0.4 to 0.5 mm or more must be provided inside the card so that even if areas other than the touch area where the numeric keypad is arranged are touched with fingers, the touch is not detected. If a gap is not provided, a detection other than in the touch area may be processed as an error. However, as shown in FIG. 70(B), there are four electrodes. Therefore, if the card is held by a finger in order to avoid sliding, the number of detections becomes five all together including detection of the finger holding the card. In addition, if the numeric keypad is tapped, the number of multiple touches of the smartphone will exceed 5, and the smartphone will not be able to recognize it. Therefore, the number of electrodes that form the conductive pattern must be set to 3. Then, the number of capacitance codes defined by the arrangement pattern of the electrodes becomes several hundreds of codes, which is a drastic reduction. Therefore, it is desirable that the back surface of the card shown in FIG. 70(C) be made of a material with an adhesive property that prevents sliding. In FIG. 70(E), a state in which the card number written on the card surface is input is shown. Thus, the card number and the PIN code maybe the same. Even if both the smartphone and the C-Card are taken and abused, it is possible to enter the PIN code at the time of use. However, if a security code is further registered, security is ensured.

(5) When the input of the PIN code is completed, the security code input guide is displayed as shown in FIG. 70(F), and the security code may be input using the numeric keypad of the card. Since security is enhanced in a number of ways, such as the use of a key based on a capacitance code from the conductive pattern of the card, a key based on a PIN code input on the card, a linkage with a smartphone ID by a smartphone application, or the like, it can be said that a security code is unnecessary and it is improbable to have a PIN code with more than 8 to 12 digits to be used. Here, extremely high security can be easily ensured by linking them with a familiar security code (which may be a security code used elsewhere, a birth date, or a telephone number) as the security code. In other words, this security code may be considered as a simplified code to facilitate input. As will be described later, when using the card, even if the security code is one easy to skim, if input is from the numeric keypad on the card, security will not be reduced. Note that the security code setting may be done on the smartphone screen with the removal of the card. This is because, at the time of registration, since the user registers with his/her own smartphone, it can be said that strict security is not necessary.

(6) FIG. 70(G) shows a menu for determining what information is to be linked and what services are to be enjoyed. These settings may be URLs that can only be viewed by the user, or may be linked to settlement systems, from the credit cards payments to the purchase and sales or the like of stocks or various financial products.

(Example of Authentication/Use of a Common Card)

Figure 71:
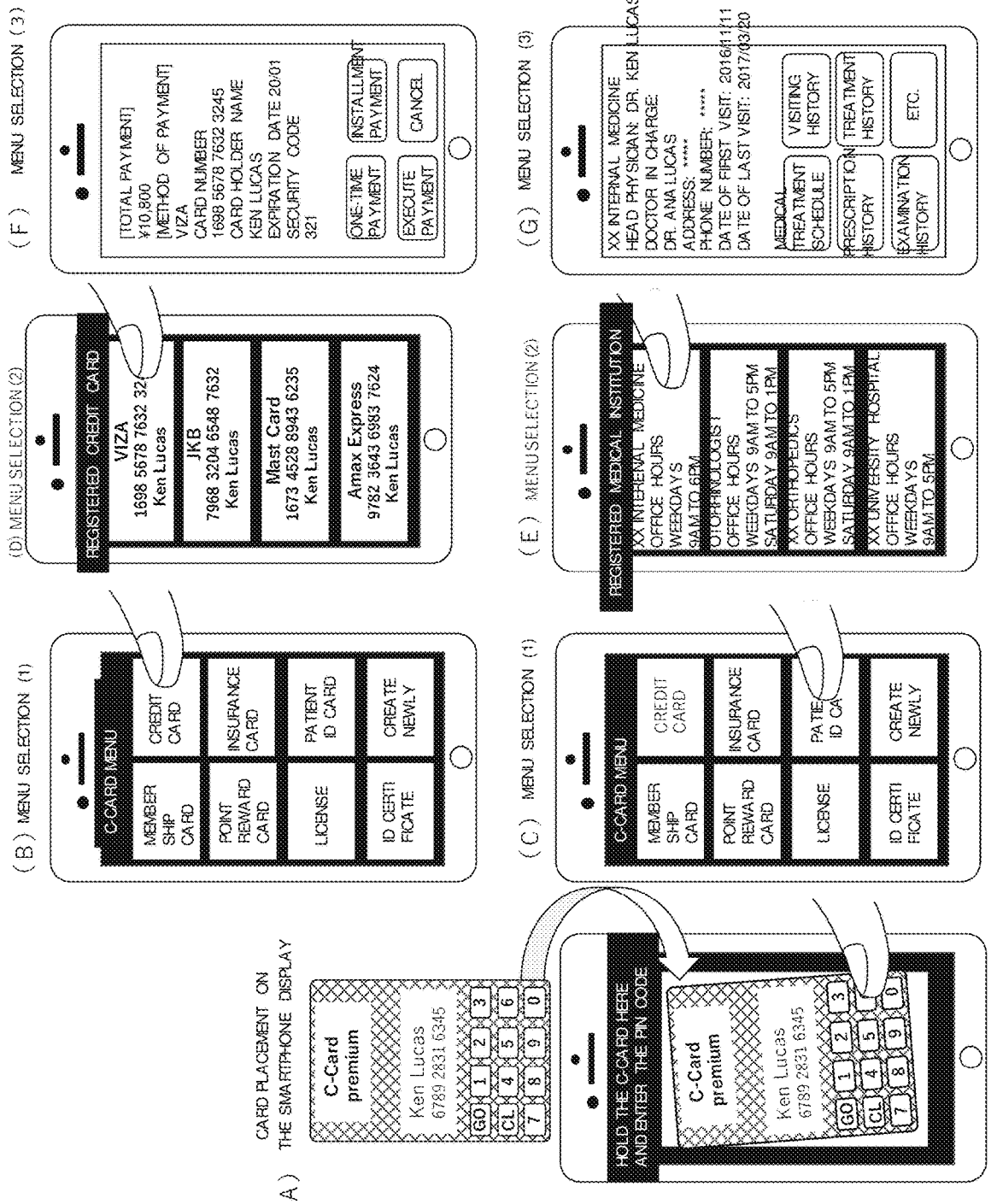
FIG. 71 is a diagram describing the authentication/usage examples of a common card.

FIG. 71 is a diagram describing procedures for using common cards (C-Card). The following procedures are followed when using common cards.

(1) As shown in FIG. 71(A), when a C-Card service site specific for a common card is accessed or a C-Card service application is activated, the area on which a C-Card is to be tapped is displayed on the smartphone screen. When a card is tapped on the area, the touch panel detects and recognizes a capacitance code defined by the arrangement pattern of electrodes formed inside the card as shown in FIG. 70(B), and the security code input mode is activated. Here, the numeric keypad of the card may be used to enter the security code.

(2) Since security is enhanced in a number of ways, such as the use of a key based on a capacitance code from the conductive pattern of the card, a key based on a PIN code input on the card, a linkage with a smartphone ID by a smartphone application, or the like, the security code input mode maybe omitted and a menu selection screen may be displayed as shown in FIGS. 71(B) and 71(C) when a C-Card service application is activated and linked with the smartphone ID. Even if both the smartphone and the C-Card are taken and abused, further security can be achieved by having a security code be entered.

(3) When a C-Card service site specific for a common card is used, since a smartphone ID cannot be obtained, it is desirable to have a security code be entered. Even if the security codes are familiar 4-digit security codes (which may be a security code used elsewhere, a birth date, or a telephone number), very high security can be ensured by having them be entered from the numeric keypad on the C-Card. That is, the arrangement of the numeric keypad is uniquely defined based upon the arrangement pattern of the electrodes. Therefore, in a case where the placement position or the rotation angle of the card is changed, if it were not a system where the position information of the arrangement pattern of the electrodes of the ID area is recognized at the same time when the touch panel detects the position information of a tap, and the position information of the numeric keypad determined from the arrangement pattern can be verified, which numeric key has been tapped cannot be recognized.

(4) Shown in FIG. 71(D) and FIG. 71(E) are windows displayed as a result of selections from the menus of FIG. 71(B) and FIG. 71(C). When VIZA shown in FIG. 71(D) is selected, at least the information on the front and back sides of the card is linked when the card is registered, and settlement conditions (single payment, split payments, and the like) are determined and settlements are performed using the information.

(5) If the patient ID card for internal medicine is select in FIG. 71(E), the treatment schedule, the visiting history, the prescription history, the treatment history, the examination history, and the like can be viewed. Depending on the medical institution, it may be possible to provide documentation for treatment reservations or tax declarations.

(6) In addition, although there are various methods for realizing the viewing of various services including membership cards, reward point cards, identification certificates such as employee ID cards and student ID cards, various licenses such as driver's licenses and qualification licenses, insurance certificates, and personal and other information, it does not matter what method is used for productization.

The essential feature of the present invention is being able to recognize which the numeric key has been tapped, regardless of the location and angle of rotation of C-Card placement, with the provision of a plurality of touch areas set on an inexpensive C-Card in which a conductive pattern defined with a simple capacitance code is formed in the ID area. This is an extremely secure system because unless the user possesses both a smartphone and a corresponding card, and the card is used with tapping, necessary settlements and access to necessary information cannot be realized. In addition, by tapping a numeric key arranged on a C-Card and entering a simple security code, it is possible to easily utilize the high security of PIN codes with a large number of digits and thus highly secure. Another significant feature is that a dedicated reader is not necessary and that wireless communication which can easily be a subject of skimming by radio interception is not used. Note that since realization can be achieved not only with plastic but also with paper cards, the system can be considered to be extremely inexpensive and highly secure.

(Registration of a Specialty Card)

Figure 72:
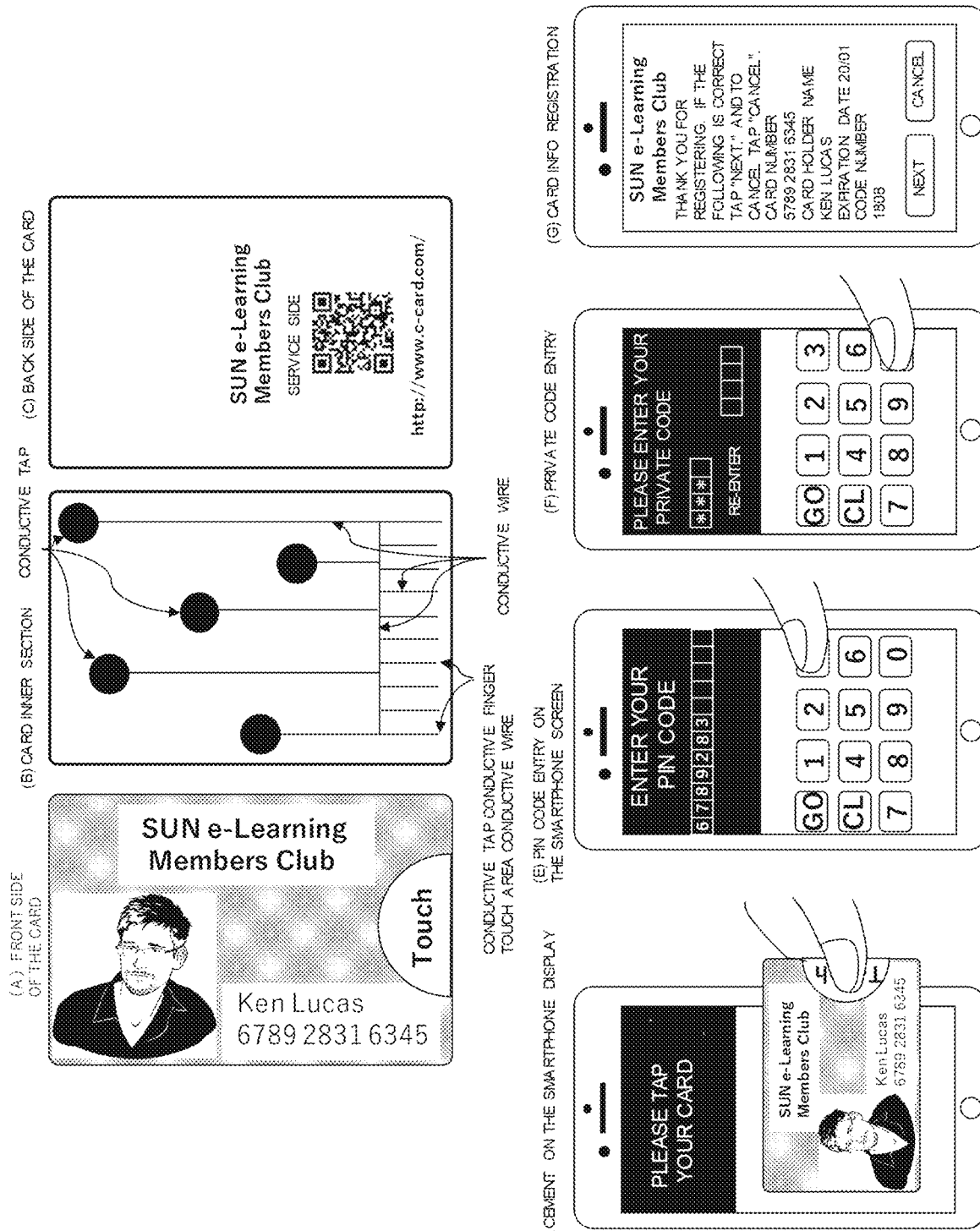
FIG. 72 is a diagram describing the registration of a specific card.

FIG. 72 is a diagram describing the registration of a specialty card when a C-Card is used as a common card.

Specialty cards include credit cards, membership cards, point cards, patient ID cards, identification cards such as employee ID cards and student ID cards, various licenses such as driver's licenses and qualification licenses, patient ID cards of various hospitals, and insurance certificates, and each independently corresponds to C-Cards. The C-Card shown in FIG. 72(A) is a membership card for an e-Learning Class. The registration method and the method of use shown in FIGS. 70 and 71 are basically the same. However, the procedures of FIG. 70(G) and FIG. 71(C) which are based on handling multiple cards are not necessary. In addition, since fields of use for specialty cards are specified and since handling can be done according to each field of use, each facility, each store, each equipment, and each net services, there is no need to manage various users and usage patterns on a single C-Card service site or C-Card service application as a common card-like platform. Therefore, a dedicated C-Card service site or C-Card service application that manages the registration and use of the C-Card for each purpose of use may be provided. Thus, depending on the degree of security, there are cases where it may be unnecessary to tap a C-Card on which a numeric keypad is printed and to tap numeric keys to enter a PIN code or a security code, and in FIG. 72, an C-Card in which a numeric keypad is not provided will be described.

(1) FIG. 72(A) shows the front side of the C-Card. A face photograph is printed for the purpose of personal authentication, but when there is no need to identify the person using face personal authentication, it is not necessary. Although the card number is written, it may be possible to have the card number displayed when the card is tapped on the smartphone after registration. Note that if the smartphone ID and card information are not linked, input of a security code or the like is required. As shown in FIG. 72(B), since there is no numeric keypad, conductive wires are wired to the electrode conduction finger touch area, and conduction to the electrodes occurs no matter which part of the area is held. In addition, since there is no numeric keypad, it is possible to arrange 5 electrodes, and it is possible to define more than 100,000 capacitance codes. As shown in FIG. 72(C), a two-dimensional code such as a QR code indicating a URL corresponding to services provided for use registration and use of a C-Card or a URL may be printed on the back of the card. If two-dimensional codes are printed, they can be photographed with a smartphone and a C-Card service site can be accessed, or the URL can be entered into a smartphone. A C-Card service website can be accessed in any way, such as having URLs transmitted by e-mail or SNS. Note that a C-Card may be registered by downloading a C-Card service application by some possible method in advance. When a C-Card service application is used, registration including the smartphone ID is carried out, and the smartphone ID can be set so that operation can only be carried out with the specified smartphone. As a result, abuse is not possible unless both the smartphone and the C-Card are taken. A C-Card service application can be downloaded and used from a specified URL at any timing.

(2) Shown in FIG. 72(D) and FIG. 72(F) is the access to a C-Card service site or the activation of a C-Card service application, by holding the touch area with fingers of a C-Card facing sideways, tapping to display a numeric keypad on the smartphone window, and tapping to enter the PIN code. The PIN code may match with the card number or a separately printed PIN code may be entered. In addition, the cloud may receive capacitance codes and smartphone IDs according to C-Card conductive patterns and unique PIN codes displayed on the smartphone display may be entered. Note that since smartphone IDs cannot be acquired from C-Card service sites (WEB), PIN codes must be issued with the thousands of capacitance codes based on conductive patterns, and thus security becomes an issue. Thus, by changing the order of the input of the security code and PIN code, and entering the security code of FIG. 72(F) first, a PIN code may be issued. Alternatively, having only the security code input icon and the PIN code input icon formed on the card face, tapping the icons, removing the C-Card, and entering on the smartphone screen may be done.

(3) In FIG. 72(G), confirmation of the card number 6789 2831 6345, the name on the card Ken Lucas, the expiration date 20/01, and the security code number 1808 is displayed. If there is no problem, an icon is tapped next, and then a subject is selected, or the name, address, birth date, age, credit card information or the like may be entered/registered, and settlements may be allowed. Although most cards with photographs printed on them usually often have necessary information registered in advance, for C-Cards with only a card number printed on them, the user may be made to register various pieces of necessary information.

(Examples of the Authentication and Use of a Specialty Card)

Figure 73:
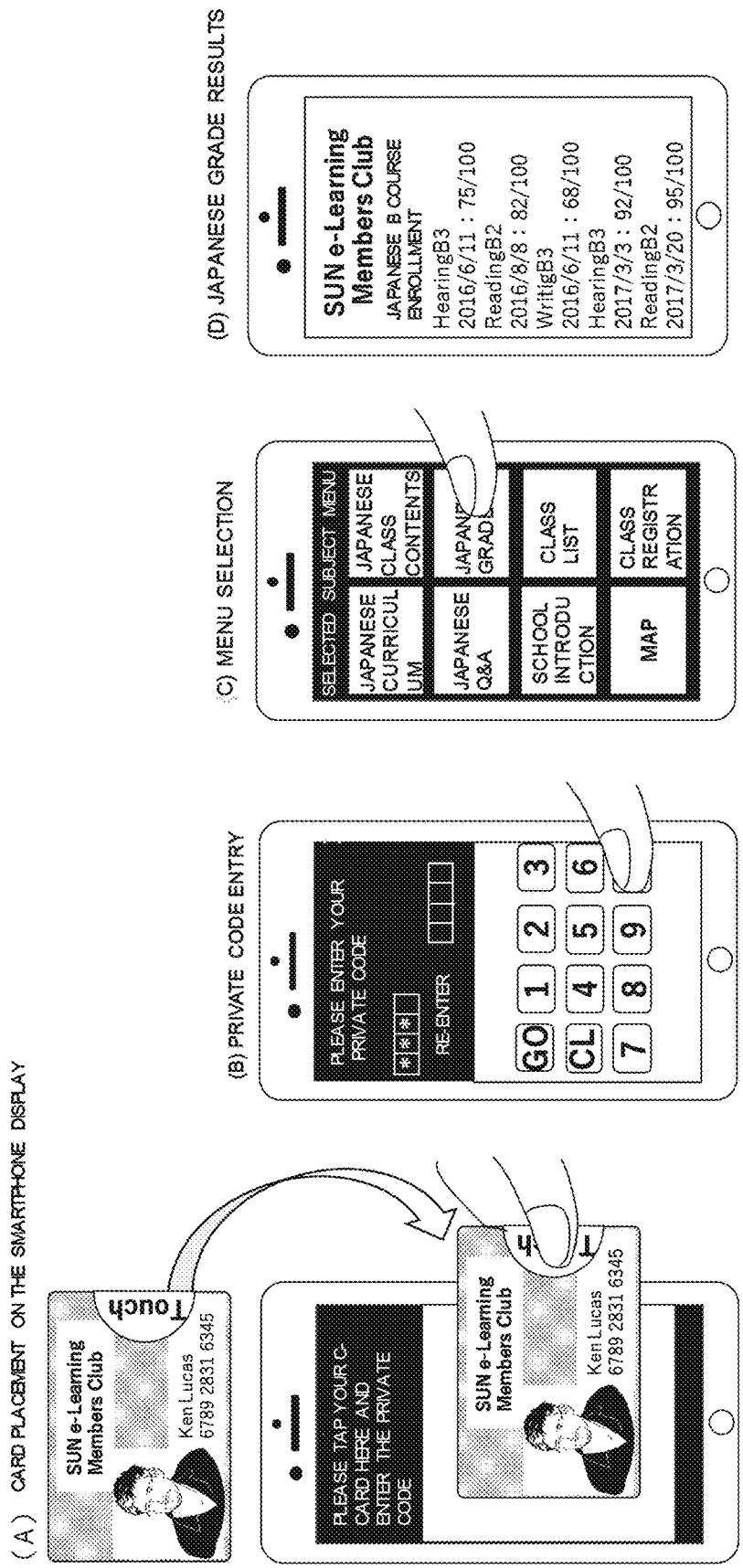
FIG. 73 is a diagram describing an example of the authentication/use of a specific card.

FIG. 73 is a diagram describing an example of authentication and the use of a specialty card.

FIG. 73(A) shows an example of the use of a membership card for an e-learning class. When a C-Card is held sideways and the touch area is held between fingers and the C-Card is tapped onto a smartphone, as shown in FIG. 73(B), a security code input screen is displayed. Therefore, if the C-Card is removed and a security code is entered on the smartphone screen, the icons of the curriculum of the subjects being learned, lectures, Q & A, grades and the like are displayed as shown in FIG. 73(C). By selecting "Japanese grades," Japanese test scores are displayed as shown in FIG. 73(D). Here, examples of the use of a C-Card in e-learning have been shown. C-Cards may also be used without photographs, and as various membership cards with benefits such as reward points and coupons can be distributed free of charge as advertising media, or they can be sold as commodity tickets (gift certificates) or content cards which enable the acquisition of music, videos, and game software. For example, for online shopping membership cards, water, sake, rice, food, toilet paper, tissue which are purchased regularly may be registered, so that when a C-Card is tapped for use, menus registered by the user are displayed, and products can be ordered simply by tapping them. In such cases where payment is accompanied or personal information with high security is made accessible, it is desirable to register with a C-Card service application capable of acquiring smartphone IDs. Note that if low security is not an issue, it may be possible to enable viewing of contents including music, videos, games, and advertisements just by tapping a C-Card.

(Authentication/Viewing of Content Cards)

Figure 74:
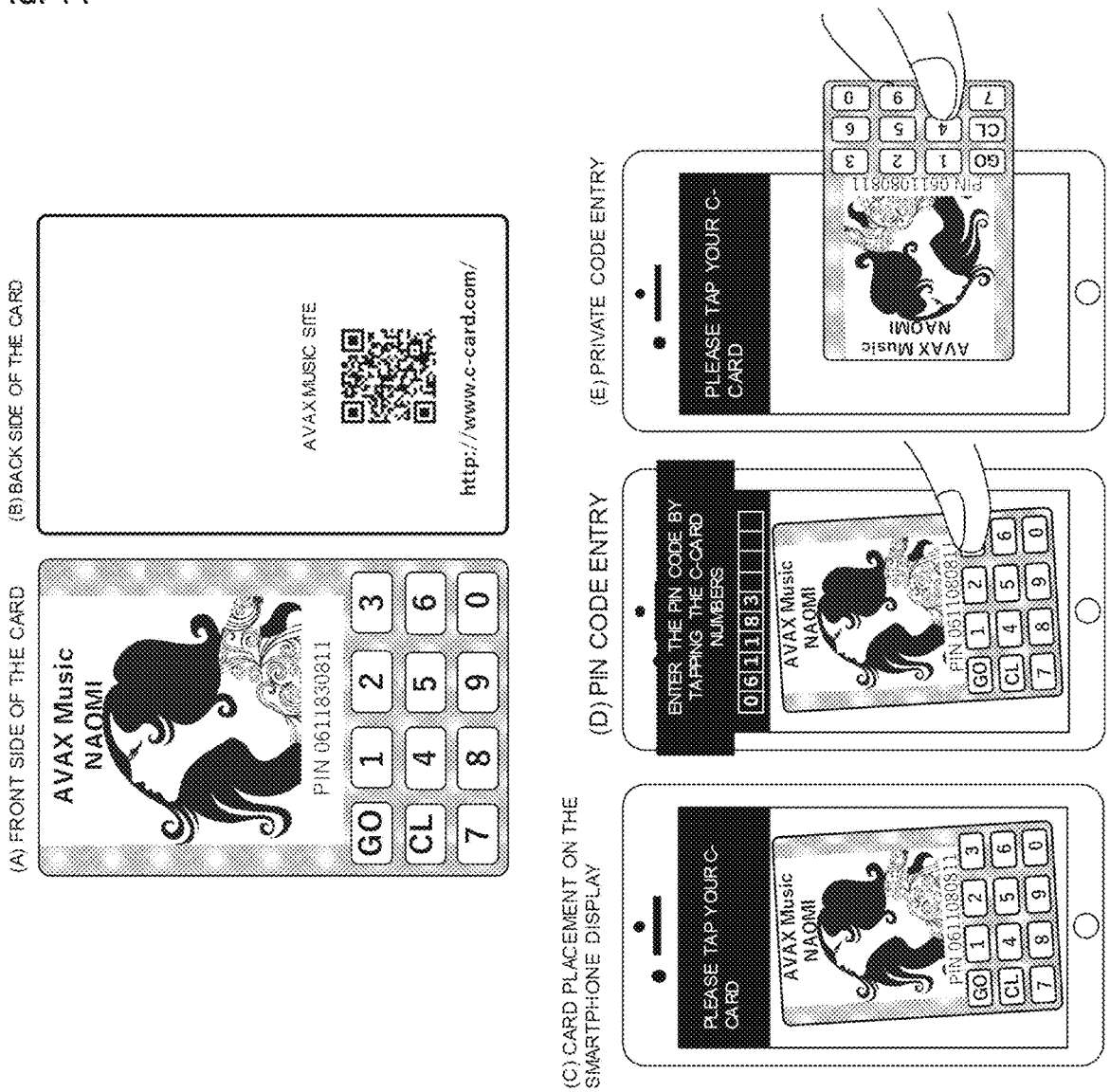
FIG. 74 is a diagram describing the authentication/viewing with a content card.

FIG. 74 is a diagram describing a case in which the C-Card is used as a content card.

Various contents can be downloaded for viewing and playing, but the Internet is pull-type (search) and is based on motivation to search and purchase or view. On the other hand, if an item is displayed in stores, or related DMs, catalogs, flyers are placed in mailboxes, motivated by the push-type psychological effect of coming into contact with information or the actual objects, even if there was no previous interest or the item had been forgotten, willingness to purchase is increased. Although the number of CD and book buyers is decreasing, a certain amount of sales can be expected. Since the Internet has inexpensive means of transmitting information, competition is becoming severe, and winners and losers are becoming prominent. Advertisements by using DM, posting, newspapers and magazines require costs, but since push-type advertisements are cost-effective, they are likely to remain. In addition, as long as they are not discarded, DMs, flyers, catalogues, and the like show presence, and information continues to be transmitted by being caught by the eye. With the Internet, if you view an ad and then close it, it will not be viewed afterwards. In particular, since advertising on the Internet is inexpensive, it is flooded with a large amount of information, and it is not uncommon to have mail rejected as spam mail. On the other hand, attractive digital contents such as music, videos, and games are viewed and played by many on smartphones and tablets. Even for digital contents, stores desire to have purchases in the form of actual products at stores. Therefore, a mechanism in which the C-Card as an actual product enhances as a push-type the willingness to purchase, and as a pull-type the C-Card enables contents from the cloud to be viewed and played is shown below. C-Cards can be purchased in stores or are distributed free of charge, and C-Cards can be triggers to all possible contents in smartphones and tablets, such as music, videos, games, e-books, learning materials, tickets and purchase of items, food delivery, various reservations, taxi arrangements, and the like.

(1) The C-Cards shown in FIG. 74(A) and FIG. 74(B) are cards that are substitutes to CDs. They can easily be purchased in a bookstore or convenience store. Also, it can also be used as a promotional advertising medium enabling the listening of only a portion of a piece of music and be distributed free and watching. The Card shown in FIG. 74(A) has photographs or illustrations of the artist printed on it, and a PIN code for accessing music is provided. The PIN code may be provided as a sticker so that it can be removed to avoid visually effects on the graphics. The PIN code is a unique ID and is a card ID that fully specifies the card. Note that the PIN code may be printed separately and be bundled together. Note that the arrangement of the electrode patterns formed in the card inner layer is the same as that in FIG. 70(B).

(2) As shown in FIG. 74(B), a two-dimensional code such as a QR code indicating a URL corresponding to services provided for use registration and use of a C-Card or a URL may be printed on the back of the card. If two-dimensional codes are printed, they can be photographed with a smartphone and a C-Card service site can be accessed, or the URL can be entered into a smartphone. A C-Card service website can be accessed in any way, such as having URLs transmitted by e-mail or SNS. Note that a C-Card may be registered by downloading a C-Card service application by some possible method in advance. When a C-Card service application is used, registration including the smartphone ID is carried out, and the smartphone ID can be set so that operation can only be carried out with the specified smartphone. As a result, abuse is not possible unless both the smartphone and the C-Card are taken. A C-Card service application can be downloaded and used from a specified URL at any timing.

(3) When a specified C-Card service site is accessed (or C-Card service application is activated), the C-Card tapping area is displayed on the smartphone screen as shown in FIG. 74(C). When a card is tapped in the area, the touch panel detects and recognizes the defined capacitance code according to the arrangement pattern of electrodes formed inside the card, and the PIN code input mode is activated. By inputting the PIN code from the numeric keypad formed on the C-Card, and tapping "GO," the PIN code input is completed. If you want to cancel, tap "CL." Here, if the screen of the smartphone is small and guidance cannot be made by text, voice guidance may be used. Since the capacitance code is formed in a limited ID area other than the touch area where the numeric keypad of the C-Card is arranged, the area of the ID area is small and only several thousand codes can be set. However, it can be said that the number is satisfactory for the number of pieces of music at a particular C-Card service site (or in a C-Card service application). The biggest role of the capacitance codes with a limit of only a few thousand codes is that without tapping a C-Card, authentication necessary for subsequent use of the card cannot be performed. Furthermore, since the arrangement of the numeric keypad is uniquely defined by the arrangement pattern of the electrodes, when the touch panel detects the position information of a tap, if the position information of the arrangement pattern of the electrodes of the ID area is not recognizing at the same time, it is not possible to recognize which numeric key has been tapped. This means that there is a need for a system that accurately implements the PIN code, even if the detected positions of a tap can change each time depending on the position and rotation angle of the card when it is tapped and placed. Thus, forgery cannot be done easily, and a very high degree of security is ensured Note that, if security with only the PIN code is sufficient, the card may be removed, and the PIN code may be entered with a numeric keypad displayed on the smartphone screen. Furthermore, although not shown, when a C-Card is tapped onto a smartphone, the cloud may acquire the capacitance code and smartphone ID based on the C-Card conductive pattern, and a unique PIN code may be displayed on the smartphone display. The PIN code may be entered using the numeric keypad of a C-Card or one displayed on the smartphone screen. Note that smartphone IDs cannot be obtained from C-Card service sites (WEB).

(4) Once a PIN code has been entered, the C-Card service site can be accessed (or the C-Card service application can be activated) at any time for appreciating music and videos, as shown in FIG. 74(E). In this case, the C-Card may be tapped sideways to make it easier to hold it with fingers, since PIN code entry is not required. Since the C-Card reading software also recognizes the position and the rotational angle of the capacitance code according to the conductive pattern, contents may be made to be viewable only by having the card facing sideways. Of course, orientation may be limited to the vertical direction. When there is a lot of music or videos, choices may be made by removing the card. Considering the possibility of C-Card forgery, if the C-Card service application is downloaded prior to authentication using the C-Card PIN code or after approval, and the PIN code and the capacitance code are registered in association with the smartphone ID, extremely high security can be realized. In a case where a C-Card that has been properly purchased is provided to a third party, the mechanism shown in (5) may be used as a promotional medium. When a PIN code is entered, only a part of the music or video can be made to be appreciated.

(5) For the C-Card used as a content card, if they are distributed free of charge for promotional use, the user can easily access a specified C-Card service site (or activate a C-Card service application) and enter a PIN code, and as shown in FIG. 74(E), the user can enjoy part of a piece of music and video simply by tapping the C-Card. And if the user decides to purchase the whole piece of the music or the video, although not shown, a window for the purchasing procedure is displayed after removal of the C-Card, and the procedure may be performed. Of course, from a security point of view, when purchasing, a C-Card service application is required to be downloaded to allow purchase. By linking the smartphone ID and the PIN code with thousands of capacitive codes, the user can appreciate thousands of pieces of music and videos simply by tapping the C-Card after making a purchase. Note that when a large number of pieces of music and videos are purchased, if the music and videos are set for each artist, the purchased music and videos may be appreciated by having the C-Card be tapped and then removed. In addition, if a numeric keypad is not placed on the C-Card surface and the input of PIN codes is enabled on the smartphone screen after tapping the C-Card, the number of power transmission taps and the arrangement area of conductive patterns can be increased, and capacitance codes exceeding 100,000 codes can be used. Thus, it would be possible to appreciate, view, play and purchase 100,000 or more digital contents or goods simply by tapping the C-Card on the smartphone. Of course, purchased music and videos may be appreciated without tapping the C-Card, by having them set on the smartphone and performing searches.

The above (1) to (5) can also be applied to all digital content businesses, as well as to the purchase of tickets and goods, home delivery of food and beverages, various reservations, and taxi arrangements. Moreover, it goes without saying that the various embodiments of the utilization of the C-Card, and mechanisms and performances of the C-Card may be combined in use.

(Registration of Shopping Cards and Ordering)

Figure 75:
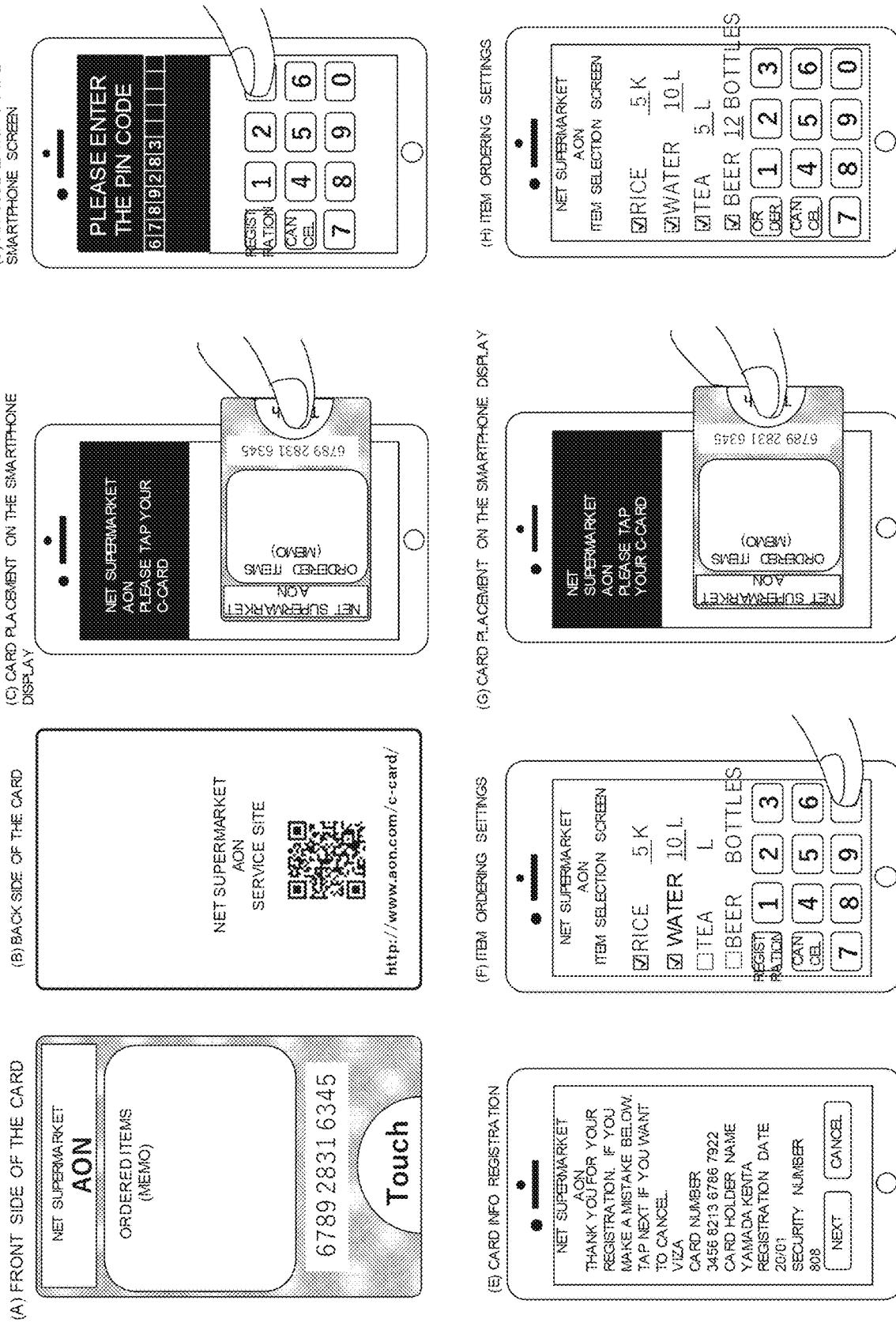
FIG. 75 is a diagram describing the registration/ordering with a shopping card.

FIG. 75 is a diagram describing a case in which the C-Card is used as a shopping card.

Presently, the purchase of everyday goods by Amazon Dash which allows the ordering of pre-registered goods simply by pressing a button is rapidly expanding. More than 50% of handled products are being ordered with Amazon Dash, but it is hard to think that saving even a small amount of time needed for ordering a product on a smartphone is the only reason. That is, an Amazon Dash button has a built-in magnet and thus can be attached to a refrigerator. This is the power of presence, and information is transmitted by having it be caught by the eye continuously. As a result, the inevitable use of Amazon Dash in the place of making purchases at other stores or by other means is probably the reason why the use of Amazon Dash has increased rapidly. However, since Amazon Dash orders are through wireless communication with smartphones or the like, the wireless environment must be stable. The same can be achieved with C-Card without using wireless communication.

(1) FIG. 75(A) and FIG. 75(B) are C-Cards for ordering products provided by stores and manufacturers such as net supermarkets. A space is provided on the surface of the card so that PIN codes and ordered goods can be written as memos. The area of the memos is preferably formed of material on which writings with a marking pen or pencil can be easily erased. As shown in FIG. 75(B) as in other embodiments, a two-dimensional code such as a QR code indicating a URL corresponding to services provided for use registration and use of a C-Card or a URL may be printed on the back of the card and C-Card service sites can be accessed.

(2) Shown in FIGS. 75(C) and 75(D), is the access to a C-Card service site or the activation of a C-Card service application, by holding the touch area with fingers of a C-Card facing sideways, tapping to display a numeric keypad on the smartphone window, and tapping to enter the PIN code. The PIN code may match the card number, or a separately printed PIN code may be entered. In addition, the cloud may receive capacitance codes and smartphone IDs according to C-Card conductive patterns and unique PIN codes displayed on the smartphone display may be entered. In this embodiment, a C-Card service application must be downloaded because settlement is involved. When a PIN code is input and the registration button is tapped, the C-Card service application may be automatically downloaded. Of course, the PIN code may be inputted after the C-Card service application is downloaded.

(3) As shown in FIG. 75(E), after inputting the PIN code, settlement information for a credit card or the like and the sending destination of the product are inputted. In FIG. 75(F), selection is from handled products, and the product and its quantity are registered. These products can be easily changed at the time of ordering. As shown in FIG. 75(G), when a C-Card is held sideways, the touch area is held between fingers, the C-Card is tapped onto a smartphone, and then removed, ordered items are displayed and orders can be placed. In this case, it is easy to change and to delete products or change the quantity.

Note that although not shown, instead of the numeric keypad shown in FIG. 74(A), a C-Card on which a plurality of photographs of products is printed may be tapped onto a smartphone, and a product may be ordered simply by tapping the product icon. Of course, ordering can be limited to only one item, and the orders can be placed just by tapping. The quantity of products can be registered as shown in FIG. 75(F). Changing the quantity may be enabled in the order confirmation process. Such a mechanism can be used for the sales of a variety of products for regular use, such as sake, food, supplements, and cosmetics. The C-Card may also be used for point cards, discount tickets, or coupon tickets to promote registration by a smartphone. All of these can be handled by the cloud.

Eleventh Embodiment

[Mechanism of a C-CARD (Use by Holding, Structure: Single Layer without a Gap Layer, Formation of Wires and Electrodes on One Side)]

As shown in FIG. 39(a), this practical example is an embodiment where a card which is a thin plate shaped apparatus 110B is used by bringing a predetermined area of the card into contact with or close proximity by holding it with the fingers to a touch panel such as a smartphone or a tablet.

Figure 76:
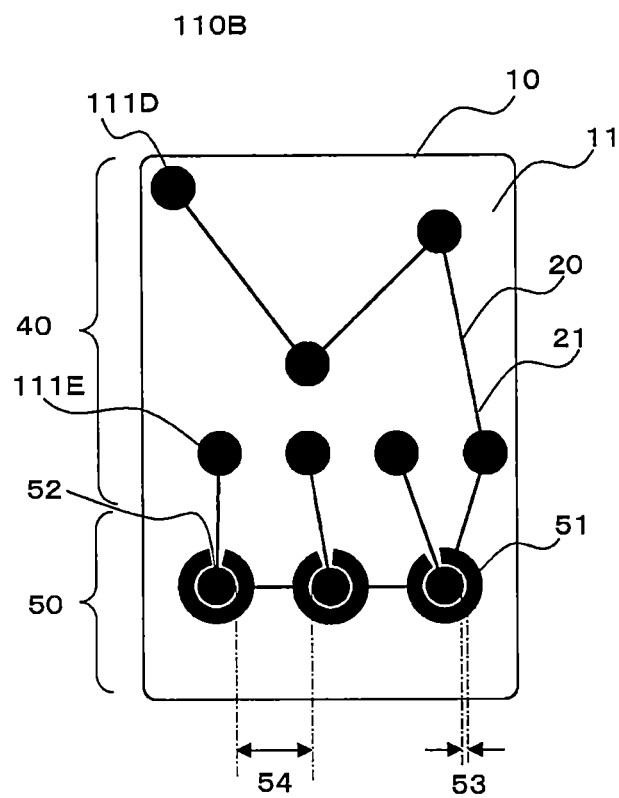
FIG. 76 is a structural example of a thin plate-like apparatus.

FIG. 76 is a plan view of a first surface on which the wiring layer 20 of the nonconductive base material 10 used for the card 110B is disposed. The nonconductive base material is made of a plastic resin film such as thin PC (polycarbonate), PET (polyethylene terephthalate) or the like, or paper, is formed into a rectangle having substantially the same external dimensions as a trading card (about 59 mm×86 mm), a cybernet standard card such as a QUO card (57.5 mm×85 mm) or a credit card (54 mm×86 mm).

The wiring layer 20 is formed by printing with a conductive ink such as silver salt ink, silver paste ink, carbon ink or the like. A contact surface area 40 is provided on the upper part in the long side direction and a holding area 50 is provided in the lower part. In the contact surface area 40, the ID electrodes 111D which are four arranged first electrodes having circular shapes with a diameter of about 7 mm, and the ID electrodes 111D are connected together in one with single stroke wiring 21 which is a linear conductive member so as to have the adjacent ones be connected with single straight lines with the shortest distances. Furthermore, they are connected to the first indicator electrode 51 provided in the holding area 50 from the lowermost ID electrode 111D. In addition, in the contact surface area 40 are three information electrodes 111E, which are second electrodes having circular shapes with a diameter of about 7 mm and are each independently connected to a second indicator electrode 52 in the holding area 50 with the wiring 21 so that the connections are with single straight lines with the shortest distances.

In general, in order to have the touch panel independently detect 2 points by multi-touch, it is said to be desirable to have the spacing be 2.5 to 3 times of the lattice-shaped TX and RX arranged at intervals of about 4 mm to 6 mm formed on the touch panel. Therefore, although it depends on the performance of the touch panel and the card, in order to accurately detect the coordinates of the center of the electrodes, it is desirable to have the distance between the centers of the arranged electrodes be 18 mm or more. Furthermore, it is desirable to have the distance between the edges of adjacent electrodes be 10 mm or more. In order to accurately detect with the touch panel of various smart phones, it is more preferable that the distance between the centers the electrodes be 20 mm or more, and it is more preferable that the distance between the edges of adjacent electrodes be 12 mm or more.

Although the diameter of the electrode may be increased, in order to secure the distance between the edges of adjacent electrodes, the number of arrangement patterns of the electrodes that can be arranged in a certain area decreases and the number of electrostatic capacitance codes decreases, and thus the diameter of an electrode is preferably 6 to 10 mm. Furthermore, the diameter of an electrode is more preferably 7 to 9 mm from the capacitance between the touch panel and the electrodes when the touch panel detects the electrodes when it does not.

Also. although the electrodes are shown as circles in the figure, they are not limited to circles, and they may be ellipses or rectangles, it goes without saying that they may be in any shape as long as the area is secured for capacitance necessary for detection and the edges of electrodes have a distance necessary for facilitating detection as independent electrodes.

As shown in the twenty-ninth and the thirtieth embodiments, of the four ID electrodes 30 and the three information electrodes 111E, the four ID electrodes 30 and one information electrode 111E are combined and arranged on the contact area 40 so that card 110B can be specified uniquely, and the conductor pattern 70 is formed by the five electrodes. Therefore, with the card 110B, three conductor patterns 70 corresponding to the information electrodes 111E can be created.

Three pairs of the first and second indicator electrodes 51 and 52 are provided in correspondence to the information electrodes 111E, and all three first indicator electrodes 51 are connected by the wiring 21.

The first indicator electrodes 51 are each formed so as to concentrically surround the second indicator electrodes 52, and the spacing 53 between the first indicator electrode 51 and the second indicator electrode 52 is narrowed so that when held by a finger, the finger simultaneously overlaps with both. Also. the second indicator electrodes 52 which are adjacent to each other are spaced apart by a predetermined distance so that a finger does not simultaneously overlap with the two.

Note that the number of ID electrodes 111D is not limited to four, and may be any number as long as they can be detected by the touch panel together with the information electrodes 111E. Also, the number of the information electrodes 111E is not limited to three and may be any number. The information electrodes 111E connected to the first indicator electrodes 51 may be any number as long as they are not detected by the touch panel in a state where a first indicator electrode is not held. Furthermore, an operation of simultaneously touching a plurality of indicator electrodes with the fingers may be made possible. Though not shown, six first indicator electrodes 51 may be provided by providing three at each end of the card.

The opposite surface 12 of the first surface on which the wiring layer 20 of the nonconductive base material 10 is arranged is a lower graphic printing surface 12 on which the graphics of the card are processed to be printable or an adhesive surface.

Figure 77:
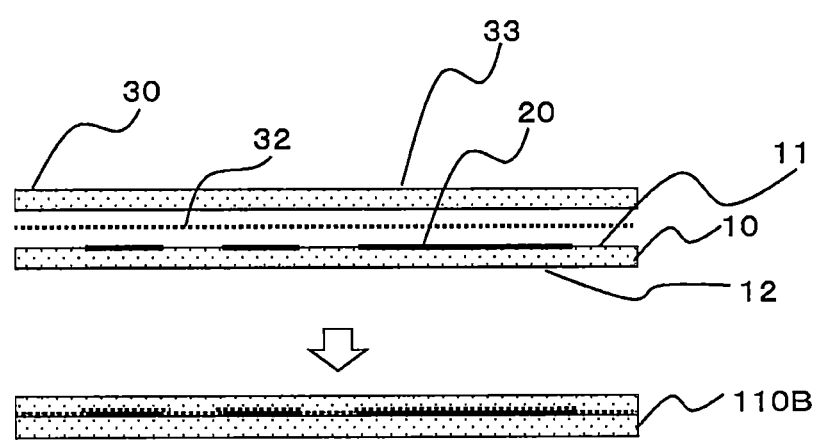
FIG. 77 is a structural example of a thin plate-like apparatus.

Shown in FIG. 77 are a cross-sectional view of the card 110B dissected in parallel with the long side showing disassembled layers and a sectional view after bonding them together.

The lower surface 12 of the nonconductive base material 10 is the lower graphic printing surface 12 on which the graphics of the card are processed to be printable and graphics of the backside of the card 110B are printed.

In regards with the nonconductive base material 10, the first surface 11 and the wiring layer 20 are arranged upwards in the drawing, and the upper nonconductive base material 30 is attached to the upper surface of the nonconductive base material 10 with an adhesive material or adhesive tape 32. The upper nonconductive base material 30 and the adhesive tape 32 have substantially the same planar outline shape as the nonconductive base material 10. The upper nonconductive base material 30 is formed of a thin plastic resin film such as PC, PET or the like, or paper, and serves as a protective layer for the wiring layer 20, and graphics of the card are printed on its surface. In addition, the upper nonconductive base material 30 is preferably made of the same material and the same thickness as the nonconductive base material 10 in order to suppress warping of the card after bonding. The upper surface of the upper nonconductive base material 30 is the upper graphics printing surface 33 on which the graphics of the card are processed to be printable, and along with the lower graphics printing surface 12, are provided with print protection treatment using PP laminate or the like for protecting the printed layer after printing. Furthermore, the surface opposite to the upper surface 33 of the upper nonconductive base material 30 is a surface having adhesiveness.

Also, the graphics printed on the upper graphic printing surface 33 include graphics for guiding to the positions of the indicator electrodes so that the sections corresponding to the positions at which the three sets of the indicator electrodes 51 and 52 are arranged can be held separately by the fingers.

By bonding the nonconductive base material 10 and the upper nonconductive base material 30, the card 110B is formed. In the layer structure of the card shown in FIG. 112, the distance from the wiring layer 20 to the touch panel surface is shortest, and thus the electrode-touch panel capacitances of the electrodes 111E, 111D can be maximized, and from the viewpoint of electrode detection performance, the layer structure of this specification is most preferable.

Figure 78:
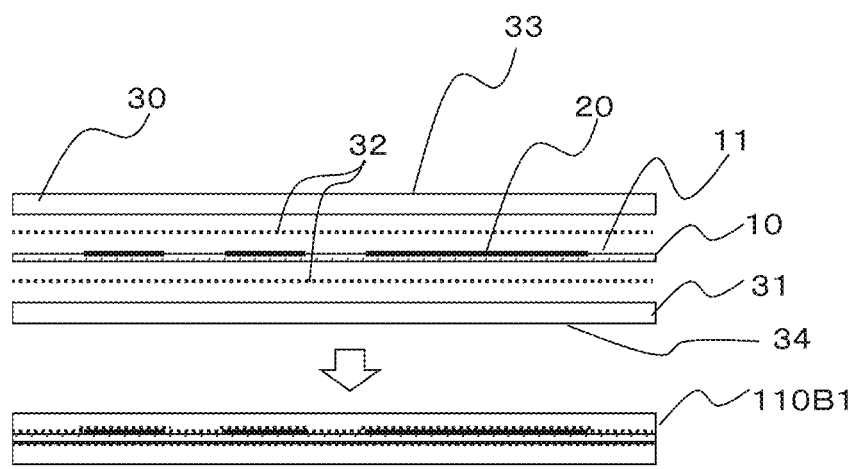
FIG. 78 is a structural example of a thin plate-like apparatus.

FIG. 78 is a diagram for describing the cross-sectional structure of the card 110B1 which is a modification of the layer configuration of the card 110B, and as shown in FIG. 77 are a cross-sectional view of the card 110B1 dissected in parallel with the long side showing disassembled layers and a sectional view after bonding them together.

In the nonconductive base material 10, the first surface 11 and the wiring layer 20 are arranged upward in the drawing, and the upper nonconductive base material 30 and the lower nonconductive base material 31 are bonded to the upper and lower sides of the nonconductive base material 10 by using an adhesive material or an adhesive tape 32. The upper nonconductive base material 30, the lower nonconductive base material 31 and the adhesive tape 32 have substantially the same planar outline shape as the nonconductive base material 10. The upper nonconductive base material 30 and the lower nonconductive base material 31 are formed of a thin plastic resin film such as PC, PET or the like, or paper, and preferably made of the same material and the same thickness in order to suppress warping of the card after bonding. The upper surface 33 and the lower surface 34 of the upper and lower nonconductive base materials 30 and 31 are an upper graphic printing surface 33 and a lower graphic printing surface 34 on which card graphics are processed to be printable and print protection treatment using PP laminate or the like for protecting the printed layer is applied after printing. In addition, the surfaces opposite to the upper surface 33 and the lower surface 34 of the upper and lower nonconductive base materials 30 and 31 are surfaces having adhesiveness.

By bonding the nonconductive base material 10 and the upper and lower nonconductive base materials 30 and 31, the card 110B is formed.

Also, it is more preferable that the conductive base material 10 and the upper and lower conductive base material are made of the same material.

Figure 79:
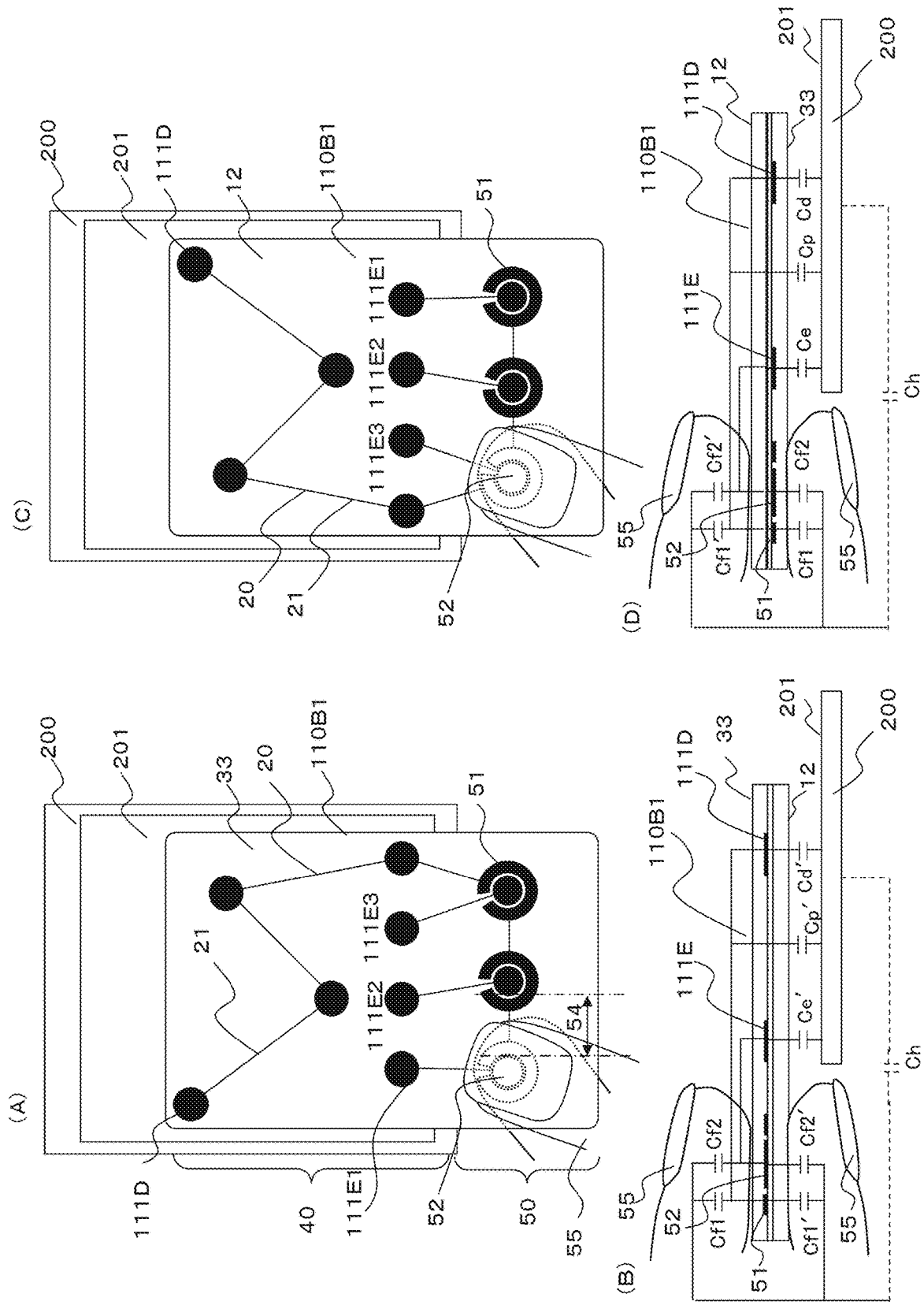
FIG. 79 is a structural example of a thin plate-like apparatus.

FIG. 79 is a diagram for describing a detection operation of the card 110B1 and a method for forming a conductor pattern. FIG. 79(A) shows a state in which the card 110B1 is held with the fingers 55 sandwiching both surfaces and the lower graphic printing surface 12 of the card 110B1 is brought into contact with the touch panel 201 of the information device 200 such as a smartphone. Actually, the wiring layer 20 cannot be visually recognized from the upper surface 33 of the card 110B1, but for the sake of explanation the wiring layer is shown transparent on the upper surface 33. FIG. 79(B) is a diagram schematically superimposing a circuit in the state of FIG. 79(A) constituted with the electrostatic capacitance generated in a cross-sectional view in which the card 110B1 shown in FIG. 78 is dissected parallel to the long side.

As shown in FIGS. 79(A) and 79(B), when a finger is superimposed on the left indicator electrodes 51 and 52 with the upper surface 33 of the card 110B1 facing upward, in the overlapping area, electrostatic capacitances of Cf1, Cf2, Cf1', Cf2' are generated between a finger and the indicator electrode 51, a finger and the indicator electrode 52 on the upper surface 33 side and the lower surface 12 side, respectively. Also, by bringing the card 110B into contact with or close proximity to the touch panel 201, electrostatic capacitance Ce' is generated between the touch panel 201 and the information electrodes 111E1, 111E2, and 111E3, respectively, Cd' is generated between the touch panel 201 and four ID electrodes 111D, and Cp' is generated in the wiring 21 connecting ID electrodes 111D. (Electrostatic capacitance is also generated in the wiring 21 between the information electrodes 111E and the indicator electrodes 52, but the wiring is short and small and thus it is omitted.)

Due to the electrostatic capacitance Cf1+Cf1', the first indicator electrode 51 and the finger are coupled to generate an alternating current conduction state, and the electrostatic capacitance Ch between the human body via the finger and the apparatus 200, and the four ID electrodes 111D through wiring 21 are in an alternating current conduction state. Thus, it is possible to change the detection capacitance Cm and the detection current $I_{RX}$, not shown, for detecting the state of the touch panel 201 directly under the ID electrodes 111D to detectable capacitance values and current values.

Likewise, due to the electrostatic capacitance Cf2+Cf2', the second indicator electrode 52 on the left side with the upper face of the card 110B1 facing upwards and the finger are coupled to generate an alternating current conduction state, and the electrostatic capacitance Ch between the human body through the finger and the device 200, and via the wiring 21, the corresponding information electrode 111E1 are in an alternating current conduction state. Thus, it is possible to change the detection capacitance Cm and the detection current $I_{RX}$, not shown, for detecting the state of the touch panel 201 directly under the information electrodes 111E1 to detectable capacitance values and current values.

Furthermore, since the second indicator electrode 52 corresponding to the information electrodes 111E2 and 111E3 is not held by the finger 55, no electrostatic capacitance equivalent to the electrostatic capacitance Cf2+Cf2' is generated, and thus the electrostatic capacitances generated between the touch panel 201 and the information electrodes 111E2 and 111E3 are respectively only Ce'. Therefore, it is not possible to change the detection capacitance Cm and the detection current $I_{RX}$, not shown, for detecting the state of the touch panel 201 directly under the information electrodes 111E2, 111E3 to detectable capacitance values and current values.

As a result, the position information of the five electrodes consisting of the four ID electrodes 111D and the information electrodes 111E1 is detected, and the conductor pattern 70 is formed.

Furthermore, when the position held by the finger 55 is changed to the position where the finger 55 overlaps the first and second indicator electrodes 51, 52 at the center of the card 110B, electrostatic capacitance similar to when the left side is held with the upper surface 33 facing upwards is generated and in addition electrostatic capacitance Cf2+Cf2' is generated in the second indicator electrode 52 at the center of the card, and since in the place of information electrode 111E1, the corresponding information electrode 111E2 generates an alternating current conduction state with the electrostatic capacitance Ch between the human body through the finger and the apparatus 200, the position information of the five electrodes consisting of the four ID electrodes 111D and the information electrodes 111E2 is detected, and a different conductor pattern 70 is formed.

Similarly, when the position held by the finger 55 is changed to the position where the finger 55 overlaps the first and second indicator electrodes 51 and 52 on the right side with the upper section 33 of the card 110B1 facing upwards, the position information of the five electrodes consisting of the four ID electrodes 111D and the information electrodes 111E3 is detected, and still another different conductor pattern 70 is formed.

Therefore, three kinds of conductor patterns 70 can be formed by changing the positions held by the fingers 55 among the three positions at the right, left, and center corresponding to each indicator electrode.

In addition, three further types of conductor patterns 70 can be formed by turning over the card 110B1 and bringing it into contact with or into close proximity to the touch panel 201.

Figure 88:
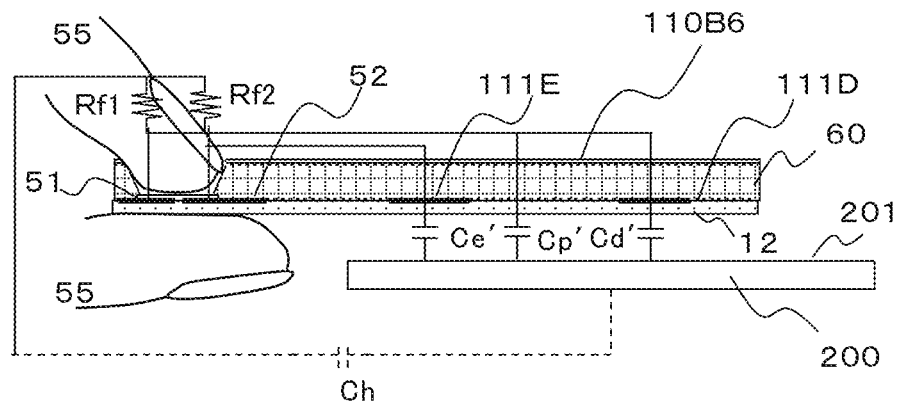
FIG. 88 is a structural example of a thin plate-like apparatus.

FIG. 79(C) shows a state in which the card 110B1 is turned over in the same state as in FIG. 79(A), and the upper graphic printing surface 33 of the card 110B is brought into contact with the touch panel 201. Actually, the wiring layer 20 cannot be visually recognized from the lower surface 12 of the card 110B1, but for the sake of explanation the wiring layer is shown transparent on the lower surface 12. FIG. 79(D) is a diagram schematically superimposing a circuit in the state of FIG. 79(B) constituted with the electrostatic capacitance generated in a cross-sectional view in which the card 110B1 shown in FIG. 88 is dissected parallel to the long side.

As shown in FIG. 79(C), since the card 110B1 is turned over to make contact with the touch panel 201, the card is placed on the touch panel 201 with the four ID electrodes 111D, the three information electrodes 111E, and the information electrodes 111E corresponding to the first and second indicator electrodes 51 and 52 are in symmetrical positions with respect to the long side direction of the card.

Furthermore, as shown in FIG. 79(D), even when the upper graphic printing surface 33 is brought into contact with the touch panel 201, at the first and second indicator electrodes 51 and 52, electrostatic capacitances Cf1+Cf1', Cf2+Cf2', the same as those when the lower graphic printing surface 12 is brought into contact are generated.

Furthermore, by turning the card 110B over, since the distance to the touch panel 201 is increased by the thickness of the nonconductive base material 10 for the four ID electrodes 111D, the three information electrodes 111E, and the wiring 21, the respective electrostatic capacitances become Cf, Ce, Cp. However, by making the thickness of the nonconductive base material 10 sufficiently thin, it is possible to suppress the respective electrostatic capacitance values to an extent that they do not substantially change or are only slightly reduced.

As a result, even in the state of FIG. 79(C), the card 110B1 of FIG. 79(A) is in the same connection state as when the lower graphic printing surface 12 is brought into contact with the touch panel 201, and conductor patterns 70 each corresponding to the three groups of indicator electrodes can be formed. Since the positional relationship of the wiring layer 20 is symmetric with respect to FIG. 79(A), the conductor patterns 70 differ between when the lower graphic printing surface 12 of the card 110B1 is brought into contact with the touch panel 201 and when the upper graphic printing surface 33 of the card 110B1 is brought into contact with the touch panel 201, thus a total of six types of conductor patterns 70 can be formed on the entire card 110B1.

Furthermore, with the card 110B having the structure shown in FIG. 77, by setting the thicknesses of the nonconductive base material 10 and the upper nonconductive base material 30 to be the same, regardless of which face of the card 110B in brought into contact the touch panel 201, since there is no difference in the distance from the wiring layer 20 to the touch panel 201, the generated electrostatic capacitance in exactly the same and it is needless to say that with respect to the front and back sides of the card 110B, a total of six types of conductor patterns 70 can be formed.

Figure 80:
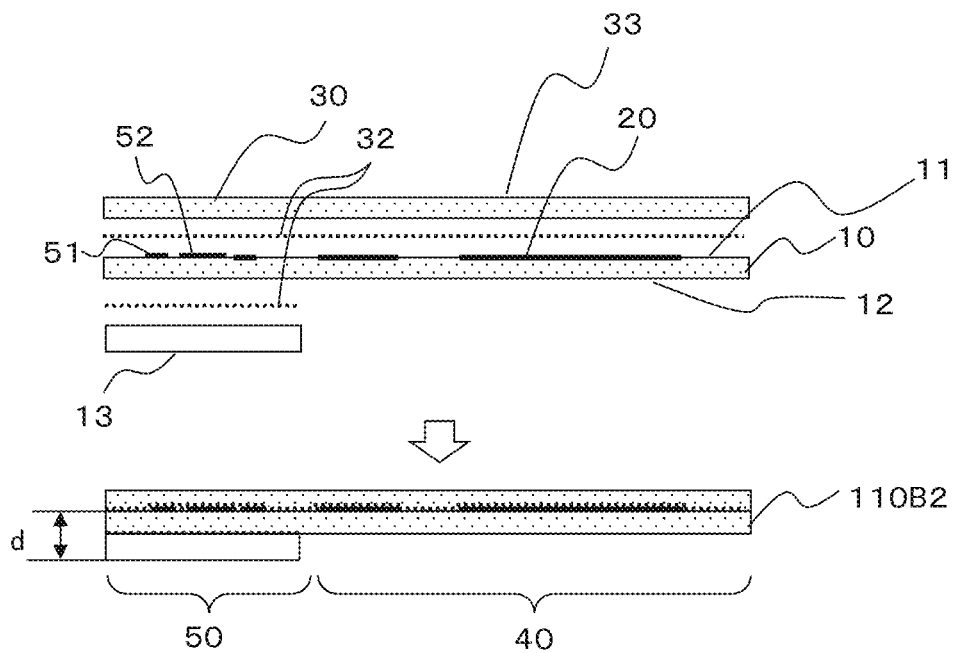
FIG. 80 is a structural example of a thin plate-like apparatus.
Figure 86:
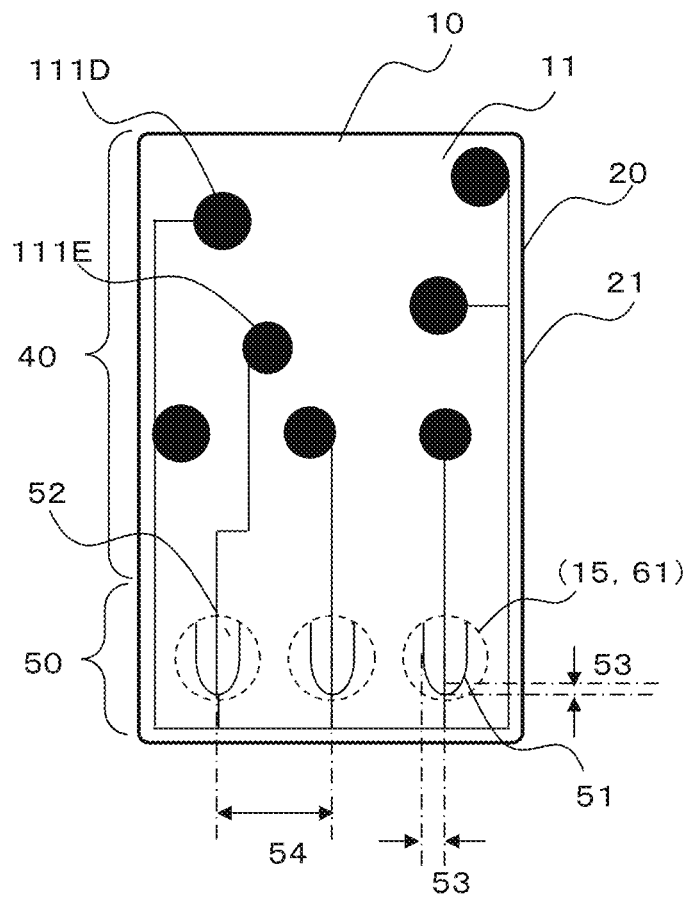
FIG. 86 is a structural example of a thin plate-like apparatus.

FIG. 80 is a cross-sectional view for describing the card 110B2 which is a modification example of the layer configuration of the card 110B, and as shown in FIG. 86 are a cross-sectional view of the card 110B2 dissected in parallel with the long side showing disassembled layers and a sectional view after bonding them together.

The card 110B2 differs from the card 110B in FIG. 77 in that the lower nonconductive base material 13 for conductivity suppression is attached to the section of the holding area 50 of the card lower surface 12 with an adhesive material or adhesive tape 32.

By providing a lower nonconductive base material 13 for suppressing conduction, the distance d between the finger on the under side and the first and second indicator electrodes 51, 52 increases when holding the holding area 50 with the fingers, and it is possible to reduce the electrostatic capacitance (the electrostatic capacitance corresponding to Cf1' and Cf2' shown in FIG. 79(B)) between the finger on the under side and the first and second indicator electrodes 51 and 52.

As a result, when holding the holding area 50 with the fingers, even if a finger holding the card inadvertently overlaps with the position of an adjacent second indicator electrode 52 with a finger without seeing the symbol for guiding to an indicator electrode position, it is possible to reduce the risk of detecting two information electrodes 111E simultaneously.

However, in the case of this modification, since the capacitance between the finger on the card bottom surface 12 side and the first and second indicator electrodes 51 and 52 no longer contributes to alternating current conduction, it is necessary to make the areas of the first and second indicator electrodes 51 and 52 larger than those of the card 110B. Note that on the touch panel side, measures may be taken with an application that generates an alarm as error processing.

Figure 81:
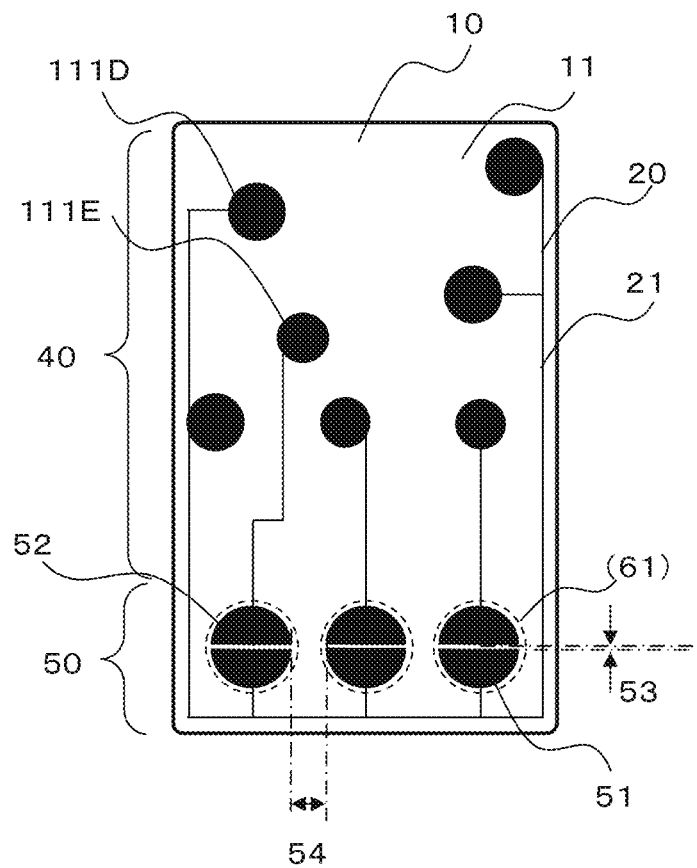
FIG. 81 is a structural example of a thin plate-like apparatus.
Figure 82:
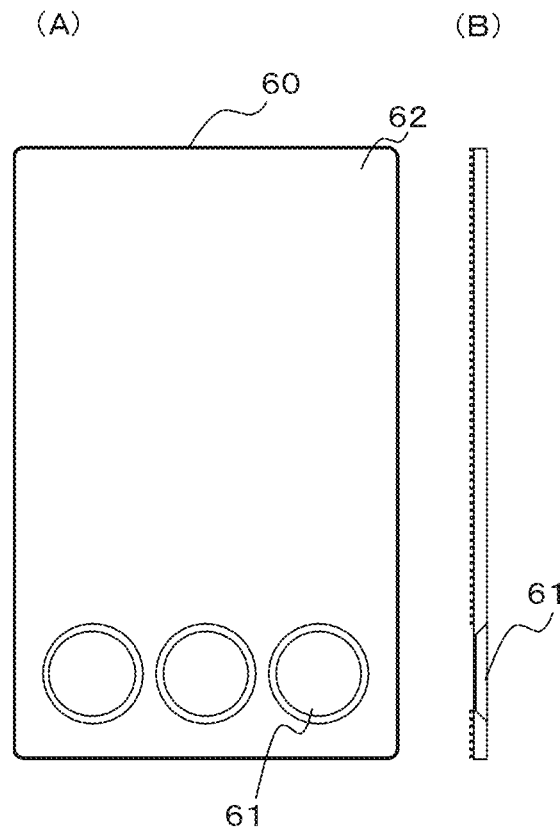
FIG. 82 is a structural example of a thin plate-like apparatus.
Figure 83:
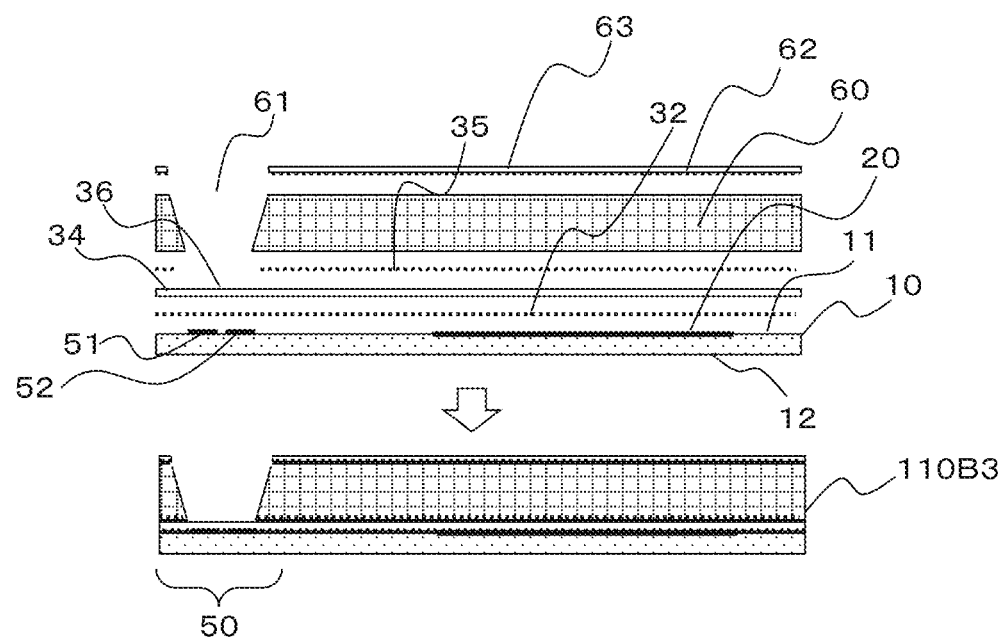
FIG. 83 is a structural example of a thin plate-like apparatus.

FIGS. 81 to 83 are diagrams for describing a card 110B3 which is a modification example of the structure of the card 110B. FIG. 81 shows the plan view of the first surface on which the wiring layer 20 of the nonconductive base material 10 used for the card 110B3 is arranged as in FIG. 76. FIG. 82 is a structural drawing of a molding plate 60 which is the upper nonconductive base material used for the card 110B3, with FIG. 82(A) a top view, and FIG. 82(B) a side view. Shown in FIG. 83, as in FIG. 77, are a cross-sectional view of the card 110B dissected in parallel with the long side showing disassembled layers and a sectional view after bonding them together.

As shown in FIG. 81, with respect to the wiring layer 20 of the card 110B in FIG. 76, the layout and arrangement of the first and second indicator electrodes 51 and 52 of the holding area 50 for the card 110B3 are different.

The first and second indicator electrodes 51, 52 are substantially semicircular shaped, and are opposed to each other in the vertical direction of the drawing with a narrow spacing 53 so that a finger overlaps with both simultaneously when holding by the fingers. Also, the spacing 54 between adjacent second indicator electrodes 52 corresponds to the space between edge sections of the semicircular shapes.

The molded plate 60 which is a nonconductive base material shown in FIG. 82 is produced by molding a plastic resin such as thin PC (polycarbonate), PET (polyethylene terephthalate) or the like, and is formed in a rectangular shape with planar external dimensions almost the same as those of the card 110B3. The molded plate 60 is relatively thicker than the upper nonconductive base material 30 used for the card 110B and is thickly formed within a range in which the thickness of the entire card 110B3 is about the thickness of a cash card.

Furthermore, openings 61 having a size that enables the exposure of all of the first and second indicator electrodes 51, 52 is provided at positions corresponding to the first and second indicator electrodes 51, 52 of the holding area 50. The side of the opening 61 has a tapered shape with the opening widening towards the upper surface. This taper is for accommodating a finger in the opening without having the user feel uncomfortable when carrying out a contact operation with a finger which is curved and for ensuring the ball of the finger to make contact with the first and second indicator electrodes 51 and 52. Of course, it may be cylindrical as long as a sufficient opening can be secured.

As shown in FIG. 83, the lower surface 12 of the nonconductive base material 10 is the lower graphic printing surface 12 on which the graphics of the card are processed to be printable and graphics of the backside of the card 110B3 are printed.

In the nonconductive base material 10, the first surface 11 and the wiring layer 20 are arranged upwards in the drawing, and the upper nonconductive base material 34 for the inner layer is attached to the upper surface of the nonconductive base material 10 with an adhesive material or adhesive tape 32. The inner nonconductive base material 34 has substantially the same planar outline shape as that of the nonconductive base material 10, and is formed of a plastic resin film such as thin PC or PET. The lower surface of the upper nonconductive base material 34 for the inner layer is an adhesive surface.

Furthermore, on the upper surface of the upper nonconductive base material 34 for the inner layer, a graphic indicating the holding section of the card is printed at a position 36 corresponding to the opening 61. A molded plate 60 is disposed above so as to align the opening 61 with the position 36, and a section corresponding to the position 36 is attached with a die-cut adhesive tape 35.

An upper graphic printing film 62 of which the back side is an adhesive tape is provided above the molding plate 60, and a graphic of the card is printed on the front side 63. The upper graphic printing film 62 is die-cut at a section corresponding to the opening 61 of the molding plate 60, and is attached to the molding plate 60 in accordance with the position of the opening 61.

After printing, the surface 63 of the upper graphic printing film 62 and the lower graphic printing surface 12 are subjected to print protection treatment with varnish or the like for protecting the printing layer.

The card 110B3 is formed by adhering the nonconductive base material 10, the upper nonconductive base material 34 for the inner layer, the molding plate 60, and the upper graphic printing film 62.

As shown in FIGS. 81 to 83, the first and second indicator electrodes are provided in the opening 61 of the molded plate 60 having a thickness, and when holding the card 110B3 with the fingers, since the opening 61 serves as a guide to the holding position, it is possible to reduce the possibility of a finger erroneously overlapping with an adjacent second indicator electrode 52. Therefore, it is possible to narrow the spacing 54 between adjacent second indicator electrodes 52 to some extent. Furthermore, by forming the molding plate 60 thick with a plastic resin having a low relative dielectric constant, even if the touch surface 201 of the card 110B3 is brought into contact with the touch panel 201 with an erroneous touch by the finger, it is possible to prevent the fingers from being detected by the touch panel 201. As a result, malfunction of the information device 200 can be prevented. That is, the molded plate 60 can be regarded as an example of a characteristic base material having physical characteristics for suppressing the generation of a change in a physical quantity detectable by a touch panel 201.

Figure 84:
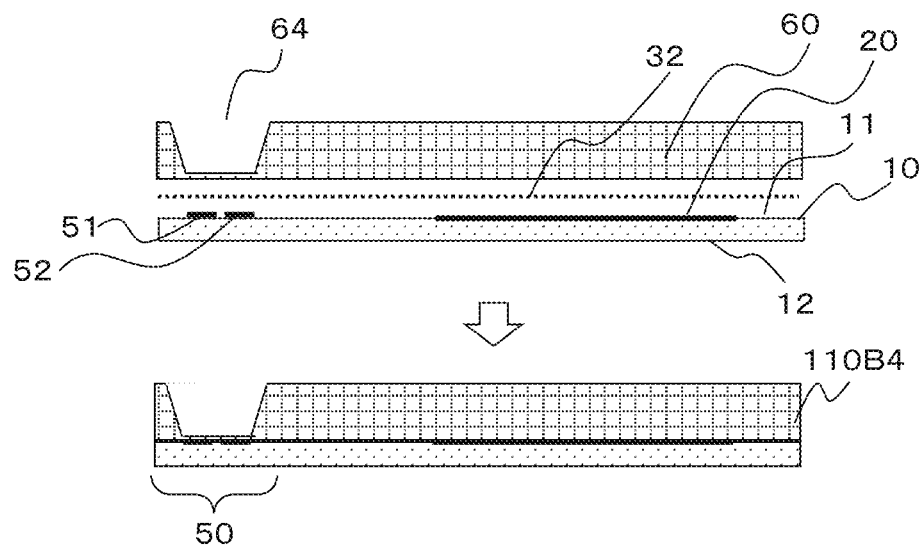
FIG. 84 is a structural example of a thin plate-like apparatus.

FIG. 84 is a cross-sectional view for describing a card 110B4 which is a modification example of the layer constitution and structure of the card 110B3, and as in FIG. 86 are a cross-sectional view of the card 110B dissected in parallel with the long side showing disassembled layers and a sectional view after bonding them together.

With respect to the card 110B3 in FIG. 83, the card 110B4 has a configuration in which the inner nonconductive upper base material 34 and the upper graphic printing film 62 are removed, and the point that the opening 61 of the molding plate 60 is changed to a recess 64 is different.

The recess 64 of the molded plate 60 used for the card 110B4 has the same opening size as the opening 61 and the side shape is the same, but there is no penetration in the vertical direction and a layer having substantially the same thickness as the thickness of the upper nonconductive base material 34 for the inner layer remains in the bottom section. The upper surface of the molding plate 60 is processed to be printable with graphics of the card including the surface of the recess 64. The lower surface of the molded plate 60 is an adhesive surface.

At the bottom of the recess 64, a pattern indicating the holding section of the card is printed. Printing is performed by a printing machine capable of printing graphics on the upper surface of the card including the symbols of the card holding section of the recess 64 and also printing on three dimensional shapes.

The first surface 11 on which the wiring layer 20 of the nonconductive base material 10 is provided and the lower surface of the molding plate 60 are arranged so that the recess 64 and the first and second indicator electrodes 51 and 52 are arranged together by bonding with an adhesive tape 32, the card 110B4 is formed.

By printing on a molded plate 60 provided with a recess 64 and on three-dimensional shapes, it is possible to reduce the member and the manufacturing processes for card 110B4 with respect to the card 110B3.

Figure 85:
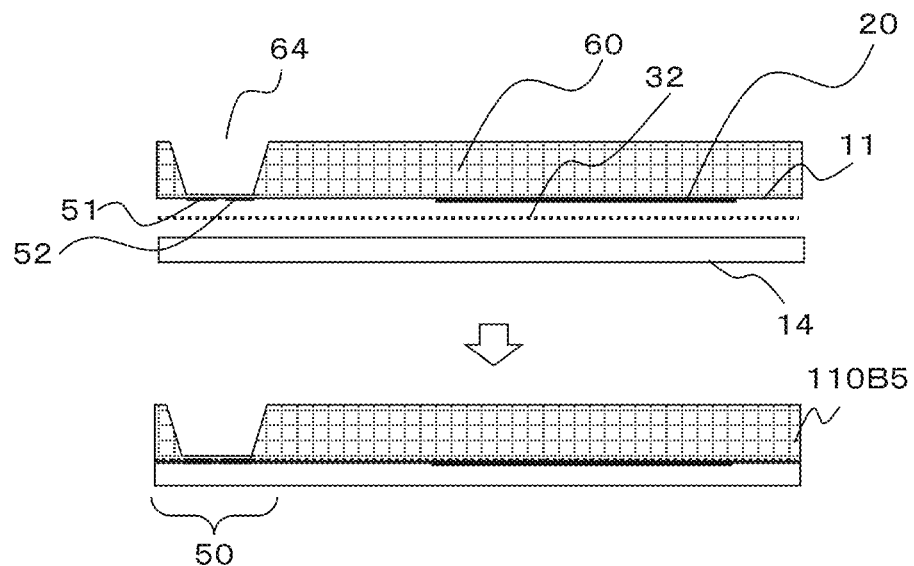
FIG. 85 is a structural example of a thin plate-like apparatus.

Furthermore, FIG. 85 is a diagram for describing a card 110B5 which is a modification example of the structure of the card 110B4, and as in in FIG. 77 are a cross-sectional view of the card 110B dissected in parallel with the long side showing disassembled layers and a sectional view after bonding them together.

The card 110B4 and the card 110B5 differ in that the first surface 11 on which the wiring layer 20 is printed is changed from the nonconductive base material 10 to the back surface of the molding plate 60.

As shown in FIG. 85, the wiring layer 20 is printed with conductive ink on the first surface 11 which is the back surface of the molded plate 60 provided with the recess 64, and in addition, the graphics for the back surface of the card are superimposed and printed. A molded plate 60 formed of a transparent plastic resin and a lower nonconductive base material 14 having substantially the same planar dimensions as those of the molded plate 60 are adhered on the under side with an adhesive material or adhesive tape 32. Since the upper surface of the lower nonconductive base material 14 is an adhesive surface and the under side is the back surface of the card 110B5, processing is carried out according to the specifications of the back side of the card.

Thus, the card 110B5 can further reduce the member and the manufacturing processes with respect to the card 110B4.

Figure 87:
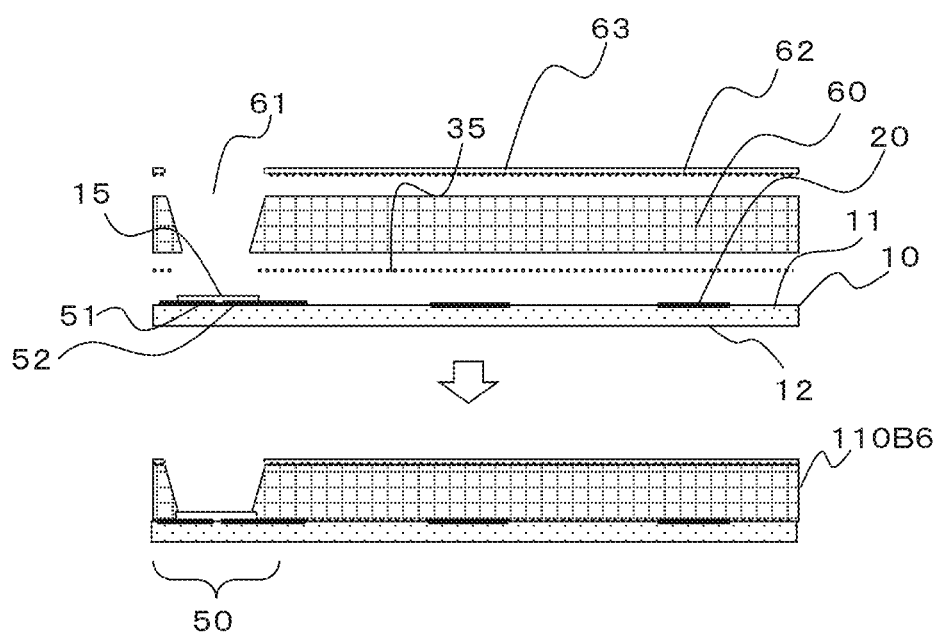
FIG. 87 is a structural example of a thin plate-like apparatus.

FIGS. 86 to 88 are diagrams for describing the card 110B6 which is a modification example of the structure of the card 110B, FIG. 86 is a plan view of the first surface on which the wiring layer 20 of the nonconductive base material 10 used for card 110B6 is arranged as in FIG. 76, and in FIG. 87, as shown in FIG. 77, are a cross-sectional view of the card 110B6 dissected in parallel with the long side showing disassembled layers and a sectional view after bonding them together. FIG. 88 is a diagram for describing the detection operation of the card 110B6 and the method of forming the conductor pattern.

With respect to the card 110B3 of FIG. 83, the card 110B6 differs in that the inner nonconductive upper base material 34 and the upper graphic printing film 62 are removed, and the shapes, the surface treatment, and the conduction method of the first and second indicator electrodes of the wiring layer 20 are changed.

As shown in FIG. 86, with respect to the wiring layer 20 of the card 110B3 in FIG. 83, the layout and arrangement of the first and second indicator electrodes 51 and 52 of the holding area 50 are different with those of the card 110B6.

The first and second indicator electrodes 51 and 52 are linear conductive members and the second indicator electrode 52 is an end section of a narrow wiring 21 having a line width of about 0.2 mm. Similarly, the first indicator electrode 51 is a narrow wiring 21 having a line width of about 0.2 mm and is arranged in a U shape so as to surround the second indicator electrode 52. The spacing 53 is narrowed so that they are grouped and when held by a finger, the finger simultaneously overlaps with both. The spacing 54 between adjacent second indicator electrodes 52 corresponds to the spacing between wirings for the second indicator electrode 52.

A wiring layer 20 is formed by printing on the first surface 11 of the nonconductive base material 10 shown in FIG. 87. The first and second indicator electrodes 51 and 52 in the holding area 50 are arranged at positions corresponding to the opening 61 of the molding plate 60. Furthermore, on the first surface 11 of the nonconductive base material 10, an opening area printing section 15 is provided in a range corresponding to the opening of the opening 61 of the molding plate 60, and an anisotropically conductive white ink having conductivity in the thickness direction including a conductive filler is used to cover the wiring 21 of each indicator electrode from above the wiring layer 20 and a pattern for guiding to the position to be held by the finger is printed. The anisotropic conductive ink includes a white ink or the like using conductive titanium oxide as a pigment.

In addition, in a case where the film thickness of the wiring layer 20 is large generating unevenness, a raised layer made of a nonconductive member such as varnish or a resist is formed to reduce the unevenness and thus the printing quality of the opening area printing section 15 can be increased.

FIG. 88 is a diagram for describing the detection operation of the card 110B6 and the method of forming a conductor pattern. FIG. 88 shows a cross sectional view, cut in parallel along the long side direction of the card 110B6, superimposed with a circuit which is constituted with the capacitance and the resistance which is generated, when the card 110B6 is held sandwiched between the fingers 55 and the lower graphic printing surface 12 of the card 110B6 is making contact with the touch panel 201 of the information device 200 such as a smartphone.

As shown in FIG. 88, when the opening 61 of the molding plate 60 and the lower surface 12 are held sandwiched between the fingers 55, the indication electrodes 51, 52 and the fingers 55 on the upper side are connected via the anisotropic conductive ink of the opening area printing section 15, and by possessing resistances Rf1 and Rf2, respectively, a direct current conduction state is established with the electrostatic capacitance Ch between the human body and the device 200. Furthermore, by bringing the card 110B6 into contact with or into close proximity to the touch panel 201, Ce' is formed between the touch panel 201 and the three information electrodes 111E1, 111E2, and 111E3, respectively, and electrostatic capacitance Cd' is generated in the four ID electrodes 111D and electrostatic capacitance Cp' is generated in the wiring 21 connecting the ID electrodes 111D. (Electrostatic capacitance is also generated in the wiring 21 between the information electrodes 111E and the indicator electrodes 52, the finger 55 on the lower surface 12 side, and the wiring 21 of the indicator electrodes 51 and 52, but the quantities are small, and thus they are omitted.)

Due to the resistance Rf1, the first indicator electrodes 51 and the fingers are in a direct current conduction state, and the electrostatic capacitance Ch generated between the human body via the finger and the device 200, and the four ID electrodes 111D are connected via the wiring 21. Thus, it is possible to change the detection capacitance Cm and the detection current $I_{RX}$, not shown, for detecting the state of the touch panel 201 directly under the ID electrodes 111D to detectable capacitance values and current values.

Likewise, only the information electrode 111E connected to the second indicator electrode 52 which is in a direct current conduction state with the finger 55 of the card 110B6 is connected to the electrostatic capacitance Ch between the human body via the finger and the device 200 by the resistance Rf2. Thus, it is possible to change the detection capacitance Cm and the detection current $I_{RX}$, not shown, for detecting the state of the touch panel 201 directly under the information electrode 111E to detectable capacitance values and current values.

Furthermore, since the second indicator electrodes 52 corresponding to the other two information electrodes 111E are not in a state of being held by finger 55, and the human body and the device 200 are not connected with the electrostatic capacitance Ch via the finger, the electrostatic capacitance generated between the touch panel 201 and the other two information electrodes 111E is only Ce', respectively. Thus, it is possible to change the detection capacitance Cm and the detection current $I_{RX}$, not shown, for detecting the state of the touch panel 201 directly under two other information electrodes 111E to detectable capacitance values and current values.

As a result, the position information of five electrodes in total including the four ID electrodes 111D and one information electrode 111E corresponding to the held position is detected, and a conductor pattern 70 is formed. Furthermore, when the position held by the finger 55 is changed to a position of the other two first and second indicator electrodes 51, 52, the position information of each of the four ID electrodes 111D are similarly detected and only the information electrode 111E corresponding to second indicator electrode 52 at the held position is detected, respectively. To form the two different conductor patterns. Therefore, three types of conductor patterns 70 in total are formed for the card 110B6.

As a result, the conductor pattern 70 can be formed more reliably by connecting the electrode 111 and the electrostatic capacitance Ch between the human body and the device 200 with direct current in the card 110B6.

Figure 89:
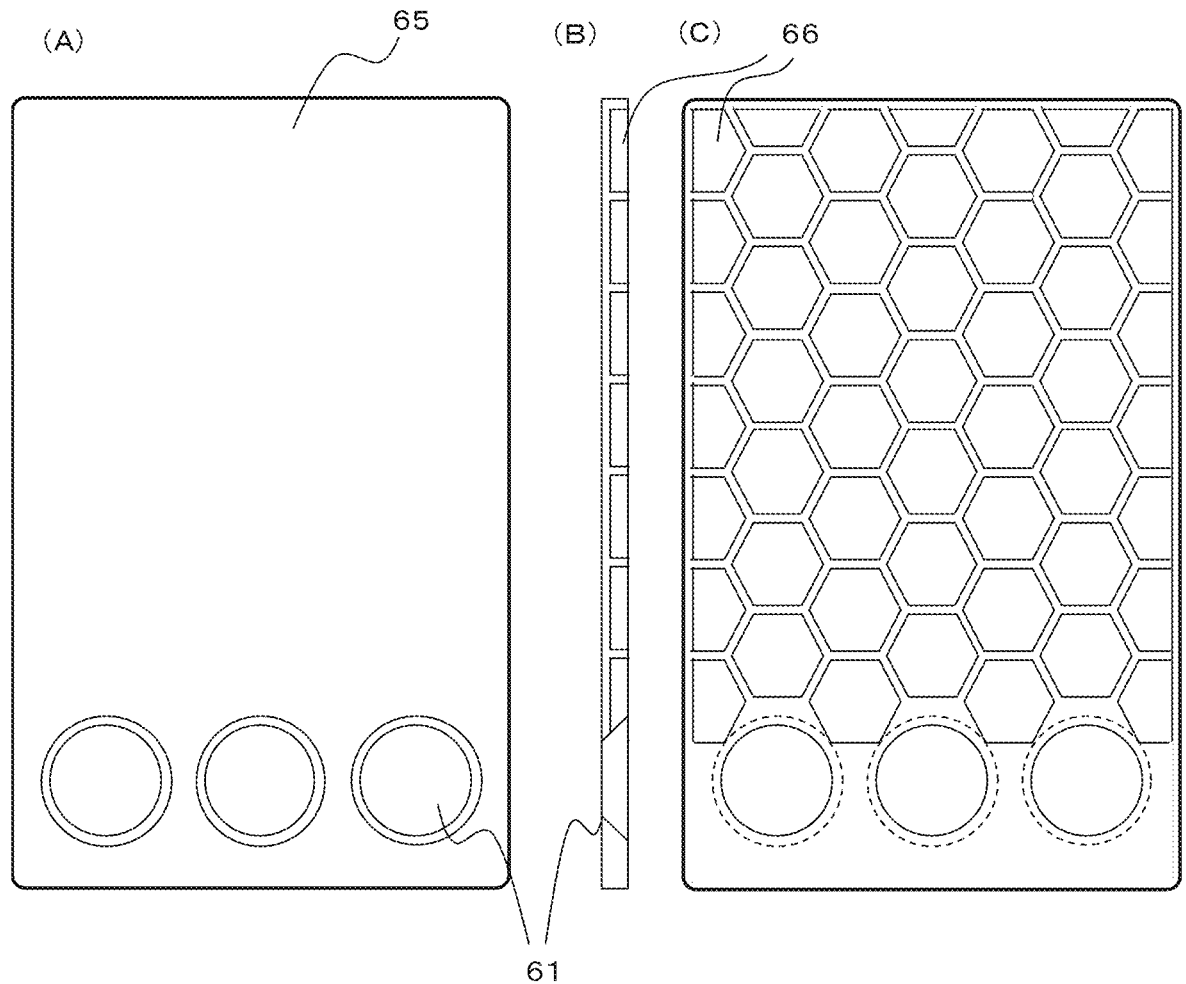
FIG. 89 is a structural example of a thin plate-like apparatus.

FIG. 89 is a diagram describing a modification example of a molding plate 65 in which the structure of the molding plate 60 used for the card 110 B is changed. FIG. 89 (A) is a top plan view, FIG. 89(B) is a side view, and FIG. 89(C) is a bottom view. The difference between the molded plate 60 and the molded plate 65 is that a groove 66 is carved from the lower surface side to the upper surface side, and when used for the card 110B, and a gap layer is formed between the wiring layer 20 and the front side of the card 110B (the side not in contact with the touch panel 201). The grooves 66 are arranged on the entire plane of the contact surface area 40 of the molded plate 65 to form a honeycomb structure as a whole, and the card has a structure in which strength is maintained while securing area for the air gaps. The depth of the grooves 66 should be adjusted depending on the thickness of the molded plate 65 to the extent that the strength does not decrease.

By providing the grooves 66 in the molded plate 65, it is possible to reduce the dielectric constant from the wiring layer 20 to the card surface. Thus, the fingers can further be prevented from being detected when there is an erroneous contact of the finger on the surface of the card 110B. As a result, malfunction of the information device 200 can be further prevented.

Twelfth Embodiment

[Mechanism of a C-CARD (Use by placing, structure: single layer without a gap layer, formation of conducting wires and electrodes on one side)]

This practical example is an embodiment of a card used by placing the card, which is a thin plate shaped apparatus 110C, so that it comes into contact with or comes into close proximity to a touch panel such as a smartphone or a tablet.

Figure 90:
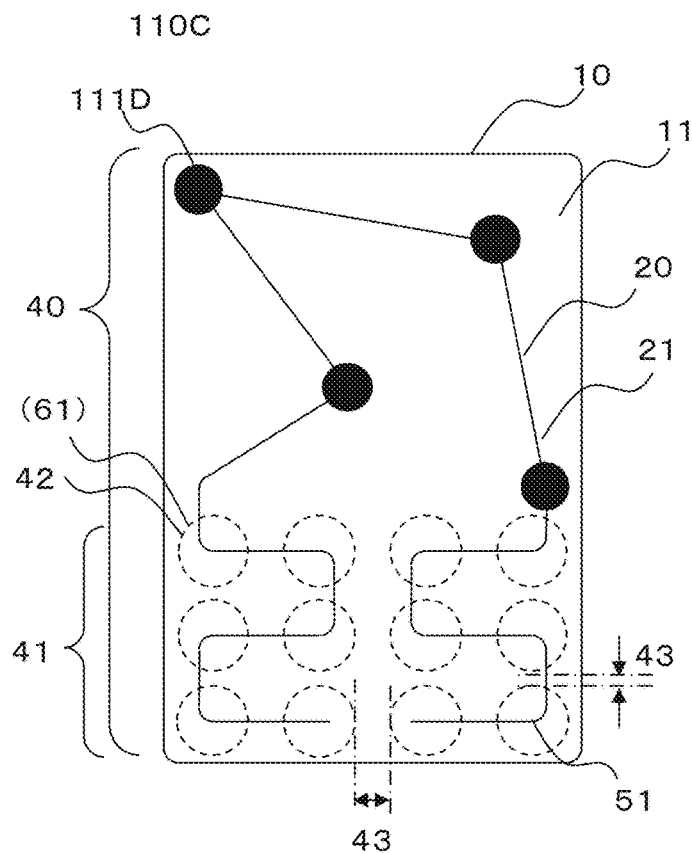
FIG. 90 is a structural example of a thin plate-like apparatus.
Figure 91:
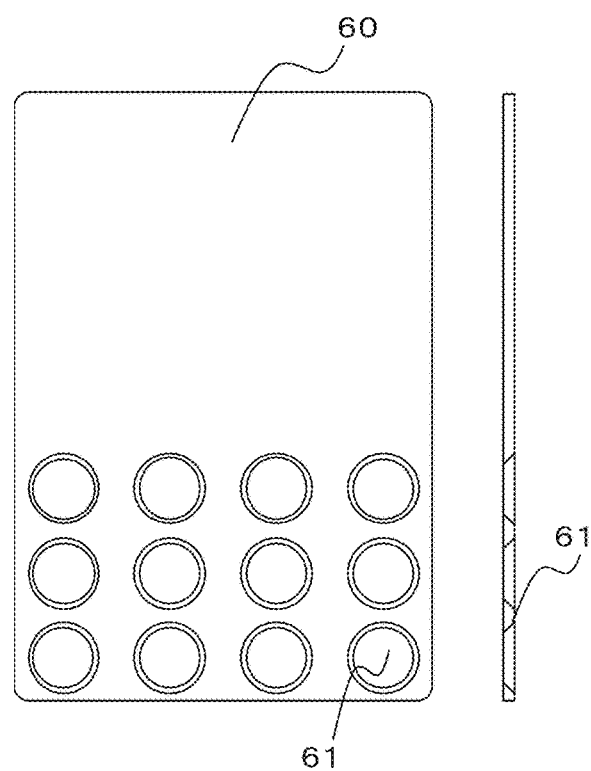
FIG. 91 is a structural example of a thin plate-like apparatus.
Figure 92:
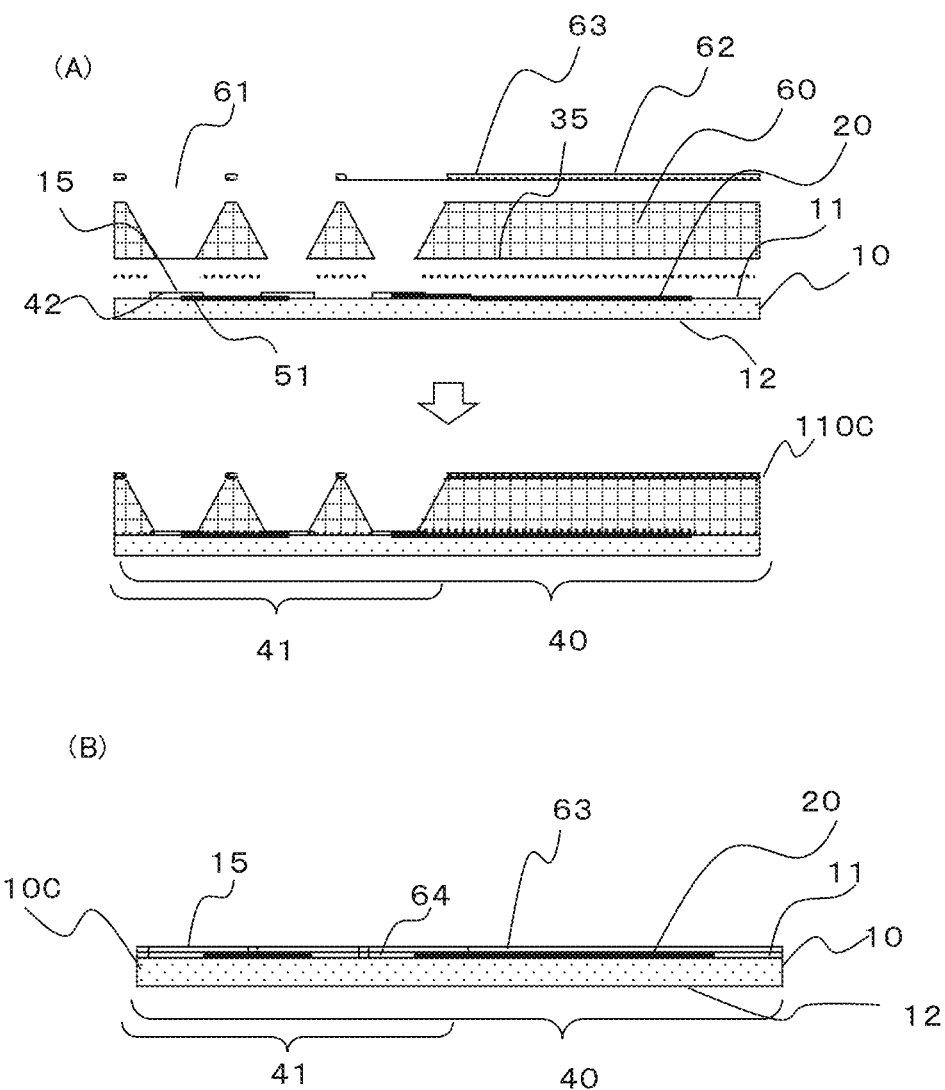
FIG. 92 is a structural example of a thin plate-like apparatus.
Figure 93:
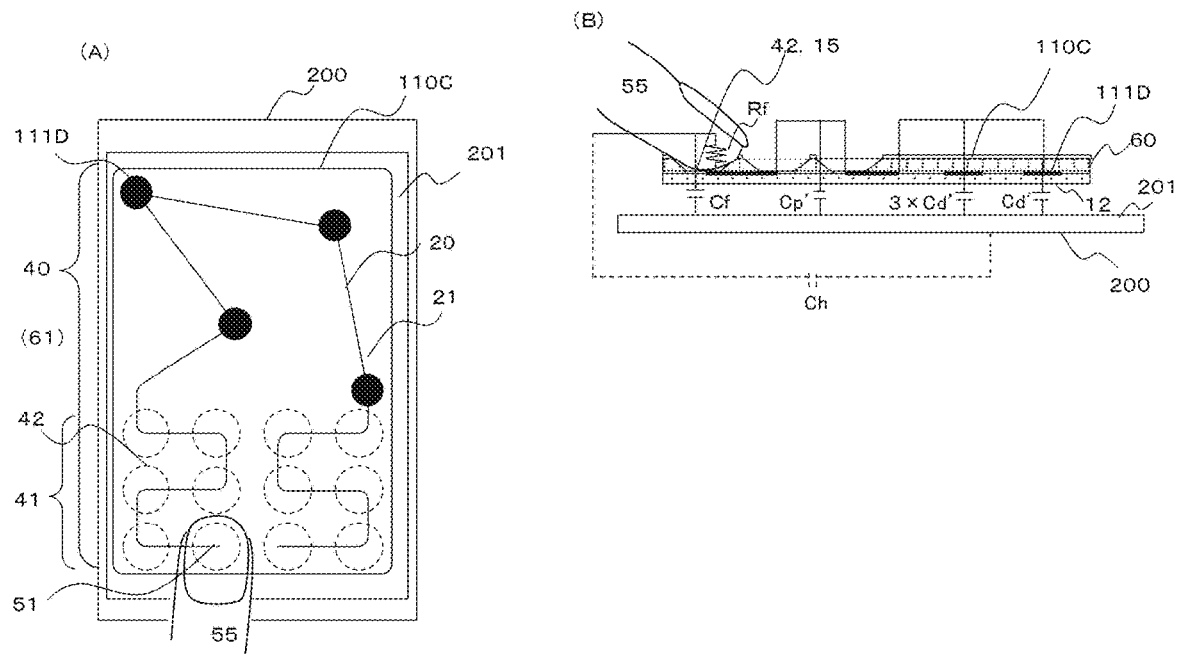
FIG. 93 is a structural example of a thin plate-like apparatus.

Shown in FIGS. 90 to 95 are views for describing the structure of the card 110C, and FIG. 90 is a plan view of the first surface 11 on which the wiring layer 20 of the nonconductive base material 10 is arranged. FIG. 91 is a view of a molded plate 60 of a nonconductive base material, in which FIG. 91(A) is a top view and FIG. 91(B) is a side view. FIG. 92 is a cross-sectional view of the card 110C dissected in parallel with the long side showing disassembled layers and a sectional view after bonding them together, FIG. 92(A) shows a case where a molding plate 60 is used, and FIG. 92(B) shows a case where a molding plate 60 is not used. FIG. 93 is a diagram for describing a detection operation of the card 110C and a method for forming a conductor pattern.

As shown in FIG. 90, the nonconductive base material 10 is a plastic resin film such as a thin PC (polycarbonate), PET (polyethylene terephthalate) or the like, or paper, and it is formed in a rectangle with almost the same external dimensions as a trading card, a Cybernet standard card such as a QUO card, and a credit card.

The wiring layer 20 is formed on the first surface 11 of the nonconductive base material 10 by printing using a conductive ink such as a silver salt ink, a silver paste ink, a carbon ink, or the like.

The entire card 110C, that is, the entire nonconductive base material 10 is the contact surface area 40, and with the long side direction of the nonconductive base material 10 designated as the vertical direction, the operation area 41 is provided at the bottom, and within the operation area 41, 12 contact units 42 are individually provided in a 4×3 equal interval arrangement. The contact units 42 are formed in circular shapes having a diameter of about 7 mm which is approximately the same size as a finger 55 of a person when touching the touch panel 201 with the purpose of operating the information device 200.

In the area other than the operation area 41 of the contact surface area 40, the ID electrodes 111D which are four first electrodes arranged with circular shapes having a diameter of about 7 mm. Two of the four ID electrodes 111D are disposed at the two edges on the upper left and the lower right according to the electrode arrangement specifications of the conductor pattern code shown in the twenty-ninth embodiment. Therefore, in addition, the four ID electrodes 111D are arranged in order from the lower right electrode, and connected as a bundle with single stroke wiring 21 which is a linear conductive member so as to have the adjacent ones be connected with single straight lines with the shortest distances, and both ends of the wiring 21 pass through the center of each contact unit 42 from the contact units 42 at both upper edge sections of the operation area 41 and are folded back and drawn around toward the lower inner contact unit 42. The sections passing through the center of each contact unit 42 are the first indicator electrodes 51. Therefore, the structure is such that all of the plurality of ID electrodes 111D are arranged inside a rectangle whose diagonal line is a line connecting the farthest two ID electrodes 111D. Furthermore, the four ID electrodes 111D and the first indicator electrodes 51 of the respective contact units 42 constitute a structure where they are connected in series by the wiring 21. Each contact unit 42 is disposed at a distance 43 such that when a person touches one with a finger, the adjacent contact unit 42, that makes two together, is not touched simultaneously.

The molded plate 60 which is a nonconductive base material shown in FIG. 91 is produced by molding a plastic resin such as thin PC (polycarbonate), PET (polyethylene terephthalate) and the like, and is formed in a rectangle with almost the same planar external dimensions as the card 110C. The molded plate 60 is relatively thicker than the nonconductive base material 10 used for the card 110C and the entire card 110C is thickly molded to a thickness to the extent of the thickness of a cash card. Furthermore, openings 61 are provided at the positions corresponding to the contact units 42 of the operation area 41 with substantially the same size as that of the contact units 42. The side of the opening 61 has a tapered shape such that the opening becomes wider toward the upper surface.

As shown in FIG. 92(A), the lower surface 12 of the nonconductive base material 10 is the lower graphic printing surface 12 on which the graphics of the card are processed to be printable and graphics of the backside of the card 110C are printed.

The nonconductive base material 10 has a first surface 11 in the upward direction in the drawing and a wiring layer 20 is arranged with formation by printing. The contact unit 42 in the operation area 41 is disposed at a position corresponding to the opening 61 of the molding plate 60. Furthermore, on the first surface 11 of the nonconductive base material 10, an opening area printing section 15 is provided in a range corresponding to the opening of the opening 61 of the molding plate 60, and an anisotropically conductive white ink having conductivity in the thickness direction including a conductive filler is used to cover the wiring 21 of each indicator electrode from above the wiring layer 20 and a pattern for guiding to the position to be held by the finger is printed. The anisotropic conductive ink includes a white ink or the like using conductive titanium oxide as a pigment.

In addition, in a case where the film thickness of the wiring layer 20 is large generating unevenness, a raised layer made of a nonconductive member such as varnish or a resist is formed to reduce the unevenness and thus the printing quality of the opening area printing section 15 can be increased.

A molded plate 60 is disposed above the first surface 11 of the nonconductive base material 10 so that the positions of the openings 61 and the contacting sections 42 can be matched, and sections corresponding to the openings 61 are attached with a die-cut adhesive tape.

An upper graphic printing film 62 whose back side is an adhesive tape is provided above the molding plate 60, and a graphic of the card is printed on the surface 63. The upper graphic printing film 62 is die-cut at a section corresponding to the opening 61 of the molding plate 60, and is attached to the molding plate 60 in accordance with the position of the opening 61.

After printing, the surface 63 of the upper graphic printing film 62 and the lower graphic printing surface 12 are subjected to print protection treatment with varnish or the like for protecting the printing layer.

Furthermore, by forming the molding plate 60 thick with a plastic resin having a low relative dielectric constant, even if the touch surface 201 of the card 110B3 is brought into contact with the touch panel 201 with an erroneous touch by the finger, it is possible to prevent the fingers from being detected by the touch panel 201. As a result, malfunction of the information device 200 can be prevented.

In addition, when the touch panel 201 is touched accidentally with a finger, while the detection of the finger by the touch panel 201 may be handled with software on the system side, the elimination of the mold plate 60 to give the structure of FIG. 92(B) may also be a choice.

As shown in FIG. 92(B), the lower surface 12 of the nonconductive base material 10 is the lower graphic printing surface 12 on which the graphics of the card are processed to be printable and graphics of the backside of the card 110C are printed.

The nonconductive base material 10 has a first surface 11 in the upward direction in the drawing and a wiring layer 20 is arranged with formation by printing. To the contact units 42 in the operation area 41, opening area printing sections 15 are provided in a range corresponding to the opening of the openings 61 of the molding plate 60, and an anisotropically conductive white ink having conductivity in the thickness direction including a conductive filler is used to cover the wiring 21 of each indicator electrode from above the wiring layer 20 and a pattern for guiding to the position to be held by the finger is printed. The anisotropic conductive ink includes a white ink or the like using conductive titanium oxide as a pigment.

The reason why the white ink is used is because when print media is pasted on the contact units 42, if the card is placed on a smartphone or a tablet and a finger touching operation is performed, the touch panel recognizes the card itself to be foreign matter and not fingers, thereby inducing error processing in some cases. Therefore, with touch panels other than smartphones and tablets, such symptoms rarely occur. In particular, with business touch panels, there is no problem even if print media is pasted on contact units 42.

In addition, in a case where the film thickness of the wiring layer 20 is large generating unevenness, a raised layer made of a nonconductive member such as varnish or a resist is formed to reduce the unevenness and thus the printing quality of the opening area printing section 15 can be increased. Furthermore, the upper surface graphic printing of the card 110C is performed on the surface 63 from above, and after printing, the surface 63 and the lower graphic printing surface 12 are subjected to print protection treatment with varnish or the like for protecting the printing layer.

By adhering the nonconductive base material 10, the molded plate 60, and the upper graphic printing film 62, the card 110C is formed.

FIG. 93(A) is a schematic diagram showing a state in which the card 110C is placed on the information device 200 and the finger 55 touches the first indicator electrode 51 of the contact unit 42, and actually, the wiring layer 20 cannot be visually recognized from the upper surface of the card 110C, but for the sake of explanation the wiring layer is shown transparent on the upper surface. FIG. 93(B) is a diagram schematically superimposing a circuit in the state of FIG. 93(A) constituted with the electrostatic capacitance and resistance generated in a cross-sectional view in which the card 110C shown in FIG. 78 is dissected parallel to the long side.

As shown in FIG. 93, when touching the contact unit 42 at the bottom of the opening 61 of the molded plate 60, the wiring 21 connected to the four ID electrodes 111D and the finger 55 are connected through the first indicator electrode 51 of a contact unit 42 via the anisotropic conductive ink of the opening area printing section 15, and via the resistance Rf, a direct current conduction state is established with the electrostatic capacitance Ch between the human body and the device 200. Furthermore, by bringing the card 110C into contact with or close proximity to the touch panel 201, the capacitance Cd' is generated between the touch panel 201 and the four ID electrodes 111D, respectively, and the capacitance Cp' is generated in the wiring 21 connecting the ID electrodes 111D, and the electrostatic capacitance Ch between the human body and the four ID electrodes 111D are connected via the device 200 via the finger 55, the first indicator electrode 51, and the wiring 21. Furthermore, the surface of the finger 55 touching the contact unit 42 serves as an electrode to generate an electrostatic capacitance Cf between the finger and the touch panel 201, and is connected to the electrostatic capacitance Ch between the human body and the device 200.

Thus, it is possible to change the detection capacitance Cm and the detection current $I_{RX}$, not shown, for detecting the state of the touch panel 201 directly under the four ID electrodes 111D and the contact unit 42 touched by the finger 55 to detectable capacitance values and current values.

When the wiring 21 is long, the Cp' generated in the wiring 21 becomes relatively large. However, by narrowing the line width of the wiring 21 to about 0.2 mm so that the wiring path does not have a dense layout, as shown in FIG. 93(A), the wiring is spread out instead of being concentrated in a specific area of the touch panel 201. Therefore, the detection capacitance Cm and the detection current $I_{RX}$, not shown, for detecting the state of the touch panel 201, are not changed to detectable capacitance values and current values.

Furthermore, since contact units 42 not connected to the finger 55 do not have the electrodes corresponding to the surface of the finger 55, no electrostatic capacitance is generated, and the detection capacitance Cm and the detection current $I_{RX}$, not shown, for detecting the state of the touch panel 201 directly under the contact unit 42 cannot be change to detectable capacitance values and current values.

As a result, the position information of a total of five electrodes including four ID electrodes 111D and one contact unit 42 touched by the finger 55 are detected, to form a conductor pattern 70. Furthermore, with card 110C, by forming a direct current connection between the electrode and the electrostatic capacitance Ch between the human body and the device 200, a conductor pattern 70 can be formed more reliably.

Figure 94:
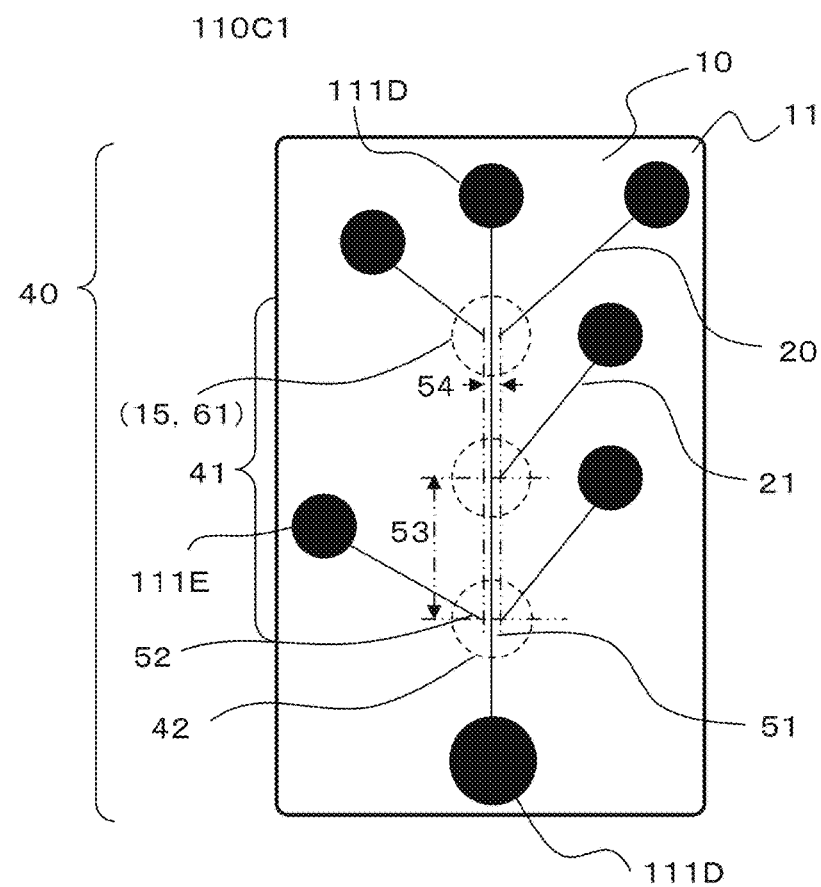
FIG. 94 is a structural example of a thin plate-like apparatus.
Figure 95:
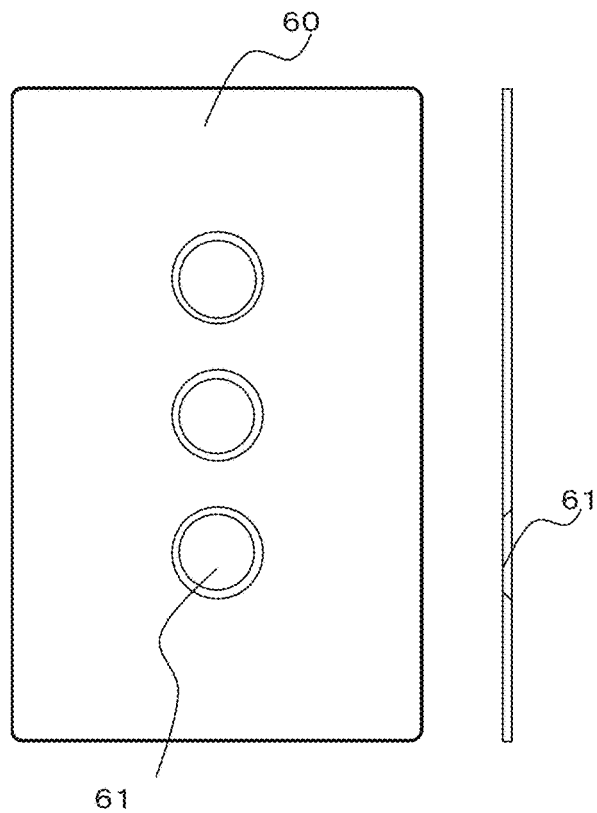
FIG. 95 is a structural example of a thin plate-like apparatus.

FIGS. 94 to 95 are diagrams for describing the card 110C1, which is a modification example of the structure of the card 110C. FIG. 94 shows a plan view of the first face on which the wiring layer 20 of the nonconductive base material 10 used for the card 110C1 is arranged as in FIG. 76. FIG. 95 shows views of a molded plate 60 of a nonconductive base material, with FIG. 95(A) showing a top view, and FIG. 95(B) showing a side view. The card 110C1 differs from the card 110C in FIG. 90 in that a second indicator electrode 52 and an information electrode 111E as a second electrode are added to the wiring layer 20 of the nonconductive base material 10.

As shown in FIG. 94, the nonconductive base material 10 is provided with the first face 11 facing upward in the drawing and the wiring layer 20 is arranged with formation by printing. The entire area of the nonconductive base material 10 is the contact area 40, the operation area 41 is located at the center of the card 110C1, and the three contact units 42 are each arranged at positions corresponding to the openings 61 of the molding plate 60 shown in FIG. 95. Furthermore, on the first surface 11 of the nonconductive base material 10, an opening area printing section 15 is provided in a range corresponding to the opening of the opening 61 of the molding plate 60, and an anisotropically conductive white ink having conductivity in the thickness direction including a conductive filler is used to cover the wiring 21 of each indicator electrode from above the wiring layer 20 and a pattern for guiding to the position to be held by the finger is printed.

In the contact surface area 40, two first electrodes, which are ID electrodes 111D, are arranged with circular shapes with a diameter of about 7 mm at the upper end, with the long side direction designated as the vertical direction, and at the lower end they are arranged with circular shapes with diameters larger than those at the upper end. In the form of a large circle. The two ID electrodes 111D are connected with wiring 21, which is a linear conductive member, so that they are connected with single straight lines which are of the shortest distance and furthermore pass through the center of the three contact units. The section passing through each contact unit 42 of the wiring 21 serves as the first indicator electrode 51. Furthermore, the information electrodes 111E, which are second electrodes, are similarly arranged with circular shapes having a diameter of about 7 mm at the three contact units 42, and each contact unit 42 has wiring 21 of single straight lines with the shortest distances extending to the interior of the contact units 42, independently. The section of the wiring 21 inside the contact unit 42 is the second indicator electrode 52. Although the second indicator electrodes 52 and the information electrodes 111E are in a one-to-one relationship, the contacting units 42 and the second indicator electrode 52 may be one to many. However, the first and second indicator electrodes 51 and 52 are provided so that the two ID electrodes 111D and up to four information electrodes 111E can be connected in one contacting unit 42.

The edge section of the wiring 21 which is a second indicator electrode 52 is formed so that the spacing 54 allows both electrodes to be touched together without fail when the wiring 21 which is the first indicator electrode 51 and the contact unit 42 are touched with a finger. Furthermore, the second indicator electrodes 52 are disposed so that the spacing 53 is large enough to disallow contact with an adjacent second indicator electrode when a contact unit 42 is touched with a finger.

When the contact unit 42 is touched with the finger 55, based upon the same principle as described in FIG. 93(B), the position information of the electrodes is detected directly below the two ID electrodes 111D, the contact unit 42 touched with the finger, and the information electrodes 111E, via the first ID electrodes 51 and 52 in the contact unit 42, and thus a conductive pattern 70 is formed.

As a result, the card 110C1 can form three types of conductor patterns more reliably by the direct current connection of the electrostatic capacitance Ch between the human body and the device 200. In addition, it is possible to increase variations in the arrangement patterns of the electrodes of the conductor patterns 70.

Thirteenth Embodiment

[Mechanism of a C-CARD (Electrode Layout Specifications of the Wiring Layer)]

Figure 96:
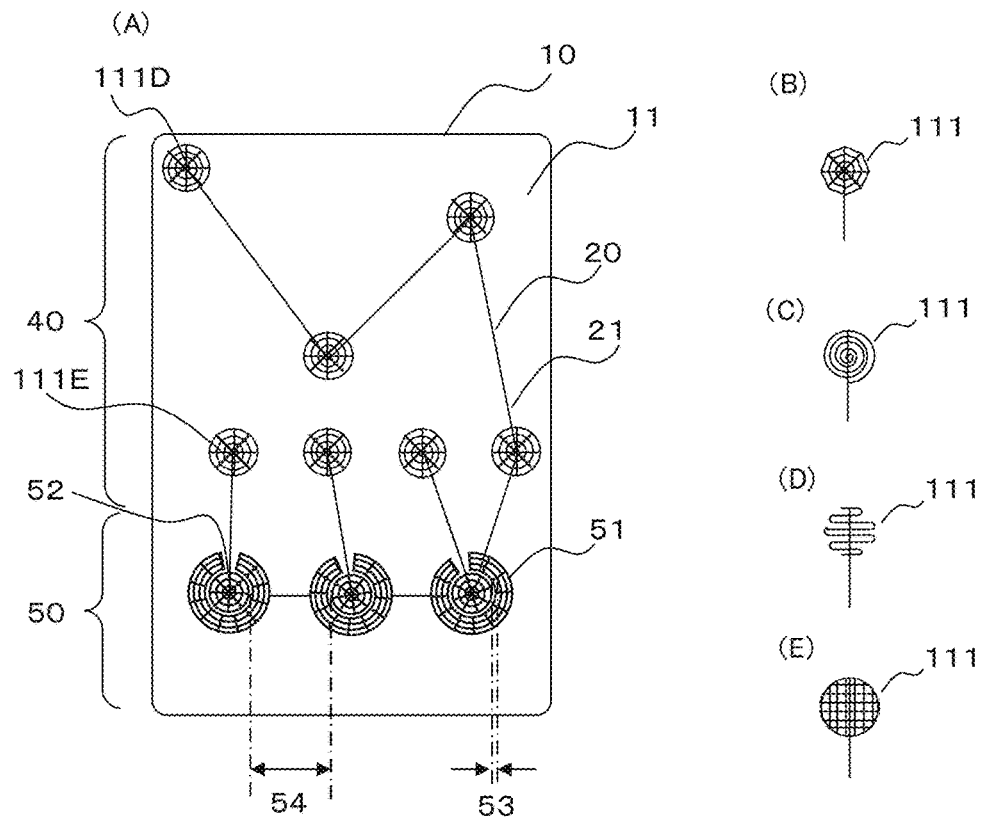
FIG. 96 is a structural example of a thin plate-like apparatus.

FIG. 96 is a view for describing a modification example of the electrode structure formed in the wiring layer 20 of the card 110. FIG. 96(A) shows a plan view of the first surface on which the wiring layer 20 of the nonconductive base material 10 used for the card 110B is arranged, and FIG. 96(B), FIG. 96(C), and FIG. 96(D) are examples of layout shapes of the electrodes 111.

As shown in FIG. 96, with respect to the wiring layer 20 of the nonconductive base material 10 in FIG. 76, only the layout shapes of the electrodes 111D, 111E and the indicator electrodes 51, 52 differ.

As shown in FIG. 96(A), the electrode layout shape is not configured with a plane but with a linear layout pattern shape, and the electrodes 111D, 111E and the indicator electrodes 51, 52 are configured with a plurality of concentric line segments. The concentric circles are radially connected by eight equally spaced straight line segments so that no increase in local resistance occurs when the area of the electrode is viewed as a plane. Furthermore, the width and the spacing of the line segments are preferably adjusted depending on the film thickness of the wiring layer 20. When the film thickness of the wiring layer is large, the side component becomes relatively large with respect to the area component of the capacitance of the line segment. Therefore, when the area of the electrode is viewed as a plane, even if the wiring density is lowered, the rate of decrease in capacitance is suppressed as compared with the case where the film thickness is small.

As for other layout shapes, for examples, FIG. 96(B) shows line segments of a regular octagon, FIG. 96 (C) shows spiral line segments, FIG. 96(D) shows wavy line segments, and FIG. 96(E) shows lattice-like line segments.

By using these layout shapes, it is possible to reduce the amount used of the relatively expensive conductive ink and reduce manufacturing costs.

Fourteenth Embodiment

[Mechanism of a C-CARD (Specifications of the Conductive Ink of the Wiring Layer and of the upper and lower nonconductive base materials)]

Since in the method for the detection of the position information of the electrodes of the card by a capacitance type touch panel 201, the electrostatic capacitance between the electrode and the touch panel 201 generated when the card is brought into contact with the touch panel is used, the capacitance generated between positions other than the electrodes in the card and the touch panel 201 leads to erroneous detections and a decrease in the accuracy of detected coordinates.

For this reason, it is important to use conductive ink which can reduce the capacitance accompanying the wiring and which enables the manufacturing cost to be low. Thus, measurement investigations of the influence of wiring on the detection operations of the electrodes 111 by the touch panel 201 was performed for each conductive ink specification.

Figure 97:
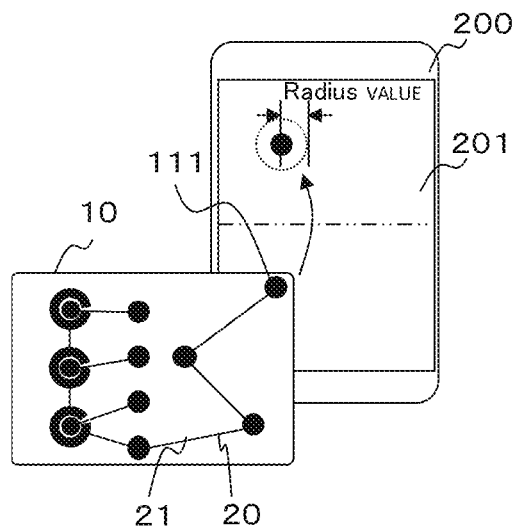
FIG. 97 is a structural example of a thin plate-like apparatus.

Methods of Evaluation and Measurements
(1) Wiring resistance: DC resistance measurements using an LCR meter DE-5000
(2) Wiring capacitance: Capacitance measurements between an electrode and wiring-touch panel device GND using an LCR meter DE-5000 at f=100 kHz, with contact being made on an EETI touch panel with the wiring surface of the sample of the non-conductive substrate 10 facing upwards.
(3) Electrode detection performance evaluation of an iPhone 6 touch panel: An application that outputs the center coordinates detected by the system of the electrodes applied to the touch panel and the radius values (detection area radius) of the capacitance detected area was developed, and using the application, measurements of the radius values (detection area radius) were carried out when the touch panel system made detections. As the method of electrode detection, with the smartphone (iPhone 6) and the card held by the hands, as shown in FIG. 97, the number of detected operations and radius values (detection area radius) were measured by repeating the operation of bringing them into contact and separating them ten times so that one electrode and the wiring make contact with the panel surface of about 20 mm.

Evaluation results are shown in Table 1.

| | | Ink specifications | | | | Base material specifications | | | Pattern specifications | |
|---|---|---|---|---|---|---|---|---|---|---|
| | | Volume resistivity | Minimum line width (mm) | Film thickness (mm) | Drying conditions | Material | Dielectric constant | Thickness (mm) | Wiring width (mm) | Electrode diameter (mm) |
| No. | Printing Method | (Ω·cm) | | | | | | | | |
| 1 | Gravure offset | Silver salt ink | 7.00E−06 | 0.004 | ~0.1 | 120° C., 5 min | PC | 3.1 | 0.18 | 0.1 | 7 |
| 2 | Screen | Carbon (CH—N) | 7.00E−02 | 0.3 | 8-10 | 60° C., 5 min | PET | 3.2 | 0.125 | 0.3 | 8 |
| 3 | Screen | Silver paste | 1.70E−04 | 0.3 | 15-20 | 60° C., 5 min | PET | 3.2 | 0.125 | 0.3 | 8 |
| ref | Etching | PCB wiring/Cu + Au plating | — | 0.1 | ~100 | — | FR-4 | 4.8 | 0.2 | 0.152 | 8 |

| | | Ink specifications | | | | LCR/Business use touch panel | | | iPhone6 evaluation | | | Radius value (Detected electrode radius) | | |
|---|---|---|---|---|---|---|---|---|---|---|---|---|---|---|
| | | Volume resistivity | Minimum line width (mm) | Film thickness (mm) | Drying conditions | Wiring resistance (Ω/mm) | Electrode capacitance (pF/piece) | Wiring capacitance (pF/mm) | Detection | operation no. | Avg. | Max | Min |
| No. | Printing Method | (Ω·cm) | | | | | | | | | | | |
| 1 | Gravure offset | Silver salt ink | 7.00E−06 | 0.004 | ~0.1 | 120° C., 5 min | 4.73 | 1.54 | 0.012 | | 117 | 41.3 | 48.7 | 24.3 |
| 2 | Screen | Calbon (CH—N) | 7.00E−02 | 0.3 | 8-10 | 60° C., 5 min | 1139 | 2.07 | 0.033 | | 49 | 73.2 | 121.6 | 38.5 |
| 3 | Screen | Silver paste | 1.70E−04 | 0.3 | 15-20 | 60° C., 5 min | 0.43 | 2.07 | 0.043 | | 107 | 74.2 | 121.6 | 24.3 |
| ref | Etching | PCB wiring/Cu + Au plating | — | 0.1 | ~100 | — | 0.004 | 2.17 | 0.033 | | 111 | 84.1 | 97.3 | 24.3 |

Evaluation result summary: As for the silver salt ink specification, the wiring resistance is about 5 Ω/mm at the line width of 0.1 mm and thus there is no problem for the target of 10 n/mm. The wiring capacitance is 0.012 pF/mm, which is less than half of those of other conductive ink samples, and the good characteristic radius values (detection area radius) are also lower than those of other conductive ink samples in regards with averages and maximums, and thus the effect of the wiring is very small to give a good result. In particular, since there are no big differences in regards with the averages and the maximums, detection can be regarded as being stable.

Also, regarding printing and ink specifications, silver salt ink can be printed in large quantities at a low cost by gravure offset printing. The minimum line width is 0.004 mm and thus thinning is possible. The film thickness is as thin as 0.1 μm and flattening treatment of the printed surface is unnecessary. The drying time is as short as 5 minutes, the TAT is short and printing is possible in large quantities. Thus, there are many merits compared with other conductive inks.

Furthermore, some silver salt inks are compatible with ink jet printers. Thus, since a large number of conductor patterns 70 corresponding to the ID codes of the card 110 can be created with a printer without making a printing plate, the plate preparation cost is not necessary and it is effective for uses where a large number of ID codes are used with a small number of sheets.

Thus, it is most preferable to form the wiring layer 20 of the card 110 by printing with silver salt ink with a wiring width of 0.1 mm or less.

Furthermore, an inspection of the wiring width brings up the concern that the wiring might affect the detection operation, since when the line width of the silver paste ink is 0.3 mm, the average of the radius value is increased to 1.8 times that when the line width is 0.1 mm with silver salt ink.

Thus, the line width of the wiring 21 of the wiring layer 20 is preferably less than 0.3 mm.

Furthermore, by using silver salt ink having a low volume resistivity of $7 \times 10^{-6}$ Ω·cm, even if the film thickness of the wiring layer 20 is reduced to 0.1 μm, the wiring resistance value fulfills 10 Ω/mm.

Accordingly, the volume resistivity of the conductive ink is preferably $1 \times 10^{-5}$ Ω·cm or less.

From the above results, it is more preferable to use silver salt ink as the conductive ink.

Although not shown in the evaluation results of Table 1, even if silver paste ink is used, by optimizing the printing conditions such as narrowing the mesh pitch in screen printing and setting the sintering drying temperature to 120° C. or more, it proved that disconnection due to rubbing is small even if layer thickness is made thin, the increase in the resistance value is suppressed and the wire width can be reduced to about 0.15 mm.

Also, as with silver salt inks, some silver paste inks are compatible with ink jet printers, whereby the cost of plate preparation is not necessary. This is effective for uses where a large number of ID codes are used with a small number of sheets.

However, for both silver salt ink and silver paste ink, it is necessary to raise the sintering drying temperature to 120° C. or higher. When printing the wiring layer 20 using the silver salt ink or the silver paste ink, the nonconductive base material 10 is classified into materials that are suitable for use and materials that are not suitable for use depending on their temperature characteristics. For example, with plastic resins, PVC (polyvinyl chloride) and PP (polypropylene) are unsuitable because the thermal deformation temperature is as low as about 60° C., whereas PET (polyethylene terephthalate) and PC (polycarbonate) are suitable materials because the thermal distortion temperature is 240° C.

On the other hand, it is also possible to perform flexographic printing using silver nano (particle) ink which is a conductive ink which does not require high temperature for sintering drying. By using flexographic printing, it is possible to suppress the amount of ink containing silver which is of high cost, and it is possible to reduce costs when carrying out mass production.

Also, as with silver salt inks, silver nano (particle) ink is compatible with ink jet printers, whereby the cost of plate preparation is not necessary. This is effective for uses where a large number of ID codes are used with a small number of sheets.

However, silver nano (particle) ink requires special surface treatment for making a chemical reaction occur with silver nanoparticles on the surface of the base material to ensure conductivity, and when the wiring layer 20 is printed by using silver nano (particle) ink, as the nonconductive base material 10, a base material subjected to special surface treatment is required.

It goes without saying that any one of the conductive inks can be used by appropriately combining conditions for printing the wiring layer 20 and the material of the nonconductive base material 10.

Fifteenth Embodiment

[Mechanism of a C-CARD (Touch Panel Detection Specifications for ID Electrodes without Human Body Contact)]

In the case of a specification in which the card 110 is used by placing it on a touch panel 201, the use applications of the card are remarkably expanded if the touch panel 201 could be made to detect the four ID electrodes 111D just by placing the card 110 on the touch panel 110 without having the human finger touch a first indicator electrode.

For this reason, the conditions for designing a card which makes the touch panel 201 detect the ID electrodes 111D without having the human finger touch a first indicator electrode is made apparent.

Figure 98:
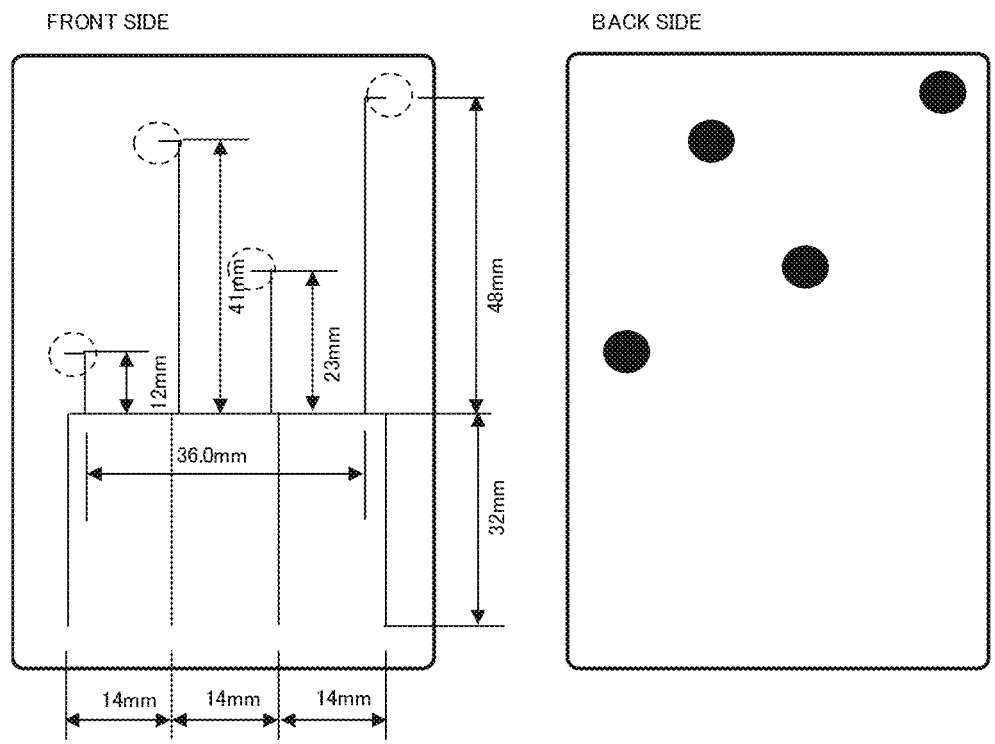
FIG. 98 is a structural example of a thin plate-like apparatus.

Copper-gold plated wirings (line width=0.1 mm, thickness=100 μm) of cards made with a PCB board (FR-4, with an air gap layer, and the relative dielectric constant≈3) shown in FIG. 98 were cut little by little to carry out experiments on the evaluation of the wiring length dependency on the touch panel detection operation of smartphones and tablets.

Test Operating Environment Conditions:
(1) When a smartphone is held in the hand,
(2) When a smartphone is placed on a wooden desk,
(3) When a tablet is placed on a wooden desk,
(4) When a tablet is placed on a steel desk.

Testing method: A card with four electrodes arranged in the ID area was placed on the touch panel screen for ten trials, and the reaction detection recognition rate of each electrode was measured. The length of the wiring pattern was changed and the reaction to the screen was observed.

Testing operation criteria: Normal upward display; Evaluated by a deduction method from 5 points
Reaction is by less than half; −3 points,
Reaction is slow; −1 point,
Reaction requires about one second to occur; −2 points,
Reaction requires one to three seconds to occur; −3 points, As a result, as shown in Table. 2, as long as the four electrodes are not aligned horizontally and/or vertically, the recognition rate for detecting all of the conductors was 100% for (1) with 8.4 cm or more in length, for (2) with 12.5 cm or more in length, for (3) with 14.4 cm or more in length, and for (4) with 10.4 cm or more in length.

Electrostatic capacitance between the wiring and electrodes of the test sample board and the touch panel of the iPad was measured between an electrode and the shield GND of the USB connector with an LCR meter DE-5000, resulting in wiring: 0.033 pF/mm and electrode: 2.46 pF/piece for this examination. Therefore, for all of the test operating environments for this examination, the wiring length and capacitance for enabling the touch panel 201 to detect the four ID electrodes 111D without having the human finger 55 touch the first indicator electrode is roughly estimated at 15 cm and 14.8 pF, respectively.

Sixteenth Embodiment

[Mechanism of a C-CARD (Touch Panel Non-Detection Specifications for ID Electrodes without Human Body Contact)]

With the card 110B shown in the eleventh embodiment that selectively generates a plurality of conductor patterns 70 according to the presence or absence of the contact of the second indicator electrode 52 by the finger 55, it is important that the information electrodes 111E making contact with the touch panel 20 are not detected by the touch panel 201 in the absence of the contact by the finger 55. For this reason, the electrostatic capacitance allowed for the electrodes not to be detected by the touch panel was evaluated.

Figure 99:
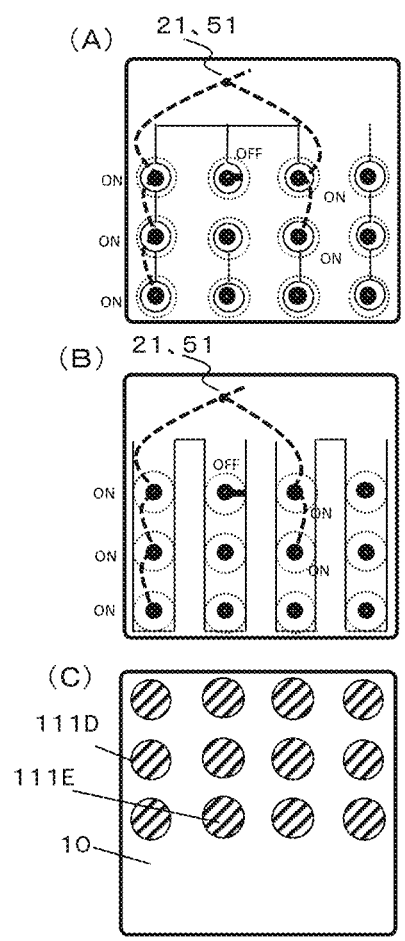
FIG. 99 is a structural example of a thin plate-like apparatus.

FIG. 99 is a schematic diagram of the evaluated board. FIG. 99(A) shows a top view of the evaluated board assuming a case where a large amount of parasitic capacitance is on the human body side of the electrodes, FIG. 99(B) shows a case assuming that a large amount of parasitic capacitance is on the touch panel side of the electrodes, and FIG. 99(C) shows the bottom view of both circuit boards.

The circuit board is a PCB board with a thickness of 1.5 mm, and electrodes with a diameter of 8 mm are arranged on the bottom surface in a 3×4 array with intervals of 12 mm in the vertical direction and 14 mm in the horizontal direction. The electrodes are connected to land patterns having a diameter of 3 mm on the upper surface via through holes, and in the upper surface is circuit board wiring where the electrodes have parasitic capacitance. Shown in FIG. 99(A) is a case where there is overlap with the electrodes, shown in FIG. 99(B) is a case where wiring is set with a width of 0.1 mm to avoid overlap with the electrodes.

In the evaluation method, land patterns of five electrodes on the outer periphery are connected by additional wiring, and a touch of the end of a wiring by a person is regarded as corresponding to an ON state for electrode detection, and parasitic capacitance generation by the connection of the land pattern of the one central electrode to the wiring on the board, is regarded as corresponding to an OFF state for electrode detection. In order to establish a state in which the bottom side is brought into contact with the touch panel and the five electrodes on the outer periphery are detected normally while the one electrode at the center is always not detected, the electrostatic capacitance of the one central electrode was evaluated by changing the board wiring length.

For the detection and non-detection determination of the electrodes by the touch panel, the evaluated board was brought into contact in the vertical and horizontal directions ten times each, and judgement was carried out by determining whether or not the output of the touch panel correctly returned the coordinates of the electrodes. The notation in Table 1 indicates the following; 5: normal detection for all trials, 3: normal detection for 10 trials or more, 2: normal detection for less than 10 trials, 1: detection for less than 10 trials with detections where not all of the five electrodes were detected, 0: no detection for all 20 trials, E: the touch panel output was the return of error indications 10 times or more.

As for the code recognition apparatus 3 and the usage environment, the following four conditions were adopted. An iPhone 6 held by the hand; an iPhone 6 placed on a cork board on which electrode detection is most difficult, an iPad-Pro held by the hand; an iPad-Pro placed on a cork board.

As a result of the evaluation as shown in Table 2, it was found that electrodes are not detected by the touch panel if the electrostatic capacitance between an electrode and the touch panel is set to 5 pF or less for either of the evaluating boards A or B under any of the conditions with iPhone 6. Furthermore, it was found that coordinates are correctly detected by the touch panel even when there are electrodes which are densely detected as in the arrangement of five electrodes for detection. By adopting the specification based on this evaluation result, it is possible to create a card that selectively generates a plurality of conductor patterns 70 according to whether or not there is contact between the second indicator electrodes 52 and the fingers 55.

TABLE 2

| Sample | | | | | Circuit board A | | | | | Circuit board B | | | | Unit |
|---|---|---|---|---|---|---|---|---|---|---|---|---|---|---|
| Type | Method | Item | | Wiring length | 156 | 131 | 106 | 80 | 66 | 174 | 136 | 84 | 66 | mm |
| iPhone6 | Handheld | Parasitic capacitance | OFF electrode to panel | | 8.44 | 7.69 | 6.86 | 5.97 | 5.14 | 9.7 | 8.16 | 6.05 | 5.49 | pF |
| | | | OFF electrode to ON electrode | | 5.35 | 4.49 | 3.56 | 2.59 | 2.32 | 3.7 | 2.95 | 1.91 | 1.76 | pF |
| | | Panel detection | No human contact OFF electrode | | 0 | 0 | 0 | 0 | 0 | 0 | 0 | 0 | 0 | pF |
| | | | Human contact OFF electrode | | E | E | E | 3 | 0 | E | E | 3 | 0 | |
| | | | Human contact ON electrode | | E | E | E | 3 | 5 | E | E | 3 | 5 | |
| | On a corkboard | Parasitic capacitance | OFF electrode to panel | | 7.38 | 7.72 | 6.81 | 5.68 | 5.36 | 9.6 | 8.03 | 6.06 | 5.66 | pF |
| | | | OFF electrode to ON electrode | | 5.82 | 5.59 | 4.57 | 3.58 | 3.38 | 5.42 | 4.47 | 3.05 | 2.94 | pF |
| | | Panel detection | No human contact OFF electrode | | 0 | 0 | 0 | 0 | 0 | 0 | 0 | 0 | 0 | |
| | | | Human contact OFF electrode | | E | E | E | 3 | 0 | E | E | 3 | 0 | |
| | | | Human contact ON electrode | | E | E | E | 3 | 5 | E | E | 3 | 5 | |
| iPad-Pro | Handheld | Parasitic capacitance | OFF electrode to panel | | 9.82 | 8.67 | 7.75 | 6.76 | 6.15 | 10.65 | 9.07 | 6.91 | 6.51 | pF |
| | | | OFF electrode to ON electrode | | 5 | 4.48 | 3.62 | 2.7 | 2.74 | 3.75 | 3.29 | 2.06 | 1.95 | pF |
| | | Panel detection | No human contact OFF electrode | | 2 | 0 | 0 | 0 | 0 | 2 | 0 | 0 | 0 | |
| | | | Human contact OFF electrode | | 5 | 5 | 2 | 0 | 0 | 5 | 2 | 0 | 0 | |
| | | | Human contact ON electrode | | 5 | 5 | 5 | 5 | 5 | 5 | 5 | 5 | 5 | |

TABLE 2-continued

| Sample | | | Circuit board A | | | | | Circuit board B | | | | Unit |
|---|---|---|---|---|---|---|---|---|---|---|---|---|
| Type | Method | Item | Wiring length | 156 | 131 | 106 | 80 | 66 | 174 | 136 | 84 | 66 | mm |
| On a corkboard | Parasitic capacitance Panel detection | OFF electrode to panel | | 9.39 | 8.83 | 7.59 | 6.65 | 5.95 | 10.37 | 8.89 | 6.8 | 6.46 | pF |
| | | OFF electrode to ON electrode | | 6.56 | 5.68 | 4.68 | 3.72 | 3.41 | 5.62 | 4.32 | 3.33 | 3.02 | pF |
| | | No human contact OFF electrode | | 0 | 0 | 0 | 0 | 0 | 0 | 0 | 0 | 0 | |
| | | Human contact OFF electrode | | 5 | 5 | 2 | 0 | 0 | 5 | 0 | 0 | 0 | |
| | | Human contact ON electrode | | 5 | 5 | 5 | 5 | 5 | 5 | 5 | 5 | 5 | |

Seventeenth Embodiment

[Mechanism of a C-CARD (Specifications for Wiring Between a First Indication Electrode and an ID Electrode, and Between Indication Electrodes)]

Figure 100:
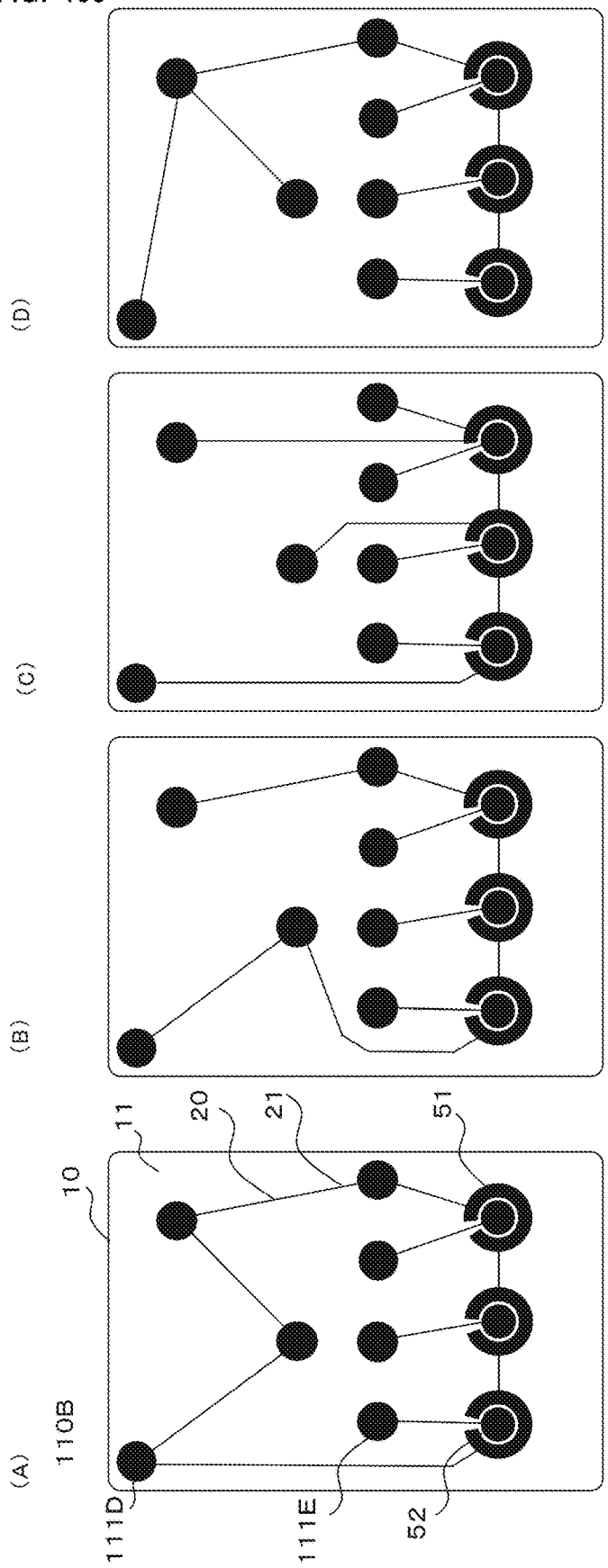
FIG. 100 is a structural example of a thin plate-like apparatus.

FIG. 100 is a view showing an example of connection specifications of the wiring 21 between the first indicator electrodes 51 and the ID electrodes 111D of the wiring layer 20. Other variations of methods for connecting the ID electrode 111D on the lower right side of the nonconductive base material 10 with a single straight line of the shortest distance will be described.

As shown in FIG. 100(A), the wiring 21 between the ID electrodes 111D forms a loop between the first indicator electrodes 51 at both ends, and thus disconnection of one wiring can be permitted. In addition, since there are two current paths, in this specification, the wiring resistance can be reduced. FIG. 100(B) shows connections to the ID electrodes 111D from both ends of the first indicator electrode 51, FIG. 100(C) shows connections that are independently to each ID electrode 111D, and FIG. 100(D) shows the wiring 21 between the ID electrodes 111D that is branched.

Eighteenth Embodiment

[Mechanism of a C-CARD (Use by Placing, Structure: Single Layer without a Gap Layer, Formation of Conductive Wires and Electrodes on Two Surfaces)]

This practical example is an embodiment of a card, which is a thin plate shaped apparatus 110D having wiring layers on the two layers of the front and back sides. According to this embodiment, the card is used by holding predetermined area of the card with the fingers and bringing it into contact with or into close proximity to the touch panel of a smartphone, a tablet, or the like.

FIG. 101(A) is a plan view of the first surface 23 on which the wiring layer 20 of the upper nonconductive base material 22 used for the card 110D is disposed. Shown in FIG. 101(B) are a top view and a side view of the molded plate 60, and shown in FIG. 101(C) is a plan view of the first surface 11 on which the wiring layer 20 of the lower nonconductive base material 10 is disposed. In order to dispose the first surface 23 of the upper nonconductive base material 22 to the interior of the card 110D and the first surface 11 of the lower nonconductive base material 10 to the interior of the card 110D, the wiring layer 20 of the upper nonconductive base material 22 and the wiring layer 20 of the lower nonconductive base material 10 are in a configuration where they are connected with the wiring layer of the upper nonconductive base material 22 flipped sideways.

Figure 102:
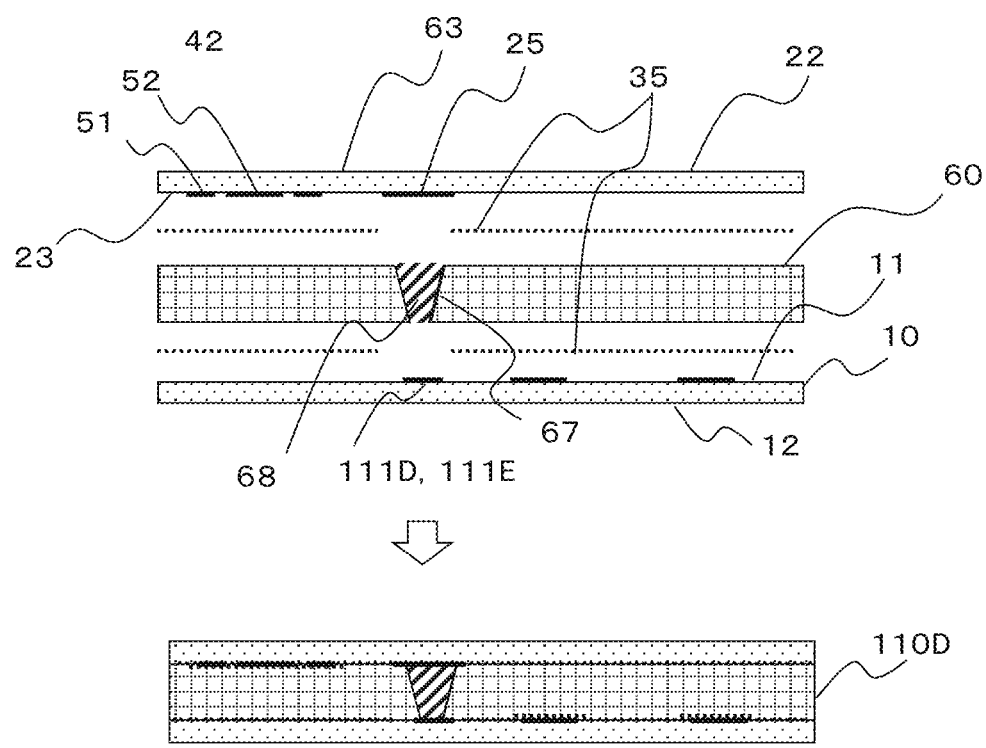
FIG. 102 is a structural example of a thin plate-like apparatus.

Shown in FIG. 102 are a cross-sectional view of the card 110B dissected in parallel with the long side showing disassembled layers and a sectional view after bonding them together.

Figure 101:
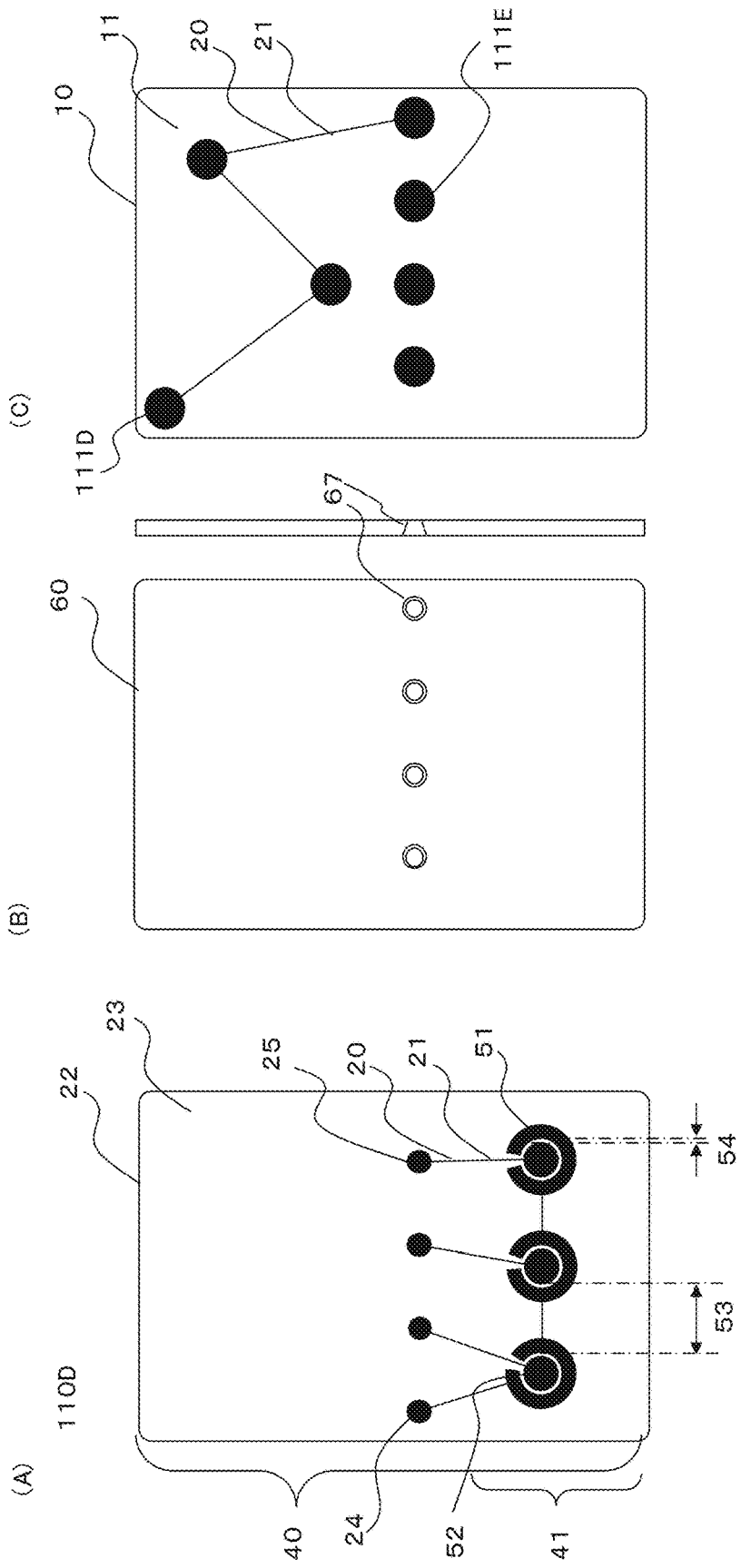
FIG. 101 is a structural example of a thin plate-like apparatus.

As shown in FIG. 101, the upper nonconductive base material 22 is a plastic resin film such as thin PC, PET or the like, or paper, and is formed in a rectangular shape with almost the same external dimensions as a trading card, a cybernet standard card such as a QUO card, and a credit card.

On the first surface 23 of the upper nonconductive base material 22, the wiring layer 20 is formed by printing using a conductive ink such as silver salt ink, silver paste ink, carbon ink or the like.

With the upper long side direction as the vertical direction, the contact area 40 is provided on the entire card, the holding area 50 is provided in the lower section, and four upper lands 25 are provided in the contact area 40. One of the upper lands 25 is provided at a right-left inverted position in regards with the position right above the ID electrode 111D which is a reference electrode in the lower right and is connected from there to the first indicator electrode 51 disposed in the holding section 50. All three remaining upper lands 25 are provided at positions that are right-left inverted in regards with positions just above the information electrodes 111E, and are connected from there to the second indicator electrodes 52 arranged in the holding sections 50. The pattern shape and configuration of the first and second indicator electrodes 51 and 52 are the same as those of the card 110 of the thirteenth embodiment.

The molded plate 60 which is a nonconductive base material as shown in FIG. 101(B) is also formed by molding a plastic resin such as PC, PET, or the like, and is formed in a rectangular shape having almost the same planar external dimensions as the card 110D. The molded plate 60 is relatively thicker than the upper nonconductive base material 30 used for the card 110B and molding is carried out with the thickness of the entire card 110C controlled to be about that of a credit card. Furthermore, a through hole 67 having a diameter smaller than that of the upper land is provided at a position left-right inverted in regards with the positions corresponding to the four upper lands 25 of the holding area 50.

In addition, the side of the through hole 67 has a tapered shape with the opening slightly widened towards the upper surface.

The lower nonconductive base material 10 shown in FIG. 101(C) is a film or paper having the same composition as the upper nonconductive base material 22, and is formed in a rectangular shape having almost the same planar external dimensions as the card 110D.

On the first surface 11 of the lower nonconductive base material 10, the wiring layer 20 is formed by printing using the same conductive ink as the wiring layer 20 of the upper nonconductive base material 22. The three information electrodes 111E are arranged with circular shapes having a diameter of about 7 mm at positions corresponding to the three through holes 67 on the upper left side of the molding plate 60 in the contact surface area 40. Furthermore, the four ID electrodes 111D are similarly disposed with circular shapes having a diameter of about 7 mm according to the arrangement information of the conductor patterns. In addition, the ID electrode 111D which is a reference electrode in the lower right is located at a position corresponding to the through hole of the molding plate 60. Furthermore, the four ID electrodes 111D are connected together in one with single stroke wiring 21 which is a linear conductive member so as to have the adjacent ones be connected with single straight lines with the shortest distances from the ID electrode 111D which is the reference electrode in the lower right.

From the four ID electrodes 111D and the three information electrodes 111E, for example, as shown in the twenty-ninth and the thirtieth embodiments, for uniquely specifying the card 110B, by a combination of four ID electrodes 111D and one information electrode 111E, conductor patterns 70 with five electrodes can be formed. Therefore, with the card 110D, three conductor patterns 70 corresponding to the information electrodes 111E can be created.

The opposite side of the first face 23 on which the wiring layer 20 of the upper nonconductive base material 22 is arranged is the upper graphic printing surface which is treated so that graphics of the card can be printed, and the surface 12 opposite of the first surface 11 on which the wiring layer 20 of the lower nonconductive base material 10 is arranged is the lower graphic printing surface 12 which is treated so that graphics of the card can be printed.

Shown in FIG. 102 are a cross-sectional view of the card 110B dissected in parallel with the long side showing disassembled layers and a sectional view after bonding them together.

The lower surface 12 of the nonconductive base material 10 is the lower graphic printing surface 12 on which the graphics of the card are treated so that graphics of the card can be printed, and graphics of the backside of the card 110D are printed. As for the lower nonconductive base material 10, the first surface 11 and the wiring layer 20 are arranged facing upwards in the drawing, and the molding plate 60 is attached to the upper side of the lower nonconductive base material 10 with a die-cut adhesive tape 35 with the through hole 67 portion. The interior of the through hole 67 is filled with a conductive adhesive material 68 containing a conductive filler such as silver paste. Above the molded plate 60, the upper nonconductive base material 22 is attached with a die-cut adhesive tape 35 to the upper side of the through hole 67 of the molding plate 60 with the first face 23 having the wiring layer 20 facing downwards. Here, it is connected to the upper land 25, the conductive adhesive material 68, and the electrodes 111D, 111E, and the information electrodes 111D, 111E for IDs are conducted from the first and second indicator electrodes 51, 52.

The upper surface of the upper nonconductive base material 30 is the upper graphic printing surface 63 on which the graphics of the card are treated so that graphics of the card can be printed, and graphics of the front side of the card 110D are printed. Furthermore, both the upper and lower graphic printing surfaces 63 and 12 are subjected to printing protection treatment such as PP lamination processing for protecting the printed layer after printing.

The graphics on the upper graphic printing surface 33 include graphics printed for guiding to the positions of the indicator electrodes so that the sections corresponding to the positions at which the three sets of the indicator electrodes 51 and 52 are arranged are individually held by the fingers.

By attaching the lower nonconductive base material 10, the molding plate 60, and the upper nonconductive base material 22, the card 110D is formed.

By providing the molding plate 60, the card 110D cannot detect the positions of the indicator electrodes on the touch panel 201 even when the first and second indicator electrodes 51 and 52 for alternate current connection are placed on the touch panel 201, and touched with the finger.

Furthermore, by forming the molding plate 60 thick with a plastic resin having a low relative dielectric constant, even if the touch surface 201 of the card 110B3 is brought into contact with the touch panel 201 with an erroneous touch by the finger, it is possible to prevent the fingers from being detected by the touch panel 201. As a result, malfunction of the information device 200 can be prevented.

[Modification Example 1 of the Eighteenth Embodiment]

Figure 103:
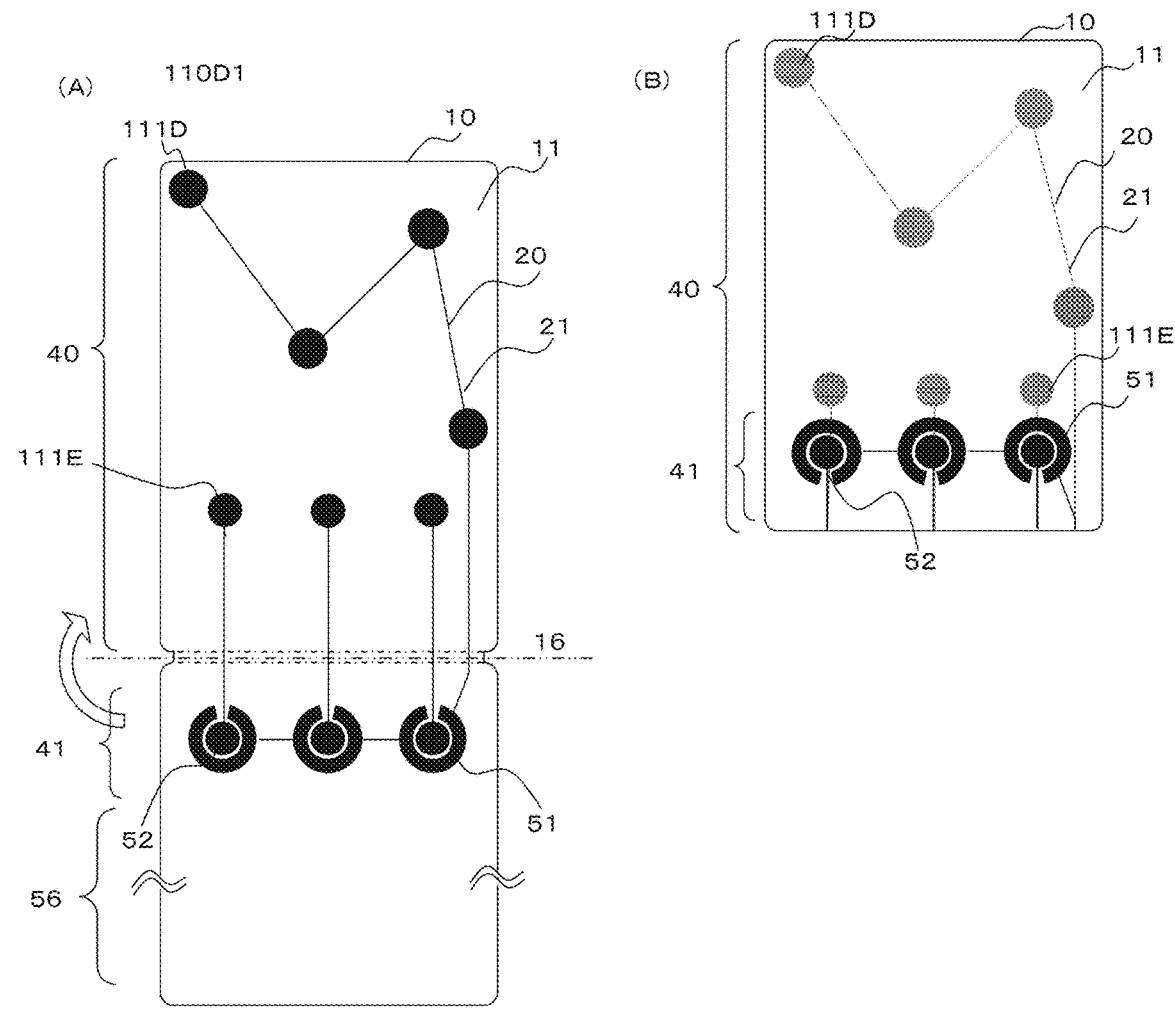
FIG. 103 is a structural example of a thin plate-like apparatus.
Figure 104:
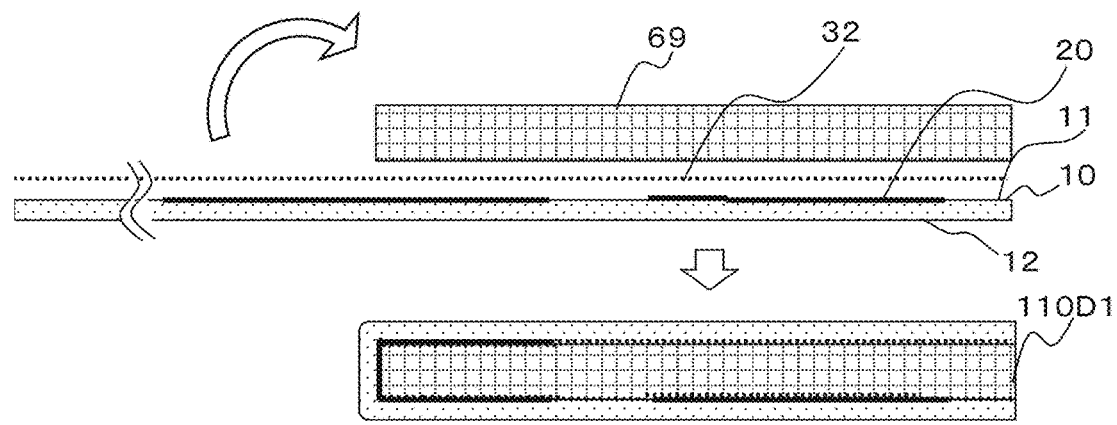
FIG. 104 is a structural example of a thin plate-like apparatus.

FIG. 103 and FIG. 104 are diagrams for describing a card 110D1 which is a modification example of the structure of the card 110D. FIG. 103(A) shows a plan view of the first surface 11 on which the wiring layer 20 of the nonconductive base material 10 used for the card 110D1 is placed, and FIG. 103(B) shows a transmission view from above of the wiring layer 20 when the nonconductive base material 10 is folded back. Shown in FIG. 104 are a cross-sectional view of the card 110B dissected in parallel with the long side showing disassembled layers and a sectional view after bonding them together.

In contrast to the card 110D of FIG. 101 provided with the wiring layers 20 separately on both sides of the molded plate 60 having the through holes 67, with the card 110D1, by attaching the wiring layer 20 of the non-conductive substrate 10 on both surfaces of a simple resin plate 69, a two layer wiring layer was obtained without providing a through hole.

As shown in FIG. 103(A), the nonconductive base material 10 is a plastic resin film such as a thin PC, PET or the like, or paper, and with respect to the external dimensions of a trading card or a credit card, it is formed in a substantially rectangular shape with substantially the same dimensions in short side direction, while in the long side direction the size is obtained by adding thickness size to twice the size of the long side of the card.

On the first surface 11 of the nonconductive base material 10, the wiring layer 20 is formed by printing using conductive ink such as silver salt ink, silver paste ink, carbon ink or the like.

The wiring layer 20 of the nonconductive base material 10 is configured so that the long side direction is the vertical direction and with the first surface 11 of the nonconductive base material 10 being the contact surface area 40, the four ID electrodes 111D arranged on the bottom side upon completion are connected together in one with single stroke wiring 21 which is a linear conductive member so as to have the adjacent ones be connected with single straight lines with the shortest distances from the ID electrode 111D which is a reference electrode in the lower right of the diagram to the ID electrode 111D in the upper left.

Also, from the three information electrodes 111E and the ID electrode 111D in the lower right, wirings are each drawn in straight lines with the shortest distances to the other side in terms of the area formed upon dividing the first surface 11 into two. Furthermore, on the other side with the area close to the center as the operation area 41, first and second indicator electrodes 51 and 52 with the same structures as those of the first and second indicator electrodes 51 and 52 of the card 110B of the thirteenth embodiment are arranged, and the wiring from the three information electrodes 111E and the ID electrodes 111D extending from the one side is connected to the corresponding first and second indicator electrodes 51 and 52, respectively. In addition, the pattern shape and configuration of the first and second indicator electrodes 51 and 52 are the same as those of the card 110 of the thirteenth embodiment.

The area other than the operation region 41 on the other side when the first surface 11 is divided into two is the upper graphic printing unit 56.

When the first surface 11 of the non-conductive substrate 10 is folded together by folding the first surface 11 inward with the line 16 dividing the surface into two at the center as a boundary, and by viewing through the wiring layer 20 from above, the wiring layer 20 as shown in FIG. 103(B) is observed. In the figure, the gray section is the lower side of the card and the black section is the upper side. Thus, it is possible to adopt a configuration in which the wiring layer is divided into two layers without forming a penetration section or the like in the nonconductive base material.

As shown in the cross sectional view of FIG. 104, the lower surface 12 of the nonconductive base material 10 of the card 110D1 is treated so that the graphics of the card can be printed, and one side of the bisected the first surface 11 is the lower graphic printing area. The other side of the bisected the first face 11 is the upper graphic printing area and it is possible to print both the front and back sides of the card by a single printing operation.
In the upper graphic printing section 56, graphics for guiding to the positions of each indicator electrode is printed so that the sections corresponding to the positions where the three indicator electrodes 51, 52 are arranged can be touched with the fingers, respectively.

Furthermore, as for the wiring layer 20 on the first surface 11 of the nonconductive base material 10, the wiring layers on the top side and the bottom side of the card can be printed by a single printing operation.

In addition, an adhesive material or adhesive tape 32 is attached to the side of the first surface 11 of the nonconductive base material 10, and to both sides of a plastic resin plate such as PC, PET, or the like having substantially the same shape and the planar external dimensions as a card and having almost the same thickness as the credit card 69, the first surface 11 of the nonconductive base material 10 is attached at the boundary with line 16 dividing the surface into two at the center.

Graphics on both sides of the card are printed on the lower surface 12 of the nonconductive base material 10, and after the printing, the lower graphics printing surface 12 is provided with print protection treatment using PP laminate or the like for protecting the printed layer.
By attaching the nonconductive base material 10 and the resin plate 6, the card 110D1 is formed.

By providing the resin plate 69, the card 110D1 cannot detect the positions of the indicator electrodes on the touch panel 201 even when the first and second indicator electrodes 51 and 52 for alternate current connection are placed on the touch panel 201, and touched with the finger.

Furthermore, by forming the molding plate 60 thick with a plastic resin having a low relative dielectric constant, even if the touch surface 201 of the card 110B3 is brought into contact with the touch panel 201 with an erroneous touch by the finger, it is possible to prevent the fingers from being detected by the touch panel 201. As a result, malfunction of the information device 200 can be prevented.

Processing of the penetration hole or the like is unnecessary for the resin plate 69, and since only one nonconductive base material 10 is attached to both sides, the manufacturing cost can be greatly reduced.

Figure 105:
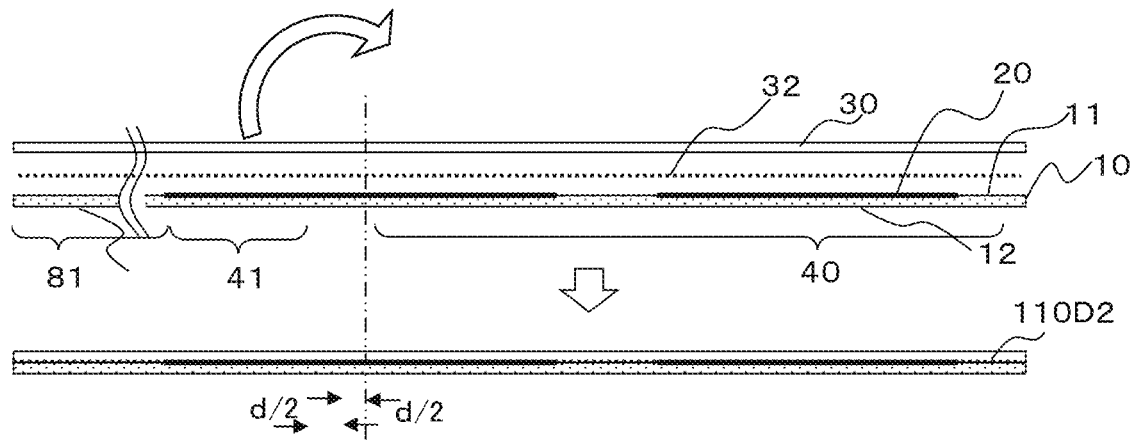
FIG. 105 is a structural example of a thin plate-like apparatus.
Figure 106:
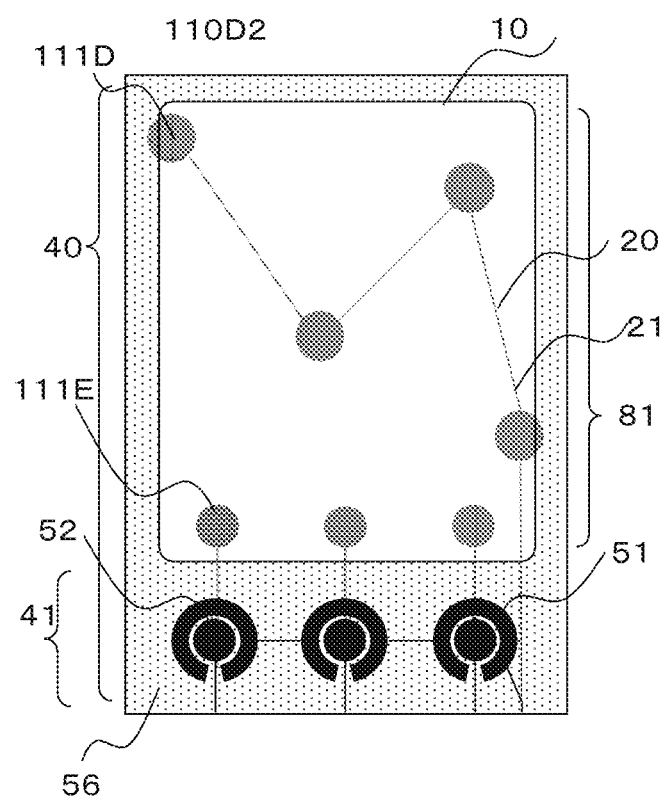
FIG. 106 is a structural example of a thin plate-like apparatus.
Figure 109:
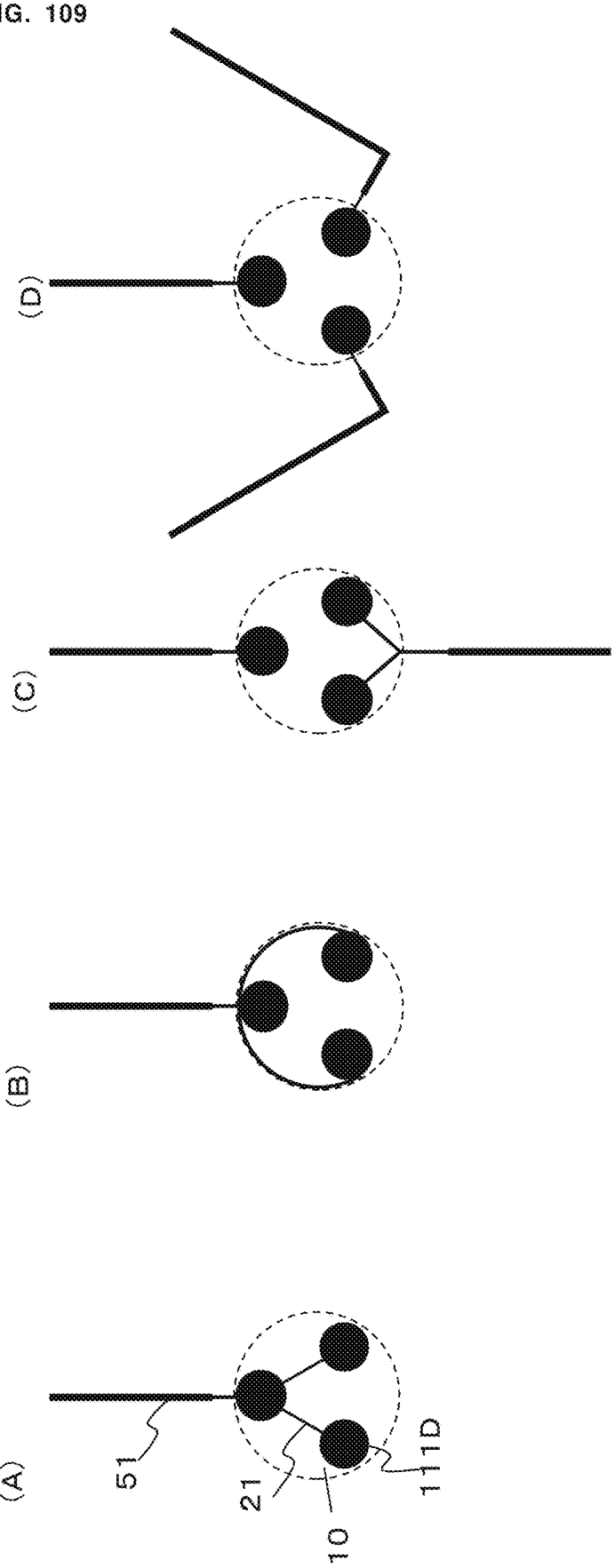
FIG. 109 is an embodiment of a compact conductor pattern.

[Modification Example 2 of the Eighteenth Embodiment]
FIGS. 105 to 107 are diagrams for describing a card case 110D2 which is a modification example of the structure of the card 110D1, and shown in FIG. 105 are a cross-sectional view of the card 110B dissected in parallel with the long side showing disassembled layers and a sectional view after bonding them together. FIG. 106 shows a view of the wiring layer 20 viewed through from above where the first surface 11 disposed with the wiring layer 20 of the nonconductive base material 10 used for the card case 110D2 is folded inward. FIG. 107(A) shows a cross sectional view of the card case 110D2 dissected in parallel with the long side direction, and FIG. 10 (B) shows a cross sectional view of the card case 110D2 dissected in parallel with the short side direction.

With respect to the card 110D1 in FIG. 103, the card case 110D2 differs with the card case 110D2 in that space is provided for folding the nonconductive base material 10 having the wiring layer 20 to form a card case.

As shown in FIG. 105 and FIG. 106, the nonconductive base material 10 is a transparent plastic resin film such as thin PC, PET or the like, and with respect to the external dimensions of a trading card, a cybernet standard card such as a QUO card or a credit card, it is formed in a substantially rectangular shape, and is slightly larger in the short side direction, while in the long side direction the size is obtained by adding thickness size to twice the size of the long side of the card.

On the first surface 11 of the nonconductive base material 10, the wiring layer 20 is formed by printing using a conductive ink such as silver salt ink, silver paste ink, carbon ink or the like.

The wiring layer 20 of the nonconductive base material 10 is configured so that the long side direction is the vertical direction and with the first surface 11 of the nonconductive base material 10 being the contact surface area 40, the four ID electrodes 111D arranged on the bottom side upon completion are connected together in one with single stroke wiring 21 which is a linear conductive member so as to have the adjacent ones be connected with single straight lines with the shortest distances from the ID electrode 111D which is a reference electrode in the lower right of the diagram to the ID electrode 111D in the upper left.

Also, from the three information electrodes 111E and the ID electrode 111D in the lower right, wirings are each drawn in straight lines with the shortest distances to the other side in terms of the area formed upon dividing the first surface 11 into two. Furthermore, on the other side with the area close to the center as the operation area 41, first and second indicator electrodes 51 and 52 with the same structures as those of the first and second indicator electrodes 51 and 52 of the card 110B of the thirteenth embodiment are arranged, and the wiring from the three information electrodes 111E and the ID electrodes 111D extending from the one side is connected to the corresponding first and second indicator electrodes 51 and 52, respectively. In addition, the pattern shape and configuration of the first and second indicator electrodes 51 and 52 are the same as those of the card 110 of the thirteenth embodiment.

The area other than the operation region 41 on the other side when the first surface 11 is divided into two is the upper graphic printing unit 56 on the outer periphery and the transparent area 81 on the inner side.

Along the line 16 dividing the first surface 11 of the nonconductive base material 10 into two at the center, the surface is bend 90 degrees centering a point somewhat larger than ½ of the case thickness D. This is done on one side and the other side. When the first surfaces 11 of both the upper side and the lower side are folded together by folding the first surface 11 inward with the line 16 dividing the surface into two at the center as a boundary, and by viewing through the wiring layer 20 from above, the wiring layer 20 as shown in FIG. 106 is observed. In the figure, the gray section is the lower side of the card and the black section is the upper side. Thus, it is possible to adopt a configuration in which the wiring layer is divided into two layers without forming a penetration section or the like in the nonconductive base material.

As shown in the cross sectional view of FIG. 105, the lower surface 12 of the nonconductive base material 10 of the card 110D2 is treated so that the graphics of the card can be printed, and one side of the bisected the first surface 11 is the contact area 40, a lower graphic printing area. The other side of the bisected the first face 11 is the operation area 41, a transparent area 81, and an upper graphic printing section 56 is on the outer periphery. Both the front and back sides of the card can be printed by a single printing operation. In the upper graphic printing section 56, graphics for guiding to the positions of each indicator electrode is printed so that the sections corresponding to the positions where the three indicator electrodes 51, 52 are arranged can be touched with the fingers, respectively.

Furthermore, as for the wiring layer 20 on the first surface 11 of the nonconductive base material 10, the wiring layers on the top side and the bottom side of the card can be printed by a single printing operation.

An adhesive material or adhesive tape 32 is attached to the side of the first surface 11 of the nonconductive base material 10, and along the line 16 dividing the first surface 11 of the nonconductive base material 10 into two at the center, the surface is bend 90 degrees centering a point somewhat larger than ½ of the case thickness D. This is done on one side and the other side.

In addition, the side surface of the nonconductive base material 10 is attached to the spacer 80 which is slightly thicker than the thickness d of the card with an adhesive material or adhesive tape.

Graphics on both sides of the card are printed on the lower surface 12 of the nonconductive base material 10, and after the printing, the lower graphics printing surface 12 is provided with print protection treatment using PP laminate or the like for protecting the printed layer.

By attaching the nonconductive base material 10 and the resin plate 6, the card case 110D2 is formed.

By using the card case 110D2 as a case for an ordinary game card having no capacitance code already having been sold, a normal game card becomes a card that can issue a capacitance code, and thus a new market can be developed.

Nineteenth Embodiment

[Mechanism of a C-CARD (Use by Placing, Structure: Small Area, Single Layer, One Side, Three Dimensional Conductor)]

This practical example is an embodiment of a small conductor pattern where a conductor pattern 70 can be issued by attaching a corresponding circuit to the bottom surface of a small figure or the like and placing the figure onto a touch panel.

FIG. 108 shows an image diagram of the use of the card 110E for issuing a conductor pattern 70 by placing the body 90 of the figure on the touch panel 201. Three ID electrodes 111D each having a diameter of about 7 mm are used to form a conductor pattern 70, a printed pattern of the nonconductive base material 10 is attached to the bottom surface 91 of the body 90 of a small figure, and wiring 21 was set up on the side surface of the body 90 as an indicator electrode 51. Patterns properly detected by the touch panel 201 were investigated by having the body 90 held together with an indicator electrode 51 by the fingers 55.

Specifications for the settings of the wiring 21 and the attachment of indicator electrodes in FIG. 109(A) to FIG. 109(D) were prepared and evaluated. It was confirmed that any one of the patterns was detected on the touch panel 201 without any significant difference.

[Modification Example 1]

In the card 110 according to all of the embodiments of the present specification, the touch panel 201 detects four ID electrodes 111D and one information electrode 111E to form one type of conductor pattern 70. However, the number of the ID electrodes 111D is not necessarily limited to four and by using three ID electrodes 111D, it is possible to implement two cases with one card 110, wherein one is to simultaneously touch three ID electrodes 111D and two second indicator electrodes 52, and have the two second indicator electrode 52 be detected to form a conductor pattern 70 with five electrodes, and the other is to simultaneously touch three ID electrodes 111D and one second indicator electrode 52, and have the one second indicator electrode 52 be detected to form a conductor pattern 70 with four electrodes As a result, the number of conductor patterns 70 that can be formed by one card can be greatly increased.

Furthermore, other than smartphones, for industrial touch panels and tablets, where the number of simultaneously detectable positions is not limited to five or limited to ten, it is also possible to increase the number of second indicator electrodes to touch simultaneously while keeping the number of ID electrodes 111D to four, and the number of second indicator electrodes touched simultaneously can be adjusted as needed according to the specifications of the touch panel without changing the configuration of the card.

[Modification Example 2]

It is possible to prepare all of the nonconductive base materials laminated on the card 110 with transparent plastic resin film such as PC or PET, and to provide a partial area with a window as a transparent area with no printing in an area corresponding to the same area of the front and back sides of card 110 where graphic printing is applied to both sides of the card 110.

This makes it possible to see the image data displayed in the transparent area of the card 110 from above even with the screen of the touch panel display on which the card was brought into contact.

Furthermore, indicator electrodes and electrodes may be arranged in the transparent area. As a result, since the image information related to the processing to be performed by the conductor pattern, which is formed by touching the indicator area, can be shown in the vicinity of the indicator electrodes, the card user can adopt a configuration that lessens the possibility of making a mistake.

Twentieth Embodiment

The thin plate-like apparatus (C-Card) described above can be used for various purposes.

Specific examples of applications will be described below. Note that in the present invention, it goes without saying that the structure and uses of the C-Card are not limited to the specific examples described below. Also, the following embodiments may be any combined and used in any way.

Furthermore, in the following embodiments, smartphones are used, but the present invention is not limited to them, and it goes without saying that other electronic devices equipped with a touch panel, such as a tablet, may be used.

[Outline of the C-Card]

Figure 110:
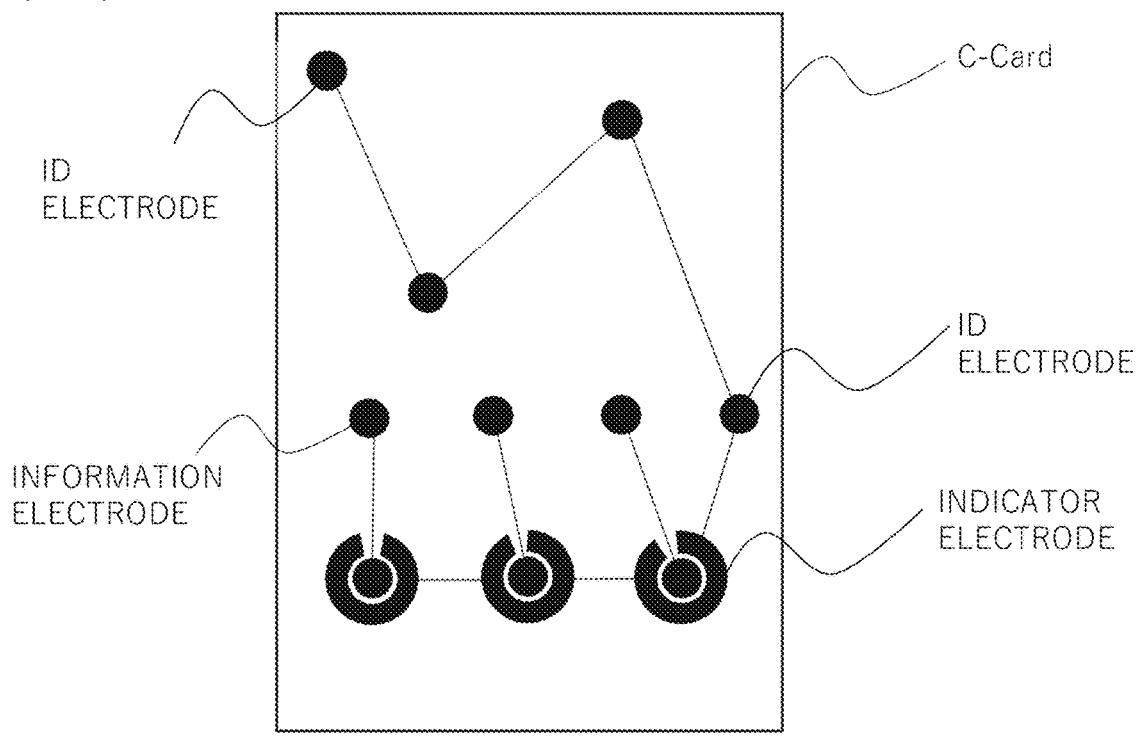
FIG. 110 is a diagram showing the internally layered structure of a C-Card.

FIG. 110 is a diagram showing an internal layered structure of a C-Card.

Figure 111:
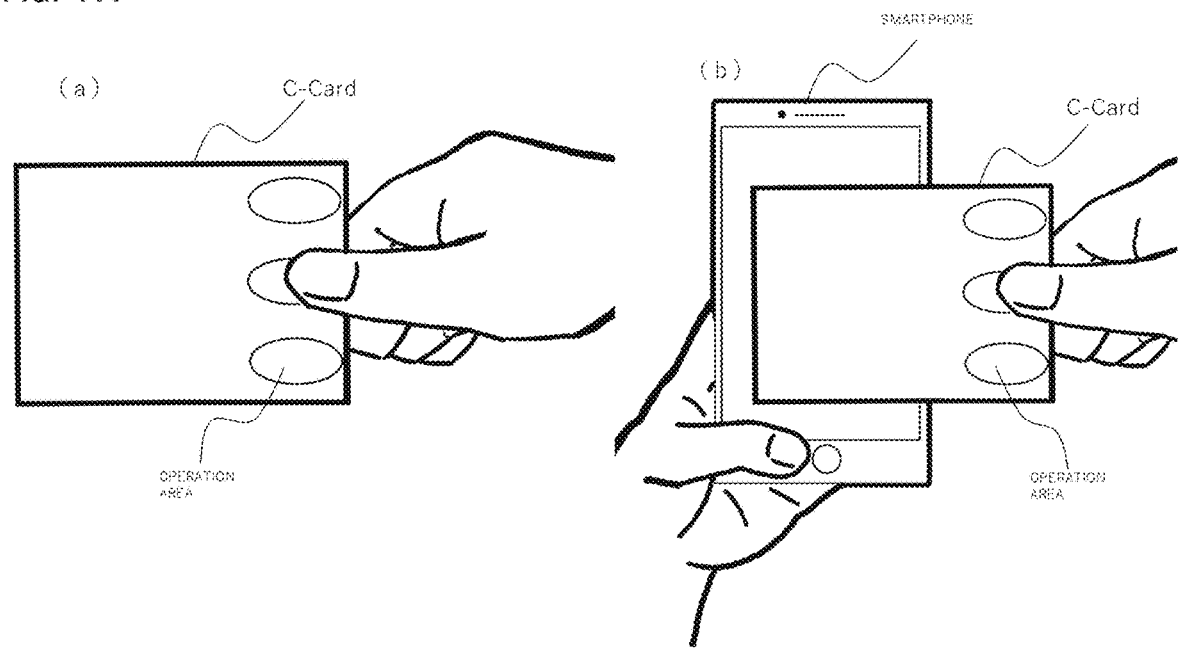
FIG. 111 is a diagram showing the selection of a touch position.

FIG. 111 is a diagram for describing the usage state of a C-Card.

As shown in the same figure, for a C-Card, seven electrodes are formed inside the card, of which five of the electrodes are detected by a smartphone, and an electrostatic capacitance code is recognized from the conductor pattern. The smartphone carries out information processing such as content browsing and operation instructing corresponding to the capacitance code.

Four electrodes out of the seven electrodes are ID electrodes connected to each other by conductive wires, and the conductor pattern is set as a card ID formed with a unique ID conductor pattern on the card. The remaining three electrodes are information electrodes and are connected with conductive wires to indicator electrodes internally formed in the operation area which is held and touched with the fingers. When either of them is held and touched with a finger, a unique conductor pattern is formed by the ID conductor pattern and the corresponding electrodes. In other words, different conductor patterns are formed by holding/touching one of them with a finger, and the smartphone can recognize the unique capacitance code. Note that the upper layer of the indicator electrodes has a nonconductive layer on which graphics are printed, and the indicator electrode has a predetermined area and has a structure enabling alternating current conduction from the finger.

FIG. 111 is a diagram showing selection of a touch position. On the surface of the C-Card, icons indicating touch positions are printed corresponding to the respective positions of the operation areas above the three indicator electrodes. As shown in FIG. 111(a), while touching one of the touch positions with a finger, the user taps the card over the smartphone as shown in FIG. 111(b). Here, "tapping" is a concept including both making contact with and coming into close proximity to.

Then, the smartphone detects one information electrode and four ID electrodes, which conduct to the indication electrode under the selected operation area, so that the five electrodes in total form three kinds of conductor patterns. Thus, three kinds of capacitance code can be recognized.

Furthermore, a graphic indicating the operation area may be formed on the front and back sides. By tapping a C-Card onto a smartphone holding same holding position, different conductor patterns may form on the front and back sides, and thus six types of capacitance code can be recognized. However, if a bilaterally symmetrical conductor pattern is generated, it cannot be recognized as a different electrostatic capacitive code when the card is turned over, and thus it would be necessary to arrange the electrodes in a unique arrangement.

With a C-Card, silver salt ink is used as conductive ink, and low cost and mass production is realized by gravure offset printing. Characteristics of gravure offset printing using a silver salt ink are described below.

After drying, organic matter volatilizes, providing almost only silver. Since the resistance value is extremely small, the line width and thickness can be minimized to the extent that electrostatic capacitance is hardly detected.

Since gravure offset printing is possible, it is possible to print with a line width of 4 μm and a thickness of about 100 nm, and the amount of ink used can be reduced drastically.

With offset printing using carbon ink or screen printing using silver paste, the ink thickness at the time of printing is approximately 5 μm or more, and the printed surface becomes uneven. As a result, since the printed layer of the upper layer or the attached printed sheet layer produces a level difference of more than 20μ, it is necessary to print with varnish or ink to smoothen areas where electrodes and wiring are not arranged to form a flat plane. At 20μ or less, processing of the level difference is unnecessary. With this degree of thickness, gravure printing can be used.

Furthermore, when the electrode and the wiring are not of color equivalent to white, it is necessary to blindfold with printing using white ink or with a thick white sheet for placing a graphic, which complicates the manufacturing process and increases the cost. Furthermore, screen printing using silver paste requires a long drying time (about 15 minutes), and a loss occurs in the printing process requiring the securing of a predetermined storage area and transferring. However, in gravure offset printing using silver salt ink, since the printing thickness is only about 100 nm and no unevenness occurs in upper printed layer or the attached printed sheet layer due to the ultra-thin thickness, a white PC (polycarbonate) sheet may be pasted on the printed surface and then printing may be carry out. Alternatively, a printing sheet already with printing may be pasted. In the case of carbon ink, without blindfolding processing, it will show through, but silver salt ink is relatively white, so blindfolding is not necessary. Furthermore, if white PC is used for the sheet on which electrodes and wiring are printed with silver salt ink, the back side of the card may be printed on the back side of the white PC. In this way, it is possible to form a card with two layers. Note that the drying time is about 5 minutes, which further leads to labor saving for the manufacturing process.

[New Services/New Products with a C-Card]

In the modern society where smartphones are indispensable, an objective would be to provide services that are secure, safe, and convenient for everyone from children to the elderly.

The user can enjoy a service by simply having the QR code printed on the back of the C-Card read, accessing the Web, and tapping the C-Card on the smartphone. Furthermore, by providing a special benefit, it is possible to urge the download of the application, and by downloading the application, a smartphone ID can be acquired, and push mail can be transmitted from a service provider, thereby enabling the provision of continuous service. This service can be applied not only to commercial activities but also to various administrative services. Note that after reading the QR code, since an application can also be downloaded immediately from the window, the C-Card may be tapped after downloading the application. However, since also the size of the application is large, it is important to provide motivation to the user who might be hesitant to download the application.

Also, by tapping a C-Card onto a smartphone and entering the PIN code printed on the C-Card, the ID of the C-Card, the PIN code, and the smartphone ID are authenticated and registered in the cloud in conjunction with each other. Afterwards, authentication can be carried out just by tapping the C-Card. With PIN code input alone, there is a high possibility that PIN codes are skimmed, but without a C-Card, a PIN code cannot be entered, and in addition, by linking with the C-Card ID, high security can be realized. Note that it is also possible to prevent skimming in the C-Card distribution process by applying a scratching process for revealing the PIN code.

[Promotion]

Since the C-Card is extremely inexpensive, it is possible to distribute it free of charge, and it may be used as a next-generation advertising medium linked with the Internet and push mail can easily be send.

Therefore, as described below, it can be used for various promotions.

(1) Promotions by Card Distribution

The card is provided to targeted persons (users) in various ways including sending DM, posting, inserting in printed matter, displaying, bundling with products, distributing on the street, as a push type medium that enhances the motivation for content browsing by attractive graphics printed on the C-Card (for example, popular characters, games, idols, coupon provision and the like).

The user can view contents simply by tapping a C-Card onto a smartphone, and the provider can appeal products/services at the same time. The user can select from a plurality of icons by finger operations, and in addition to browsing contents, registration (downloading of an application) for obtaining additional services (for browsing of even more attractive contents and acquisition of coupons) can be carried out, and information on events, introduction of shops/facilities, maps and the like can freely be set. Downloading of an application by the user enables the provider to transmit push mail, and to continue providing information to the user also afterwards. It is also possible to persuade visiting shops and participating in events.

FIGS. 112 to 113 are diagrams showing a case where a C-Card is used for the promotion of a movie.

FIG. 112 is a diagram showing a card for promotion of a movie, wherein FIG. 112(a) shows the front side of the card and FIG. 112(b) shows the back side of the card.

The user receives a card on a street, at a movie theater, or the like. As shown in FIG. 112(a), the movie title, the released date, and illustrations are printed in the upper part of the front side of the card. In the lower part of the front side of the card, there are three operation areas, marked "TOUCH; SPECIAL PREVIEW; MOVIE," "TOUCH; CHARACTER," "TOUCH; THEATER LIST," respectively. As shown in FIG. 112(b), a QR code (registered trademark) and a URL are printed on the lower part of the back side of the card.

FIG. 113 is a diagram for describing the usage state of a card.

Although not shown, the user accesses a Web site for movie promotion by reading a QR code (registered trademark) on the back side of the card with a smartphone or inputting a URL. As shown in FIG. 113(a), the user taps the card onto a smartphone while holding the operation area marked "TOUCH; SPECIAL PREVIEW; MOVIE." Then, as shown in FIG. 113(b), a video of the special movie preview can be viewed.

When the user taps a card onto a smartphone while holding the operation area marked "TOUCH; CHARACTER," a Web page introducing characters appearing in the movie is accessed, and when holding the operation area marked "TOUCH; THEATER LIST," and tapping the card onto a smartphone, a list of theaters where the movie is shown is displayed. Note that by reading the QR code (registered trademark) or by inputting the URL on the back side of the card, an application downloading site is displayed, and if the user downloads the application, the application can acquire the user's smartphone ID and various kinds of information can be transmitted by the advertiser.

(2) Promotion by a Store

If C-Cards are distributed to customers who purchase products or services at stores, they become powerful tools for having the customer become a repeater.

The store side (provider) provides to the purchaser (user) a C-Card on which reward points or a coupon are registered. For example, when a visitor (user) holds the part marked "POINT ACQUISITION" with the fingers and taps it on the shop website, an application is downloaded. Next, by entering the PIN code marked on the C-Card, reward points or coupons can be acquired. By downloading the application, the application can acquire the user's smartphone ID and it becomes possible to transmit push mail from the store at any time to the user, and information such as "5 times of points are awarded at the weekend" and the like can be provided. When the user holds "POINTS" with the fingers, reward points or coupons that can be used are displayed. By holding "NEW ARRIVALS" with the fingers, new service information can be viewed.

Figure 115:
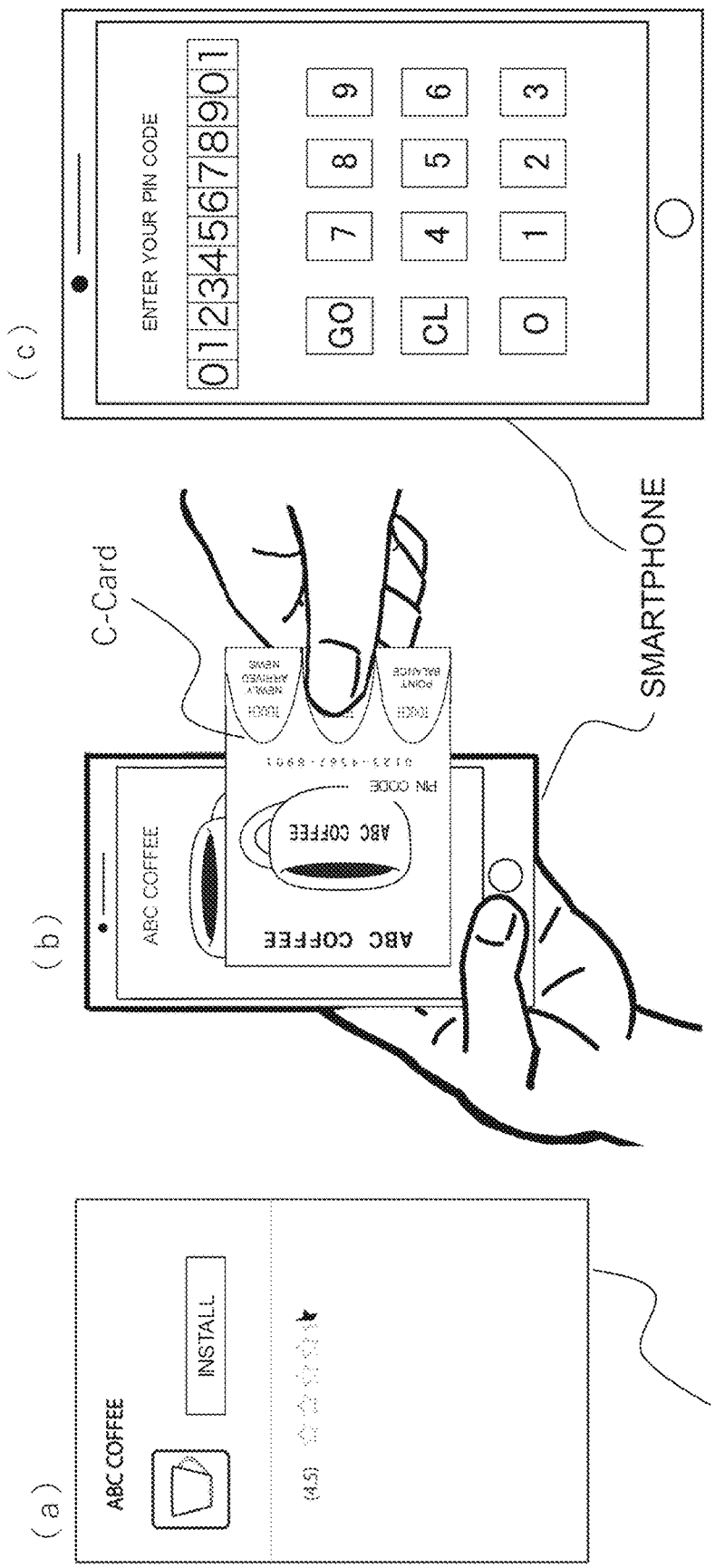
FIG. 115 is a diagram showing a case where a C-Card is used for promotion by a coffee shop, and is a diagram describing the usage state of the card.

FIGS. 114 to 115 are diagrams showing a case where the C-Card is used for promotion by a cafe.

FIG. 114 is a diagram showing a card for promotion by a cafe, wherein FIG. 114(a) shows the front side of the card and FIG. 114(b) shows the back side of the card.

A waiter/waitress at a cafe distributes cards to visiting users. As shown in FIG. 114(a), the name of the cafe, illustrations, and a PIN code are marked in the upper part of the front side of the card. In the lower part of the front side of the card are three operation areas, which are marked "TOUCH; POINT BALANCE," "TOUCH; GET ACQUISITION," "TOUCH; NEWLY ARRIVED NEWS," respectively. As shown in FIG. 114(b), a QR code (registered trademark) and a URL are printed on the lower part of the back side of the card.

FIG. 115 is a diagram for describing the usage state of a card.

Although not shown, the user reads the QR code (registered trademark) on the back side of the card with a smartphone or inputs the URL. Then, as shown in FIG. 115(a), a window for installing an application of the cafe is displayed. As shown in FIG. 115(b), after installing the application, the user taps the card onto a smartphone while holding the operation area of "TOUCH; POINT ACQUISITION." Then, as shown in FIG. 115(c), a window for inputting the PIN code is displayed. When the user inputs the PIN code marked on the card surface, the user can acquire a coupon.

When the user taps the card onto the smartphone while holding the operation area of "TOUCH; POINT BALANCE," the balance of the reward points is displayed, and when tapping the card toto the smartphone while holding the operation area of "TOUCH; NEWLY ARRIVED NEWS," newly arrived information such as new menus, campaign information, coupon provision and the like are displayed. In addition, push mail may be transmitted as alerts for newly arrived information. If there is a desire to newly acquire points and coupons, the application is activated, the operation area of "TOUCH; POINT ACQUISITION" is held and the card is tapped onto the smartphone, and then point icons and coupons to be provided are displayed on the smartphone and the user only has to tap the sought after service. As a result, since the user responds to the distributed information, that the user still possesses the card can be grasped, and these kinds of information can be utilized for new marketing. Furthermore, to newly provide points and coupons, the store side may provide a touch panel and make it possible to provide points and coupons by having the user acquire them by tapping a card on the touch panel. By doing so, the user may be persuaded to visit the store. When using points or coupons at a shop, the card is handed to the store clerk, and the store clerk taps it over a shop smartphone, enters the PIN code, and erases the used points and coupons.

[Content Sales]

The C-Card can also function as a key by the entry of PIN codes for permitting access to contents and downloading of contents.

Described below are details.

(1) Music/Video Contents

When the user holds "PIN CODE INPUT" of the purchased C-Card with the fingers and taps it onto a smartphone, a smartphone PIN code input window is displayed. Next, by entering the PIN code marked on the C-Card the purchased music and videos can be enjoyed. By holding one of the icons corresponding to various contents with the fingers, the corresponding content is reproduced. Furthermore, by holding "SNS" with the fingers, a window for entering comments is displayed. Note that once a PIN code is entered, thereafter, a content is reproduced by holding the predetermined icon with the fingers and tapping the card onto a smartphone.

Even if a user buys a CD or a DVD, the user cannot acquire new release information unless carrying out troublesome membership registration, but with a C-Card, various pieces of new release information, event introduction information, and the like can be automatically acquired.

Figure 117:
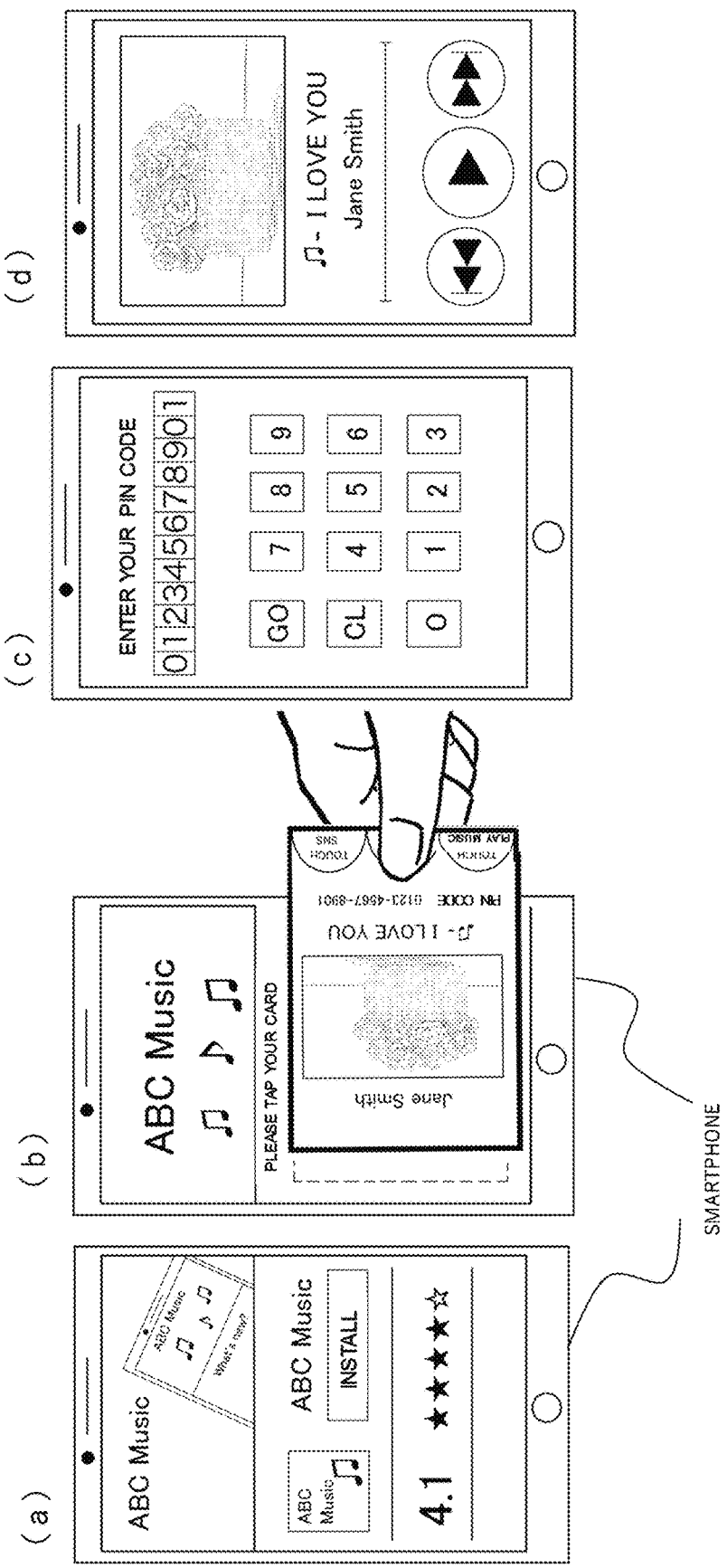
FIG. 117 is a diagram showing a case where a C-Card is used for viewing songs/video contents, and is a diagram describing the usage state of the card.

FIGS. 116 to 117 are diagrams showing specific details for accessing tune/video contents.

FIG. 116 is a diagram showing a C-card (card) for music/video contents, wherein FIG. 116(a) is the front side of the card and FIG. 116(b) is the back side of the card.

Users purchase the cards at CD shops, convenience stores, or the like. As shown in FIG. 116(a), in the upper part of the front side of the card, the singer's name, illustrations, tune titles, and PIN codes are marked. In the lower part of the front side of the card, there are three operation areas, which are marked as "TOUCH; PLAY MUSIC," "TOUCH; PLAY MV," and "TOUCH; SNS," respectively. As shown in FIG. 116(b), a QR code (registered trademark) and a URL are printed on the lower part of the back side of the card.

FIG. 117 is a diagram for describing the usage state of a card.

Although not shown, the user reads the QR code (registered trademark) on the back side of the card with the smartphone or inputs the URL. Then, as shown in FIG. 117(a), a window for installing an application for viewing music/video contents is displayed. As shown in FIG. 117(b), after installing the application, the user taps the card onto a smartphone while holding the operation area of "TOUCH PLAY MV." Then, as shown in FIG. 117(c), a window for inputting the PIN code is displayed. When the user inputs the PIN code marked on the card surface, the music video of the corresponding tune is played as shown in FIG. 117(d).

Afterwards, if contents are desired to be viewed, all that is required is the activated of the corresponding application and tapping of the card. When the user taps the card onto the smartphone while holding the operation area of "TOUCH; PLAY MUSIC," a tune is reproduced, and when tapping the card onto the smartphone while holding the operation area of "TOUCH; SNS," a window for inputting comments is displayed, and the user can write feedback of the tune and the like.

(2) Trading Card/Game Card

A huge demand for trading cards and game cards by the C-Card are expected.

With an athlete card, the user can acquire various kinds of information in real time from the introduction of the athlete, results of the day, future schedules, and the like.

Since trading cards have high collectability and are used continuously, development to stable business is anticipated.

With the game card, since characters and items are printed, the user can play in various ways by holding the icon such as "attack" or "defense" with the fingers and tapping the C-Card onto a smartphone. In addition, since the position and rotation angle of the C-Card tapped onto the smartphone can be recognized, it is possible to operate the game by rotating and moving the C-Card. In addition, it is also possible to make linkages with arcade games.

FIGS. 118 to 119 are diagrams showing specific details of a game card using a C-Card.

FIG. 118 is a diagram showing a game card, wherein FIG. 118(a) is the front side of the card and FIG. 118(b) is the back side of the card.

A user purchases a card at a game arcade, at a convenience store, on the net, or the like. As shown in FIG. 118(a), in the upper part of the front side of the card, the name of the game, illustrations, and the type of the card are marked. There are three operation areas in the lower part of the front side of the card marked "WEAPON 1 ATTACK," "WEAPON 2 ATTACK," "DEFENSE," respectively. As shown in FIG. 118(b), a QR code (registered trademark) and a URL are printed in the upper part of the back side of the card.

FIG. 119 is a diagram for describing the usage state of a card.

Although not shown, the user reads the QR code (registered trademark) on the back side of the card with a smartphone or inputs the URL. Then, a window for installing the game application is displayed. After installing the application and starting the game, the user taps the card onto the smartphone while holding the operation area of "WEAPON 2 ATTACK," as shown in FIG. 119(a) Then, an attack corresponding to "WEAPON 2" is performed.

FIG. 119(b) is a diagram for describing a state in which a game card is used in an arcade game. In this way, it is possible to use the same card for both a smartphone and an arcade game. Parameters and the like obtained by the game using a smartphone can also be used in the arcade game. Naturally, scores, parameters, and the like obtained in and arcade game can also be used with a smartphone.

[When Using the Same Card ID]

FIGS. 120 to 123 are diagrams for describing a case where different contents are provided with the same card ID.

The number of card IDs provided by ID electrodes is limited. Therefore, if the number of issued C-Cards (cards) increases, the number of types of issued cards would exceed the number of card IDs.

Therefore, a method of providing different contents even with the same card ID will be described.

Figure 120:
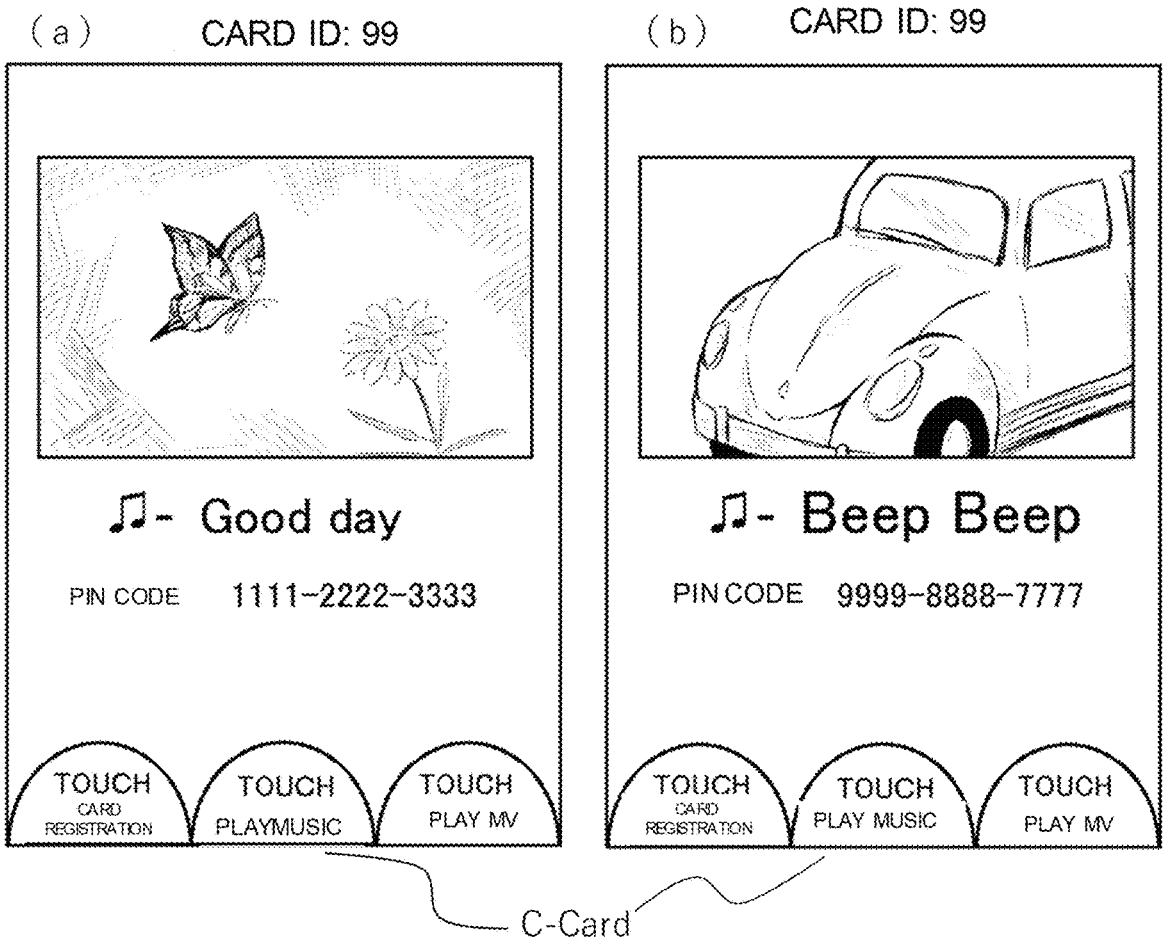
FIG. 120 is a diagram describing a case where different contents are provided with the same card ID, and is a diagram showing two cards having the same card ID.

FIG. 120 is a diagram showing two cards having the same card ID. For the card of FIG. 120(a), 99 is assigned as the card ID, and 1111-2222-3333 is assigned as the PIN code. On the other hand, for the card of FIG. 120(b), 99 is assigned as the card ID, and 9999-8888-7777 is assigned as the PIN code.

In this way, the two cards have the same card ID but different PIN codes.

Figure 121:
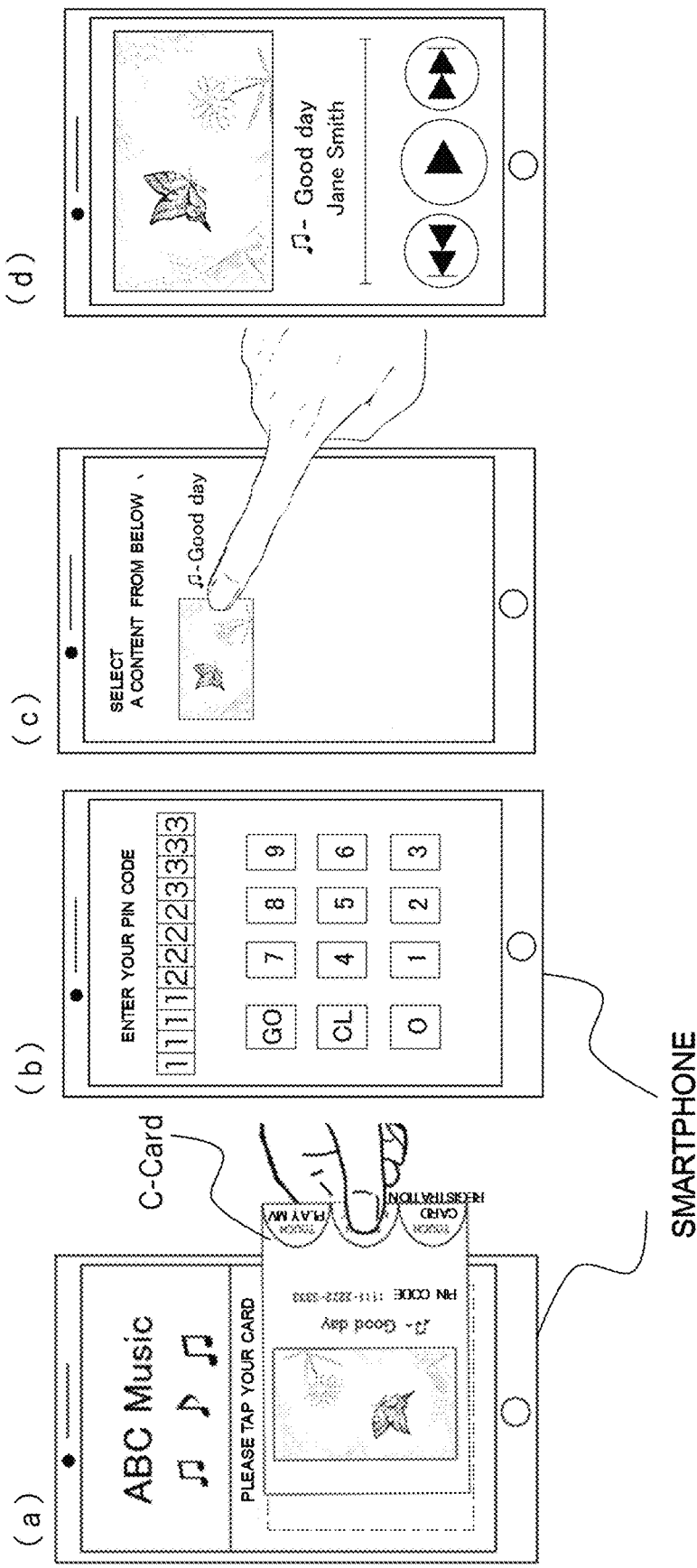
FIG. 121 is a diagram describing a case where different contents are provided with the same card ID, and is a diagram describing a processing of first registering a card and then listening to music.

Although not shown, a QR code (registered trademark) and a URL are printed on the back side of the card. The user reads the QR code (registered trademark) on the back side of the card with a smartphone or inputs the URL. Then, a window for installing a predetermined application (in the case of FIG. 120(a) and FIG. 120(b), for enjoying tunes) is displayed. When the application is activated after installing the application, the initial window for ABC MUSIC (a window for tapping the card) is displayed. When the user holds the "CARD REGISTRATION" icon and taps the card onto a smartphone, a PIN code input window is displayed. The "GO" icon displayed on the smartphone is touched after entering the PIN code. As a result, registration of the card is completed, and authentication information in which the smartphone ID, the card ID, and the PIN code are linked is stored in the memory of the smartphone and/or in the cloud (server). Upon inputting the PIN code, if there is a typing error or cancellation of input is desired, what needs to be done is to touch the "CL" icon. At the time of initial registration, at least the card ID and PIN code must be authenticated in the cloud, therefore it is desirable to access the cloud. After card registration, when using the card with the contents already downloaded, it is not necessary to access the cloud. If the contents are not downloaded, it is necessary to access the cloud every time. It is desirable to make the card usable only on the smartphone of the owner by linking it to a smartphone ID. FIG. 121 is a diagram for describing the process of registering a card for the first time and listening to a tune.

As shown in FIG. 121(a), the user runs the application, holds the "CARD registration" icon of the card of FIG. 120(a) and taps the card onto the initial window of the application. Then, as shown in FIG. 121(b), a PIN code input screen is displayed. When the user enters the PIN code "111122223333" marked on the card, an icon indicating the card of FIG. 120(a) is displayed as shown in FIG. 121(c). On the screen, writings such as "SELECT A CONTENT FROM BELOW" are displayed together with card icons. The user touches the card icon. Then, the tune linked with the card is reproduced on the smartphone, as shown in FIG. 121(d).

In this manner, with an application in which the use of the same card ID is a prerequisite, card icons are set each time a PIN code is input. The user selects the set icon. As a result, after registration, even if the user possessing another card (unregistered card) having the same card ID as the card ID of the registered card taps the card onto the smartphone, since an icon corresponding to an unregistered card is not displayed, contents of cards not registered cannot be viewed.

Figure 122:
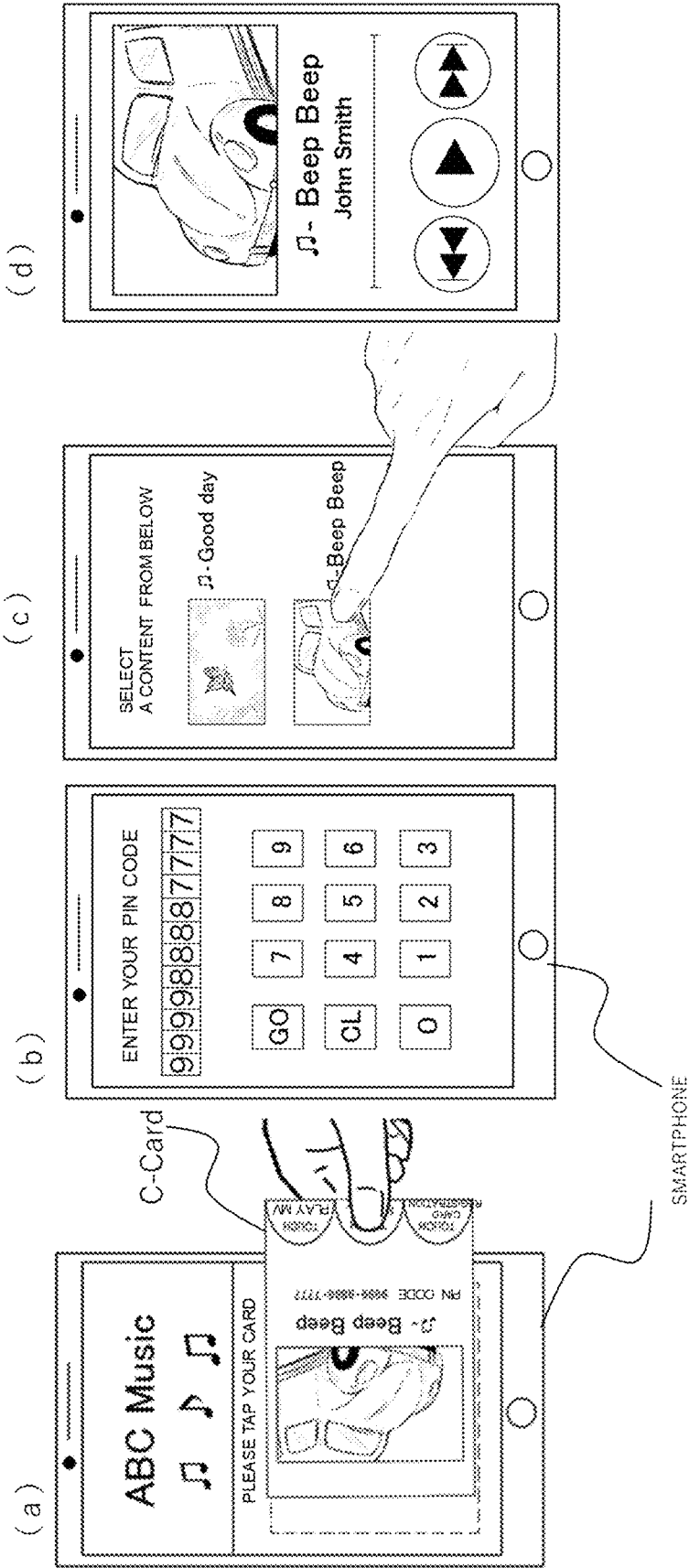
FIG. 122 is a diagram describing a case where different contents are provided with the same card ID, and is a diagram describing a processing of registering the card of FIG. 120 (b) and then listening to the music after pre-registering the card of FIG. 120(a) on a smartphone.

FIG. 122 is a diagram for describing the process of registering the card of FIG. 120(b) after the registration of the card of FIG. 120(a) on a smartphone and listening to music.

As shown in FIG. 122(a), the user runs the application, holds the "CARD registration" icon of the card of FIG. 120(b) and taps it onto the initial window of the application. Then, as shown in FIG. 122(b), a PIN code input screen is displayed. When the user enters the PIN code "999988887777" marked on the card, a card icon indicating the card having the recognized card ID is displayed on the screen of the smartphone, as shown in FIG. 121(c). In this embodiment, card icons corresponding to the card of FIG. 120(a) and the card of FIG. 120(b) are displayed. On the screen, writings such as "SELECT A CONTENT FROM BELOW" are displayed together with the card icon. The user selects and touches a card icon. Then, as shown in FIG. 122(d), the selected tune is reproduced on the smartphone. Here, if the card icon of FIG. 120(a) is selected, the tune of FIG. 120(a) is reproduced.

FIG. 123 is a diagram describing a case where the two cards in FIGS. 120(a) and 120(b) having the same card ID are registered by PIN code input shown FIGS. 121 and 122 and then used again. When running the application and holding the "PLAY" icon of one of the cards in FIG. 120(a) or FIG. 120(b) and tapping the card onto the initial window of the application, the two card icons already registered are displayed. Therefore, if one is selected and touched, the selected tune is reproduced.

[Sightseeing and Events]

In Japan, as of 2017, the elimination of language barriers, and the provision of attractive Japanese tourism resources and hospitality services has been an issue in order to acquire 40 million overseas tourists towards 2020. The C-Card can solve this problem. It can be used as an extremely inexpensive tourist card that can be distributed free of charge.

(1) Tourist Information Card

Tourist information pamphlets are usually displayed in hotels/inns, sightseeing facilities and stations in tourist spots. Similarly, C-Cards can be displayed. Pictures of scenic tourist spots and facilities are printed on a C-Card. When the user holds language icons such as "JAPANESE," "ENGLISH," "CHINESE," or "EXPLANATION," "EVENTS," "MAP," "WEATHER," or the like with the fingers, and taps the card onto an installed tablet or his/her smartphone, the corresponding information can be viewed. With the "COUPON" icon, by downloading an application, benefits such as discounts can be obtained, and new information can be sent from the tourist site side, thereby contributing to the acquisition of repeaters. A "HOTEL INFORMATION CARD" can provide various kinds of service information ranging from the introduction of neighboring hotels, vacancy information, to reservations. With a "WEATHER CARD," information on the current weather and forecasts of the tourist spots in the area can be obtained.

Figure 125:
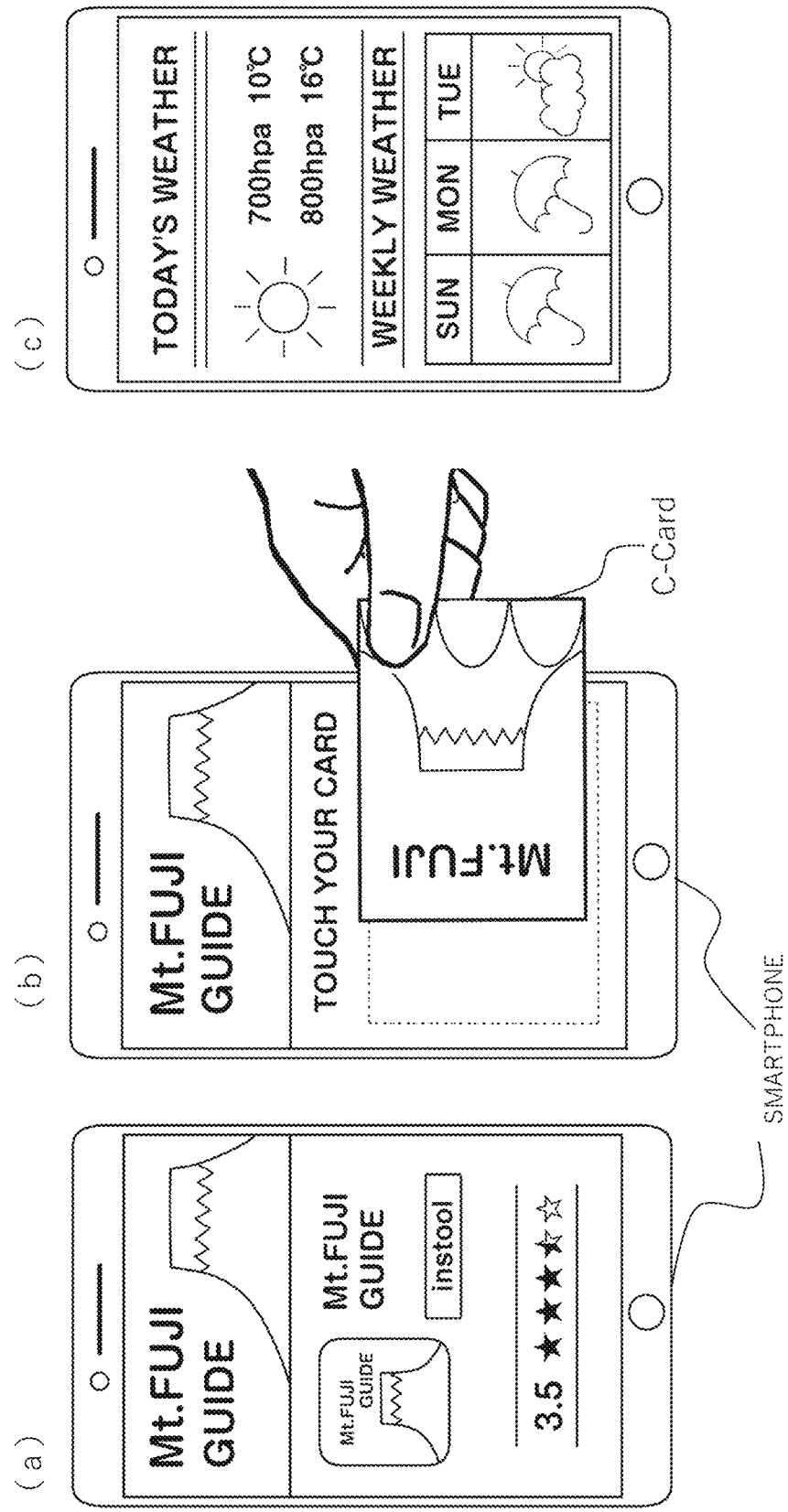
FIG. 125 is a diagram showing a specific example of a sightseeing information card using a C-Card, and is a diagram describing the usage state of the card.

FIGS. 124 to 125 are diagrams showing specific examples of tourist information cards using a C-Card.

FIG. 124 is a diagram showing a tourist information card, wherein FIG. 124(a) is the front side of the card and FIG. 124(b) is the back side of the card.

The user acquires a tourist information card displayed at a hotel/inn, tourist facilities, stations, or the like. As shown in FIG. 124(a), in the upper part of the front side of the card, the letters "MT. FUJI" and a picture of Mt. Fuji indicating a tourist spot are printed. In the lower part of the card surface, there are three operation areas with the writings "ABOUT FUJI," "ROUTE," and "WEATHER," and illustrations corresponding to the contents of each writing, respectively. As shown in FIG. 124(b), a QR code (registered trademark) and a URL are printed in the upper part of the back side of the card. There are three operation areas in the lower part of the back of the card, which are marked "JAPANESE," "ENGLISH," and "CHINESE," respectively.

FIG. 125 is a diagram for describing the usage state of a card.

Although not shown, the user reads the QR code (registered trademark) on the back side of the card with the smartphone or inputs the URL. Then, a window for installing a guide application for Mt. Fuji is displayed as shown in FIG. 125(a). After installing the application, the user taps the card onto the smartphone while holding the operation area of "WEATHER" as shown in FIG. 125(b). Then a window showing the weather of Mt. Fuji is displayed. Note that card tapping of a tourist card can be done on a WEB site without installing the application. In that case, since it is not possible to acquire the smartphone ID, information cannot be sent to the user.

Note that before doing the operation in FIG. 125(b), by tapping the card onto the smartphone while holding the operation area of either "JAPANESE," "ENGLISH," or "CHINESE" with the back side of the card facing upwards, it is possible to set the language for use. As a result, regardless of which operation area on the front side of the card is selected, information is displayed in the desired language.

(2) Inbound Card

For increasing inbound demands, C-Cards are distributed at airports and in tours for foreigners and hospitality services are realized.

When the user uses the "LANGUAGE" icon to set the language to be used on the smartphone screen, when the C-card that provides various kinds of tourist information is used, guidance is in the set language.

In order to gain foreign tourist repeaters, it is effective to provide C-cards that make the owner want to use them even after returning home. Also, C-Cards that provide discount coupons or reward points usable in e-commerce after returning home are effective. To use these benefits, the downloading of an application would be a prerequisite. As a result, it is possible to continue communication by push mail or by SNS from C-Card issuer thereafter. For tourists who cannot use credit cards, the C-Card can also be used as a prepaid card. In that case, it is necessary to apply security such as PIN code input.

[Education Card]

From the past, education cards such as cards used for rote exercises and flash cards have been popular, boasting strong popularity. However, they are unsuitable for learning pronunciation and stroke order, and for the explanation of contents difficult to understand. It is preferable to have verbal answering for learning pronunciation, and in order to learn Chinese characters it is better to show the stroke order by video. Explanation of contents difficult to understand can be done in a simple manner with videos. Thus, it is possible to use C-Cards for such kind of effective and easy-to-understand education cards.

Themes and questions are provided on the front side of the C-Card, including those of mathematics, science, and the like, in addition to English language, Chinese characters, and history which generally require memorizing. When holding the "QUESTION" icon and tapping the card onto a smartphone, questions are verbally provided one after another. In responding to the questions, the C-Card may be rotated for answering, since the rotation angle of the C-Card can be recognized. For example, when five answer candidates are arranged on the surface of a C-Card, by setting marks such as arrows for pointing to them, the user can give an answer by pointing the card in accordance with the direction of the mark of the selected answer. Furthermore, it is possible to select a question or answer corresponding to the position where the C-Card is tapped. By selecting the "EXPLANATION" icon, the themes or questions are explained with easy-to-understand contents in texts, with voices, and with videos. The "ANALYSIS" icon analyzes the results of the scores of multiple examinations and appropriate learning advice is provided.

(1) Learning Card for Memorizing

Figure 126:
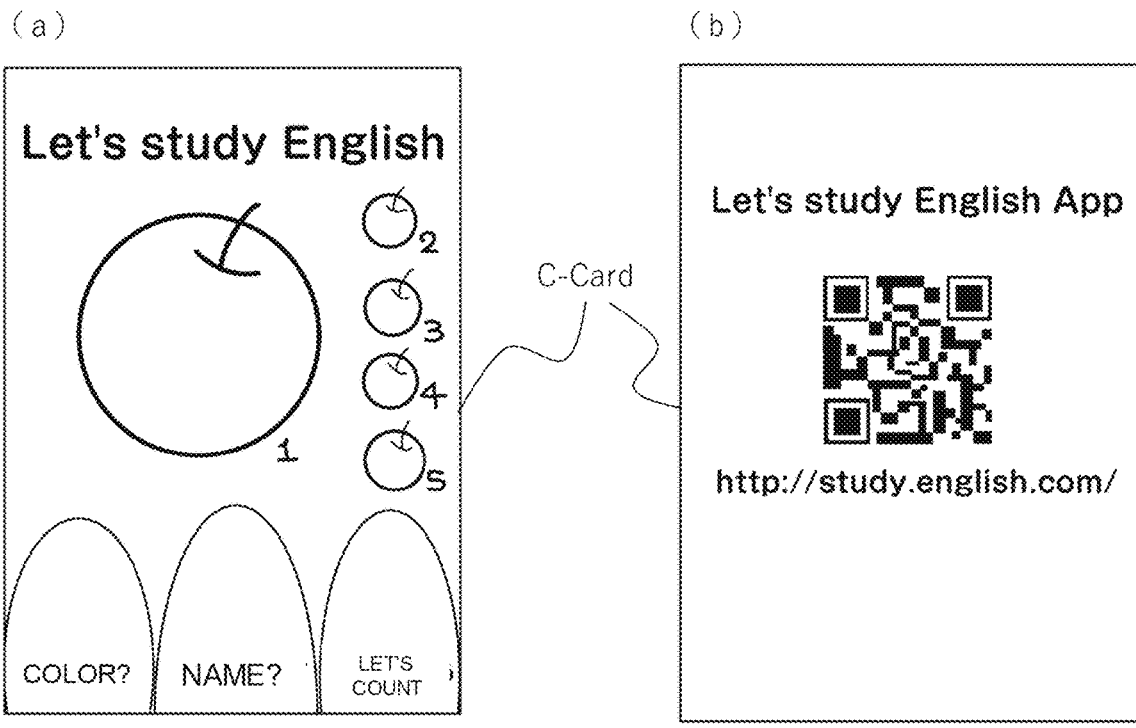
FIG. 126 is a diagram showing a specific example of a learning card for memorizing using a C-Card, and is a diagram showing a learning card for memorizing.
Figure 127:
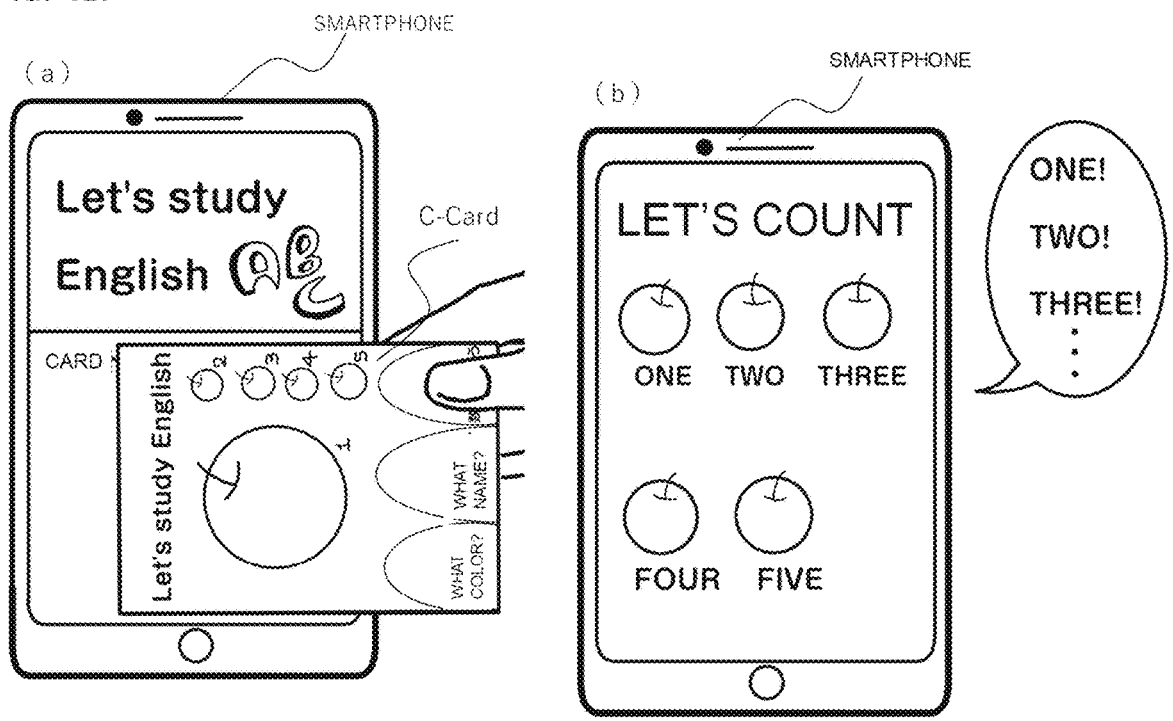
FIG. 127 is a diagram showing a specific example of a learning card for memorizing using a C-Card, and is a diagram for describing the usage state of the card.

FIGS. 126 to 127 are diagrams showing specific examples of a learning card for memorizing using a C-Card.

FIG. 126 is a diagram showing a learning card for memorizing, wherein FIG. 126(*a*) is the front side of the card and FIG. 126(*b*) is the back side of the card.

The user purchases a learning card for memorizing at a bookstore, a toy department, or the like. As shown in FIG. 126(*a*), writings and illustrations are printed in the upper part of the front of the card. There are three operation areas in the lower part of the front side of the card, and they are marked "WHAT COLOR?" "WHAT NAME?" "LET'S COUNT," respectively. As shown in FIG. 126(*b*), a QR code (registered trademark) and a URL are printed in the center of the back side of the card.

FIG. 127 is a diagram for describing the usage state of a card.

Although not shown, the user reads the QR code (registered trademark) on the back side of the card with the smartphone or inputs the URL. Then, a window for installing the learning application is displayed. After installing the application, the user taps the card onto the smartphone while holding the operation area of "LET'S COUNT" as shown in FIG. 127(*a*). Then, as shown in FIG. 127(*b*), the writing "LET'S COUNT" and five apples are displayed. Below the picture of the apples, the English words "ONE," "TWO," "THREE," "FOUR," "FIVE" for representing numbers are displayed. Thus, the user can learn English words representing numbers. In addition, the English words representing numbers may be verbally output.

When the user taps the card onto a smartphone while holding the operation area of "WHAT COLOR?" a red apple and the English word "RED" corresponding to the color of the apple are displayed. When holding the operation area of "WHAT NAME?" and tapping the card onto a smartphone, the picture of an apple and the English word "APPLE" corresponding to an apple are displayed. Of course, in this case as well, it is also possible to verbally output the English words.

(2) Quiz Card

Figure 129:
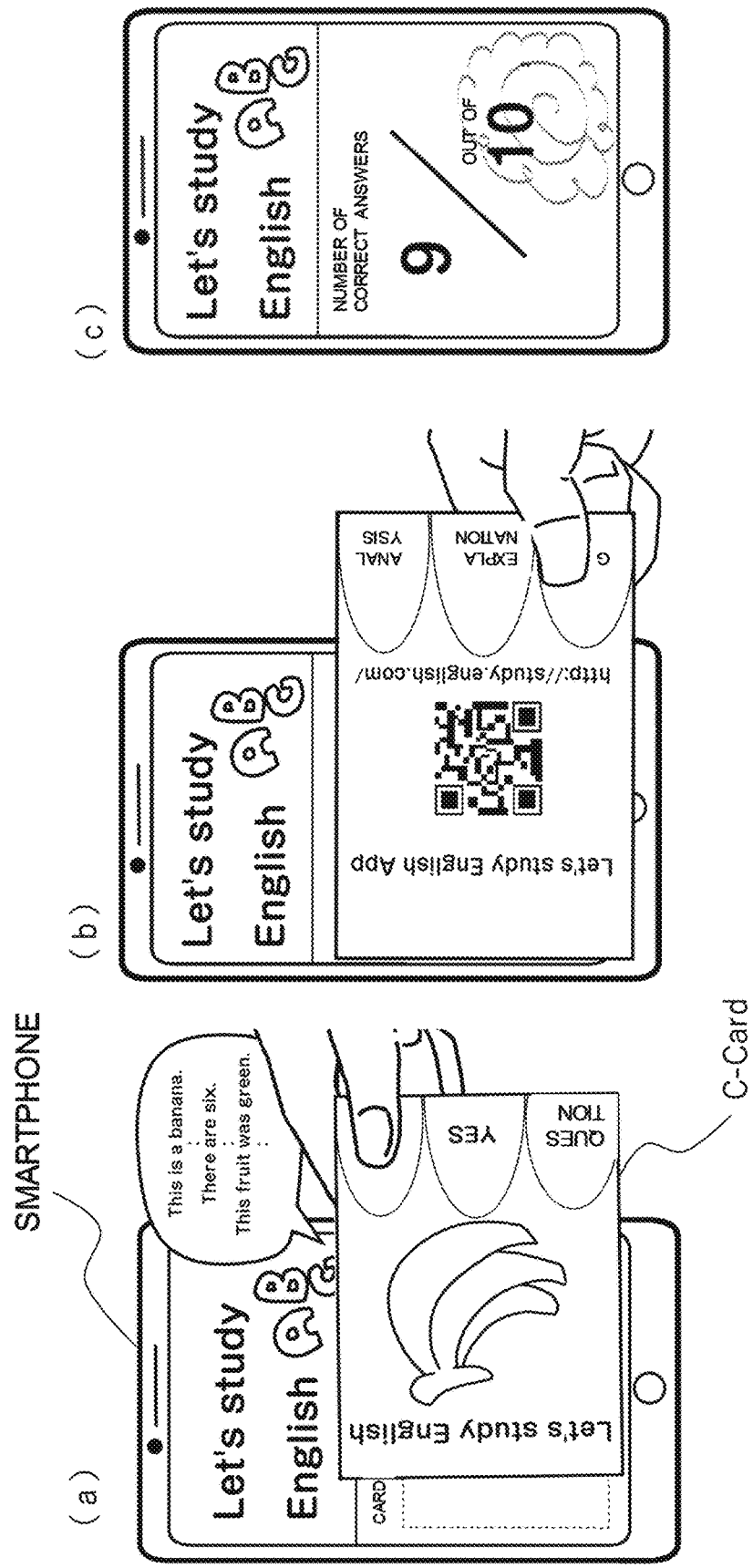
FIG. 129 is a diagram showing a specific example of a problem card using a C-Card, and is a diagram for describing the usage state of the card.

FIGS. 128 to 129 are diagrams showing specific examples of quiz cards using a C-Card.

FIG. 128 is a diagram showing quiz cards, wherein FIG. 128(*a*) is the front side of the card and FIG. 128(*b*) is the back side of the card.

The user purchases a learning card for memorizing at a bookstore, a toy department, or the like. As shown in FIG. 128(*a*), writings and illustrations are printed in the upper part of the front side of the card. There are three operation areas in the lower part of the front side of the card, which are marked "QUESTION," "YES," and "NO," respectively. As shown in FIG. 128(*b*), a QR code (registered trademark) and a URL are printed in the center of the back side of the card. There are three operation areas in the lower part of the back side of the card, which are marked "GRADING," "EXPLANATION," AND "ANALYSIS," respectively.

FIG. 129 is a diagram for describing the usage state of a card.

Although not shown, the user reads the QR code (registered trademark) on the back side of the card with the smartphone or inputs the URL. Then, a window for installing the learning application is displayed. After installing the application, the user taps the card onto a smartphone while holding the operation area of "QUESTION." Then, English sentences such as "This is a banana." "There are six." "This fruit was green." are displayed on the screen or verbally output, as shown in FIG. 129(*a*). If the user thinks that the English sentence is correct, the user holds the operation area of "YES" or if incorrect holds the operation area of "NO," while tapping the card onto the smartphone. After completing answers regarding the English sentences, as shown in FIG. 129(*b*), the back side of the card is faced upwards, and the operation area of "GRADING" is held while the card is tapped onto the smartphone. Then, as shown in FIG. 129(*c*), a window showing how many answers are correct is displayed.

When the user taps the card onto a smartphone while holding the operation area of "EXPLANATION," a detailed explanation on the reason for the answer to the question or the like is displayed on the screen. When the card is tapped on the smartphone while holding the operation area of "ANALYSIS," the smartphone analyzes the results of the scores of multiple examinations and appropriate learning advice is displayed.

Note that such grading, explanation, and analysis may be performed not only by displaying still images but also by videos or by using voices.

[Point Card]

Although not shown, the C-Card can also be used as a reward point card.

A user receives a card with reward points from a store clerk when shopping at a store, in campaigns, or the like. There are three operation areas in the lower part of the front side of the card, which are marked "POINT REGISTRATION/ACQUISITION," "POINT USE," and "POINT BALANCE," respectively. A QR code (registered trademark) and a URL are printed on the back side of the card.

The user reads the QR code (registered trademark) on the back side of the card with a smartphone or inputs the URL. Then, a window for installing an application of the store or a point card dedicated application is displayed. After installing the application, the user taps the card onto a smartphone while holding the operation area of "POINT REGISTRATION/ACQUISITION." Then, a window for entering a PIN code is displayed. When the user enters the PIN code marked on the front side of the card, the registration of the point card is completed. When registration is completed, the number of reward points, the smartphone ID, the card ID, the PIN code are registered in the cloud.

When acquiring points doing shopping at a store, the user hands the card to the clerk at the time of making payments. The clerk then taps the card onto a smartphone of the shop side while holding the operation area of "POINT REGISTRATION/ACQUISITION" and inputs the PIN code written on the front side of the card. Then, on the screen of the smartphone of the shop side, together with information such as the current number of reward points of the user, a window for inputting the amount of money for making the purchase by the user and an icon marked "GRANT POINTS" is displayed. When a clerk touches the "GRANT POINTS" icon after entering the purchasing price, the number of points corresponding to the purchasing price are added to the user's point card.

When using the reward points doing shopping at a store, the user hands the card to the clerk at the time of making payments as in the case of point acquisition. When the clerk taps the card onto the smartphone of the shop side while holding the operation area of "USE POINTS" and inputs the PIN code marked on the card surface, thus enabling authentication based upon the point card information registered in the cloud. Then, on the screen of the smartphone of the shop side, a window for inputting reward points together with information such as the current number of points of the user and an icon marked "USE POINTS" are displayed. The clerk inputs the number of points the user wishes to use and touches the "USE POINTS" icon. Then, the corresponding points are erased and the number of points after point use is updated. Also, by tapping the card onto the smartphone while holding the operation area of "POINT BALANCE," it is possible to check the point balance at that point in time.

Currently, instead of conventional cash registers, the number of stores using smartphones and tablets as cash registers is increasing. If a C-Card is used as a point card as in the present invention, in a store using a smartphone or a tablet as a register, there is no need to install a machine dedicated for point cards (magnetic card reading machine or the like), and thus, it is convenient and economical. Note that for point cards with many users, card IDs cannot be allocated to each issued card because there are not enough card IDs.

Therefore, when card IDs are allocated to each shop, even if a multiple number of cards are possessed, it is necessary only to perform processing for each PIN code like in the case of [When using the same card ID] described above. Even with differing point cards, it is possible to use point cards of various stores and issuing agencies with the same application.

Furthermore, this reward point card can be used with similar operations not only at stores but also in online shopping at home.

[Prepaid Card]

Although not shown, the C-Card can also be used as a prepaid card.

The user purchases a card at a convenience store or the like. To the card, the amount for purchase, such as 3,000 yen, 5,000 yen, 10,000 yen, or the like is preset. There are three operation areas in the lower part of the front side of the card, which are marked "PREPAID CARD REGISTRATION," "USE PREPAID CARD," and "PREPAID CARD BALANCE," respectively. A QR code (registered trademark) and a URL are printed on the back side of the card.

The user reads the QR code (registered trademark) on the back side of the card with a smartphone or inputs the URL. Then, a window for installing an application for a prepaid card is displayed. After installing the application, the user taps the card onto the smartphone while holding the operation area of "PREPAID CARD REGISTRATION." Then, a screen for entering the PIN code is displayed. When the user inputs the PIN code marked on the front of the card, registration of the prepaid card is completed. When registration is completed, the purchasing price, smartphone ID, card ID, and PIN code are registered in the cloud.

When using a prepaid card doing shopping at a store, the user hands the card to the clerk at the time of making payments. Then, the clerk taps the card onto a smartphone of the shop side while holding the operation area of "USE PREPAID CARD" and inputs the PIN code marked on the front side of the card, thus enabling authentication based upon the prepaid card information registered in the cloud. Then, on the screen of the smartphone of the shop side, a window for inputting the amount and an icon marked "USE PREPAID CARD" are displayed together with information such as the current balance of the user. The clerk inputs the amount of money the user wishes to use and touches the "USE PREPAID CARD" icon. Then, the entered amount is subtracted from the prepaid card balance, and the payment is completed.

By tapping the card onto a smartphone while holding the operation area of "PREPAID CARD BALANCE," it is possible to check the balance at that point in time.

Note that when the amount of money left in prepaid card is low, money may be deposited. In this case, in addition to depositing at the store front of a convenience store or the like, it may be made possible to deposit money from an application for prepaid cards using a credit card or the like. Note that with prepaid cards which have many users, there are not enough card IDs, and thus card IDs cannot be assigned to each issued card. Since using prepaid cards is one method of carrying out financial settlements and it is necessary to ensure security, card IDs are allocated to each dealer or each sales period, and it is necessary only to perform processing for each PIN code like in the case of [When using the same card ID] described above. Thus, even when a plurality of different prepaid cards is possessed, prepaid cards of various issuing institutions can be used with the same application.

Furthermore, the prepaid card can be used applying the same operations not only at stores but also for online shopping at home. In this case, if "PREPAID CARD PAYMENT" is selected when making a settlement for online shopping, an application or a browser for prepaid cards is activated and a window for tapping the card is displayed. When the user taps the card onto the smartphone while holding the operation area of "USE PREPAID CARD," a window for inputting a PIN code is displayed. When the user inputs the PIN code marked on the front of the card, a settlement using the prepaid card is completed.

[Summary]

In a conventional touch card, electrodes for sensing by a touch panel such as a smartphone and conductive wires connected to the electrodes are formed in an inner layer. Conductive wires for conducting electricity from a person's finger to an electrode are usually wired (printed) with carbon ink having a large resistance value in consideration of cost and printing process. As a result, the width of the wiring of the conductive wire connected to the electrode from the indicator electrode increases, in order to generate an appropriate amount of electrostatic capacitance by conducting from the indicator electrode formed in the inner layer of the area for human finger contact to the electrode. As a result, since the wiring width is large, the touch panel detects the electrostatic capacitance of the wiring itself, there are many cases where there are recognitions of positions actually without electrodes and the recognized positions of the electrodes are deviated due to the influence of the wiring. Currently, there are many products with only less than 100 electrostatic capacitive codes that can be read without erroneous recognition. Furthermore, since the electrostatic capacitance detected from the electrode is greatly increased, the range (area) of the electrostatic capacitance to be detected increases. Thus, with a large number of smartphones, since the detection area is large, there are many cases where contact is recognized not to be by a finger and error processing is performed.

Also recently, cards using silver paste ink, which has a small resistance value and in which the wiring width can be narrowed, in the place of carbon ink having a volume resistivity of about $1.0 \times 10^{-2}$ Ω·cm are becoming popular. However, for silver paste ink having a volume resistivity of about $1.0 \times 10^{-4}$ Ω·cm, there is a difficult in adapting to mass printing due to the characteristics of the material, since screen printing is used and a certain amount of drying time is required. Since silver paste ink has a low resistance value, properly speaking, the wiring width and the printing thickness can be minimized. However, since screen printing is used, the printed wiring has a line width of 0.3 mm or more and a printing thickness of about 5 μm. Therefore, it is necessary to use a certain amount of ink, and compared with carbon ink, the cost increases significantly with the expensive silver paste ink. Moreover, in the case where the printing medium is thin and the dielectric constant is high, if the line width is 0.3 mm or more, there is the possibility of the capacitance of the intersections of the wiring being detected or the increase in the capacitance of the connected electrodes, leading to the deviation in the positions of the electrodes detected by a touch panel.

The present invention has been made in view of such situations, and the dramatic improvement of the functions of the card is the technical problem to be solved. Particularly, the following are to become possible: (1) the realization of the browsing of a plurality of contents in accordance to the position touched with a finger with a single card, (2) the realization of the accurate detection of electrode positions, thereby allowing the formation of a large number of conductor patterns and the use of a large number of capacitive codes. Also aimed is the realization of the optimum product by the combination of any of the above with respect to the user's needs. Note that the product on which the electrodes are arranged is not limited to the card, but may be a chip or a stamp with electrodes and wiring formed within. Furthermore, stickers with electrodes and wiring may be attached to an object whose bottom surface is flat.

According to the present invention, by setting a plurality of finger contact operation areas to the predetermined area of the C-Card and providing indicator electrodes in the inner layer, when a finger contact operation is performed at one of the positions, capacitance directly below the contact position is detected, and furthermore since electrostatic capacitance including those of the electrodes connected only to the indication electrode are detected, it is possible to form different conductor patterns depending on the position touched by the finger. As a result, it is possible to make the touch panel recognize a plurality of capacitance codes with one card, and thus the card can be used for various purposes. By forming a plurality of icons, writings, numbers, and the like, and making it visually possible to select, the plurality of services (browsing of contents, operation of applications/games, acquisition of stamps/points, settlements, and the like) that can be enjoyed with the C-Card can be acknowledged at a glance by the printings on the card surface and usability can be improved. Meanwhile, it is possible to improve the recognition rate, increase the number of codes, and reduce costs by the reasonable arrangement and wiring of electrodes when forming conductor patterns as card IDs. Furthermore, the printing method using the silver salt ink can greatly improve the cost performance by reducing the misperception rate, reducing the amount of ink used, and simplifying the manufacturing process.

Twenty-First Embodiment

[Mechanism of a C-CARD (Electrode Specifications for Human Body Non-Contact Detection)]

Figure 130:
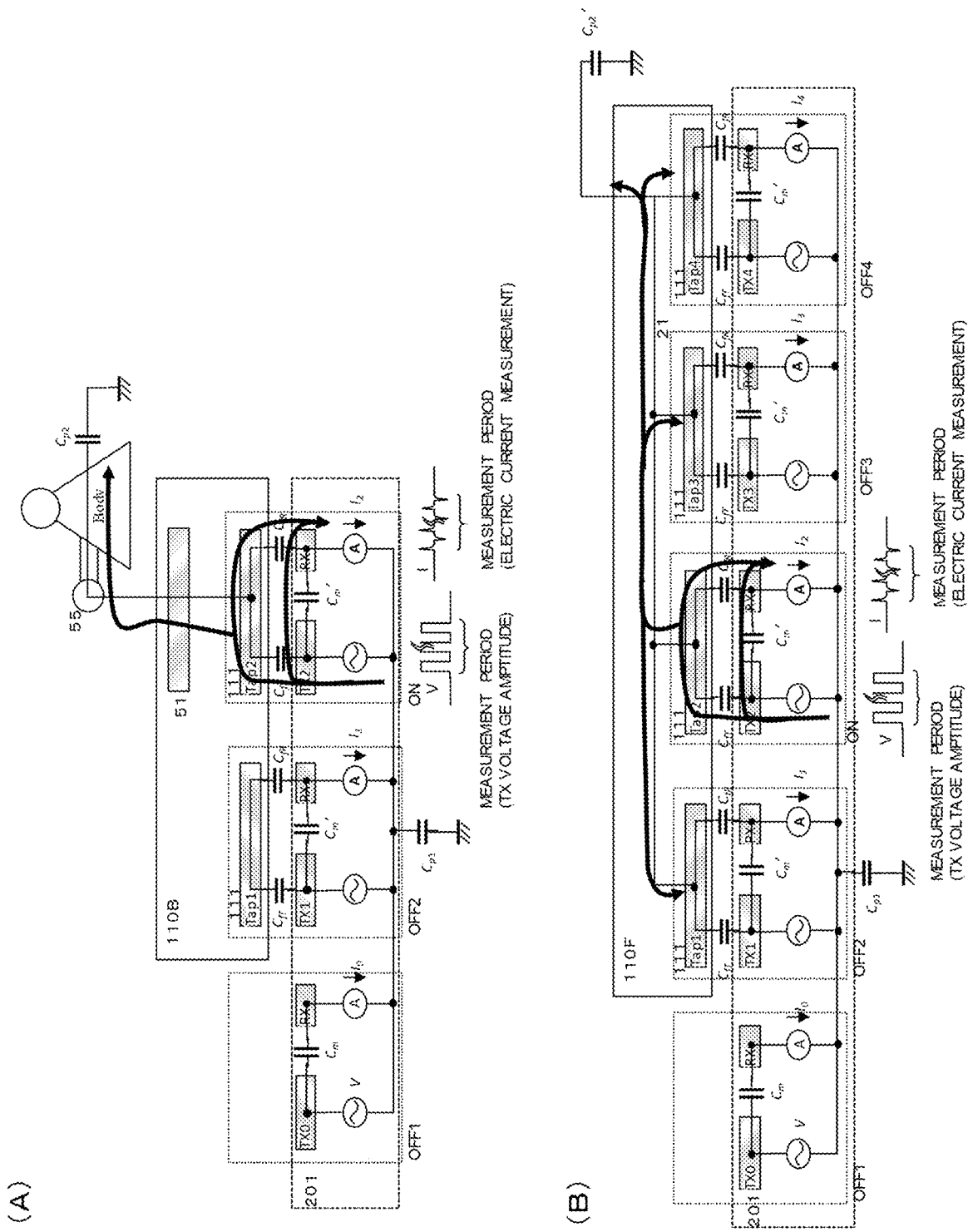
FIG. 130 is a diagram describing a code recognition apparatus and the electrode detection operations of the code generation apparatus.

FIG. 130 is a schematic diagram showing the operation state of the code generation apparatus 110 of the twenty-first embodiment. FIG. 130(A) shows a state in which the code generation apparatus 110B is placed on the touch panel 201 and the indication electrode 51 is touched with a finger 55 of a person, and FIG. 130(B) shows schematic drawing of the touch panel 201 carrying out a detection operation of each electrodes 111 in a state where the code generation apparatus 110F is only placed on the touch panel 201.

The method of using the code generation apparatus 110B involves touching an indicator electrode 55 while holding a card, which is a code generation apparatus, with the fingers 55 and having the touch panel 201 detect the conductor pattern 70 formed on the card by bringing the card into contact with the touch panel of a smartphone or the like, which is a code recognition apparatus 200. (Hereinafter referred to as "human body contact detection.") On the other hand, the code generation apparatus 110F is used only by placing a card, which is a code generation apparatus, on the touch panel 201 such as a smartphone, which is the code recognition apparatus 200. In this case, with the code generation apparatus 110F, it is necessary to have the touch panel 201 detect a conductor pattern formed on the card without having a finger or a hand touch an indicator electrode 51 and without having conduction to the human body, (Hereinafter referred to as "human body non-contact detection.") As shown in FIG. 130(A), in general, a capacitive type touch panel 201 has a structure in which a large number of TXn and RXn are arranged in a mesh like shape intersecting with each other perpendicularly with spacings of about 4 mm to 6 mm in the interior of the touch panel and electrostatic capacitance Cm for detecting touches at the intersections of TXn and RXn is provided to detect whether or not there is a touch by the finger on the surface of the touch panel and to detect the position of a touch.

If there is a tap by a finger or by an electrode 111 on the surface of the touch panel 201, electrostatic capacitances CfT and CfR are formed between Tap-TXn and Tap-RXn, and the combined capacitance Cm' between TXn and RXn becomes smaller than Cm. The position (coordinate) of tap on the touch panel 201 is specified by sequentially applying about several hundred KHz of voltage amplitudes (AC signals) to the large number of TXn, measuring current In flowing to the side of each RXn during a set period for a large number of RXn, and measuring the capacitance change of Cm' by the change of the current value In at the intersection of TXn and RXn being tapped.

In regards with the human body contact detection shown in FIG. 130(A), the code generation apparatus 110B is placed on the touch panel 201, and when an electrode 111 of about 8 mm in diameter provided in the code generation apparatus 110B is tapped on any of the positions on the touch panel 201, electrostatic capacitance Cm' is changed by the electrode 111. However, as shown in Tap1 of FIG. 130 (A), since the electrode 111 not connected to the indicator electrode 51 of the code generating apparatus 110B is separated from the human body, although a change in Cm' with only one electrode 111 occurs, the amount of the change in current I1 is small and the determination threshold for the coordinate detection of the touch panel 201 is not reached. In regards with the electrode 111 of Tap2 connected to the human body through the indicator electrode 51 of the code generating apparatus 111, the indicator electrode 51 possesses coupling capacitance Cp2 with the human body, and the voltage amplitude (AC signal) of TX2 flows minute electric current also to the human body side via the coupling capacitance Cp2. Therefore, the amount of change of current I2 of RX2 increases to exceed the determination threshold for coordinate detection of the touch panel 201, and the position of the electrode 111 of Tap2 is detected.

On the other hand, in regards with human body non-contact detection shown in FIG. 130(B), the electrodes 111 provided in the code generation apparatus 110F are arranged so that the plurality of electrodes 111 are always mutually interconnected by the conductive wire 21, which are conductors, within the code generation apparatus 110F. In the case of FIG. 130(B), the electrodes 111 of Tap1 to Tap4 are connected to form a conductor pattern. Furthermore, in FIG. 130(B), an additional capacitance Cp2' is shown between the common node of the conductor wires 21, which are conductors connecting the electrodes 111 to each other, and the ground, it corresponds to the parasitic capacitance possessed by the conductive wire 21, the parasitic capacitance possessed by the face of the electrodes 111 opposite to the touch panel. In a case where the contact surface area of the card which is the code generation apparatus 110F is placed without protruding from the touch panel 201, most of the parasitic capacitance of the conductive wire 21, although not shown, presides dispersed among each respective TXn and RXn of the touch panel 201 directly below the conductive wire 21. Considering a case where the touch panel 201 gives voltage amplitude (AC signal) to TX2 at the position of Tap2 where the electrode 111 is located, in regards with human body non-contact detection, the electrodes 111 of the other Tap1, Tap3, Tap4 have coupling capacitances with TX1, TX3, TX4, RX1, RX3, RX4 via the common node, and the voltage amplitude (AC signal) of TX2 flows minute currents I1, I3, I4 also to RX1, RX3, RX4 via respective coupling capacitances. Furthermore, the additional capacitance Cp2' also serves as a coupling capacitance, and minute currents flow. Therefore, the amount of change of current I2 of the RX2 becomes large, exceeding the determination threshold of coordinate detection of the touch panel 201, and the position of the electrode 111 of TAp2 is detected. The minute currents I1, I3, and I4 flowing through RX1, RX3, and RX4 are dispersed currents and are sufficiently small, and thus they do not exceed the determination threshold for coordinate detection of the RXn.

Also, when TXn, RXn of the touch panel 201 are sequentially switches to where another the electrode 111 is positioned, similarly, since a minute current can be made to flow to the coupling capacitance of electrodes 111 located at positions other than the object TXn, RXn, it is possible have the touch panel 201 detect the positions of all of the electrodes 111 connected to the common node.

Furthermore, as shown in the seventeenth embodiment, not only is the electrode 111 connected to the common node of the conductive wires 21, conductors which connect the electrodes 111 to each other, but also by further extending the wirings inside of the code generation apparatus 110F, it is possible to increase the additional capacitance Cp2' and improve the detection performance.

Here, in FIG. 130(B), is a case where all of the electrodes 111 are arranged on different TXn and RXn. However, the conductor patterns of the actual touch panel 201 and the code generation apparatus 110F are two-dimensional (planar shaped), and there are cases where a plurality of electrodes 111 are arranged on a common TXn or a common RXn. In this case, the total capacitance of the common node connected to all of the electrodes 111 may be reduced in effective total capacitance as compared to when all of the electrodes 111 are disposed on different TXn and RXn.

Figure 131:
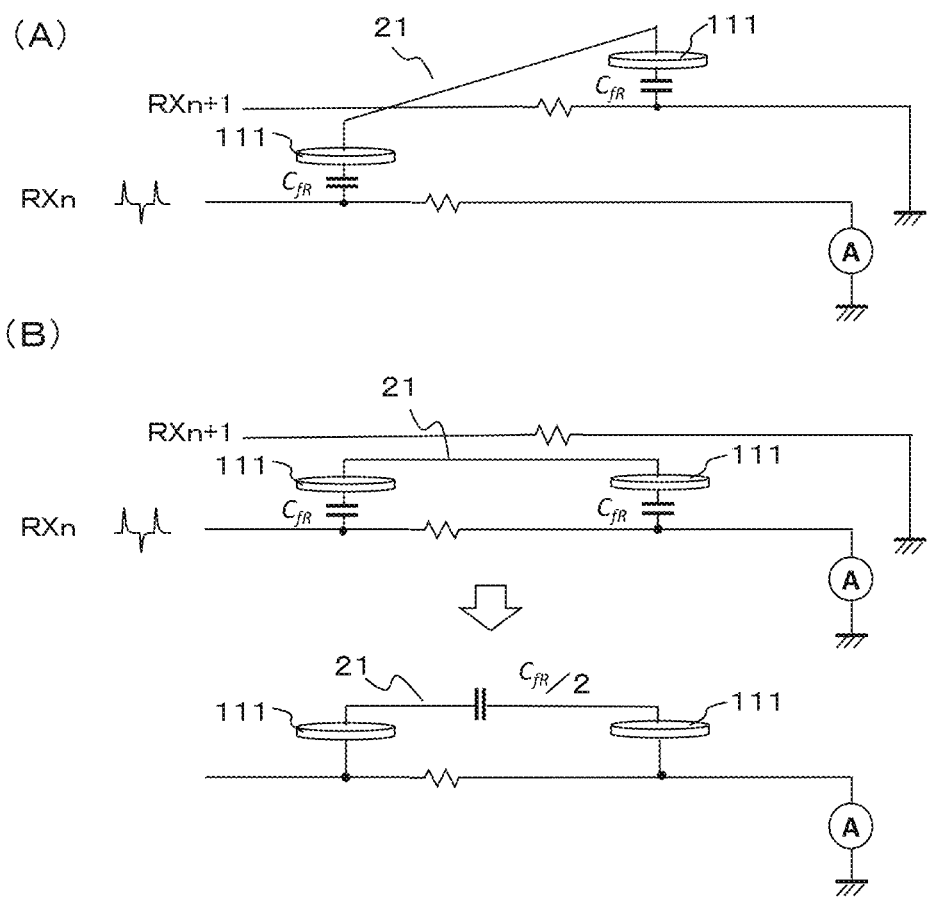
FIG. 131 is a diagram describing a code recognition apparatus and the electrode detection operations of the code generation apparatus.

FIG. 131 shows a conceptual diagram of the generated capacitance due to the arrangement relationship of the two electrodes 111 with respect to RXn. For example, as shown in FIG. 131(A), when the two electrodes 111 are arranged on separate R×n lines and the current of RXn is measured, the capacitance CfR of the electrode 111 arranged on the RXn+1 side serves as a reactance that disperses the current from the target RXn makes it flow to RXn+1, but, as shown in FIG. 116(B), when two electrodes 111 are arranged on the same RXn, if the wiring resistance between the electrodes is neglected, the capacitance CfR between the electrode and the RXn of two electrodes 111 does not function as a reactance for dispersing and flowing the current from the object RXn, the effective total capacitance of the common node to which all of electrodes are connected decreases, since a configuration is formed in which the terminals on both sides of the series connected combined capacitance CfR/2 are connected to the same RXn, Thus, in regards with human body non-contact detection, there is a dependency between the electrode arrangement positions of the conductor pattern and the electrode detection performance of the touch panel 201. Normally, TXn and RXn of the touch panel 201 are aligned in the vertical direction and the horizontal direction with respect to the rectangular touch panel surface. Therefore, when a plurality of electrodes 111 of a conductor pattern are aligned in the vertical or horizontal direction on the touch panel surface, it becomes difficult to detect the electrodes. Since these directions are those in which the electrodes cannot be detected, this phenomenon is likely to occur in a use environment where smartphone detection performance is low.

Therefore, in regards with the code generation apparatus 110F for human body non-contact detection, the conductor pattern 70 needs to be a conductor pattern to which a plurality of electrodes 111 are connected, and a more reliable detection can be achieved by connecting as many electrodes 111 as possible within the limit of multi-touches allowed by a code recognition apparatus 200.

Figure 132:
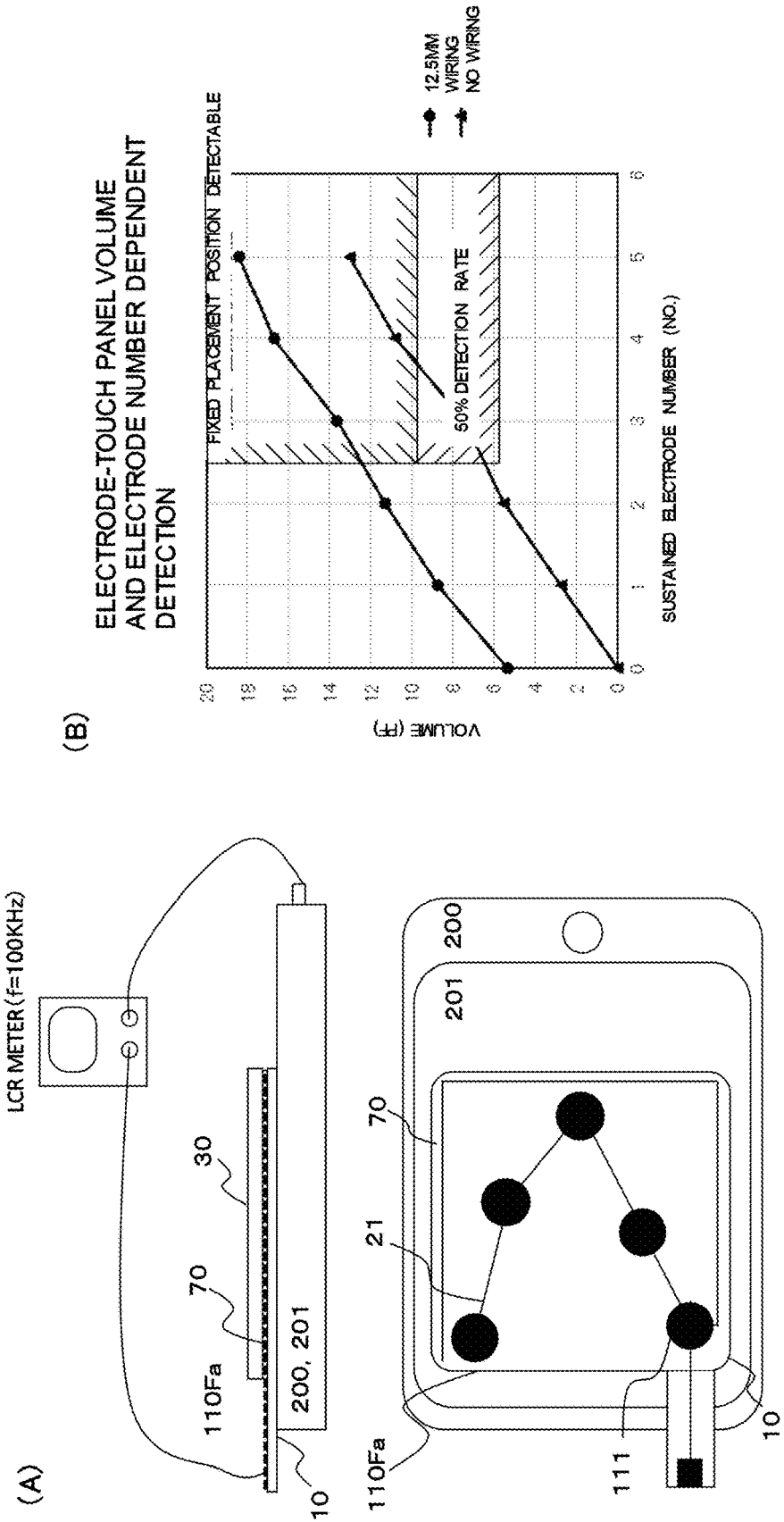
FIG. 132 is a diagram describing a conductor pattern electrode specification of a code generating apparatus.

FIG. 132 shows the results of an examination of the number of necessary electrodes for the conductor pattern of the code generation apparatus 110F for human body non-contact detection. FIG. 132(A) is a schematic diagram of the method of evaluation, and FIG. 132(B) is a graph of the evaluation result.

As shown in FIG. 132(A), the conductor pattern capacitance and the electrode detection states were evaluated with a sample code generating apparatus 110F where the conductor pattern 70 is print formed with silver nanoink on a touch panel 201 of a code recognition apparatus 200 (iPhone 6) attached with a 0.55 mm thick surface protection glass, the conductor pattern 70 in which five circular electrodes 111 having a diameter of 8 mm are connected to a lower nonconductive base material 30 made of a PP resin sheet having a thickness of 0.185 mm is print formed with silver nanoink, and an acrylic plate having a thickness of 2 mm corresponding to the upper nonconductive base material 30 also serving as a weight for flat placement is attached.

The capacitance between the electrodes (conductor pattern) and the touch panel, and the electrode number dependency of the detection state were measured with the one to five circular electrodes 111 having a diameter of 8 mm for the conductor pattern 70 connected with wiring 21 having a width of 0.3 mm, using a sample having a capacitance adding wiring of 12.5 cm wired on the outer periphery and a sample not having the additional wiring. The capacitance was measured between the GND shield of a USB connector and the conductor pattern terminal drawn out of the touch panel 201 with an LCR meter DE-5000 (f=100 KHz). For the evaluation of the electrode detection state, a smartphone (iPhone 6) was used as the code recognition apparatus 200, and as a usage environment in which the detection performance of the touch panel 201 is low, in a state in which 0.55 mm thick protective glass is attached to the touch panel 201 was used, and measurements were carried out by placing the case on a wooden desk. Using the application program that displays the detected coordinates by the touch panel, the number of electrodes detected was examined by performing 10 trials of placing the sample on which the conductor pattern 70 is formed on the touch panel 201 in the direction as shown in the figure and rotating it by about ±15 degrees.

FIG. 132(B) shows the electrode dependency of the capacitance between the electrode and the touch panel during detection. Evaluation was made of 0 to 5 electrodes with and without capacitance added wiring. The area with hatched lines diagonally to the right in the graph corresponds to when all of the sample electrodes are detected at once for the 10 trials, but the number of detections decreases due to rotation, and with wiring, 3 or more electrodes, and with no wiring, 4 or more electrodes were found to be required to fit. Also, the area with hatched lines diagonally to the left corresponds to when all of the sample electrodes are detected at once for 50% or more of the 10 trials, and the case where there are three electrodes with no additional wiring corresponded. With two electrodes or less, regardless of whether or not there is additional wiring, cases where all of the sample electrodes are detected at once was 50% or less. There were no specifications where all of the electrodes were detected all ten times when including rotation.

Also, it was found that the wiring of 12.5 cm with 0.3 mm width could add a capacitance of 5.4 pF, and the detection performance could be slightly improved compared with when the wiring is not used. Conversion to capacitance per unit wiring length gives the value of 0.043 pF/mm. The capacitance per electrode is 2.6 pF on the average, and there are deviations depending on the electrodes (the slope of the graph is not uniform) because also included is inter-electrode wiring capacitance.

From this result, it is preferable to have three or more electrodes connected in the code generation apparatus 110F for human body non-contact detection, more preferably to have four or more electrodes connected. As specifications of the evaluated sample, for the code generation apparatus 110F for human body non-contact detection, it is necessary to set requirements for the orientation of a code generation apparatus 110F when it is brought into contact with touch panel 201 (the angle with respect to the short side or the long side of the touch panel), and for the conductor pattern, it is necessary to limit the number of electrodes that can align in the vertical direction or the horizontal direction on the touch panel surface when the electrodes 111 are brought into contact in accordance with the requirements.

In addition, if the conductor patterns can be detected regardless of the electrode arrangement upon improved detection performance by taking measures to make improves regarding capacitance, such as further decreasing the thickness of the lower nonconductive base material 10 to increase the capacitance of the electrodes 111 and increasing the capacitance of the node connected to the electrodes by additional wiring or the like, these requirements become unnecessary.

Furthermore, in a case where additional capacitance Cp2' is formed in the conductor pattern 70 by extended wiring, it is possible to assist the electrode detection by the touch panel 201 by having the wiring have lengths of about 6.25 cm or about 12.5 cm in a comb shape or a loop shape, which correspond respectively to a half of the wavelength of the WiFi frequency of 12.5 GHz and to a fourth of the wavelength of the WiFi frequency of 5 GHz, and having resonance occur with the WiFi radio waves.

Twenty-Second Embodiment

[Mechanism of a C-CARD (First and Second Indicator Electrode Specifications for the Conductor Pattern for Human Body Contact Detection)]

As shown in FIG. 133(A), in the conductor pattern 70 of the code generation apparatus 110B, the four first electrodes, which are the ID electrodes 111D, are arranged with circular shapes having diameters of about 8 mm and the ID electrodes 111D are connected together in one with single stroke wiring 21 which is a linear conductive member so as to have the adjacent ones be connected with single straight lines with the shortest distances. Furthermore, connection is from the ID electrode 111D on the left end to the first indicator electrode 51 provided in the holding area 50. In addition, in the contact surface area 40, three information electrodes 111E, which are second electrodes, with circular shapes having a diameter of about 9 mm are arranged, and each one is connected independently to the corresponding one out of the three second indicator electrodes 52, respectively, in the holding area 50 with wiring of single straight lines so that wiring distance is the shortest.

Three pairs of the first and second indicator electrodes 51 and 52 are provided corresponding to the information electrodes 111E, and all three first indicator electrodes 51 are connected by wiring. The first indicator electrodes 51 are formed so as to surround the periphery of the second indicator electrodes 52, and the spacing 53 between the first indicator electrode 51 and the second indicator electrode 52 must be narrow enough so that when held with a finger, both are simultaneously superimposed with the finger without failure. Furthermore, since a second indicator electrode 52 which is not held by the finger must not be detected by the touch panel 201, the spacing between adjacent second indicator electrodes 52 is set at a predetermined distance so that they are not superimposed with a finger simultaneously when held by a finger.

The four ID electrodes 111D and the three information electrodes 111E are arranged in the contact surface area 40, a conductor pattern 70 is formed by the combination of the four electrodes of the ID electrodes 111D and the one information electrode 111E to form a unique pattern code. Therefore, with the code generation apparatus 110B, three types of ID code information corresponding to the information electrodes 111E can be created.

Since the spacing 53 between the first and second indicator electrodes 51 and 52 is relatively narrow, a coupling capacitance is generated between the first and second indicator electrodes. Therefore, when a pair of first and second indicator electrodes 51 and 52 are held with the fingers, the voltage amplitude (AC signal) occurring at TXn of the touch panel 201 for coordinate detection enters from the first indicator electrode 51 held by the finger into the second indicator electrode 52 that is not held by the finger through this coupling capacitance. Thus, an information electrode 111E that should not be detected is detected and a phenomenon in which the number of detected electrodes is more than five occurs. In this case, depending on the specifications of the smartphone, which is the code recognition apparatus 200, the multi-touch constraint of "the number of detected coordinates is 5 or less" is applied. The detected coordinates are canceled by error processing, and the problem that codes cannot be generation occurs. Since this phenomenon of the occurrence of cancellation by error is due to the erroneous detection of an electrode, it is likely to occur in a usage environment with high detection performance of the smartphone.

Therefore, the relationship between detection performance and spacing 53 between the first and second indicator electrodes 51 and 52 was evaluated. FIG. 133(A) to FIG. 133(E) are schematic diagrams of the conductor pattern 70 of the code generation apparatus 110B used for the evaluation. Table. 3, FIG. 134(A), and FIG. 134(B) summarize the dependency of the spacing 53 between the first and second indicator electrodes 51 and 52 on the detection rate and the error rate, which are indicators of the detection performance.

TABLE 3

| No. | First indicator electrode area (sq mm) | Second indicator electrode area (sq min) | Inner circumference opposition length | First-second indicator electrode distance S (mm) | First-second indicator electrode capacitance (pF) | Detection rate | Error rate |
|---|---|---|---|---|---|---|---|
| A | 96.1 | 46.3 | 24.8 | 0.50 | 1.22 | 19% | 81% |
| B | 100.5 | | | 0.75 | 1.01 | 29% | 71% |
| C | 104.9 | | | 1.00 | 0.85 | 58% | 40% |
| D | 109.4 | | | 1.25 | 0.79 | 76% | 21% |
| E | 113.8 | | | 1.50 | 0.76 | 81% | 15% |

Figure 133:
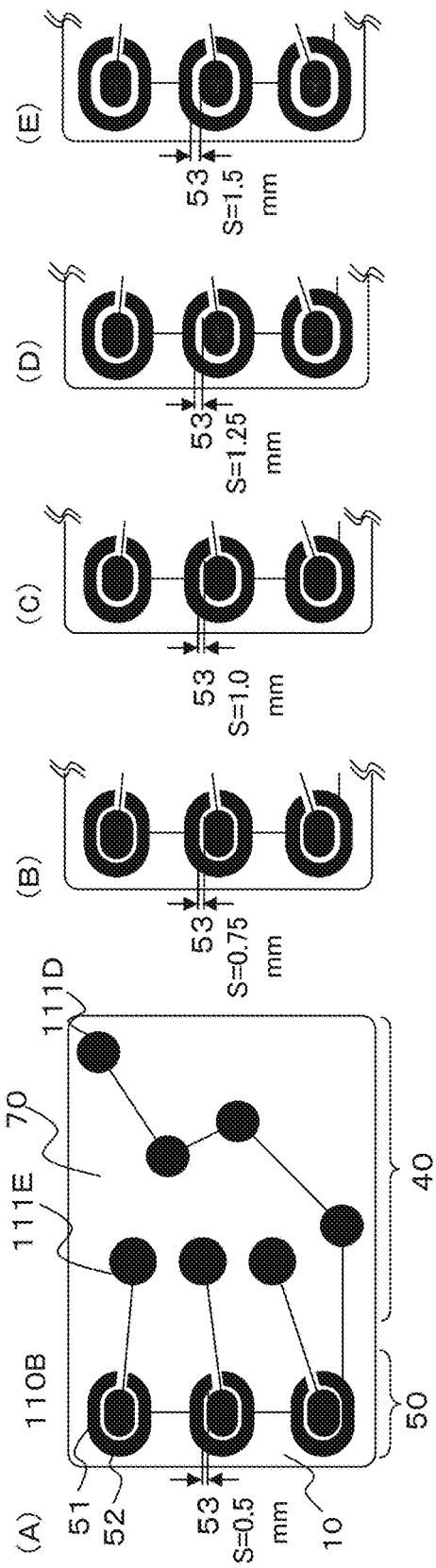
FIG. 133 is a diagram describing specifications of the first and second indicator electrode conductor patterns of a code generating apparatus.
Figure 134:
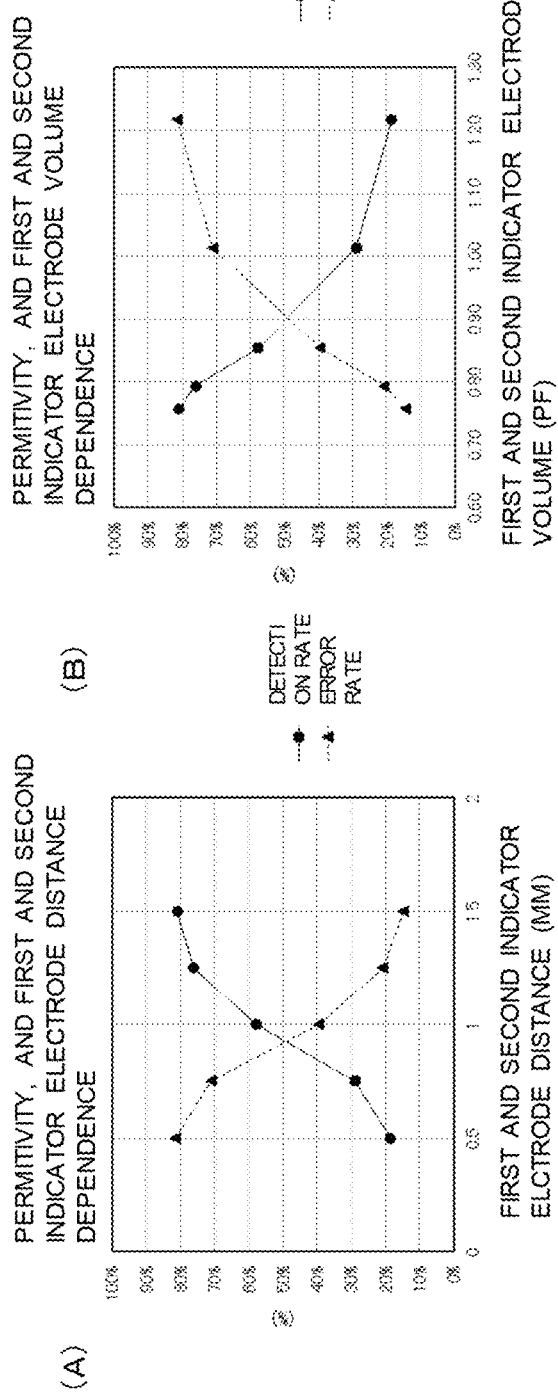
FIG. 134 is a diagram describing specifications of the first and second indicator electrode conductor patterns of a code generating apparatus.

A card sample was prepared by affixing a 0.188 mm thick PET sheet coated with an adhesive material on one side to the surface (printed surface) of the conductive pattern 70 with a PP resin sheet having a thickness of 0.185 mm on which conductive patterns 70 of FIGS. 133 (A) to (E) are printed with silver nano ink. The operation of holding the three indicator electrodes 51 and 52 of the code generator 110B of the conductor pattern 70 with the fingers one by one, and bringing on the back side of the card into contact and then removing was repeated 20 times each, 60 times in total on the touch panel 201 of a code recognizing apparatus 200 (iPhone 6) with no protective sheet or the like on the surface which was held by the hand. The number of times that the code recognition device 200 determined that the detected electrode coordinates obtained from the touch panel 201 coincided with the electrode coordinates of the ID code was compiled as the ID recognition rate and the ratio of the number of cancellations by error was compiled as the error rate. Regarding the determination of whether or not the detected coordinates match, a match was concluded when all of the detected coordinates of the five arranged electrodes coincided within the range of ±50% of one grid interval of the arrangement grid obtained by dividing the contact area 40 into 8×7. Furthermore, since this phenomenon is a problem which occurs between the indicator electrodes 51 and 52 which are not held, the measurement of the capacitance between the first and second indicator electrodes was carried out by placing the first and second indicator electrodes 51 and 52 on a foamed polystyrene plate having a very low relative dielectric constant, applying a probe on the sides of the connected ID electrode 111D and information electrode 111E, and measuring with an LCR meter DE-5000 (f=100 KHz).

Table. 3, FIG. 134(A), and FIG. 134(B) show the dependency of the detection rate and the error rate on the first and second indicator electrode spacings. As shown in FIG. 134(A), by plotting the first and second indicator electrode spacings on the X axis and the occurrence ratios on the Y axis, it was found that as the first and second indicator electrode spacings 53 became wider, the detection rate Was improved and the error rate was reduced. Furthermore, as shown in FIG. 134(B), by setting the X axis to the first-second indicator electrode capacitance, it was found that the error rate increases as the capacitance increases, and the cause of the phenomenon of cancellation by error was clarified to the first-second indicator electrode capacitance.

In the graph of FIG. 134(A), the slope of the error occurrence rate is small when the spacing between the first and second indicator electrodes is about 1.2 mm and shows a tendency to saturate at around 1.5 mm. From these results, the interval between the first and second indicator electrodes is preferably 1.2 mm or more, and more preferably 1.5 mm or more.

Twenty-Third Embodiment

[Mechanism of a C-CARD (Second Indication Electrode Specifications for Human Body Contact Detection)]

Although the code generation apparatus 110B is of human body contact detection, the conductor pattern 70 is sandwiched between the upper and lower nonconductive base materials 30, 10, and has the specification of alternate current conduction via the coupling capacitance held between a finger and an indicator electrode. Therefore, in order to secure necessary capacitance, it is necessary to increase the area of the indicator electrode in accordance with the thickness of the upper and lower nonconductive base materials 30, 10. Furthermore, as shown in the twenty-second embodiment, since it is necessary for one pair of first and second indicator electrodes 51, 52 to be touched simultaneously with a finger, and the coupling capacitance between the first and second indicator electrodes is required to be as small as possible, it is necessary to space the first and second indicator electrode spacing 53 by 1.5 mm or more. Thus, there are many restrictions for the pattern of the second indicator electrode 52, and it is assumed that sufficient area cannot be secured. Therefore, the minimum necessary area for the pattern of the second indicator electrode 52 was examined.

Figure 135:
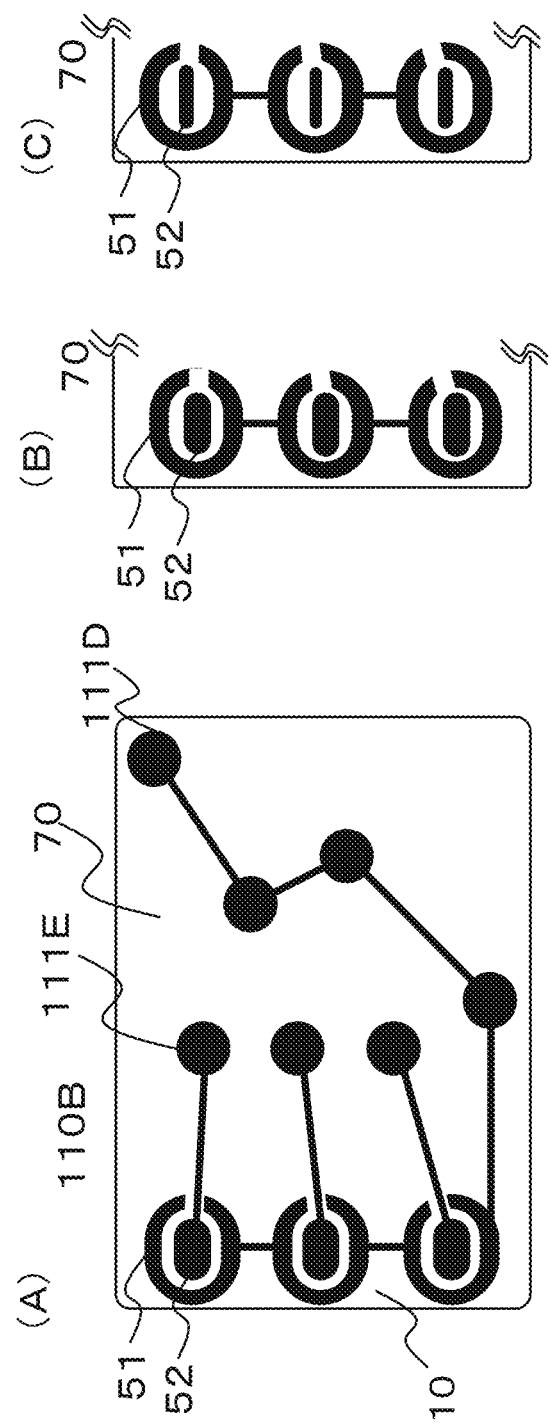
FIG. 135 is a diagram describing specifications of the second indicator electrode conductor pattern of a code generating apparatus.

FIG. 135 and Table. 4 show the results of the evaluating of the area of the indication electrode 52 necessary for the code generation apparatus 110B for human body contact detection. FIG. 135(A), FIG. 135(B), and FIG. 135 (C) show the evaluation of the indicator electrode specifications of a conductor pattern and Table. 4 is a table summarizing the evaluation results.

A card sample was prepared by affixing a 0.3 mm thick PVC sheet coated with an adhesive material on to the surface (printed surface) of the conductive pattern 70 with a PET resin sheet having a thickness of 0.07 mm on which conductive patterns 70 of FIG. 135 are printed with carbon ink. The operation of holding the three indicator electrodes 51 and 52 of the code generator 110B with the fingers one by one, and bringing the side opposite of the conductor pattern 70 into contact with the touch panel 201 of a code recognizing apparatus 200 (iPhone 6) and then removing was repeated 20 times each, 60 times in total, with the code recognizing apparatus 200 (iPhone 6) placed in a cardboard case with a low relative dielectric constant and the touch panel 201 attached with a surface protection glass of 0.55 mm thickness. The number of times that the code recognition device 200 determined that the detected electrode coordinates obtained from the touch panel 201 coincided with the electrode coordinates of the ID code was compiled as the ID recognition rate and the ratio of the number of times at least one of the five electrodes was not detected was compiled as the non-detection rate. Regarding the determination of whether or not the detected coordinates match, a match was concluded when all of the detected coordinates of the five arranged electrodes coincided within the range of ±50% of one grid interval of the arrangement grid obtained by dividing the contact area 40 into 8×7. The coupling capacitance, was calculated by assuming the relative dielectric constant of the upper and lower nonconductive base materials 30 and 10 to be 3 and reactance calculation was carried out by assuming that the alternating currency frequency is 100 KHz and the sample card is touched with the fingers on both sides. In addition, the converted second indicating electrode area is converted into the area required when a PET resin sheet having a thickness of 0.188 mm is used for both the upper and lower non-conductive base materials 30 and 10 of the evaluated sample card and mentioned in the Table.

Table. 4 shows the second indicator electrode area dependency on the detection of the information electrode 111E. It is found that the detection rate decreases under conditions where the command electrode area of (C) is 17.4 $mm^2$ and the reactance is 198.5 KΩ. For this reason, for the code generation apparatus 110B for human body contact detection by the coupling capacitance with the alternating current signal, it is found that at the alternating currency frequency of 100 KHz, it is necessary to have the indicator electrode 52 have an area size to accommodate the capacitance of 100 KΩ or less, and for a PET resin sheet with a thickness of 0.188 μm, an area of about 54 $mm^2$ or more is necessary.

Twenty-Fourth Embodiment

[Mechanism of a C-CARD (Electrode Diameter and Placement Spacing Specifications and ID Code Recognition Rates)]

For the code generation apparatus 110B, since the position information of the four ID electrodes 111D and the three information electrodes 111E printed as a conductor pattern 70 on the card correspond to an ID code, many ID codes can be created if the degree of freedom in the electrode arrangement is high. For this reason, the electrode diameter and the arrangement spacing of the electrodes were evaluated.

FIG. 136 shows the result of the evaluation of electrode diameter Φ and electrode edge spacing towards the ID code recognition rate of the code generation apparatus 110B. FIG. 136(A) shows the electrode specification of the evaluated code generation apparatus 110B, and FIG. 136(B) shows the electrode diameter dependency graph of the evaluated ID recognition rate. As shown in FIG. 136(A), on the 0.185 mm-thick PP resin sheet having a cybernet standard sized card shape, with an electrode arrangement corresponding to an ID code, a conductor pattern 70 with ID electrodes 111D with an electrode diameter of 8 mm, and information electrodes 111E with an electrode diameter of 9 mm was print

TABLE 4

| No. | Second indicator electrode area (sq mm) | Coupling capacitance (pF) | Recluctance (KΩ) | Detection rate | Non-detection rate | Converted second indicator electrode area (sq mm) |
|---|---|---|---|---|---|---|
| A | 43.0 | 20.1 | 79.1 | 92% | 8% | 70.9 |
| B | 32.6 | 15.2 | 104.5 | 94% | 6% | 53.7 |
| C | 17.4 | 8.0 | 198.5 | 79% | 21% | 28.3 | formed with silver nano ink, and a card sample with a 0.07 mm thick PET resin sheet attached with an adhesive material to the surface (printed side) of the conductor pattern 70 was prepared. For the three models of (1) AQUOS, (2) Galaxy S5, and (3) iPhone 6 which are code recognition apparatuses 200 placed in cardboard boxes of low relative dielectric constants, a surface protection sheet of 0.33 mm in thickness was attached to the touch panels 201 of (1) and (2), and a surface protection glass of 0.55 mm in thickness was attached to the touch panel 201 of (3). The operation of holding the three indicator electrodes 51 and 52 of the code generator 110B with the fingers one by one, and bringing the side opposite of the conductor pattern 70 into contact with the touch panel 201 of a code recognizing apparatus 200 and then removing was repeated 20 times each, 60 times in total. The number of times that the code recognition device 200 determined that the detected electrode coordinates obtained from the touch panel 201 coincided with the electrode coordinates of the ID code was compiled as the ID recognition rate. Regarding the determination of whether or not the detected coordinates match, a match was concluded when all of the detected coordinates of the five arranged electrodes coincided within the range of ±50% of one grid interval of the arrangement grid obtained by dividing the contact area 40 into 8×7.

Based on the sample in FIG. 136(A), the ID recognition rate when the electrode diameter Φ of the ID electrode 111D shown in the figure was changed from 8 mm to 6.5 mm was examined. The intercenter distance between ID electrodes 111D was fixed at 14.5 mm, and in contrast to the change of the electrode diameter Φ from 8 mm to 6.5 mm, the spacing between the electrode edges was spread from 6.5 mm to 8.0 mm. From the evaluation result of the ID recognition rate shown in FIG. 136(B), it was found that when the electrode diameter Φ was smaller than 7 mm in the two models of the android system, the ID recognition rate greatly decreased. This is because, by reducing the electrode diameter Φ, the electrostatic capacitance between the touch panel and the electrode for the electrodes becomes small, and thus the touch panel 201 cannot detect the electrodes. For an AQUOS, although the electrostatic capacitance was the largest among the evaluated samples, with electrodes with a diameter of Φ8 mm, the ID recognition rate was lower than when the electrode diameter was Φ7.8 mm. Although there is a possibility that this is due to influence by the narrow electrode spacing, the same phenomenon is not seen with other models. In addition, electrode diameter dependency is not seen for an iPhone 6 at the ID recognition rate of about 60%, but it can be presumed that this is because the recognition rate is levelled off due to characteristics other than the electrode diameter. From these results, it is preferable to have the electrode diameter be 7 mm or more, and furthermore, when the electrode edge spacing cannot be sufficiently secured due to the increase in the electrode diameter, it is found to be necessary to widen the intercenter distance of the electrodes.

Figure 137:
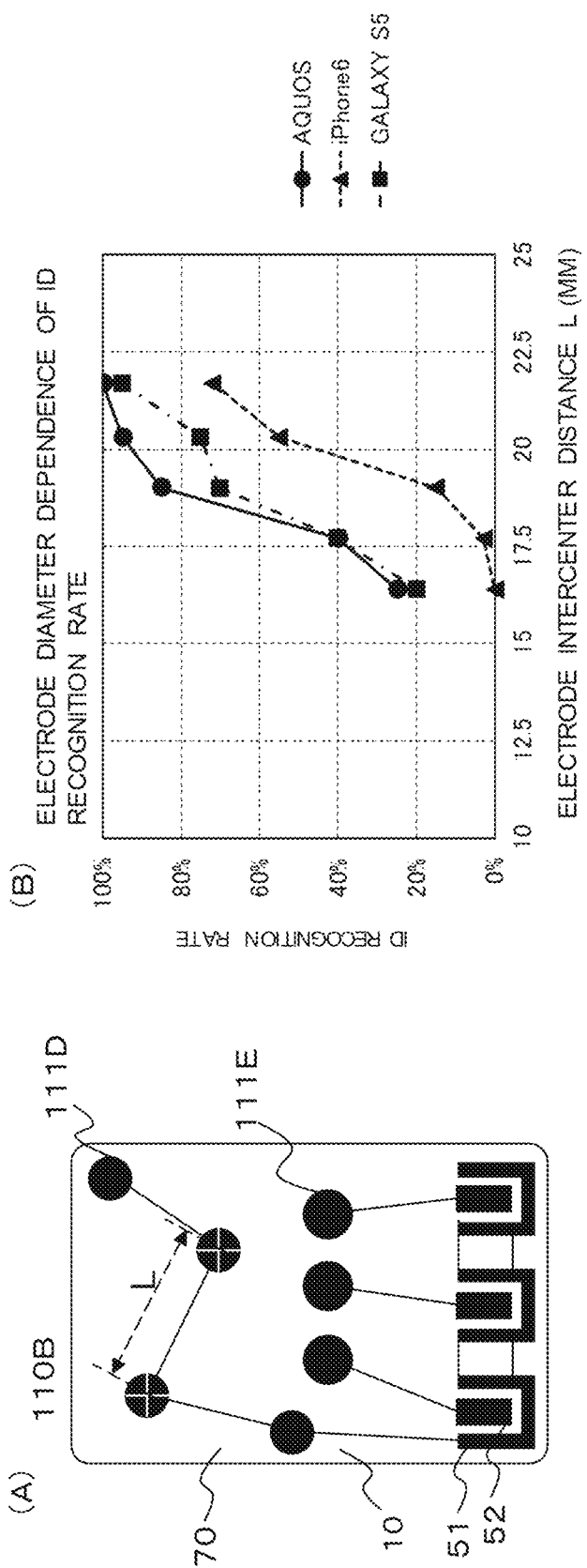
FIG. 137 is a diagram showing a result of an evaluation of the electrode inter-center distance L of a code generation apparatus.

FIG. 137 shows the result of evaluation of the intercenter distance L of electrodes of the code generation apparatus 110B. FIG. 137(A) shows electrode specifications of the evaluated code generation apparatus 110B, and FIG. 137(B) shows the electrode diameter dependency graph of the evaluated ID recognition rate. As shown in FIG. 137, the specifications of the evaluated sample and the evaluation method are the same as those for the electrode diameter evaluation shown in FIG. 136 except for the electrode diameter. In the conductor pattern 70 of FIG. 137(A), the ID electrode diameter is uniformly 7.4 mm.

Based on the sample in FIG. 137(A), the ID recognition rate when the intercenter distance of the ID electrode shown in the diagram was changed from 21.7 mm to 16.4 mm was examined. Also, corresponds to varying the electrode spacing from 9 mm to 14.3 mm. From the evaluation result of the ID recognition rate shown in FIG. 137(B), it is found that the ID recognition rate greatly decreases when the intercenter distances of the electrodes is smaller than 18 mm for any model. In the case of this evaluation in which the electrode diameter is 7.4 mm, since the mesh interval of TX and RX in the touch panel 201 for detecting the touch positions is 4 mm to 6 mm, even if only TX and RX directly below the bottom surface of one electrode were to have electrostatic capacitance with the electrode, the detection capacitance Cm of at least 2×2 of the intersection points of TX, RX mesh reacts. Actually, since the electrostatic capacitance of the electrodes also spreads to the outer portion of the bottom surface, if the intercenter distance L of the electrodes is not more than three meshes of the touch panel 201, the touch panel cannot recognize the gap between the two electrodes on the touch panel, and the touch panel may determine them to be just one electrode, in some cases. From these results, the intercenter distance of the electrodes is preferably 18 mm or more, and the distance between adjacent electrode edge portions is preferably 10 mm or more. In order to obtain high ID recognition rates stably with various smartphones, it is more preferable that the intercenter distance between the electrodes is 20 mm or more, and the distance between adjacent electrode edge portions is more preferably 12 mm or more.

Twenty-Fifth Embodiment

[Mechanism of C-CARD (Base Material Film Thickness Specifications and ID Code Recognition Rates)]

The conductor pattern 70 of the code generation apparatus 110B is sandwiched between the upper and lower nonconductive base materials 30 and 10, and the base material film thickness and the relative dielectric constant of the upper conductive base material 30 are important factors for determining the electrostatic capacitance value generated by the electrodes.

Also, the base material film thickness and the relative dielectric constant of the upper nonconductive base material 30 are important factors for determining the reactance between an indicator electrode and a finger. For this reason, evaluation was made on the thickness of the base material.

Figure 138:
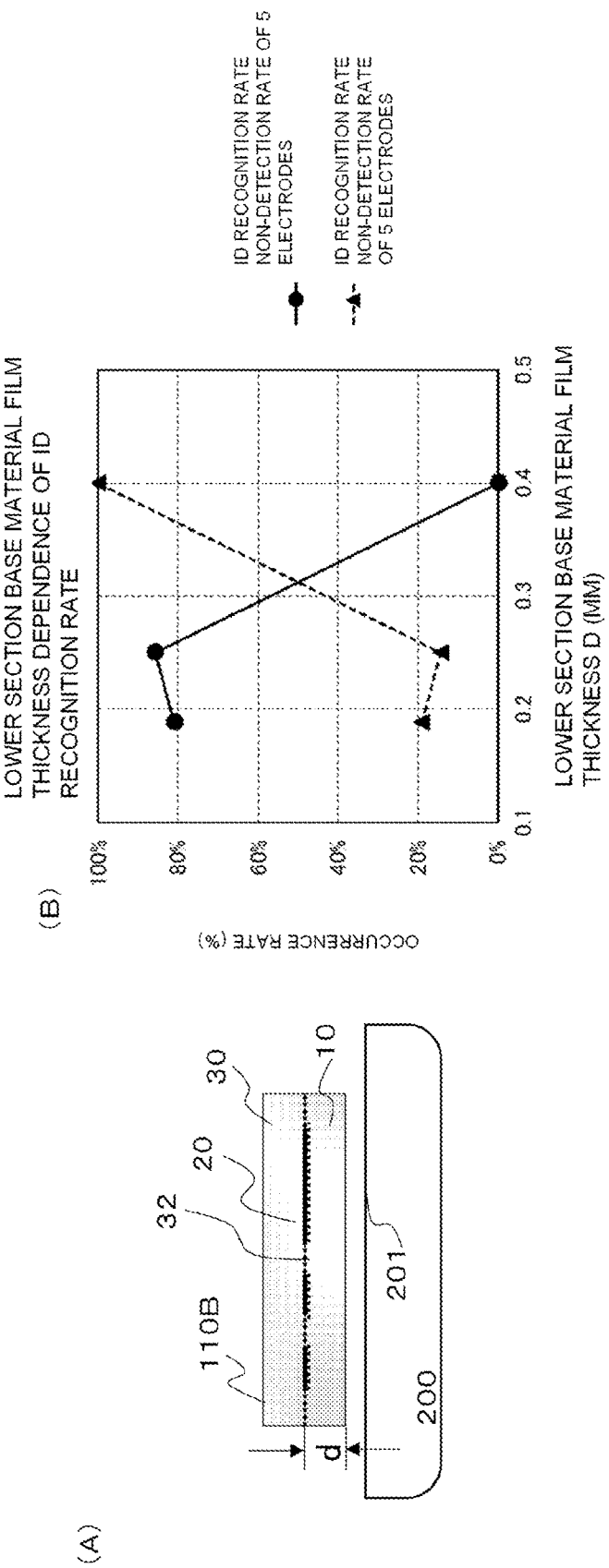
FIG. 138 is a diagram showing a result of an evaluation of the thickness d of the non-conductive base material film of the lower section of a code generation apparatus.

FIG. 138 shows the results of the evaluation of film thickness d of the lower nonconductive base material of the code generating apparatus 110B. FIG. 138(A) is a cross-sectional structural diagram of the evaluated code generation apparatus 110B, and FIG. 138(B) is graph showing the dependency of the lower nonconductive base material thickness on the evaluated ID recognition rate. As shown in FIG. 138(A), on the back surface of a card shaped PC resin sheet of trading card size with an electrode arrangement corresponding to an ID code, a conductor pattern having ID electrodes 111D with electrode diameters of 7 mm and information electrodes 111E with electrode diameters of 8 mm was print formed with silver salt ink on an upper nonconductive base material 30 was attached with two types of PET resin sheets (Lumirror) having film thicknesses d of 0.188 mm and 0.25 mm. Furthermore, card samples with three types of thickness including a lower nonconductive substrate 10 having a thickness of 0.4 mm by applying a 0.15 mm thick PET resin sheet with an adhesive material to a 0.25 mm thick PET resin sheet (Lumirror) were made. Evaluation was carried out by holding an iPhone 6 with a touch panel 201 on which a 0.33 mm thick surface protection glass was attached by the hand. The operation of holding the three indicator electrodes 51 and 52 of the code generator 110B with the fingers one by one, and bringing the front side of the conductor pattern 70 which is the lower conductive base material 10 side into contact with the touch panel 201 of a code recognizing apparatus 200 (iPhone 6) and then removing was repeated 20 times each, 60 times in total, and using an application that outputs the detected number of electrodes and their coordinates, the number of times the ID code was correctly detected, the number of times the electrode could not be detected, and the number of times cancellation by error occurred were compiled, and regarded as the ID recognition rate, the 5 electrode non-detection rate, and the error rate, respectively. Regarding the detection judgment of the ID code, judgement that the detection was correct was concluded when all of the detected coordinates of the five arranged electrodes coincided within the range of ±50% of one grid interval of the arrangement grid obtained by dividing the contact area 40 into 8×7, and it was regarded non-detected for the 5 electrodes when at least one of the five electrodes was not detected.

According to the evaluation result of the ID recognition rate in FIG. 138(B), a high ID recognition rate of about 80% can be obtained with the film thickness of the lower nonconductive base material 10 of up to 0.25 mm, but when the thickness is more than that, the ID recognition rate decreases and the non-recognition rate for 5 electrodes increases. This can be assumed to be because by increasing the thickness of the lower nonconductive base material 10, the capacitance between the electrode-touch panel TX and RX electrodes decreases, the amount of change in the detection capacitance Cm at the intersections of the TX and RX mesh is small, and the electrodes cannot be detected. From these results, the film thickness d of the lower nonconductive base material 10 is preferably 0.25 mm or less, and more preferably 0.188 mm or less.

Figure 139:
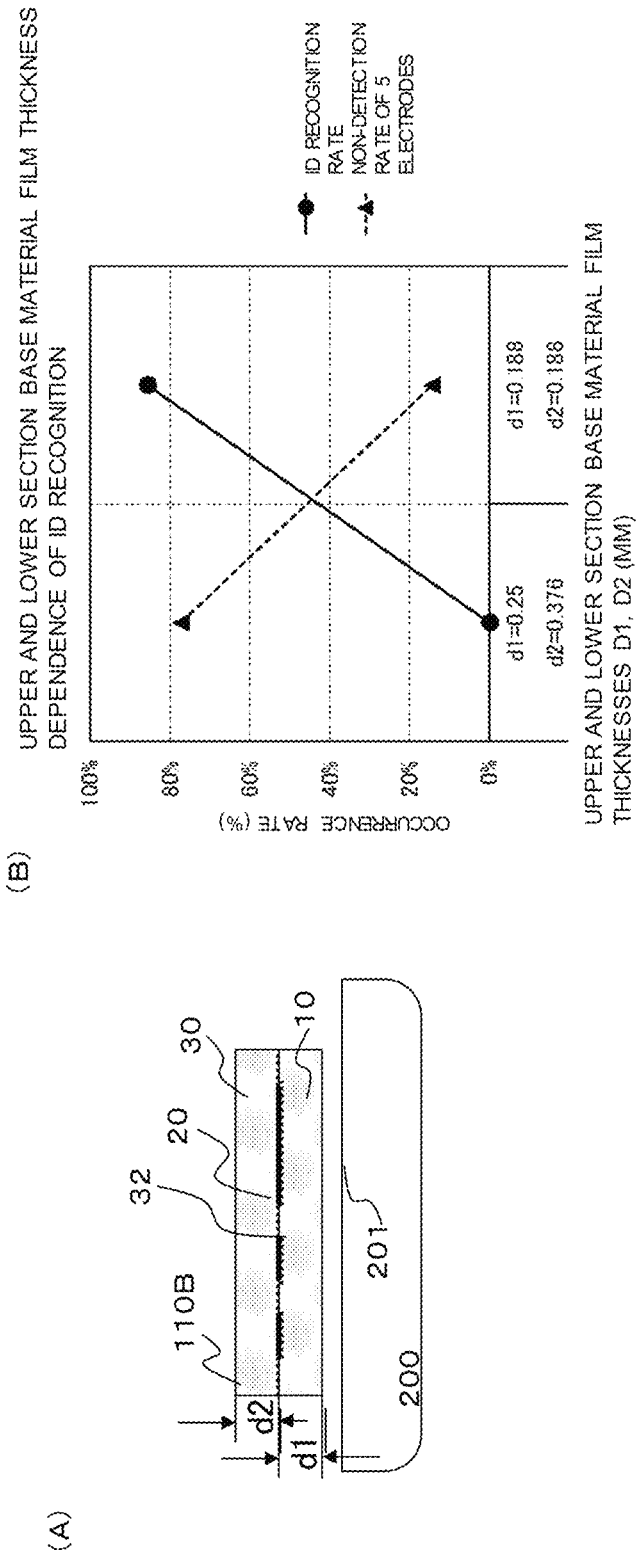
FIG. 139 is a diagram showing a result of an evaluation of the thickness of the non-conductive base material film of both the upper and lower sections of a code generation apparatus.

FIG. 139 shows the results of the evaluation of the thicknesses d2, d1 of the nonconductive base material on both the upper and lower sections of the code generation apparatus 110B. FIG. 139(A) shows a cross-sectional structural view of the evaluated code generation apparatus 110B, and FIG. 139(B) is a graph showing the dependency of the evaluated ID recognition rate to the upper and the lower nonconductive base material film thickness d2, d1. As shown in FIG. 139(A), the specifications of the evaluated sample and the evaluation orientation are the same as those of the upper and lower nonconductive base materials 30 and 10 shown in FIG. 138, besides the electrode diameters, presence/absence of a smartphone case, and thickness of the protective glass. For the conductor pattern 70 of FIG. 139(A), the ID electrode diameter is 8 mm and the information electrode diameter is 9 mm, a case made of cardboard having a low relative dielectric constant is used for the smartphone case, and film thickness for the protective glass is 0.55 mm. For the upper and lower nonconductive base materials 30, 10, two kinds of combinations of film thicknesses d2, d1 of d1=0.25 mm, d2=0.376 m, and d1=d2=0.188 mm were used for the evaluation.

According to the evaluation result of the ID recognition rate in FIG. 139(B), although the ID recognition rate as high as about 80% can be obtained for a sample in which the thicknesses of the upper and lower nonconductive base materials 30 and 10 are both 0.188 mm, for samples of thicker d1=0.25 mm and d2=0.376 mm for both the lower nonconductive base materials 30 and 10, ID recognition rates are lower and five electrode nonrecognition rates increased. Also taking into account the evaluation result of the film thickness of 0.25 mm of the lower nonconductive base material 10 in FIG. 138(B), it can be said that the reason why electrodes cannot be detected can be assumed to be because as the upper and lower nonconductive base materials 30 and 10 are thickened, not only does the capacitance between the electrode-touch panel TX and RX electrodes decrease, but also, the electrostatic capacitance between the first and second indicator electrodes 51 and 52 decreases, the capacitance between the first and second indicator electrodes 51 and 52 and the finger further decreases, the reactance between the indicator electrode and the finger increases, and the electrode detection current $I_{RX}$ does not sufficiently flow toward the human body. From these results, it is preferable to have the film thicknesses of the upper and lower nonconductive base materials 30 and 10 be 0.188 mm each or less.

Twenty-Sixth Embodiment

[Mechanism of a C-CARD (Electrode Wiring Specification of Conductive Pattern and ID Code Recognition Rate)]

In the conductive pattern 70 of the code generator 110B, the ID electrode 111D, the information electrode 111E, the first and second indicating electrodes 51 and 52 need to be connected by wiring, but when printing with carbon ink, due to the minimum dimension width of printing and the wiring resistance value, the wiring width can only be reduced to about 0.8 mm and the film thickness cannot be reduced. For this reason, the capacitance between the wiring and the touch panel is larger than the wiring when other conductive ink is used, and the touch panel detects the capacitance of the wiring, which affects the detection coordinates of the touch panel and a coordinate error may be generated, resulting in reducing the ID code recognition rate. For this reason, the evaluation with respect to the electrode wiring specification of an electroconductive pattern was performed.

FIG. 140 shows the ID recognition rate and detection error evaluation result for each wiring specification of the conductive pattern 70 of the code generator 110B.

The upper part is the specification, and the lower part is the evaluation result. A card sample in which a PET resin sheet having a thickness of 0.07 mm with an adhesive was pasted was prepared as the lower non-conductive substrate 10, where the conductive pattern 70 of FIG. 140 is printed with carbon ink on the surface (printed surface) of a 0.3 mm-thick PVC resin sheet. As a reference, the card sample in which a conductive pattern was printed with a silver salt ink on a non-conductive substrate 10 of a PET resin sheet having a thickness of 0.188 mm was further prepared. The specification of the conductive pattern 70 is that the ID electrode diameter and the information electrode diameter are both 8 mm and the wiring width is 0.8 mm, (1) Each electrode is in contact with a parallel straight line to the indicating electrode, (2) Specification in which the ID electrodes are connected in a single stroke line so as to be the shortest distance, (3) Specification in that wiring is done in a single stroke line and the wiring protrudes beyond the electrodes in the direction in which the wiring extends between the electrodes, wherein the protruding length is 4 mm within the distance of one touch TX/RX electrode mesh of the touch panel, (4) Specification wherein the wiring in a single stroke line loops to connect from the indicating electrode to the farthest end electrode, back to the indicating electrode, (5) For specifications wherein wiring is divided into two lines so that each two ID electrodes from the left and right ends of the indicating electrode, the ID recognition rate, mismatch rate, 5 electrode non-detection rate, error rate, and detection error ΔL were evaluated for 5 specifications.

Evaluation is performed on the conductive pattern 70 of the created card sample on the touch panel 201 and on the touch panel 201 on which the protective sheet or the like is not affixed on the surface of the code recognition device 200 (iPhone 6+) that holds the housing by hand, by holding the three indicating electrodes 51 and 52 of the code generator 110B one finger at a time, 20 times each and 60 times in total, the code recognition device 200 counts the number of times that the detection electrode coordinates obtained from the touch panel 201 and the electrode coordinates of the ID code coincide with each other to obtain an ID recognition rate, the ratio of the number of times that error cancellation occurred is the error rate, and the ratio of the number of times that even one of the five electrodes was not detected was the non-detection rate. The coincidence determination of the detection is that all the detection coordinates of the five arranged electrodes fall within a range of ±50% of one grid interval of the arrangement grid obtained by dividing the contact area 40 into 8×7. did. Items that did not enter the range were regarded as not matching.

Further, the detection error ΔL indicates the deviation of the electrode coordinates as a ratio when the grid interval is 1.

When compared with the carbon ink of the same sample specification at the wiring width of 0.8 mm shown in the evaluation result of FIG. 140, with respect to the individual electrode wiring (1), the one-stroke letters of (2) to (4) have a higher ID recognition rate and a smaller detection error ΔL, which shows that the influence of the wiring can be reduced. Among the one-stroke letters, the protruding wiring specification of (3) is the best for both the ID recognition rate and the detection error ΔL, and the detection error ΔL is almost the same as the silver paste ink sample having a wiring width of 0.2 mm, and the detection error can be corrected to the electrode center position thanks to the influence of wiring protrudes. In the loop wiring specification of (4), the farthest end electrode, which is the reference electrode for code recognition, is shifted to the indicating electrode side due to the influence of the long wiring returning from the farthest end electrode, and the coordinates of the other electrodes will shift in the direction that becomes flat in the Y coordinates direction. (5) The two-system wiring has a good ID recognition rate, but has a large detection error ΔL. Since this is affected by wiring for each system, the right system is drawn to the right and the left system is drawn only to the left separately for each system, and the error increases, so that the electrode position dependency of the detection error seems to increase.

For this reason, it is preferable that the conductive pattern has the single stroke writing specification, and when the wiring width is wide and the wiring influence is large, it is preferable to add a protruding wiring to correct the detection error.

The (3) protruding wiring specification in FIG. 140 is a specification in which the wiring extending to the electrode is extended in the same direction. However, cases are assumed when adjacent electrodes are close, it is difficult to route up to four wirings extending from each electrode.

Figure 141:
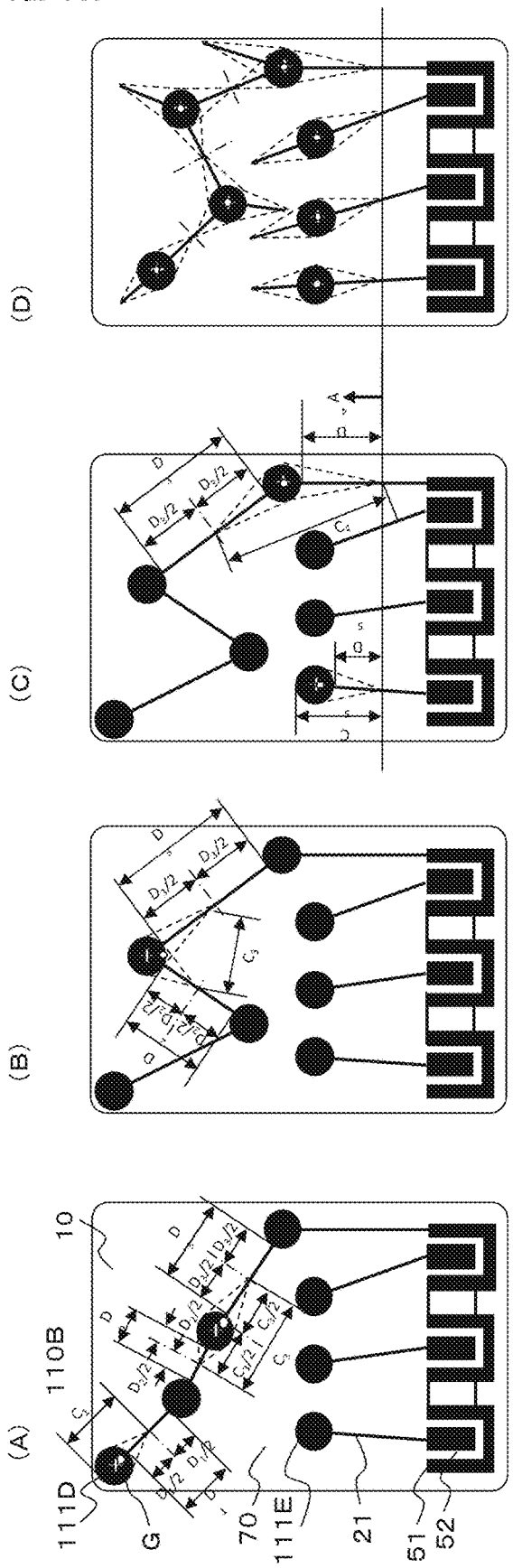
FIG. 141 is a diagram showing an example of a centroid position (the position of the center of gravity of electrostatic charge amount distribution) in consideration of the wiring influence of an ID electrode and an information electrode of a code generation apparatus.

For this reason, FIG. 141 shows another protruding wiring specification capable of correcting the detected coordinate error.

FIGS. 141(A), 141(B), and 141(C) are diagrams showing examples of centroid positions (center positions of electrostatic capacity distributions) in consideration of the wiring influence of the ID electrode 111E of the code generator 110B and the ID electrode 111D, And FIG. 141(D) is a diagram of the conductive pattern 70 to which the detection coordinate correction protruding wiring with the centroid position overwritten is added.

As shown in FIGS. 141(A) to 141(C), when the wiring width is wide in the conductive pattern in which the wiring 21 is connected to the electrode and the detection coordinates of the electrode are shifted due to the wiring influence, the wiring 21 connecting the electrodes with respect to the wiring length D, the capacitance of the wiring having a length of D/2 on the electrodes at both ends of the wiring length D affects the detection coordinates as an electrode portion. For this reason, in coordinate detection, it can be regarded as a new electrode shape in which a region surrounded by a line segment indicated by a broken line in the drawing in contact with the outer periphery of the electrode from the position D/2 of the wiring extending from the electrode is detected. At this time, the detection coordinates of the electrode are substantially the same as the centroid position G of the new electrode shape indicated by the white point in the figure. For example, Since the ID electrode 111D and the information electrode 111E on the farthest end side from the instruction electrode 51 are only connected to one wiring 21, and it is regarded as a thin drop-shaped electrode shape in the direction of one wiring 21 so that the centroid G equivalent to the detected coordinates is a position moved on the connected wiring 21 by an amount corresponding to the wiring length. Further, for example, since an electrode connected from two directions is regarded as an electrode shape having convex portions in two directions in which a drop shape extending to the position of D/2 of two wirings is superimposed, the centroid position of the shape becomes the detection coordinate.

For this reason, as shown in FIG. 141(D), an additional wire is connected to the electrode, and a drop-shaped region surrounded by a line segment in contact with the outer periphery of the electrode is added to the electrode shape, and the direction and length of the added wiring are determined so that the centroid position G of the electrode shape overlaps the electrode center coordinates on the design of the conductive pattern 70.

As a result, it is possible to correct the detection coordinates of the electrodes only by adding the protruding wire from each electrode.

Twenty-Seventh Embodiment

[C-CARD Mechanism (Attached C-Card Specification)]

Figure 142:
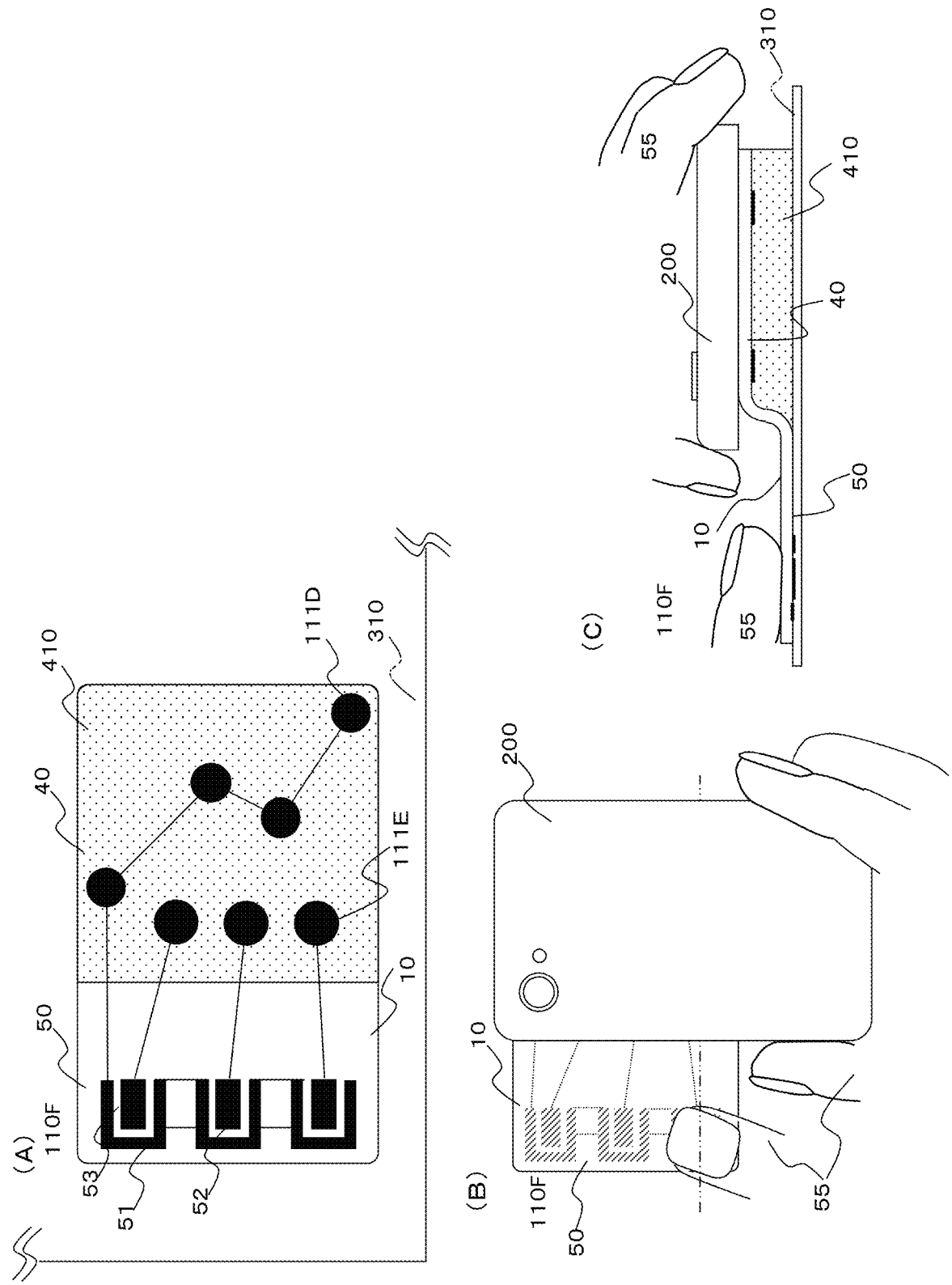
FIG. 142 is a schematic diagram showing the outer shape of a code generation apparatus.

FIG. 142 is a schematic diagram showing the outer shape of the code generator 110F of the embodiment 27th. FIG. 142 (A) is a transparent view seen from the upper surface, FIG. 142 (B) is a top view in use, and FIG. 142 (C) is a cross-sectional view seen from the side in use.

The code generator 110F corresponds to a form in which a human body contact detection and AC conduction specification code generator 110B is used not on a card but on a poster or a wall.

As shown in FIG. 142, the non-conductive substrate 10 of the code generator 110F has a conductive pattern 70 printed on its inner surface with conductive ink. The conductive pattern 70 has the same specifications as the code generator 110B, and has a different planar shape to correspond to the bulging portion of the contact surface area 40.

The non-conductive substrate 10 that defines the shape of the code generator 110F has a short side shorter than the long side of the touch panel 201 of the smartphone, and a short side that can be touched by human fingers by being secured outside the smartphone in length, where a contact area 40 is provided on the right side in the long side direction, and a holding area 50 is provided on the bottom, in the contact surface region 40, four first electrodes 111D and three information electrodes 111E are arranged, they are respectively connected to a first indicator electrode 51 and a second indicator electrode 52 provided in the holding region 50. In the code generation device 110F, three types of ID code information corresponding to the information electrode 111E can be generated in the code generation device 110B.

FIG. 142(B) is a diagram illustrating a detection operation and a conductive pattern formation method. FIGS. 142(B) and 142(C) show a state where the touch panel 201 of the code recognition device 200 such as a smartphone is in contact with the contact surface area 40 of the code generation device 110F. Actually, the conductive pattern cannot be visually recognized from the upper surface of the non-conductive base material 10, but in the drawing, the conductive pattern 70 is seen through from above for the purpose of explanation. FIG. 142(C) is a cross-sectional view.

As shown in FIGS. 142(B) and 142(C), when the finger 55 is placed on the left indicator electrodes 51 and 52 of the code generator 110F, capacitances are generated between the finger surface and the indicating electrode 51 and between the finger surface and the indicating electrode 51, so that the indicator electrodes 51 and 52 and the finger surface are coupled to each other. As shown in FIG. 130 (A), the capacitance between the indicator electrode 51 and the finger surface is connected in series, and the AC conductive state is established, and due to the voltage amplitude (AC signal) of TX2, a small current also flows to the human body side via the coupling capacitor Cp2.

For this reason, the code generator 110F is similar to the code generator 110B in that the ID electrode 111D connected to the first indicator electrode 51 and one of the information electrodes 111E connected to the second indicator electrode 52 on which the finger overlaps, are detected by the touch panel 201. Further, since the remaining two information electrodes 111E connected to the second indicator electrode that is not overlapped with the finger does not generate a capacitance, it does not have a coupling capacitance with the human body, the electrode is not detected even if the voltage amplitude (AC signal) of TXn of the touch panel 201 occurs.

A buffer material 410 is bonded to the back surface of the contact area 40 of the non-conductive substrate 10 with a double-sided tape or an adhesive. The cushioning material 410 is made of a non-conductive material having elasticity such as a sponge having a thickness of about 10 mm, and when the touch panel 201 of the smartphone which is the code recognition device 200 is brought into contact with the surface, the entire surface of the contact surface area 40 is surely secured. Another purpose of the cushioning material 410 is to prevent the surface of the touch panel 201 from being damaged. In addition, the boundary between the contact area 40 and the holding area 50 is a chamfered curved surface or inclined surface, and the sheet surface is bent at an obtuse angle when the nonconductive substrate 10 is attached, to prevent the wiring between the electrodes from being disconnected.

Since the code generator 110F is composed only of the non-conductive base material 10 and the buffer material 410, it is very light and can be used by pasting it to the back surface of the base material 310 such as a poster made of paper attached to the wall with a double-sided tape or an adhesive. Further, the pasting base material 310 needs to have insulating properties so as not to affect the conductive pattern.

Twenty-Eighth Embodiment

[Mechanism of a C-CARD (Modified Example of Pasted C-Card Specification)]

Figure 143:
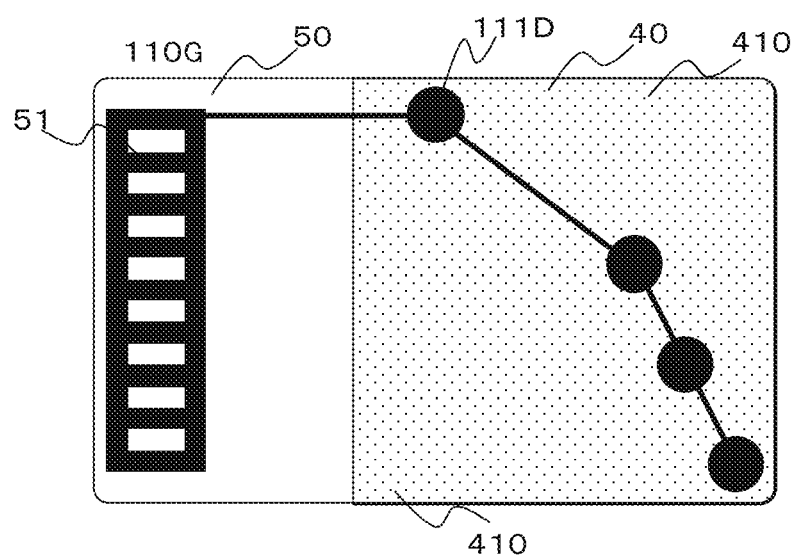
FIG. 143 is a diagram showing a modification of a code generation apparatus.

FIG. 143 shows a code generator 110G as a modification of the twenty-seventh embodiment. As shown in FIG. 143, the code generator 110G is composed of the conductive pattern 70 printed with the conductive ink on the non-conductive substrate 10, does not have the information electrode 111E and the second indicating electrode 52, but only the ID electrode 111D and the first indicating electrode 51. The code generator 110G created using the non-conductive substrate 10 can generate only one type of ID code information since one location of the first indicator electrode 51 of the holding region 50 can be touched by the finger 55, so that operation can be performed easily.

Figure 144:
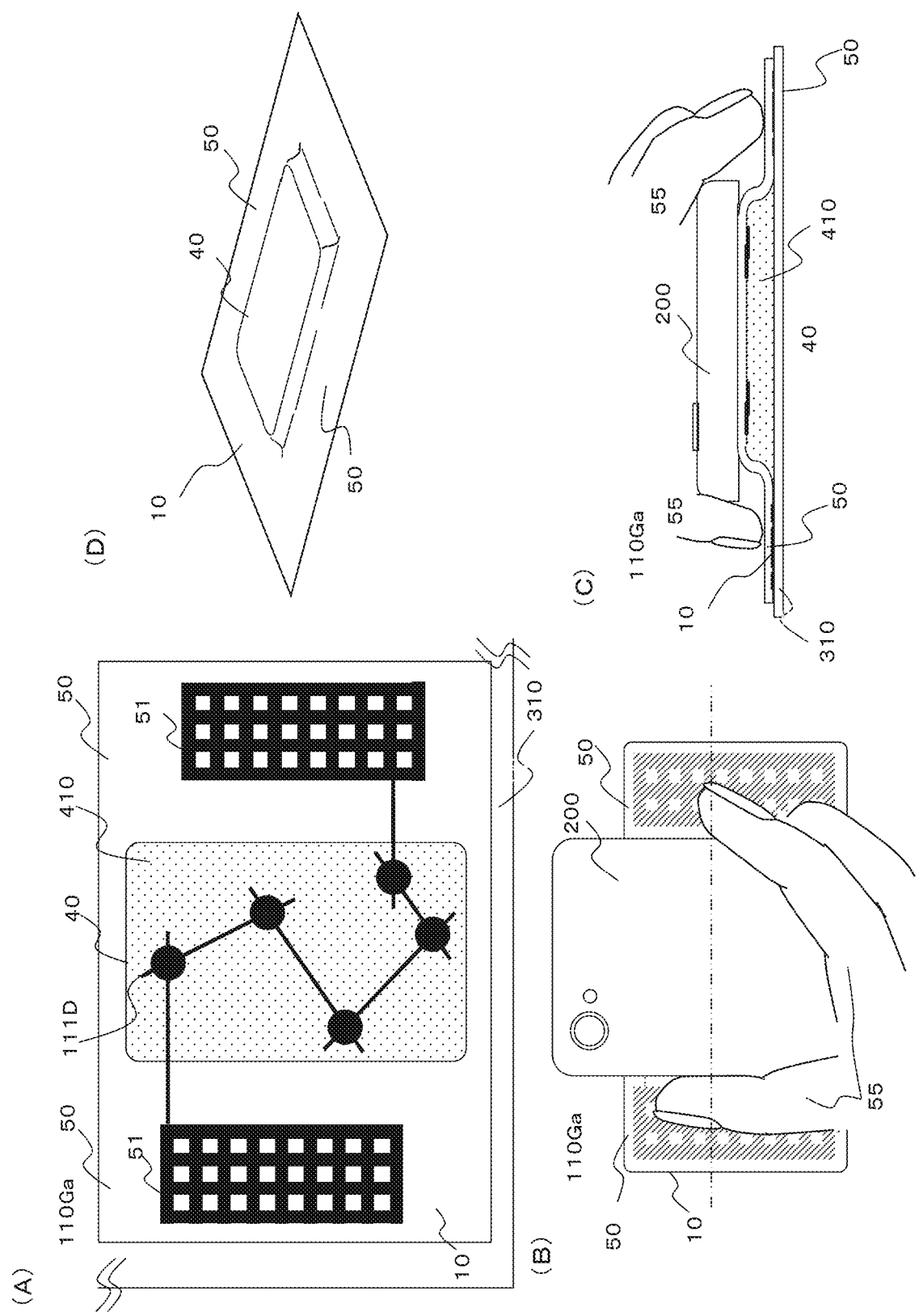
FIG. 144 is a diagram showing a modification of a code generation apparatus.

FIG. 144 shows a code generator 110Ga that is a modification of the code generator 110. FIG. 144(A) is a transparent view seen from the upper surface, FIG. 144(B) is a top view in the used state, FIG. 144(C) is a cross-sectional view seen from the side in the used state, and FIG. 144(D) is an external view of the electroconductive base material 10a.

As shown in FIG. 144(A), the conductive pattern 70 is printed with conductive ink on the inner surface of the non-conductive substrate 10a of the code generator 110Ga, and the electrode 111D is arranged and held in the contact area 40. Further an indicating electrode 51 is disposed in the holding region 50. The holding region 50 and the indicator electrode 51 are common nodes in which the ID electrodes 111D are connected together, but are provided at two places on the left and right sides of the contact surface region 40. Further, the holding region may be provided at two places on both the upper and lower sides, or may be provided on all four sides.

The contact surface region 40 of the non-conductive substrate 10a is a rectangle whose side on which the holding region 50 is provided is a long side, wherein the long side direction is shorter than the long side size of the touch panel screen of the smartphone 200 which is a code recognition device, further wherein the short side direction is shorter than the short side size of the touch panel screen. Further, the ratio of the long side to the short side may be a value close to the ratio of the long side to the short side of the touch panel screen.

Further, as shown in FIG. 144 (D), the non-conductive base material 10a is formed in a bulged portion having a flat top surface with a flat top surface in which the contact surface region 40 is formed by extruding about 10 mm from the inside to the outside. And a cushioning material 410 is adhered to the inside of the bulging portion of the base material with a double-sided tape or an adhesive. The buffer material 410 is made of a non-conductive material having elasticity, such as a sponge, having the same thickness as the bulging portion of the contact surface region 40, and is embedded without gaps between the bulging portion of the contact surface region 40 and the back surface of the pasting substrate 310. As a result, when the touch panel 201 of the smartphone, which is the code recognition device 200, is brought into contact with the flat portion of the contact area 40, the entire contact area 40 can be reliably contacted and the surface of the touch panel 201 is not damaged.

FIGS. 144(B) and 144(C) are views of the state in which the touch panel 201 of the code recognition device 200 such as a smartphone is in contact with the holding area 50 of the code generation device 110Ga, and FIG. 144(C) is a cross-sectional view of the state in contact with each other.

Since the bulging portion of the contact surface area 40 is rectangular, when the smartphone 200 is brought into contact, the long side direction of the touch panel screen and the long side direction of the bulging portion can be naturally guided to face each other.

Since holding regions 50 are provided at both ends of the bulging portion 40 on the long side, and the indicating electrode 51 is disposed on almost the entire inner surface side of the holding region 50, as shown in FIGS. 144(B) and 144(C), the finger 55 with the smartphone 200 naturally contacts the indicator electrode 51, AC conduction with the indicator electrode 51 can be easily achieved.

Twenty-Ninth Embodiment

[C-CARD Mechanism (Human Non-Contact Detection Type C-Card Specification)]

In the specifications of the pasting type C-Card shown in the twenty-seventh and twenty-eighth embodiments, in order for the touch panel 201 of the code recognition device 200 to detect the electrodes, the code recognition devices 110F, 110G, and 110Ga all require human body contact. However, it is not held by a finger as in the case of a card-structured code generator, and it is difficult to reliably bring the indicator electrode 51 into contact with a human body such as a finger. However, unlike the card structure, the pasting type C-Card can use a larger area than the poster or wall card, and therefore the area restriction of the conductive pattern 70 is loose. For this reason, we examined the sticking type C-Card specification of the human body non-contact detection method.

Figure 145:
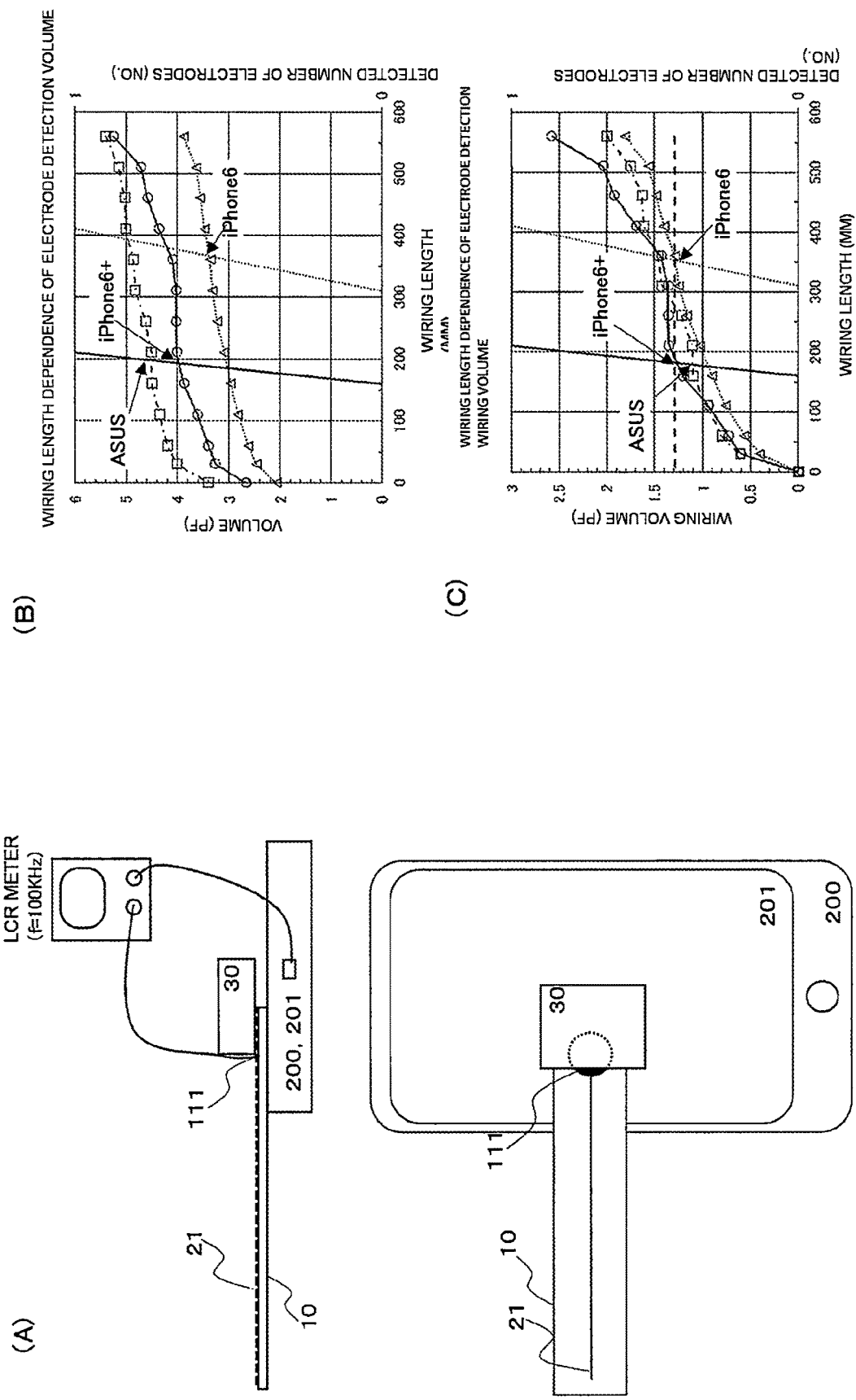
FIG. 145 is a diagram showing a result of the examination of wiring length and wiring capacitance necessary for human body non-contact detection with respect to one electrode.

FIG. 145 shows the result of studying the wiring length and wiring capacity necessary for non-human body contact detection for one electrode. FIG. 145(A) is a schematic diagram of the evaluation method, and FIGS. 145(B) and 145(C) are graphs of the evaluation results.

As shown in FIG. 145(A), an electrode 111 having an electrode diameter of 8 mm and a wiring 21 having a wiring width of 0.2 mm are printed and formed on a 0.135 mm thick PET resin sheet with silver nano ink, wherein the code recognition device 200 is (1) ASUS ZenFone 4 (X00HD), (2) iPhone 6+, (3) iPhone 6, where (1) and (2) have no protective sheet, and (3) is attached to the screen edge on the touch panel 201 with a surface protective glass of 0.55 mm thickness. The electrode 111 is fixed with the foamed polystyrene of 10 mm thickness corresponding to the upper nonelectroconductive base material 30 which also served as the load flatly mounted. And wiring capacitance and the electrode detection state was evaluated.

The capacity was measured with an LCR meter DE-5000 (f=100 KHz) between the shield GND of the USB connector and the conductive pattern terminal drawn to the outside of the touch panel 201. Since it is a capacitance measurement as seen from the touch panel of the wiring 21 and the electrode 111 in a state of being attached to a poster or a wall surface, The code recognition device 200 is placed on a 1 cm thick corkboard base with a space of about 15 cm above the steel desk, the wiring protruding from the touch panel 201 is in a state of being arranged on the cork board. For this reason, the capacity of the wiring 21 part is not clear of the counter electrode facing the wiring electrode, unlike the original capacitance value, it is highly influenced by radio waves in the measurement environment.

For the evaluation of the electrode detection state, an application program that displays the detection coordinates of the touch panel of the touch panel 201 of the code recognition device 200 is used, and the electrode 111 of the non-conductive substrate 10 is lightly pressed by the upper non-conductive substrate 30 on the touch panel 201. In this state, it was confirmed whether the electrode 111 was detected.

FIG. 145(B) shows the wiring length dependency of the capacitance between the electrode 111 and the touch panel and the detection status. The curve with the marker is the wiring dependency of the capacitance shown on the left Y axis, and the capacitance value at X=0 is the capacitance between the electrodes and the touch panel per electrode. In addition, the straight line rising from the X axis without the marker is the wiring length dependency of electrode detection on the right Y axis. The X coordinate value of the intersection of the curve with the marker and the straight line without the marker is the wiring length necessary for electrode detection, and the Y coordinate value is the capacitance value necessary for detection including the electrode capacitance.

FIG. 145(C) shows the wiring length dependence of the touch panel capacitance of only the wiring 21 obtained by subtracting the electrode-touch panel capacitance at X=0 from the graph of FIG. 145(B). As shown in FIG. 145(C), with the three types of smartphones 200 evaluated, the electrodes are detected by the touch panel when the capacitance value exceeds about 1.3 pF, excluding the electrode capacitance. In terms of wiring length, iPhone 6 requires 35 mm or more. However, as described above, the capacitance value of the wiring 21 is largely influenced by the measurement environment. Even in this measurement, the capacitance does not have a linear dependence on the wiring length, but fluctuates. For this reason, it is expected that a longer wiring is actually required.

As shown in the twenty-first embodiment, the touch panel 201 may or may not detect the electrode 111 with the two electrodes 111 or the plurality of electrodes 111 arranged on the touch panel without contact with the human body, depending on the positional relationship between the position where the electrode 111 is placed and the TX and RX electrodes in the touch panel. In a state where two electrodes have a capacity with respect to the same TX or RX in the touch panel 201, that is, in a state where two or more electrodes are arranged substantially parallel to the long side and the short side of the rectangular touch panel screen, the electrodes that could be detected when not arranged in parallel may not be detected.

For this reason, two electrodes having wiring 21 that can be detected for each electrode are brought into contact on the touch panel, and it was evaluated whether it was possible to continue detection regardless of the arrangement angle of the two electrodes with respect to the touch panel.

Figure 146:
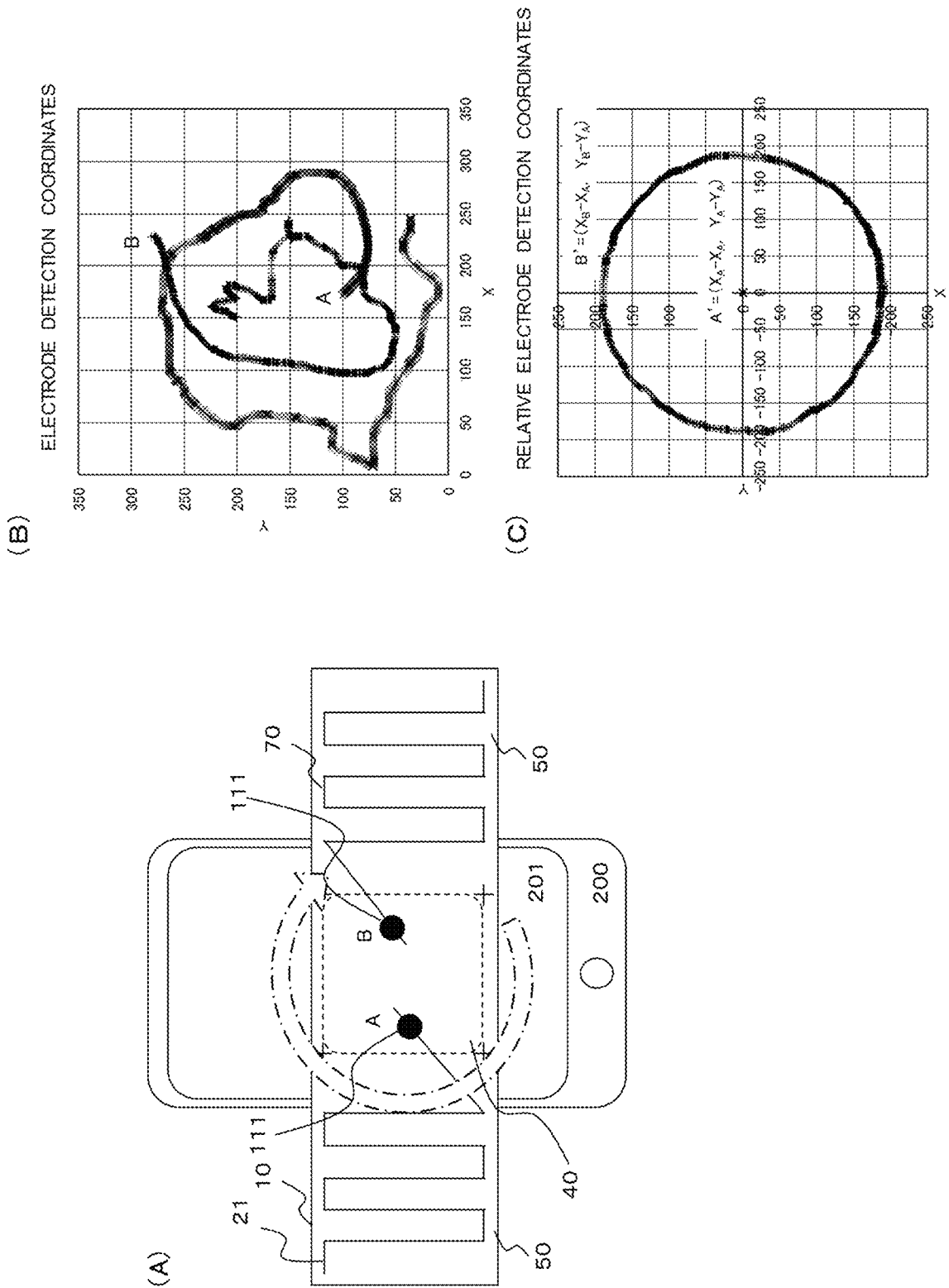
FIG. 146 is a diagram showing a result of a touch panel arrangement angle dependency evaluation of the electrode detection state with respect to two electrodes without human body contact.

FIG. 146 shows the result of evaluating the touch panel arrangement angle dependency of the electrode detection state for two electrodes without human contact. FIG. 146(A) is a schematic diagram of the evaluation method, and FIGS. 146(B) and 146(C) are graphs of the evaluation results.

As shown in FIG. 146(A), an electrode 111 having an electrode diameter of 8 mm and a wiring 21 having a wiring width of 0.2 mm are printed and formed independently as conductive pattern 70 with silver nano-ink on a PET resin sheet having a thickness of 0.135 mm which is a non-conductive substrate 10. An area of about 40 mm where the two electrodes are arranged is a contact area 40, a portion of the wiring 21 outside that is a holding area 50, and only the contact area 40 is in contact with the touch panel 201, a sample of the non-conductive base material 10 was made, where the holding region 50 with the wiring 21 was bent at the boundary portion of the contact surface region 40 that was not in contact with the touch panel 201. The electrode center interval of the conductive pattern 70 was 29 mm, and the length of the wiring 21 was 40 mm.

This sample is arranged so that only the contact area 40 is in contact with the touch panel 201 of the iPhone 6 that is the code recognition device 200, Using an application program that displays the touch panel detection coordinates, in a state where the two electrodes are detected, the non-conductive base material 10 sample is rotated by 360° or more while keeping the contact area 40 away from the touch panel 201, The number of detected electrodes and the detection coordinates during that time were confirmed.

The number of detected electrodes and the detection coordinates during that time were confirmed. FIG. 146(C) is a plot of the detection coordinates of two electrodes in a coordinate system with the A electrode detection position obtained by subtracting the detection coordinates of the A electrode from the detection coordinates of each electrode as the origin.

As shown in FIG. 146(C), it can be seen that the A electrode is detected at the origin and the B electrode is detected concentrically at all angles of 360°. For this reason, when two electrodes having wiring 21 that can be detected independently for each electrode are brought into contact with the touch panel, it was able to confirm that the two electrodes continue to be detected regardless of the arrangement angle with respect to the touch panel.

Based on these results, a human-body non-contact detection type code generator 110H was created, and the wiring length of the wiring 21 necessary for the holding region 50 of the code generator 110H was examined.

Figure 147:
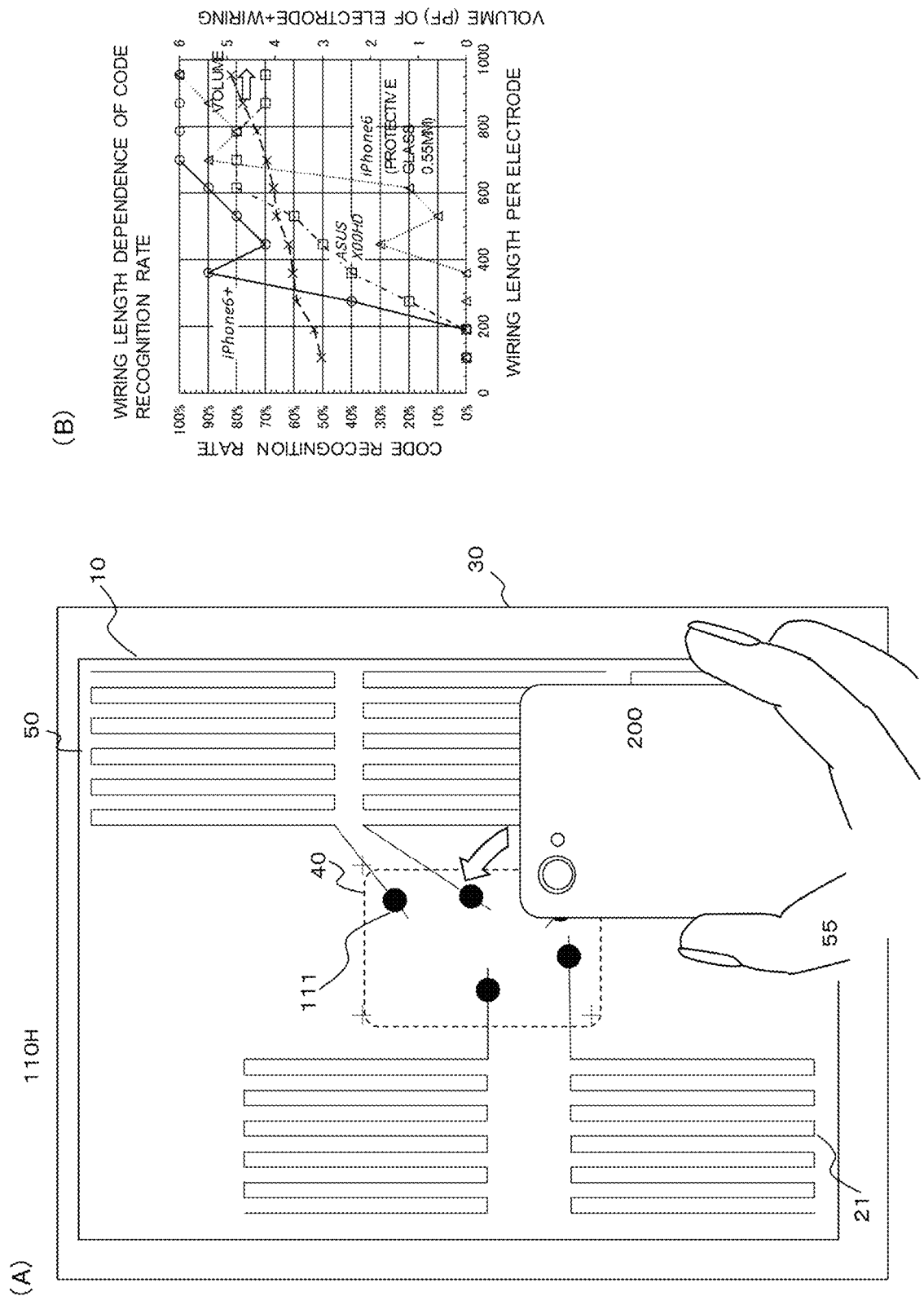
FIG. 147 is a diagram showing a result of a wiring length dependency evaluation of the code recognition rate of a code generation apparatus.

FIG. 147 shows the wiring length dependency evaluation result of the code recognition rate of the code generator 110H. FIG. 147(A) shows the specification and evaluation method of the evaluated code generator 110H, while FIG. 147(B) is a wiring length dependency graph of the evaluated ID recognition rate.

As shown in FIG. 147(A), 5 ID electrodes 111D with the electrodes' arrangement corresponding to an ID code with a diameter of 8 mm as a contact surface area 40 are arranged in the central portion of an A4 size 0.135 mm thick PET resin sheet which is a non-conductive substrate 10. Furthermore, each electrode is connected independently with a wiring 21 having a wiring width of 0.2 mm and a total wiring length of 95 mm, with 80 mm folded at 5 mm intervein, wherein conductive patterns 70 is arranged on the left and right sides of the contact area 40 as the holding area 50 were printed with silver nano ink.

The surface on which the conductive pattern 70 of the non-conductive substrate 10 was printed was used as the inner surface, and the bulging portion was provided on the contact area 40 by adhering a foamed polystyrene plate having a thickness of 10 mm, wherein the holding regions 50 on both sides are bent along the bulging portion and attached to the lower non-conductive substrate 30 of the paper, so that it is set as the code generator 110H. The outer surface of the non-conductive substrate 10 prints a graphic that serves as a guide for the contact area 40. In addition, since a graphic that serves as a guide for bringing the finger 55 into contact with the holding area 50 is not necessary, it is possible to print a graphic related to the processing content executed when the code is recognized by the code recognition device 200. Thus, the design of the code generator 110H can be improved.

Needless to say, the contact area 40 may be formed by using a bulging portion formed by extrusion from the back side as shown in FIG. 144(D) of the twenty-eighth embodiment.

The ID recognition rate was evaluated while changing the wiring length of the wiring 21 in the holding area of the code generator 110H.

The wiring length 21 was changed by sequentially cutting the wiring with a total wiring length of 95 mm. (For this reason, at the time of evaluation when the wiring length is short, the finely cut floating wiring remains close to the wiring 21.) Since the code generator 110H is actually used in a state where it is attached to a poster or a wall surface, the cord generator 110H was placed on a 1 cm-thick cork board base having a space of about 15 cm from the steel desk and evaluated.

Using one of touch panel of three types of smartphones that are the code recognition device 200 (1) ASUS ZenFone 4 (X00HD), (2) iPhone 6+, (3) iPhone 6, while (1) and (2) have no protective sheet, (3) with a surface protective glass of 0.55 mm thickness, and with the smartphone case in hand, the touch panel 201 is repeatedly touched to the touch surface area 40 of the code generator 110H 10 times, the number of times that the code recognition device 200 determined that the detection electrode coordinates obtained from the touch panel 201 coincided with the electrode coordinates of the ID code was totaled to obtain an ID recognition rate. The coincidence determination of the detection coordinates is that all the detection coordinates of the five arranged electrodes fall within a range of ±50% of one grid interval of the arrangement grid obtained by dividing the contact area 40 into 8×7.

As shown in FIG. 147 (B), in the case of iPhone 6+, the wiring length of the wiring 21 per electrode is set to 300 mm or more, and in the case of ASUS X00HD 6+ are set to 600 mm or more, the ID recognition rate 70% or more is obtained in the use environment without the protective sheet and the protective glass, and the ID recognition rate can be set to an actually usable level. Further, if the wiring length is ensured to be 70 mm or more, the ID recognition rate is 70% or more in any of the three types of code recognition devices 200 that have been evaluated, and the ID recognition rate can be set to a practical level, and this condition is preferable.

Furthermore, by optimizing the wiring width and wiring layout specifications, it seems that the capacitance necessary for detection can be secured and the wiring length can be reduced.

Thirtieth Embodiment

[C-CARD Mechanism (Electrode Layout Specification of ID Code Pattern)]

The code generator 110B is provided with a contact surface area 40 that contacts the touch panel 201 of the code recognition device 200 in which four ID electrodes 111D and three information electrodes 111E are arranged in the size of a trading card (about 59 mm×86 mm) or a cybernet standard card (57.5 mm×85 mm) such as a QUO card, and a holding area 50 for holding three sets of first and second indicating electrodes 51 and 52 for holding a cord generating device as a card and conducting the electrodes and the human body. The area ratio of the contact area 40 and the holding area 50 is about 3:1, and the area of the contact area 40 Can't be big enough in order to be contacted even with a small model of the touch panel screen size of the smartphone as the code recognition device 200.

Of these, the conductive pattern 70 must be formed by forming a geometric pattern that is unique and whose direction can be recognized by the electrode arrangement as an ID code.

Further, as shown in the 24th embodiment, when the electrode interval is shortened, the ID recognition rate is lowered, and therefore the interval between the ID electrode 111D and the information electrode 111E cannot be reduced. Due to these restrictions, the number of ID codes made of a unique conductive pattern 70 composed of a combination of five electrode arrangements is not so large. For this reason, electrode arrangement specifications were examined.

Figure 148:
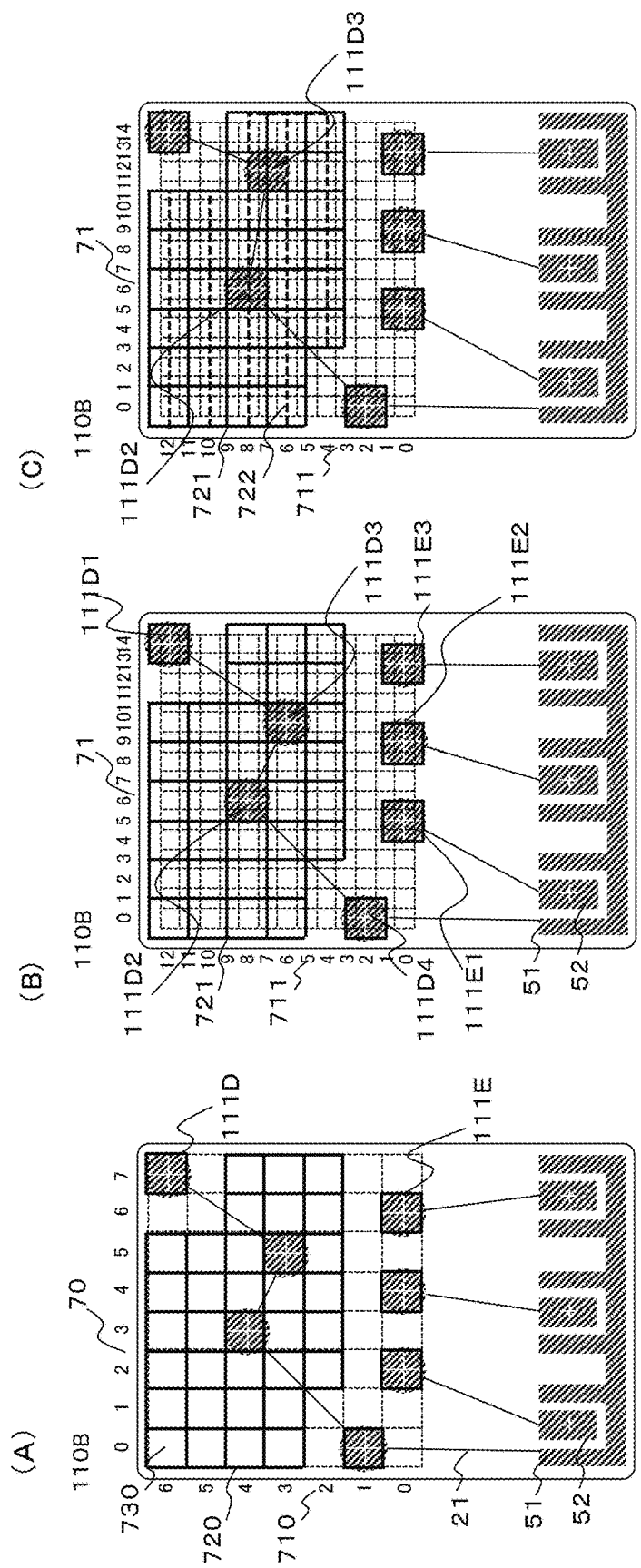
FIG. 148 is a schematic diagram of an electrode arrangement specification of a code generation apparatus.

FIG. 148 is a schematic diagram of electrode arrangement specifications of the code generator 110B. FIG. 148 (A) is a standard arrangement specification that takes into account the electrode diameter and tolerance at the time of detection determination, and (B) and (C) are specifications in which the arrangement specification and the tolerance setting for detection determination are divided and improved.

Both the ID electrode 111D and the information electrode 111E have an electrode diameter of 8 mm. The electrode arrangement grid 710 having the standard arrangement specification (A) has an interval of 6.5 mm and the number of arrangement positions of 56 (X direction 8×Y direction 7, when securing a margin for the printing size of the conductive pattern 70 on the outer periphery of the card size and the deviation of the punching into the card shape. With respect to the electrode arrangement cell 730 of the electrode arrangement grid 710, the conductive pattern 70 is formed by being arranged and aligning the center coordinates of the electrodes 111D and 111E at the center position of the electrode arrangement cell 730 corresponding to the ID code.

When an ID code is recognized by the code recognition device 200 from the conductive pattern 70, the coordinates of the electrodes detected by the touch panel 201 are converted into an ID code using the encoding algorithm described previously. At this time, due to the influence of the wiring 21 of the conductive pattern 70 and the influence between adjacent electrodes, a shift occurs between the detection coordinates of the touch panel 201 and the arrangement position of the conductive pattern. This deviation amount is a detection error, if this amount of deviation is a detection error and exceeds ½ of the grid interval, the coding algorithm of the code recognition device 200 converts the ID code, assuming that the electrode is arranged in the electrode arrangement cell 730 adjacent to one grid in a direction shifted from the arranged electrode arrangement cell 730.

For this reason, as a standard, the maximum allowable detection error during ID code recognition is grid interval/2. When converted to the actual dimensions on the conductive pattern 70 of the code generator 110B, the allowable error is within 3.25 mm.

In the evaluation results shown in Embodiment 26 and FIG. 140, the detection error of the code generator 110B is distributed in an average value from 0.19 to 0.39 for one grid interval of the 8×7 grid arrangement specification. Similarly, when this is converted into the actual size on the conductive pattern 70 of the code generator 110B, the detection error is distributed in an average value of 1.235 mm to 2.53 mm.

From these, it can be said that the grid interval in the arrangement specification of FIG. 148(A) is almost appropriate for the performance of the code generator 110B.

However, in the arrangement specification of FIG. 148 (A), the conductive pattern 70 is created in consideration of the limitation of the electrode center interval shown in Embodiment 24 so that the number of ID codes is obtained while the electrode center interval of 20 mm or more is secured, the number of ID codes is only 25, and it is 387 even if it is 18 mm or more.

In order to increase the number of usable ID codes, it is necessary to improve the electrode arrangement specifications. FIGS. 148(B) and 148(C) are schematic views of electrode arrangement specifications reviewed. In contrast to the standard arrangement specification of FIG. 148(A), the arrangement grid 711 in FIG. 148(B) and FIG. 148(C) has a grid interval of about 3.35 mm, which is about half that of the standard arrangement grid 710. In this case, the maximum value of the allowable detection error converted to the actual size on the conductive pattern 71 of the code generator 110B is within 1.675 mm, And if this is left as it is, there is concern that small detection errors occur frequently with respect to the distribution of average detection errors of the evaluation results shown in FIG. 140, from 1.235 mm to 2.53 mm.

For this reason, the ID code system is divided into groups, and new group number information is added, The maximum allowable detection error of (2*grid interval)/2 can be set, by dividing the range of allowable detection errors in the encoding algorithm of the code recognition device 200 in units of groups, furthermore, by providing additional restrictions on the electrode arrangement specifications of the conductive pattern 71. When converted to the actual dimensions on the conductive pattern 71 of the code generator 110B, the allowable error is within 3.35 mm, and the allowable error can be increased by 0.1 mm compared to the standard arrangement specification with a grid interval of 6.5 mm.

However, in order to change the detection error range of the encoding algorithm in units of groups, it is necessary to manage the ID codes so that only the ID codes of the same group are used in units of the service to be provided and/or in units of customers.

The grouping is classified into 16 groups corresponding to the even and odd of the X coordinate and Y coordinate of the electrode arrangement grid coordinates of the two ID electrodes 111D2 and 111D3 which are not the reference ID electrodes. Thereby, in the conductive pattern 71 of the ID code of the same group, it can be ensured that the ID electrode 111D2 and the ID electrode 111D3 do not have the ID electrode arranged at a position where the X grid coordinate and the Y grid coordinate are adjacent to each other.

FIGS. 148(B) and 148(C) show arrangement specifications in which grouping is applied and the grid interval is narrowed. FIG. 148(B) is a group in which all of X and Y of the ID electrodes 111D2 and 111D3 are even numbers, and FIG. 148(C) is a group in which X and Y of the ID electrode 111D2 are even numbers and X and Y of 111D3 are odd numbers.

ID electrode 111D1 and ID electrode 111D4 located at (14, 12) and (0, 2) in FIG. 148(B) are reference electrodes for ID code encoding processing, and are fixed positions. Further, the information electrodes 111E1, 111E2, 111E3 located at (5, 0), (9, 0), (13, 0) are independent electrodes that are not connected to the other corresponding to the second indicating electrodes 52, respectively. This is for generating three types of ID codes with one conductive pattern 70 by using one electrode, and this is also a fixed position.

For example, the ID electrode 111D2 of FIG. 148(B) is arranged at the grid coordinates of (6, 8), and the ID electrode 111D3 is arranged at the grid coordinates of (10, 6). The allowable detection error range in the encoding algorithm of the code recognition apparatus 200 is that the error range mesh 721 is applied to both ID electrodes. If coordinates are detected in the frame, it is recognized as correct. The electrode centers of the grid coordinates (5, 7), (6, 7), (7, 7) (5, 8), (7, 8), (5, 9), (6, 9), (7, 9), are provided on the frame of the error range mesh 721 where the ID electrode 111D2 is located and at the intersection. Since the grid coordinates of any electrode placement cell are not (X, Y)=(even, even), and since the ID electrode is not securely placed to 111D2 in the electrode arrangement cell of these grid coordinates and in the ID code of the group, even if the area up to the frame of the error range mesh 721 is recognized as the electrode arrangement of the ID code, it is not erroneously recognized as a conductive pattern of another ID code in the same group.

In the case of FIG. 148(C), the ID electrode 111D2 is arranged at grid coordinates (6, 8), and the ID electrode 111D3 is arranged at grid coordinates (12, 7). The allowable detection error range in the encoding algorithm of the code recognition device 200 is that the ID electrode 111D2 is applied with the error range mesh 721, and the ID electrode 111D3 is applied with the error range mesh 722. Thinking like the ID electrode 111D2 in FIG. 148(B), since the ID electrode 111D2 is only (even, even) and the ID electrode 111D3 is only arranged at the (even, odd) position among each corresponding ID code group, even if the area of each error range mesh 721, 722 is recognized as the electrode arrangement of the ID electrode of the ID code, the ID electrode 111D2 of the other ID code and the ID electrode 111D2 in the same group are never erroneously recognized, similarly, the ID conduction 111D3 of the other ID code and the ID electrode 111D3 in the same group will not be erroneously recognized. However, when the ID electrode 111D2 is shifted by one grid width in the −Y coordinate direction and the ID electrode 111D3 is shifted by one grid width in the +Y coordinate, it has possibilities that the ID electrode 111D2 corresponds to (6, 7) and the ID electrode 111D3 corresponds to (12, 8). If the ID electrode 111D2 and the ID electrode 111D3 are mistaken at this coordinate, the erroneously detected coordinates are (even, even) for the ID electrode 111D2, and (even, odd) for the ID electrode 111D3. Depending on the encoding algorithm of the code recognition device 200, there may be a case where it is erroneously recognized as another ID code in the same group. For this reason, the grouping of ID codes is introduced, and the restrictions, where an electrode coordinate arrangement in which the Y grid coordinates of the ID electrode 111D2 and the ID electrode 111D3 differ by only one grid, is added to the electrode arrangement specification of the conductive pattern 71.

By using these methods to group ID codes, the number of usable ID codes can be increased. Table 5 shows the results of determining the number of ID codes with and without grouping for each restriction on the distance between the electrode centers. By performing grouping, the number of ID codes can be increased to 438 even if the restriction on the distance between the electrode centers is 20 mm.

TABLE 5

| Specifications | ID Grouping | | Yes | No |
|---|---|---|---|---|
| | Arrangement grid specifications | Spacing | 6.5 mm | 3.35 mm |
| | | Arrangement position no. | 56 | 195 |
| | | Grid coordinates | 8 × 7 | 15 × 13 |
| | Maximum permissible errors | | 3.25 mm | 3.35 mm |
| ID code no. | Electrode center distance constraint | 18 mm | 387 | 1069 |
| | | 20 mm | 25 | 438 |

Thirtieth-First Embodiment

[C-CARD Mechanism (ID Code Encoding Algorithm Specifications)]

From the conductive pattern of the code generator 110, for example, the code recognition device 200 can identify the code as a pattern code and acquire information by the following method.

Figure 149:
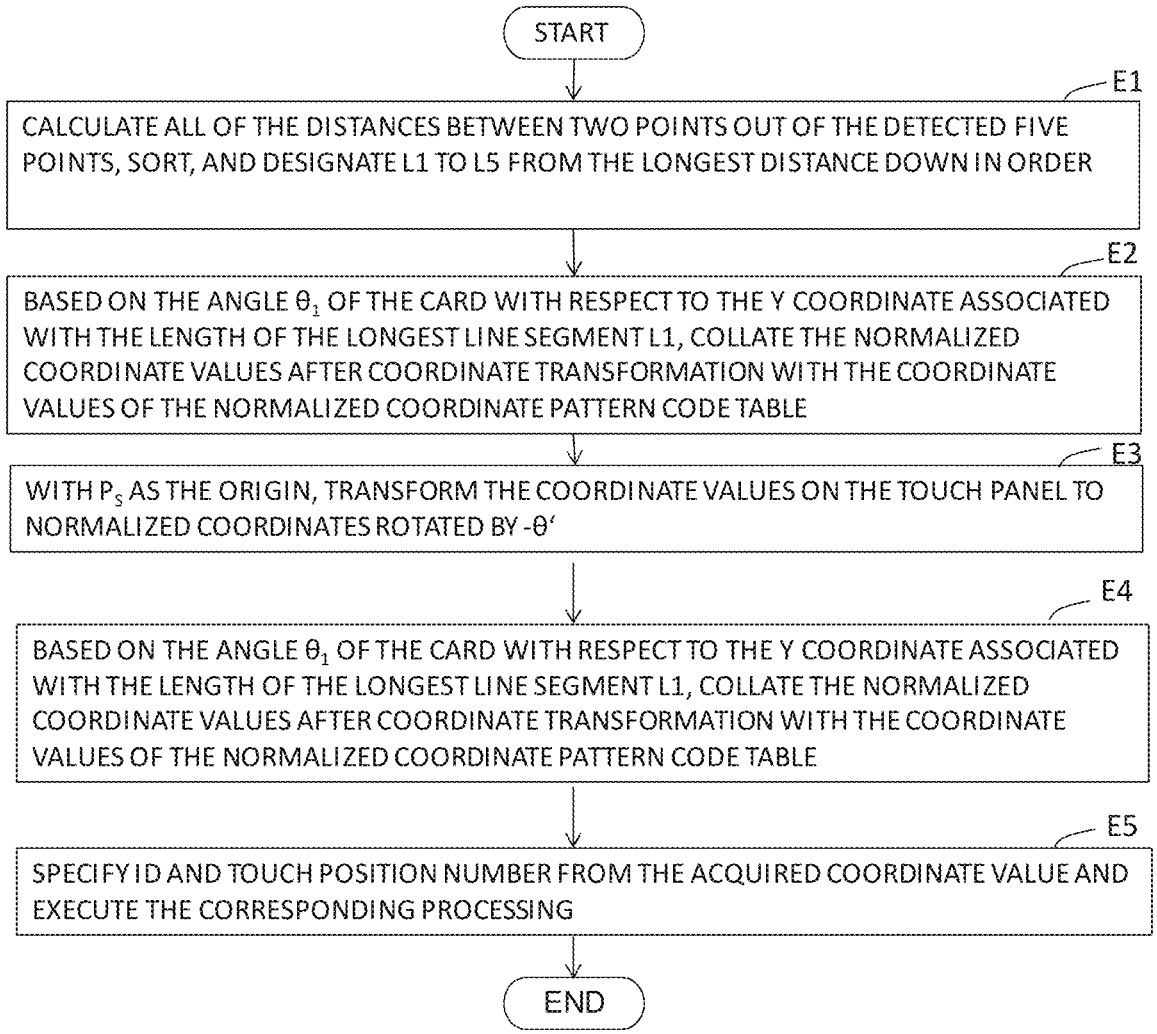
FIG. 149 is a diagram (1) showing a method of recognizing the position of an electrode by a code recognition apparatus and processing of a program according to this position recognition method.
Figure 150:
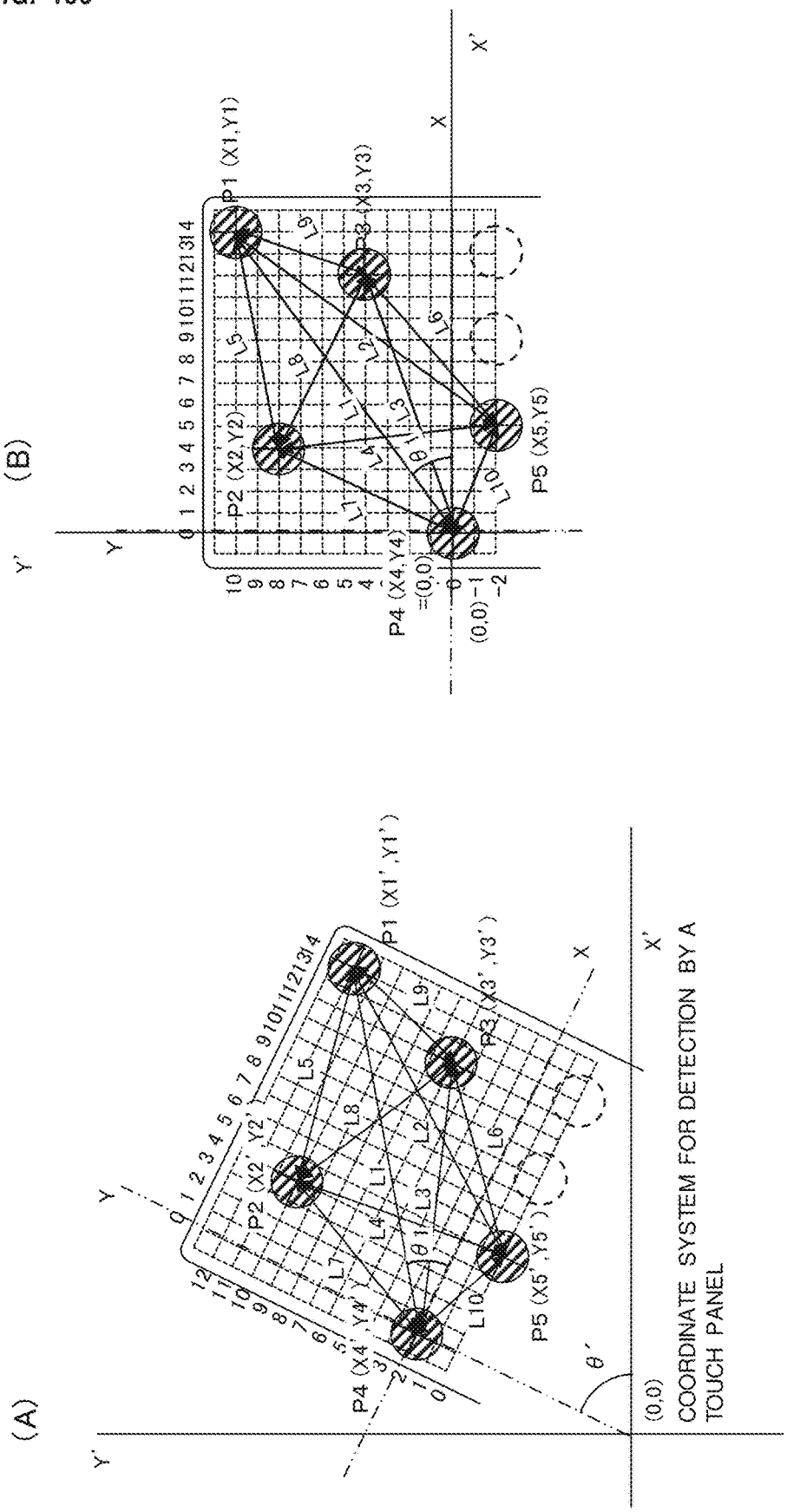
FIG. 150 is a diagram (2) showing a method of recognizing the position of an electrode by a code recognition apparatus and processing of a program according to this position recognition method.
Figure 151:
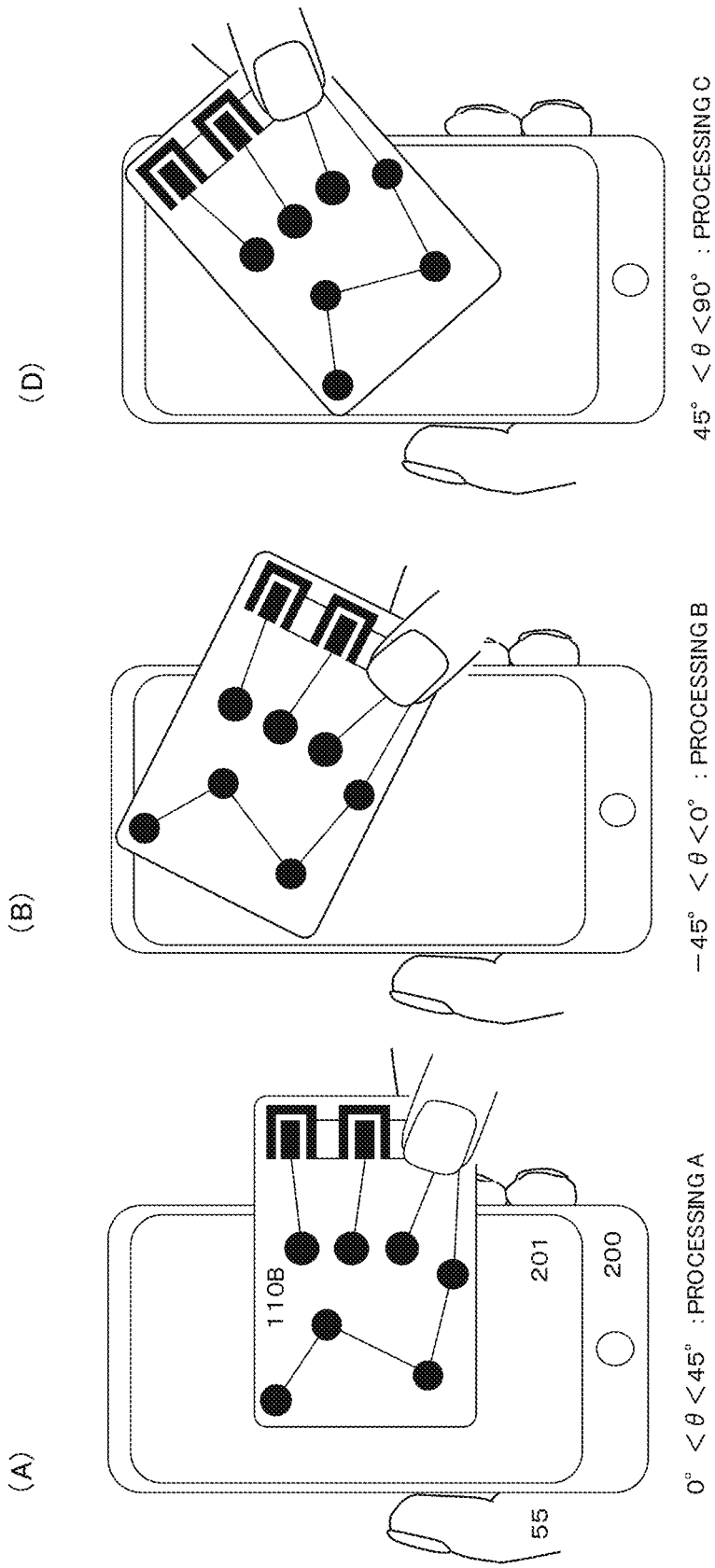
FIG. 151 is a diagram (3) showing a method of recognizing the position of an electrode by a code recognition apparatus and processing of a program according to this position recognition method.

With reference to FIGS. 149 to 151, a method of recognizing the position of the electrode 111 by the code recognizing device 200 and processing of a program according to this position recognizing method will be exemplified. In the present embodiment, the code recognition device 200 recognizes the conductive pattern 70 from the coordinates of the five electrodes 111 detected in the code detection area of the touch panel 201, and defines and acquires a pattern code.

(Algorithm Details)
(Step E1) FIG. 149 illustrates details of the algorithm. In this embodiment, the coordinate values of the detection points in the coordinate system on the touch panel in FIG. 150A are presented as P1 (X1', Y1'), P2 (X2', Y2'), P3 (X3', Y3'), P4 (X4', Y4'), P5 (X5', Y5'). The code recognition device 200 calculates all the distances between two points out of a total of five points including four points of the detected ID electrode and one point of the information electrode. The result of sorting is L1>L2>L3>L4>L5>L6>L7>L8>L9>L10. Note that the XY coordinate system in FIG. 150A has a coordinate system which has an origin in the lower left of the touch area. In FIG. 150A, the coordinate value of each detection point when the code generator 110 is placed on the touch panel by θ' rotation is represented by the X'Y' coordinate system of the touch panel. The longest line segment L1 connecting the two detection points consists of P1 and P4, and forms an angle θ1 of L1 with respect to the positive direction (Y-axis direction) of the code generator 200. θ 1 is set in advance in the code recognition apparatus 200 as one piece of information corresponding to the longest line segment connecting two detection points, and is stored in, for example, a ROM.

Further, the code recognition device 200 stores the grid coordinates of the four ID electrodes, 111D1, 111D2, 111D3, and 111D4, and the three information electrodes, 111E1, 111E2, and 111E3, corresponding to the ID code number. For example, the electrode arrangement of the ID code is such that 111D1 and 111D4 are the reference electrodes, (0, 2) and (14, 12), and the remaining 111D2 and 111D3 are sequentially arranged according to the restrictions on the distance between the electrode centers. As a condition for arrangement, the relation of X2+Y2*14<X3+Y3*14 (111D2 is placed before 111D3) is arranged. Thereby, the magnitude relationship of each electrode in the grid coordinate system of the ID code is in the order of 111D4, 111D3, 111D2, 111D1, 111E1, 111E2, and 111E3.

(Step E2) In the code recognition by the five detection points, first, the code recognition device 200 obtains the start point PS and the end point PE constituting the longest line segment L1 connecting the two detection points. In this embodiment, P4 and P1 are PS or PE. However, since it is not possible to determine which point is PS, two points are assigned to PS in order and the coincidence with the code coordinates is determined. Here, the case where P4 is PS will be described. The angle of the line segment connecting the two points PS and PE starting from PS with respect to the touch panel X' direction when the code generator 110 is placed at an angle $$\theta'=\tan-1\{(X1'-X4')/(Y1'-Y4')\}$$

The normalized length in the grid coordinate system of the code generator 110 of the longest line segment L1 is obtained from the arrangement coordinates (0, 2) and (14, 12) of the reference electrode, and given by the following equation, $$L1g=\sqrt{((14-0)^2+(12-2)^2)}=17.204$$

Similarly, the angle θ between the line segment L1g and the X axis of the grid coordinate system is given by the equation, $$\theta=\tan-1\{(12-2)/(14-0)\}=35.54°.$$

By putting the coordinate magnification between the touch panel coordinate system and the grid coordinate system is un, the following equation is obtained, $$un=114/(L1*\cos\theta)|.$$

Also, by putting the conversion rotating angle between the touch panel coordinate system and the grid coordinate system is Δθ, it is obtained by $$\Delta\theta=\theta-\theta'.$$

(Step E3) The code recognition device 200 calculates the relative coordinate values of the other four detection points with PS as the origin as follows; ΔP1 {ΔX1'=(X1'-X4'), ΔY1'=(Y1'-Y4')}, ΔP2 {X2'=(X2'-X4'), ΔY2'=(Y2'-Y4')}, ΔP3 {ΔX3'=(X3'-X4'), ΔY3'=(Y3'-Y4')}, ΔP5' {ΔX5'=(X5'-X4'), ΔY5'=(Y5'-Y4')}. Further, in order to set PS as a reference point (0, 0) for rotation in the grid coordinate system, the electrode coordinate of the ID code in the grid coordinate system for performing the coincidence determination has a Y coordinate value of −2.

Further, as shown in FIG. 150(B), the code recognizing device 200 rotates the coordinate values on the touch panel by θ' and performs coordinate conversion to the grid coordinate system. The coordinates after the coordinate conversion are called standardized coordinates, and the coordinate values after the coordinate conversion are called standardized coordinate values. For example, as shown in FIG. 150(A) the coordinate transformation of the points P1 and P2 are obtained as follows;

$$P1: \theta 1d=\tan-1(\Delta X1'/\Delta Y1')$$

$$X1=\cos(\theta 1d+\Delta\theta)\times L1\times un=14$$

$$Y1=\sin(\theta 1d+\Delta\theta)\times L1\times un=10$$

$$P2: \theta 2d=\tan-1(\Delta X2'/\Delta Y2')$$

$$X2=\cos(\theta 2d+\Delta\theta)\times L7\times un$$

$$Y2=\sin(\theta 1d+\Delta\theta)\times L7\times un.$$

Similarly, P3 and P5 are also obtained.

(Step E4) The code recognition apparatus 200 sorts the grid coordinate system of P1, P2, P3, P4, and P5 obtained by coordinate conversion from the coordinates on the touch panel in the descending order of the values of X+Y*14, and the coordinates obtained for P2, P3, and P5 other than P4 and P1 assigned to PS, PE, and the grouping information are converted into integers in consideration of the allowable error range. Since each of the X and Y coordinates of the ID electrodes 111D2 and 111D3 can be determined from the group number as an even number or an odd number, the coordinate N converted to an integer with respect to the conversion coordinate value m in case of an odd number is given as $$N=\text{integer}(m/2)*2+1$$

and in case of an even number $$N=\text{integer}((m+1)/2)*2.$$

As a result, the converted coordinate value m including the detection error can be converted to an integer in a range of N−1 ≤ m ≤ N+1 regardless of the odd number or even number.

The coordinates of the second largest P point after sorting correspond to the ID electrode 111D2, the coordinates of the third largest P point correspond to the ID electrode 111D3, and the coordinates of the smallest P point correspond to the information electrodes 111E1 to 111E3. Since the information electrode is a fixed coordinate (odd, even), the smallest P point is converted to an integer with the X coordinate being an even number and the Y coordinate being an odd number.

Next, after converting to an integer, the Y coordinate value −2 performed for coordinate rotation conversion is returned to the base.

Then, each electrode coordinate converted into an integer by coordinate conversion is collated with the coordinate of each electrode in the grid coordinate system of the stored ID code, and the matching one is determined as the ID code.

If there is no match, the PS and PE at the two points of L1 are reversed and the same flow is repeated.

(Step E5) The code recognition device 200 executes processing corresponding to the obtained ID code.

As described above, the code recognition device 200 can specify an ID code from the coordinates at which the touch panel 201 detects the electrode of the code generation device 110, and can execute processing corresponding to the ID code.

By using the encoding algorithm specification of the ID code of the present embodiment, the code recognition device 200 can specify the ID code regardless of the angle at which the code generator 110 is in contact with the touch panel 201 as shown in FIG. 151. Further, the contact angle is specified by the value of the rotation angle AO between the touch panel 201 coordinate system and the card grid coordinate system obtained at the time of coordinate conversion, and the processing contents depending on the ID code and the contact angle can also be changed.

If it is not necessary to recognize the direction in which the card is tucked, the electrode arrangement of the ID code conductive pattern 70 may be a unique geometric pattern (regular polygon, etc.) in which the direction cannot be recognized, and in that case the number of ID codes can be increased.

Thirty-Second Embodiment

FIGS. 152 to 156 are diagrams for explaining authentication of the card code (capacitance code) of the C-Card (hereinafter also referred to as "multi-touch card" or "card") described above.

(Card Code Specifications)

First, the card code specifications will be described with reference to FIG. 152.

Figure 152:
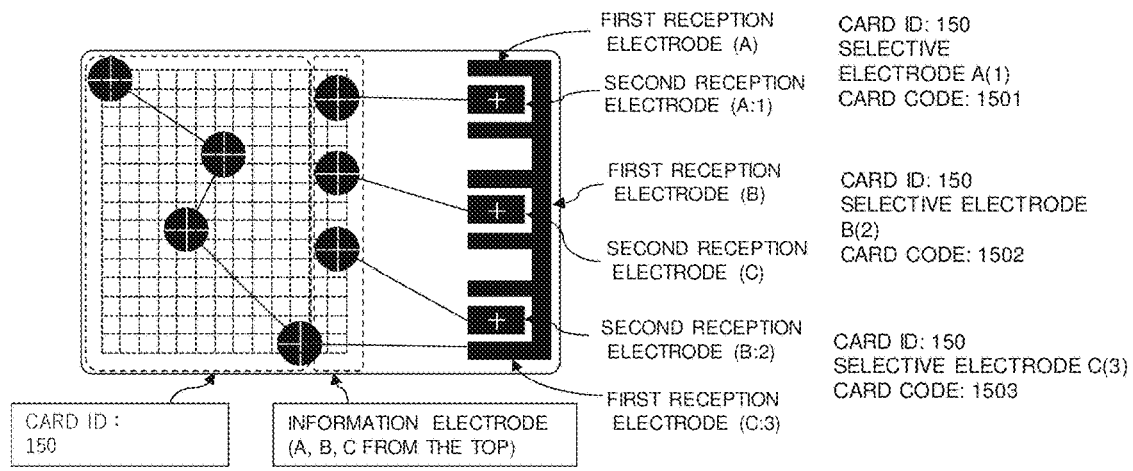
FIG. 152 is a diagram describing a card code format.

By holding with a finger simultaneously both of the first indicator electrode A and the second indicator electrode A, both of the first indicator electrode B and the second indicator electrode B, or both of the first indicator electrode C and the second indicator electrode C shown in FIG. 152, AC electricity (when a non-conductive layer is formed on the indicator electrode) or DC electricity (when the indicator electrode is exposed) flows from the held human body. The touch panel detects the coordinate values of the five electrodes by detecting the capacitance of the total of five electrodes composing of the four first electrodes that form the card ID and any of the information electrodes A, B, and C in the smartphone side. Here, a card ID quantified by a geometric pattern is defined based on coordinate values detected from the four first electrodes (The number may be less than 4. Any number may be used as long as it is equal to or less than the number obtained by subtracting 1 from the predetermined number that the smartphone can detect.) connected to the first indicator electrode by conductive wires. This geometric pattern is a unique conductive pattern which is formed of a conductor on the card and whose rotation direction is uniquely determined. Furthermore, by detecting the coordinate value of the information electrode A, the information electrode B, or the information electrode C, the coordinate value of the electrode detected by one card becomes five, and three types of geometric patterns are detected by one card and digitized card codes are recognized. Note that the numbers of the first electrode, the information electrode (a plurality of information electrodes connected to the second indicator electrode may be plural), and the first and second indicator electrodes forming a set are arbitrary. Of course, the card code is not limited to three types, and it goes without saying that a conductive pattern in which a plurality of types of card codes are defined may be formed on various media including the card. Since the conductive pattern that forms the card code and card ID is a unique geometric pattern, the conductive pattern that is in contact with or close to the touch panel can recognize the pattern at any angle or position relative to the touch panel, and can be digitized as a card ID and card code. In the embodiment of FIG. 152, as an example, when the card ID is set to be 150, the card code is set to be 1501 for the electrode A, 1502 for the electrode B, and 1503 for the electrode C depending on the electrode that is detected by the position where the first indicator electrode is held by the finger, but these card IDs and code values may be set arbitrarily.

(Corporate ID/Card Code Authentication System)

Figure 153:
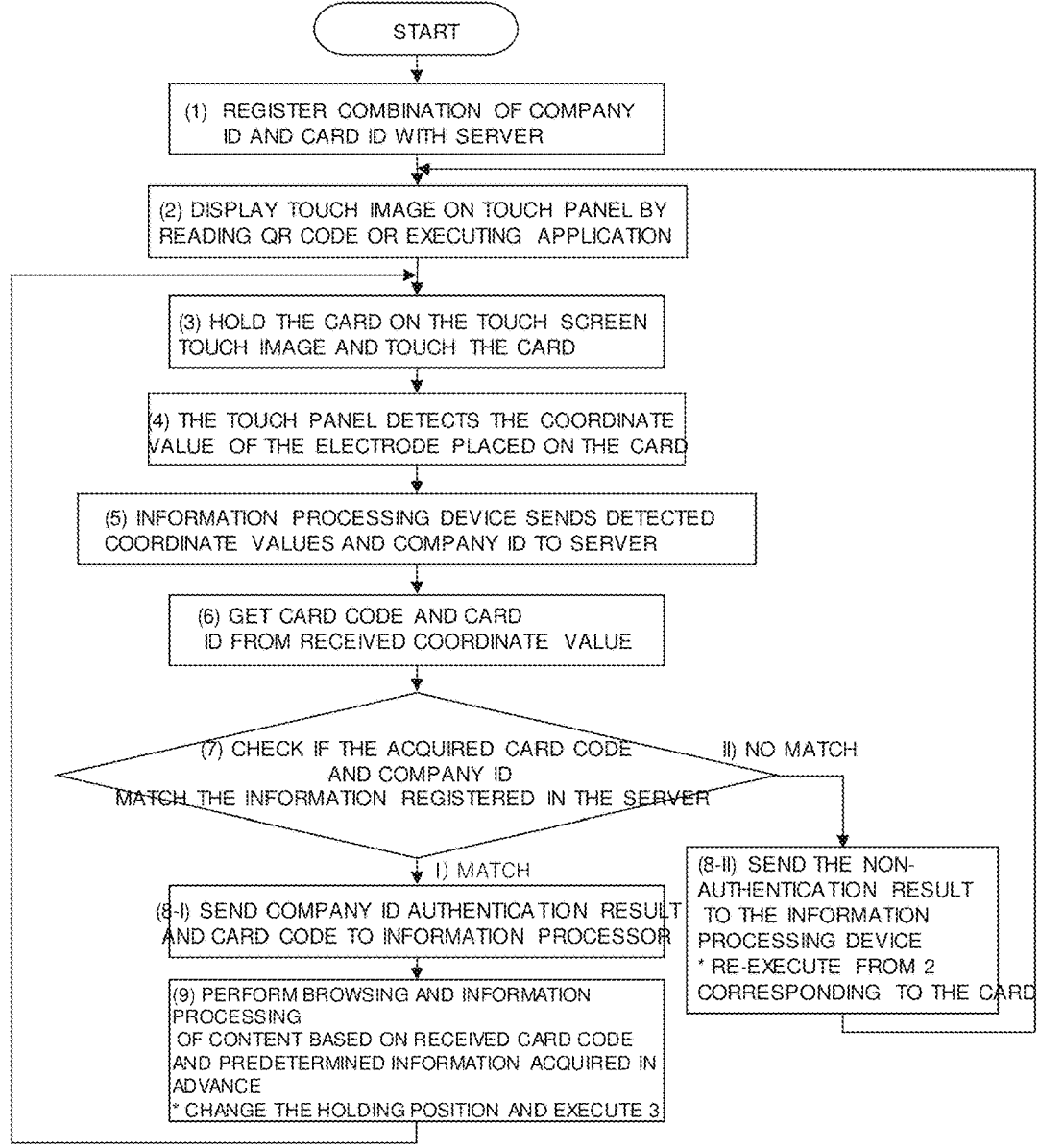
FIG. 153 is a flowchart showing a company ID/card code authentication flow.

FIG. 153 is a flowchart for explaining the company ID/card code authentication system.

When a user uses a multi-touch card, it is desirable to construct a card code authentication system in order to perform charging, obtain usage logs, and conceal card code analysis. The flow of the authentication system is shown in FIG. 153.

(1) First, the company ID of the contract company and one or more card IDs used by the company are registered in the authentication server. A company ID-card ID table may be created.

(2) Next, when a predetermined process is performed by the information processing apparatus such as QR code reading or application execution, a touch image for guiding the touch of the card is displayed on the touch panel.

(3) Next, the user holds the card and touches the touch image displayed on the touch panel.

(4) Next, the touch panel (including the touch position calculation means) on which the card is tricked detects the coordinate positions (coordinate values) of a predetermined number of electrodes from the detected capacitance.

(5) Next, the information processing apparatus (including software) connected to the touch panel transmits at least the coordinate value and the company ID to the authentication server.

(6) Next, the authentication server recognizes the card code by pattern analysis from the received coordinate value of the electrode and acquires the card ID from the card code.

(7) Next, the authentication server checks whether the acquired card ID is a card ID registered together with the company ID.

(8) When the acquired card ID is verified as a pre-registered card ID, the authentication server transmits a card code to the information processing apparatus (including software) to complete the authentication. If not verified, the authentication server transmits a code indicating an error to the information processing apparatus (including software) and is not authenticated. In the case of non-authentication, since a card with an unregistered card ID is used, it is necessary to re-execute from (2) corresponding to the card.

(9) An information processing apparatus (including software) executes browsing of content such as a WEB site and various information processing using an authenticated card code.

In addition, in the process (1), a predetermined number of card codes corresponding to the card ID (three in the embodiment, but a predetermined number in which a set of information electrodes and second indicator electrodes is formed) may be registered instead of the card ID. In that case, the predetermined number of card codes registered together with the company ID in (5) are collated. The card code authentication system can record the history of authenticated company IDs and card codes over time and can be used for multi-touch card effect measurement and marketing research. If linked to GPS built into information processing devices such as smartphones, the history can be recorded along with the area of use. In order to make various charges by using a card, you can use a PIN code and password together to ensure high security for card code authentication.

(Content Download by Browser)

The user captures a QR code printed on the back side of the card (or the front side) or a separate sheet (register a URL that includes at least the company ID) with a QR code reader (including the camera) equipped with (or connected to) an information processing device such as a smartphone, tablet, or PC. Then, the user reads the URL analyzed by the analytical device such as a smartphone, accesses the URL by browser, and downloads content data including HTML, JavaScript (JS), and predetermined data (including company ID). When content display or the like is executed, a card touch screen is displayed on a display (touch panel) such as a smartphone. When the user touches the card by holding the plural holding areas printed on the card surface with a finger, the touch panel detects the coordinate values of a predetermined number of electrodes, and JS sends at least the coordinate value and the company ID are transmitted to the card code authentication system and the card code authentication system, and the result of the card code analyzed from the coordinate value and the authentication result of the company ID are received. Thereafter, processing based on the card code is executed. If you download and acquire HTML or JS with a general-purpose browser, you can analyze the HTML or JS temporarily stored in the information processing device and acquire the URL where the image, video data, and content are registered, so that these contents can spread to third parties.

In order to provide content only to the person who owns the card, it is required to develop a dedicated browser (application) with QR code reading function, to download and install the dedicated browser according to the following procedure, and to create a mechanism that cannot conceal URLs and store content data. By downloading and installing the application, the smartphone ID can be acquired, and push communication (mail and information distribution to smartphone users) gets possible.

(1) Using a general-purpose browser, read the QR code for the card and download and install a dedicated browser.
(2) Using a dedicated browser, read the QR code for the card, acquire the URL, download confidential HTML, JS, and predetermined data (including company ID) and acquire or stream the content.

(Application Development Using SDK (Software Development Kit))

If priority is given to real-time performance such as games, or if you do not want to go through the authentication server, an authentication system may be provided as an SDK and incorporated into an application or JS in order to perform card code analysis, card ID acquisition and authentication from the coordinate values detected by the touch panel. In that case, an SDK in which the card ID (or card code) contracted with the company ID is registered may be provided. As a result, a card having a card ID not contracted with the company cannot be used, and security can be ensured.

(Subcode (Dedicated Argument) Setting)

Even with a single card ID, a subcode (dedicated argument) can additionally be described in the URL registered in the QR code, and the different contents can be downloaded by changing the URL depending on the combination of the company ID and each subcode. Thereby, plural types of multi-touch cards having the same card ID (including a predetermined number of card codes) can be realized. Corresponding graphics are printed on the surface of these multiple types of cards, and a QR code in which a URL including at least a company ID and a subcode is registered is printed on the back surface (or the front surface) of the card or on a separate sheet. The company ID and subcode may be described in the data area of the QR code.

(Content Creation with Subcode Setting by Content Generator)

In the present invention, a content generator (CMS: content management system) that automatically creates content for a multi-touch card is used to set a touch screen image (which may be a moving image) or a touch area (A, B, C), and the content browsing and operation settings when the card is touched on the touch screen can be performed for each subcode.

The user inputs a file name, URL, and execution software name on the interface screen as shown in FIG. 155. In the figure, 11 is set as the company ID, and one card ID (150) is set for the company ID (11). Four subcodes 1 to 4 are set. Note that the number of subcodes and their numbers may be set freely. Different touch screens for images 1 to 4 are set for each subcode, but the same touch screen may be set. Further, although A1 to A4, B1 to B4, and C1 to C4 are set as file names, URLs, and execution software names for each subcode, the same names may be included. When the subcode is not used, the subcode (1) may or may not be described in the URL. If the touch screen and A, B, and C contents are all set by URL, the capacity of content including HTML, JS, and predetermined data (including company ID and subcode) automatically created by CMS is small and become easier to manage. Here, there may be a non-input field in the A, B, and C contents, which means that it does not react even if the indicator electrode is held, and naturally the holding area does not need to be clearly shown in graphics. If the touch image has already been input and the A, B and C contents have not been input, the content of the card is not set. In addition, by entering the server name (e.g.: https://content.iml-lab.net/card/) for registering this automatically generated content, a QR code that contains at least the company ID and subcode as shown in FIG. 155 a URL that contains may be automatically generated. In FIG. 155 (*a*), FIG. 155(*b*), FIG. 155(*c*), and FIG. 155(*d*) in this figure, subcodes 001 to 004 are described in the last three digits of the URL dedicated argument. The company ID should be kept secret and should be encrypted and described in the URL. The last 4 digits to the last 8 digits of the dedicated argument correspond to the company ID. Of course, the subcode may also be encrypted and described. Such a format may be in any form or order.

(Group Number (Dedicated Argument) Setting)

In case that multiple card IDs are set for one company ID, different contents can be downloaded from each card when a user touches multiple cards with different card IDs on one touch card screen. In that case, by grouping which card IDs are targeted for a given touch card screen and by assigning a group number to the combination, at least one copy of the same card ID can be set to the group number. As in the case of using the subcode number, the group number (dedicated argument) is added to the URL registered in the QR code by changing the group number while using the same card ID, and the different contents can be downloaded by changing the URL according to the company ID and the group number and/or their combination of each subcode. Further, by using the subcode together, it is possible to provide many environments where a plurality of cards can be used on a predetermined touch screen. In that case, it is necessary to describe at least the group number and subcode in the URL registered in the QR code. The group number may also be encrypted, and such a format may be in any format or order. In this way, on the surface of multiple types of cards classified by group number and subcode, the corresponding graphic is printed, and at least the QR code that registered the URL including the company ID, group number, and subcode is printed on the back side (or the front side) or on a separate sheet. The company ID, the group number, and the subcode for authentication may be described in the QR code data area.

(Content Creation by Group Number and Subcode Setting by Content Generator)

In the present invention, a multi-touch card content may be automatically created for each group number and subcode using a content generator (CMS: content management system).

The user inputs a file name, URL, and execution software name on the interface screen as shown in FIG. 156. In this figure, the company ID is set to 12, and a plurality of card IDs (151, 152, 153) are set for the company ID (12). Even if only one card ID is set, the group number can be set like the subcode. Subcodes 1 to 4 Up to four are set. The number of group numbers and subcodes, and the number may be set freely. Different touch screens for images 11 to 31 are set for each group number and subcode, but the same touch screen may be set. Further, although A111 to A321, B111 to B321, and C111 to C321 are set as file names, URLs, and execution software names, the same names may be included. When the group number is not used, the group number (1) may or may not be described in the URL. If the touch screen and A, B and C contents are all set by URL, the capacity of the content including HTML, JS automatically created by CMS and predetermined data (including company ID, group number, subcode, etc.) is reduced, and the management becomes easier. Here, there may be a non-input field in the A, B, and C content fields, and in the case of no input, no reaction occurs even if the indicator electrode is held. Of course, the holding area does not need to be clearly indicated by a graphic. If the touch image has already been input and the A, B and C contents have not been input, the content of the card is not set.

In the embodiment of FIG. 156, in the group number (1), card IDs 151, 152, and 153 and subcodes 1 to 4 are set, respectively. As a result, when the touch image set for each subcode is touched one after another while changing the card with holding the predetermined holding area of each card having the corresponding three types of card IDs 151, 152, 153, respectively, browsing and information processing for the corresponding contents are performed. In the group number (2), card ID only for 152 and subcodes for 1 to 3 are set. In the group number (3), card IDs for 151 and 153 and one subcode only for 1 are set.

(Security by Entering PIN Code)

In order to enhance the security of multi-touch cards, PIN code input is desirable in addition to card code (including card ID) authentication using a dedicated browser (application). Currently, PIN codes are used for prepaid cards such as POSA cards that are used on the internet using smartphones and PCs. The user purchases a prepaid card that can be used at each site, obtains the PIN code by removing the concealed PIN code and by scratching the concealment seal, enters the PIN code, and settles his payment. However, there is a social problem of "ore-ore swindle" where fraud groups use telephones to make elderly people purchase prepaid cards for e-commerce at convenience stores, etc., ask for a PIN code, and illegally use prepaid cards. The problem is that even if the fraud group does not obtain the prepaid card, fraud can be easily done if the senior citizen purchases the prepaid card by telephone and obtains the PIN code. If a multi-touch card is used as a prepaid card, it is possible to have a mechanism in which the PIN code cannot be entered unless the user downloads and installs a dedicated browser (application), and defaces the card by holding the specified holding area. As a result, it is not possible to do "ore-ore swindle" by telephone alone, and the card must be handed over. Since "ore-ore swindle" is extremely difficult to carry out, and evidence tends to remain, it can provide extremely high security.

On the other hand, PIN code input is also desirable when providing content (including paid items) such as video/images, game items, and benefits such as coupons and points only to specific people. This is because the meaning of the service for a specific person is lost if the content or coupon is copied and spread to a third party. In addition, companies will suffer serious damage if economic services such as discounts and cash vouchers for specific people spread. Therefore, the service provider can provide various services only in the case that the service provider downloads and installs a dedicated browser (application) like a prepaid card and enters the PIN code to authenticate the card holder when a user uses a multi-touch card. If the application is downloaded and installed, the ID of an information processing device such as a smartphone can be acquired, push communication can be performed from the provider side, and a new service can be provided to the user in a timely manner.

When push communication or content concealment is not required, a general-purpose browser may be used with emphasis on convenience.

In short, C-Card specification (multi-touch card) that touches the touch panel while holding it with your finger (all technical contents related to card production and use, such as card ID circuit pattern, data format, structure, material, formation method) and the authentication system was explained, and in addition to producing and using in combination with other hold-type C-Card specifications, at least a part of the specification of the holding type C-Card can be applied in combination with the mounting type C-Card that is used by placing the card on the touch panel shown in FIGS. 38 to 75. Similarly, at least a part of the specifications of the placement type card can be applied in combination with the holding type card.

Third-Third Embodiment

The present embodiment relates to various uses using a multi-touch card.

(Gift Card Card)

Figure 157:
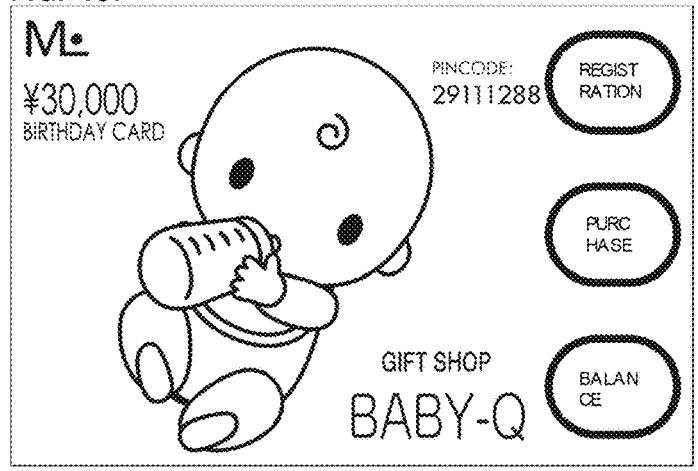
FIG. 157 is a diagram describing a case where a multi-touch card is used as a gift card.

Multi-touch cards can be used with various prepaid cards. For example, a prepaid card (gift card) shown in FIG. 157 is an example of a gift card for birthday celebration of a baby of 30,000 yen. The EC site where you can purchase merchandise with a gift card is "GIFT SHOP BABY-Q," and when the user enters the PIN code 29111288 and registers, the merchandise that can be purchased with this gift card is displayed, and the product can be purchased and settled by selecting with a tap. The PIN code may be hidden by a scratch or a concealment seal, or may be printed on a separate sheet. When push communication is not performed or when a PIN code may be input every time, a general-purpose browser may be used. The user captures a QR code printed on the back side (which may be the front side or a separate sheet), downloads content consisting of HTML, JS, predetermined data, etc., and then either of the card holding areas "registration," "purchase," or "balance" may be held, and the card may be touched on the touch screen displayed on the smartphone display. In order to track which smartphone is used when stolen or duplicated goods are used, it is desirable for users to download a dedicated browser (application). The smartphone can be specified by acquiring the smartphone ID by the application. Furthermore, services such as points and coupons can be provided with push communication.

The payment information is all managed in the cloud by linking the PIN code, card ID, and smartphone ID (not linked to the smartphone ID when using a general-purpose browser).

In order to further enhance security, a password may be set.

When the user first holds the "Register" icon and touches the card, "Enter PIN code" appears on the PIN code entry screen on the smartphone display. On the PIN code entry screen, you can enter the PIN code using the numeric keypad. When the user enters the PIN code "29111288", the smartphone will beep and a message "You have been authenticated. If you want to purchase a product, please grab the purchase icon and touch the card to check and settle the purchase." will appear on the display to complete registration. If the user enters a number other than "29111288", the smartphone will make a beep sound and the message "PIN code could not be authenticated" will appear on the display. If the user touches the card by picking up the "Purchase" or "Balance" icon before registration, "Please pick up the registration icon and touch the card" is displayed on the display.

When the user holds the "Purchase" icon and touches the card, the display shows the WEB screen for products that can be purchased with BABY-Q, and the description of the product can be viewed. If a list of products is displayed and at least one purchased item is checked, a 'payment' icon and a 'cancel' icon are displayed together with the purchase amount and the balance after purchasing the product. When the user taps the 'payment' icon, the purchase is confirmed and a screen showing payment is displayed. Subsequent items in the product list are unchecked and only the check frame is available. When you tap the 'Cancel' icon, the list of purchased items is displayed again. If the balance becomes negative, a message such as "Insufficient balance" is displayed. If the purchased item is not checked, a message "Please tap the check box of the product you want to purchase" is displayed.

When the user holds the "balance" icon and touches the card, the purchased product name, amount, and balance are displayed on the display so that the user can know what has already been purchased.

(Product Promotion Card)

Figure 158:
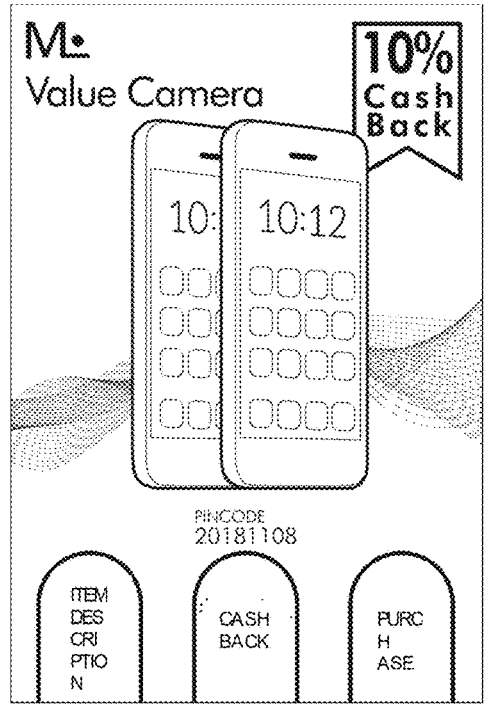
FIG. 158 is a diagram describing a case where a multi-touch card is used as a product promotion card.

The multi-touch card can be used as a product promotion card as shown in FIG. 158. Card providers carry out campaigns by distributing at stores, stations, etc., posting to houses around shopping streets, and putting them on insert flyers. In order for the product purchaser (user) to acquire cashback benefits that encourage the purchase of the product, it is desirable to download a dedicated browser (application) from the QR code printed on the back side. By downloading the application, the card provider can acquire the user's own smartphone ID and provide related products and services, new product information, and further benefits to the user in a timely manner via push communication, and customer enclosure can be realized. The payment information is all managed in the cloud by linking the PIN code, card ID, and smartphone ID.

First, a user captures a QR code printed on the back side with a general-purpose QR code reader, and downloads content including HTML, JS, predetermined data, and the like. If you hold the "Product Introduction" icon and touch the card, an attractive video will be displayed on the smartphone display to introduce the product.

If the user holds the "Purchase" icon and touches the card before the cashback procedure, the screen will read "Pick the cashback icon to download the application and enter the PIN code." After the cashback procedure, if you hold the "Purchase" icon and touch the card, the product list (color: black, white, silver, gold) with a check box will be displayed on the display, and a check is displayed when the user taps and selects a purchased item. At the bottom of the product list, 'Purchase' and 'Cancel' icons are displayed. When the user taps 'Purchase', "Thank you for the purchase" is displayed, and you are transferred to the credit card or prepaid card payment screen. If the purchased item is not checked for selection, "Please select item" is displayed. When the user taps 'Cancel', a product list with a check frame that is unchecked is displayed.

When the user holds the "cashback" icon and touches the card, the message "Download the application and enter the PIN code" is displayed on the display together with the "Download application" icon. When the user taps the "app download" icon, the app is downloaded. When the installation of the application is completed by tapping the 'Install' icon displayed after downloading, the PIN code input screen is displayed, and the PIN code can be entered using the numeric keypad.

When the user enters the PIN code "20181108", the smartphone makes a "bingo" sound and the display shows "Authenticated. If you want to purchase a product, pick the purchase icon and select the purchase" and the registration is performed. If the user enters a number other than "20181108", the smartphone will make a sound corresponding to "incorrect" and the message "PIN code could not be authenticated" will appear on the display.

(Business Card)

Figure 159:
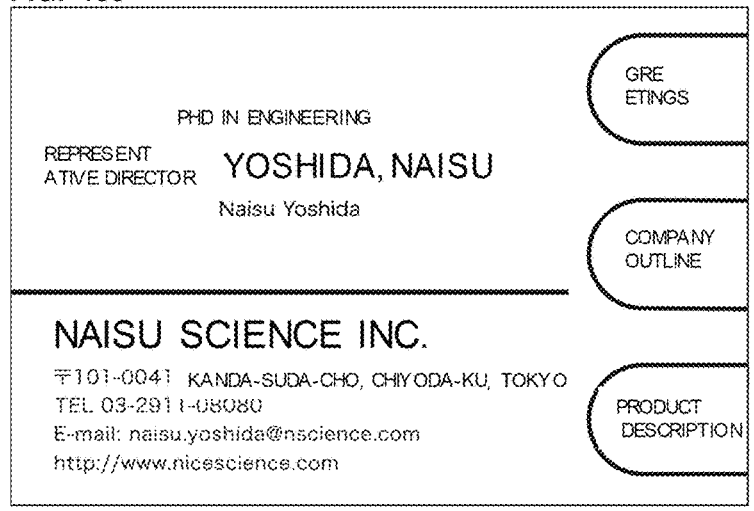
FIG. 159 is a diagram describing a case where a multi-touch card is used as a business card.

The multi-touch card can be used as a business card as shown in FIG. 159. For convenience, a general-purpose browser may be used. The user captures the QR code printed on the back side, and downloads content including HTML, JS, predetermined data, and the like. And if you touch the card on the touch screen that holds one of the cards holding areas "Greeting", "Company Profile", or "Product Introduction", the corresponding content will be a video or still image (with audio but it is introduced).

By describing the subcode and company ID set for each department in the QR code printed on the back side in the URL, "Department Manager Greeting Video" and "Department Overview" for each name department of the provided business card, "Product introduction of department" can be viewed. In addition, by describing the subcode and company ID in the URL for each staff member, for each person who provided the business card, "Personal greeting video", "Summary of the department that the person appeals", "Product introduction that the person appeals" can also be provided. In addition, a different subcode is set for each person's business card, and the subcode of the business card given to the other party is recorded, and the contents corresponding to the "greeting" and "product introduction" of the business card obtained by the other party can be updated in a timely manner, and different contents can be provided for each destination. The subcode (numerical value) may be printed in the vicinity of the QR code described in the URL, and recorded when handed over to the other party. Then, the content corresponding to the subcode can be easily updated. A "document" icon may be provided in the holding area so that the document for the other party who has given the business card can be viewed.

When the user holds the "greeting" icon and touches the card, the video of the representative director is displayed on the smartphone display. If the "greeting" icon is held again and the card is touched during the reproduction of the moving image, the moving image is reproduced from the beginning. Similarly, when viewing a different content and holding a "greeting" icon and tricking a card, the moving image is reproduced from the beginning.

When the user holds the "company outline" icon and touches the card, the company outline produced by Power-Point is displayed on the display.

When the user holds the "Product Description" icon and touches the card, a demonstration video of the product is displayed on the display. If the "Product Description" icon is held again and the card is touched during the moving image reproduction, the moving image is reproduced from the beginning. Similarly, when viewing the other contents and holding the "Product Description" icon and touching the card, the moving image is reproduced from the beginning.

(Greeting Card)

Figure 160:
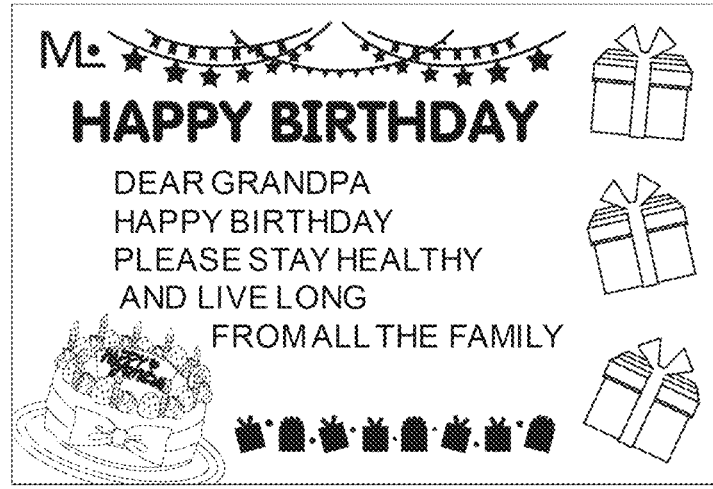
FIG. 160 is a diagram describing a case where a multi-touch card is used as a greeting card.

Multi-touch cards can be used for greeting cards in various fields such as birthday cards, Christmas cards, New Year's cards, postcards, etc., as shown in FIG. 160. This card is for greeting card production and sales companies and is sold at stores and online. The greeting card giver (sender) shoots three types (or a predetermined number) of photos (may include audio) and videos on a smartphone and uploads them to the cloud. As a method for uploading to the cloud, for example, the sender captures an application download QR code that is printed separately from the QR code on the back of the card. Then, on the display of the smartphone, a "Download" icon and "Please tap the download icon to download the content registration application" are displayed. When the user taps the "app download" icon, the application is downloaded. When the installation of the application is completed by tapping the 'Install' icon displayed after downloading, the screen will display "Please shoot the QR code printed on the back of the card with the application's dedicated QR code reader."

When you capture the QR code on the back of the card, the message "Select the video or photo you take and tap the three card icons to register" is displayed, and when such an operation is performed, the photo or video is registered in the cloud. In this application, the sender can display the registered photos and videos for each card and delete/update them at any time.

The side that received the card uses a general-purpose QR code reader to capture the QR code printed on the back of the card and containing the subcode that identifies the card in the URL. If you hold the card icon (red, purple, or yellow BOX icon) on the touch image displayed on the display and touch the card, you can send 3 types of photos and videos (only audio is acceptable) and view content registered in the cloud.

(Language Navigation Card)

Figure 161:
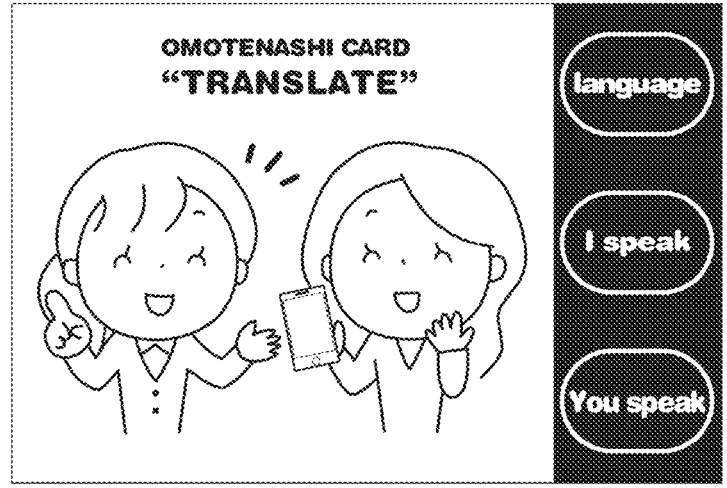
FIG. 161 is a diagram describing a case where a multi-touch card is used as a language navigation card.

The multi-touch card can also be used as a language navigation card as shown in FIG. 161.

If the user touches the language navigation card on the smartphone and touches it again, the spoken content is interpreted and translated in the partner's language, allowing overseas travelers, visitors to Japan, and various store staff to visit Japan and a usable system can be provided. In the language setting, the user and the partner language can be set, and the smartphone setting language is the default of the user language. This language navigation card may be supported by a general-purpose browser, giving priority to convenience. A user can take a QR code printed on the back side, download and use content such as HTML, JS, and predetermined data. In addition, when measuring the effect of where and how many of this language navigation card are distributed and how much is used, a QR code with a subcode linked to the distributed region and time may be printed on the back of the card.

In order to provide various information and services in Japan while traveling to Japan and after returning to Japan (based on information obtained from seasonal photos/videos and events of tourist destinations, product purchases, store benefits, interpretation/translation), it is desirable to download a dedicated application with these functions.

When the user first captures the QR code printed on the back side with a general-purpose QR code reader, downloads content consisting of HTML, JS, predetermined data, etc., holds the "language" icon and touches the card, the language setting screen for the person and the other party is displayed. The user's language is initially set in the smartphone setting language, but it can be changed. When the partner language is set, the language is stored and used until it is changed.

When the user holds the "I speak" icon and touches the card to speak, the person speaks, and when the user finishes speaking, holding the "I speak" icon and touching the card again interprets the content into the language used by the other party, the voice is uttered from the speaker of the smartphone, and the text is displayed on the display. Similarly, after the user holds the "You speak" icon and touches the card and the other party speaks and finishes speaking, holding the "You speak" icon and touching the card again the content is interpreted and translated with voice utterance and the text display in the language of the user. Since two people who use different languages can easily communicate with each other, it can be an indispensable item for inbound use by a store clerk such as a store or a restaurant, making smooth correspondence to foreigners.

So far, we have explained the use of C-Card (multi-touch card) that touches the touch panel with a finger (all areas of use, service contents/providing methods, necessary systems, etc.). Of course, at least a part of the use of the C-Card of the holding type is mounted on the touch panel shown in FIGS. 38 to 75, and it can be applied in combination with a mounting type C-Card. Similarly, at least a part of the use of the placement type card can be applied in combination with the holding type card. In addition, in order to increase security, an example in which a PIN code is input after the holding area is held and the card is touched on the touch screen has been shown, and you may hold and touch a card on a touch screen. By entering the PIN code, the available card IDs can be specified, and even a small number of card IDs can be identified by touching a large number of cards on the same touch screen.

Although various embodiments using C-Card have been described above, the present invention is not limited to this embodiment, and C-Card can be used for various other purposes.

The embodiments in this specification and the drawings can be combined in various ways.

[Explanation of Signs]

DESCRIPTION OF REFERENCE NUMERALS AND SIGNS

110 . . . DEVICE, CARD-TYPE DEVICE, 200 . . . INFORMATION EQUIPMENT, 111 . . . ELECTRODE

The invention claimed is:

1. A thin plate like apparatus
wherein the thin plate type apparatus according to the present invention is a thin plate type apparatus having one or more nonconductive base materials, and comprises a wiring layer which is formed of a conductive member including an electrode acting on a panel having a sensor for detecting a physical quantity, wherein the said panel detects position of the electrode from a physical quantity in a predetermined range detected by the said sensor,
wherein the said wiring layer comprises the electrode formed on a first surface which is one of the nonconductive base material surfaces, a plurality of linear conductive member connected to the electrode on the said first surface, and one or more operation areas having a first indicator electrode and a second indicator electrode on the said first surface,
wherein the electrode includes a plurality of first electrodes and one or more second electrodes that are not connected with the first electrodes,
wherein each of the said plurality of first electrodes is connected by the said linear conductive member as a bundle or each separately, at least one of the first electrodes is connected to the first indicator electrode by the linear conductive member, each of the one or more second electrodes is connected to the corresponding second indicator electrode by the linear conductive member, between the first indicator electrode and the second indicator electrode arranged on the said operation area, a predetermined distance is secured in a range in which a finger is in a conductive state when an operation of touching the operation area with a finger is performed, the predetermined distance is a distance that suppresses a coupling between the first indicator electrode and the second indicator electrode that enables the physical quantity of the second electrode to be detected by the panel, the second electrode connected to the second indicator electrode has a physical quantity in a range in which the position is not detected by the said panel, and wherein when the operation area receive finger contact operations, the first indicator electrode of a position receiving the said contact operations, the first electrode connected to the first indicator electrode, and the finger, and, the second indicator electrode, the second electrode connected to the second indicator electrode and the finger are in a conductive state, and a pattern comprising an arrangement of the first electrode and the second electrode wherein each respective position is detectable by the said panel in a state of making contact with or coming into proximity to the said panel by a physical quantity of the first electrode connected to the first indicator electrode and the physical quantity of the second electrode connected to the second indicator electrode.

2. The thin plate like apparatus according to claim 1, wherein the nonconductive base material is laminated on a surface on which the first surface is formed, the conduction is due to a coupling of an AC signal through the nonconductive base material, and the operation area receives an operation of touching with the finger.

3. The thin plate like apparatus according to claim 1, wherein the patterns different from each other are formed on both surfaces of the thin plate in a state of making contact with or coming into proximity to the said panel.

4. The thin plate like apparatus according to claim 1, wherein at least one of the said one or more nonconductive base materials is a characteristic base material having the physical property of suppressing a change in a physical quantity of which the position where the said contact operation is received is detectable by the said panel, when the said apparatus receives a finger contact operation in a state of making contact with or coming into proximity to a panel, at least at one part other than the said operation area, wherein the said wiring layer is provided on one side of the said characteristic base material.

5. The thin plate like apparatus according to claim 1, wherein a predetermined distance is secured between the ends of the second indicator electrode and other second indicator electrode close to the second indicator electrode so that when the operation area receives finger contact operations, only the second indicator electrode formed on the operation area receiving the finger contact operations and the finger are in a conductive state.

6. The thin plate like apparatus according to claim 1, wherein the said first indicator electrode is formed so as to surround a predetermined range around the said second indicator electrode.

7. The thin plate like apparatus according to claim 1, wherein each of the said first electrode connected as a bundle or each separately is connected with any one of the other first electrode by the linear conductive member with a line segment.

8. The thin plate like apparatus according to claim 1, wherein the said first electrode connected as a bundle or each separately is connected by a one-stroke path with the said linear conductive member.

9. The thin plate like apparatus according to claim 1, wherein at least a part of the said plurality of first electrodes is formed by having conductive wiring wired to form a linear pattern.

10. The thin plate like apparatus according to claim 1, wherein in a state where the said apparatus is making contact with or is in close proximity to the said panel, the said panel cannot detect the positions from the physical quantities generated when a finger touches the surface opposite to the surface on the side of the panel receiving the said contact or being approached.

11. The thin plate like apparatus according to claim 1, wherein at least one linear conductive member is formed by extending from the electrode connected to one linear conductive member or the electrode connected to a corner formed by two or more linear conductive members among a first electrode and/or a second electrode connected by the said linear conductive member in a predetermined direction.

12. A thin plate like apparatus
wherein the thin plate shaped apparatus according to the present invention is a thin plate like apparatus having one or more nonconductive base materials, comprises a wiring layer formed of a conductive member including an electrode acting on a panel having a sensor for detecting a physical quantity, and the said panel detects a position of the electrode from physical quantities in a predetermined range detected by the said sensor, wherein the said wiring layer comprises the electrode arranged on the first surface which is one of the surfaces of the said nonconductive base materials, a plurality of linear conductive members connected to the electrode on the said first surface, and a linear conductive member formed on one or more operation areas touched by a finger on the said first surface, wherein the electrode includes a plurality of first electrodes, wherein each of the said plurality of first electrodes is connected by the said linear conductive member as a bundle or each separately, wherein the linear conductive member formed on the operation area is connected to at least one of the plurality of first electrodes as a first indicator electrode by the linear conductive member, wherein the first indicator electrode has a physical quantity in a range in which the position is not detected by the said panel, wherein when the operation area receives finger contact operations, the first indicator electrode of the said positions receiving the said contact, the first electrode connected to the first indicator electrode and the finger are in a conductive state, and a pattern comprising an arrangement of the positions receiving the said contact and the first electrode is formed wherein each respective position is detectable by the said panel in a state of making contact with or coming into proximity to the said panel by a physical quantity of the position receiving the said contact and the physical quantity of the first electrode.

13. The thin plate like apparatus according to claim 12, wherein the nonconductive base material is laminated on a surface on which the first surface is formed, the conduction is due to a coupling of an AC signal through the nonconductive base material, and the operation area receives an operation of touching with the finger.

14. The thin plate like apparatus according to claim 12, wherein the patterns different from each other are formed on both surfaces of the thin plate in a state of making contact with or coming into proximity to the said panel.

15. The thin plate like apparatus according to claim 12, wherein at least one of the said one or more nonconductive base materials is a characteristic base material having the physical property of suppressing a change in a physical quantity of which the position where the said contact operation is received is detectable by the said panel, when the said apparatus receives a finger contact operation in a state of making contact with or coming into proximity to a panel, at least at one part other than the said operation area, wherein the said wiring layer is provided on one side of the said characteristic base material.

16. The thin plate like apparatus according to claim 12, wherein in the operation area, an opening which reaches from the said first surface to a surface of the nonconductive base material and enables the said finger contact operation on the conductive member formed on the operation area is provided.

17. The thin plate like apparatus according to claim 12, wherein each of the said first electrode connected as a bundle or each separately is connected with any one of the other first electrode by the linear conductive member with a line segment.

18. The thin plate like apparatus according to claim 12, wherein the said first electrode connected as a bundle or each separately is connected by a one-stroke path with the said linear conductive member.

19. The thin plate like apparatus according to claim 12, wherein at least a part of the said plurality of first electrodes is formed by having conductive wiring wired to form a linear pattern.

20. The thin plate like apparatus according to claim 12, wherein at least a part of the said apparatus comprises a transparent region having the one or more transparent nonconductive base materials.

21. The thin plate like apparatus according to claim 20, wherein the said transparent region comprises one or more operation areas touched with the finger.

22. The thin plate like apparatus according to claim 12, wherein at least one linear conductive member is formed by extending from the electrode connected to one linear conductive member or the electrode connected to a corner formed by two or more linear conductive members among a first electrode and/or a second electrode connected by the said linear conductive member in a predetermined direction.

* * * * *